(12) United States Patent
Kwak et al.

(10) Patent No.: US 11,743,422 B2
(45) Date of Patent: *Aug. 29, 2023

(54) APPARATUS AND METHOD FOR TRANSCEIVING BROADCAST SIGNAL

(71) Applicant: LG ELECTRONICS INC., Seoul (KR)

(72) Inventors: Minsung Kwak, Seoul (KR); Sungryong Hong, Seoul (KR); Woosuk Ko, Seoul (KR); Woosuk Kwon, Seoul (KR); Jangwon Lee, Seoul (KR); Kyoungsoo Moon, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/744,376

(22) Filed: May 13, 2022

(65) Prior Publication Data

US 2022/0368852 A1 Nov. 17, 2022

Related U.S. Application Data

(63) Continuation of application No. 17/387,675, filed on Jul. 28, 2021, now Pat. No. 11,336,862, which is a
(Continued)

(51) Int. Cl.
*H04N 7/088* (2006.01)
*H04N 21/235* (2011.01)
(Continued)

(52) U.S. Cl.
CPC ........ *H04N 7/088* (2013.01); *H03M 13/1102* (2013.01); *H03M 13/253* (2013.01);
(Continued)

(58) Field of Classification Search
None
See application file for complete search history.

(56) References Cited

U.S. PATENT DOCUMENTS 8,830,895 B2 * 9/2014 Wang .................. H04W 4/06
370/312
9,929,888 B2 3/2018 Kwak et al.
(Continued)

FOREIGN PATENT DOCUMENTS

EP 2200210 B1 4/2012
EP 2707974 A1 3/2014
(Continued)

OTHER PUBLICATIONS

Sohn et al., "Design of MMT-based Broadcasting System for UHD Video Streaming over Heterogeneous Networks", Journal of Broadcast Engineering, Jan. 2015, vol. 20, No. 1, (http://www.kpubs.org.article.articleMain.kpubs?articleANo=BSGHC3_2015_v20n1_16), See pp. 3, 6.

*Primary Examiner* — Younes Naji
(74) *Attorney, Agent, or Firm* — Dentons US LLP

(57) ABSTRACT

A method for transmitting a broadcast signal according to an embodiment of the present invention comprises generating service layer signaling information for discovery and acquisition of a broadcast service and a content component of the broadcast service; generating service list information including for service list building and discovery of the service layer signaling information; and physical layer processing of the service list information, service layer signaling information, and content component.

20 Claims, 87 Drawing Sheets

Related U.S. Application Data continuation of application No. 15/555,385, filed as application No. PCT/KR2016/002018 on Feb. 29, 2016, now Pat. No. 11,115,622.

(60) Provisional application No. 62/133,963, filed on Mar. 16, 2015, provisional application No. 62/128,528, filed on Mar. 5, 2015, provisional application No. 62/127,288, filed on Mar. 2, 2015.

(51) Int. Cl.

| | | |
|---|---|---|
| *H04N 21/236* | (2011.01) | |
| *H04L 1/00* | (2006.01) | |
| *H04L 67/02* | (2022.01) | |
| *H04N 21/434* | (2011.01) | |
| *H03M 13/00* | (2006.01) | |
| *H03M 13/25* | (2006.01) | |
| *H03M 13/29* | (2006.01) | |
| *H03M 13/27* | (2006.01) | |
| *H04L 65/65* | (2022.01) | |
| *H04L 65/70* | (2022.01) | |
| *H04L 65/611* | (2022.01) | |
| *H03M 13/11* | (2006.01) | |
| *H04L 65/80* | (2022.01) | |
| *H04N 21/2362* | (2011.01) | |
| *H04N 21/2665* | (2011.01) | |
| *H04N 21/858* | (2011.01) | |
| *H04W 4/06* | (2009.01) | |
| *H04L 1/04* | (2006.01) | |
| *H03M 13/15* | (2006.01) | |
| *H04L 67/146* | (2022.01) | |

(52) U.S. Cl.
CPC ......... *H03M 13/255* (2013.01); *H03M 13/27* (2013.01); *H03M 13/2703* (2013.01); *H03M 13/2906* (2013.01); *H03M 13/618* (2013.01); *H03M 13/6362* (2013.01); *H04L 1/0041* (2013.01); *H04L 1/0048* (2013.01); *H04L 1/0057* (2013.01); *H04L 1/0058* (2013.01); *H04L 1/0071* (2013.01); *H04L 1/0075* (2013.01); *H04L 65/611* (2022.05); *H04L 65/65* (2022.05); *H04L 65/70* (2022.05); *H04L 65/80* (2013.01); *H04L 67/02* (2013.01); *H04N 7/0887* (2013.01); *H04N 21/235* (2013.01); *H04N 21/236* (2013.01); *H04N 21/2353* (2013.01); *H04N 21/2362* (2013.01); *H04N 21/23614* (2013.01); *H04N 21/4345* (2013.01); *H04N 21/4348* (2013.01); *H04N 21/8586* (2013.01); *H04W 4/06* (2013.01); *H03M 13/1165* (2013.01); *H03M 13/152* (2013.01); *H04L 1/04* (2013.01); *H04L 67/146* (2013.01)

(56) References Cited

U.S. PATENT DOCUMENTS

| | | | |
|---|---|---|---|
| 11,218,235 B2* | 1/2022 | Deshpande | H04N 21/4345 |
| 11,317,138 B2* | 4/2022 | Yang | H04N 21/23614 |
| 2009/0133062 A1* | 5/2009 | Park | H04N 21/84 |
| | | | 725/39 |
| 2011/0044410 A1* | 2/2011 | Jang | H04N 21/43853 |
| | | | 375/340 |
| 2013/0121229 A1* | 5/2013 | Vare | H04H 20/22 |
| | | | 370/312 |
| 2013/0219431 A1* | 8/2013 | Hong | H04L 27/2601 |
| | | | 725/54 |
| 2013/0223383 A1* | 8/2013 | Park | H04H 20/57 |
| | | | 370/329 |
| 2014/0029502 A1 | 1/2014 | Hong et al. | |
| 2014/0059633 A1* | 2/2014 | Song | H04N 21/8126 |
| | | | 725/116 |
| 2014/0351446 A1* | 11/2014 | Cho | H04W 4/80 |
| | | | 709/227 |
| 2016/0205158 A1* | 7/2016 | Lo | H04L 65/60 |
| | | | 709/219 |
| 2017/0019431 A1 | 1/2017 | Kitahara et al. | |
| 2017/0134764 A1* | 5/2017 | Yamagishi | H04L 67/02 |

FOREIGN PATENT DOCUMENTS

| | | |
|---|---|---|
| KR | 10-2009-0131663 A | 12/2009 |
| KR | 10-2010-0050184 A | 5/2010 |
| KR | 10-1112524 B1 | 3/2012 |
| WO | WO 2011/126240 A2 | 10/2011 |
| WO | WO 2012/036429 A2 | 3/2012 |
| WO | WO 2012/077987 A2 | 6/2012 |
| WO | WO 2012/152969 A1 | 11/2012 |
| WO | WO 2015/008986 A1 | 1/2015 |

* cited by examiner

FIG. 3

| Element or Attribute Name | | Use |
|---|---|---|
| SLT | | |
| | @bsid | 1 |
| | @sltSectionVersion | 1 |
| | @sltSectionNumber | 0..1 |
| | @totalSltSectionNumbers | 0..1 |
| | @language | 0..1 |
| | @capabilities | 0..1 |
| | InetSigLoc | 0..1 |
| | Service | 1..N |
| | @serviceId | 1 |
| | @SLT serviceSeqNumber | 1 |
| | @protected | 0..1 |
| | @majorChannelNo | 1 |
| | @minorChannelNo | 1 |
| | @serviceCategory | 1 |
| | @shortServiceName | 1 |
| | @hidden | 0..1 |
| | @sls ProtocolType | 1 |
| | BroadcastSignaling | 0..1 |
| | @slsPlpId | 0..1 |
| | @slsDestinationIpAddress | 0..1 |
| | @slsDestinationUdpPort | 0..1 |
| | @slsSourceIpAddress | 0..1 |
| | @slsMajorProtocolVersion | 0..1 |
| | @SlsMinorProtocolVersion | 0..1 |
| | @serviceLanguage | 0..1 |
| | @broadbandAccessRequired | 0..1 |
| | @capabilities | 0..1 |
| | InetSigLoc | 0..1 |

FIG. 5

| Element or Attribute Name | | | | Use |
|---|---|---|---|---|
| bundleDescription | | | | |
| | userServiceDescription | | | |
| | | @serviceId | | M |
| | | @atsc: serviceId | | M |
| | | @atsc: serviceStatus | | OD |
| | | @atsc: fullMPDUri | | M |
| | | @atsc: sTSIDUri | | M |
| | | name | | 0..N |
| | | | lang | CM |
| | | serviceLanguage | | 0...N |
| | | atsc: capabilityCode | | 0...1 |
| | | deliveryMethod | | 1..N |
| | | | r12: broadcastAppService | 1..N |
| | | | basePattern | 1..N |
| | | | r12: unicastAppService | 0..N |
| | | | basePattern | 1..N |

FIG. 6

| Element and Attribute Names | | | | Use |
|---|---|---|---|---|
| S - TSID | | | | |
| | @serviceId | | | O |
| | RS | | | 1..N |
| | | @bsid | | OD |
| | | @sIpAddr | | OD |
| | | @dIpAddr | | OD |
| | | @dport | | OD |
| | | @PLPID | | OD |
| | | LS | | 1..N |
| | | | @tsi | M |
| | | | @PLPID | OD |
| | | | @bw | O |
| | | | @startTime | O |
| | | | @endTime | O |
| | | | SrcFlow | 0..1 |
| | | | RprFlow | 0..1 |

FIG. 7

| Element or Attribute Name | | | | | Use |
|---|---|---|---|---|---|
| bundleDescription | | | | | |
| | userServiceDescription | | | | |
| | | @serviceId | | | M |
| | | @atsc : serviceId | | | M |
| | | Name | | | 0..N |
| | | | Lang | | CM |
| | | serviceLanguage | | | 0..N |
| | | atsc : capabilityCode | | | 0..1 |
| | | atsc : Channel | | | 1 |
| | | | @atsc : majorChannelNo | | M |
| | | | @atsc : minorChannelNo | | M |
| | | | @atsc : serviceLang | | O |
| | | | @atsc : serviceGenre | | O |
| | | | @atsc : serviceIcon | | M |
| | | | atsc : ServiceDescription | | 0..N |
| | | | | @atsc : serviceDescrText | M |
| | | | | @atsc : serviceDescrLang | O |
| | | atsc:mpuComponent | | | 0..1 |
| | | | @atsc : mmtPackageId | | M |
| | | | @atsc : next_MmtPackageId | | O |
| | | atsc : routeComponent | | | 0..1 |
| | | | @atsc: sTSIDUri | | M |
| | | | @slsPlpId | | OD |
| | | | @slsDestinationIpAddress | | OD |
| | | | @slsDestinationUdpPort | | M |
| | | | @slsSourceIpAddress | | M |
| | | | @slsMajorProtocolVersion | | OD |
| | | | @SlsMinorProtocolVersion | | OD |
| | | atsc : broadbandComponent | | | 0..1 |
| | | | @atsc : fullfMPDUri | | M |
| | | atsc : ComponentInfo | | | 1..N |
| | | | @atsc : component_Type | | M |
| | | | @atsc : component_Role | | M |
| | | | @atsc : component_ProtectedFlag | | OD |
| | | | @atsc : component_Id | | M |
| | | | @atsc : component_Name | | O |

[Figure 8]
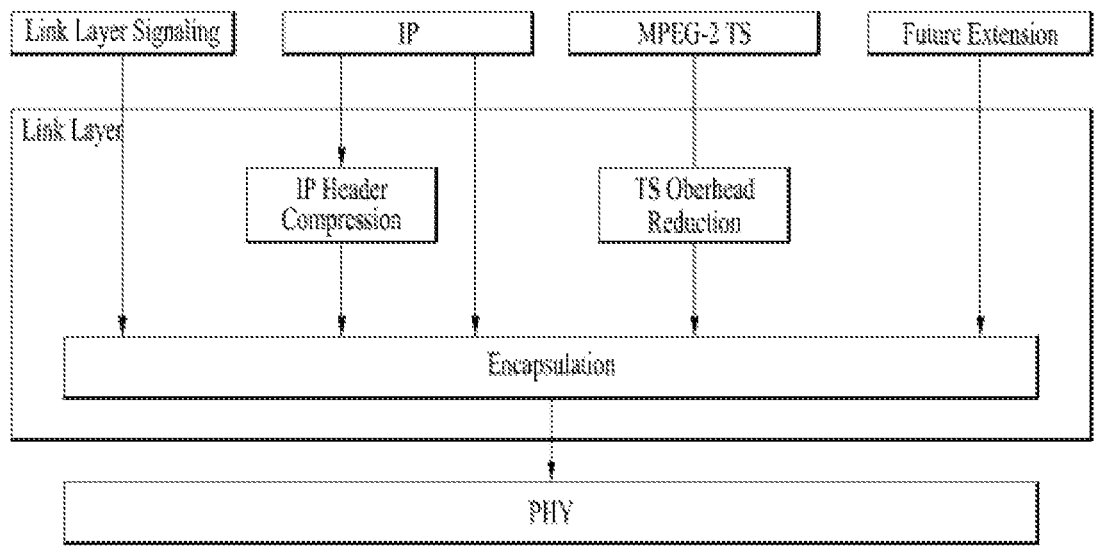
[Figure 9]
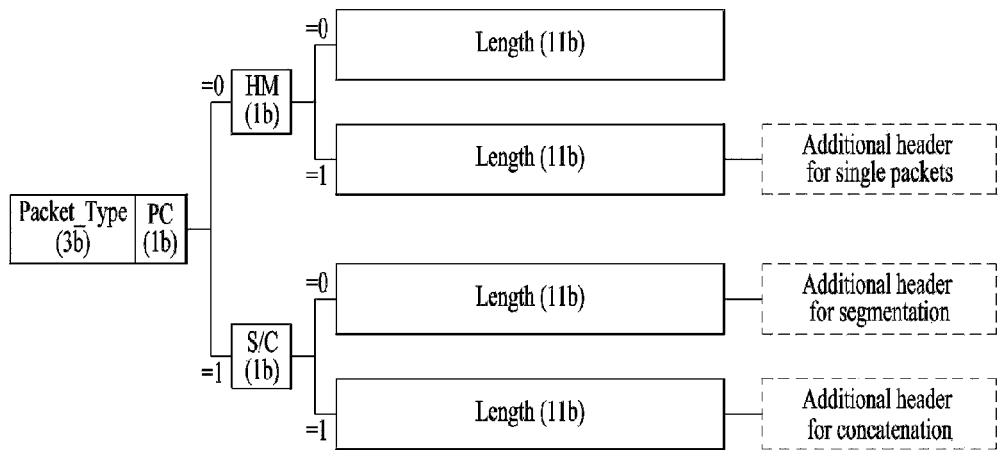

[Figure 10]
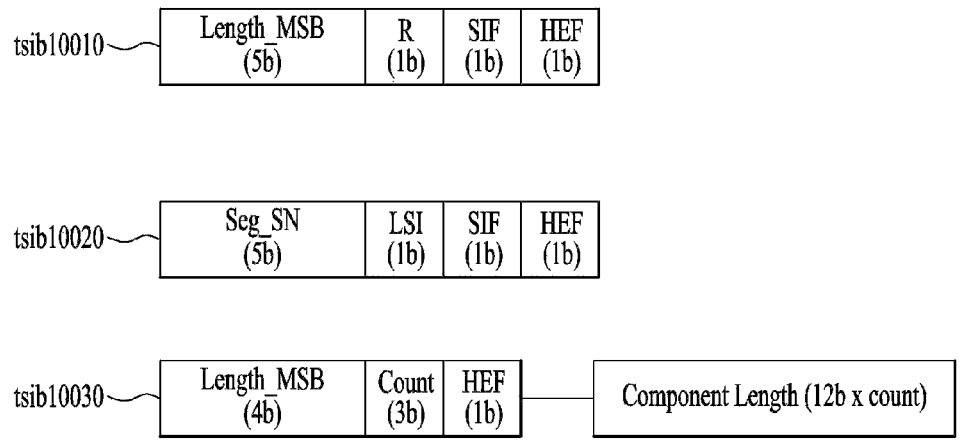

FIG. 13
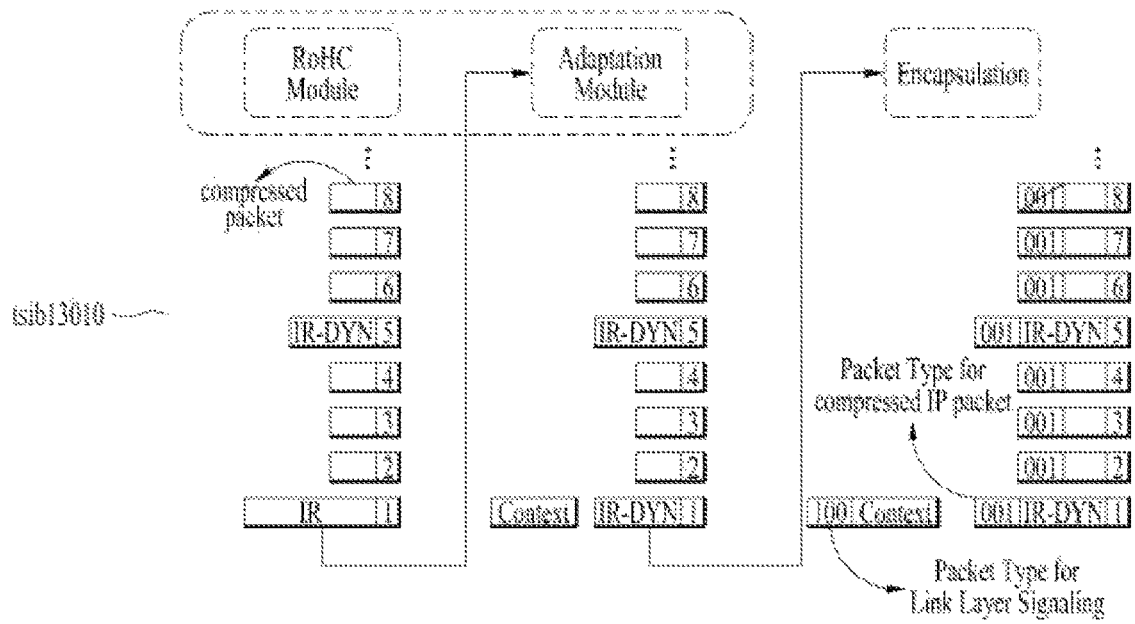
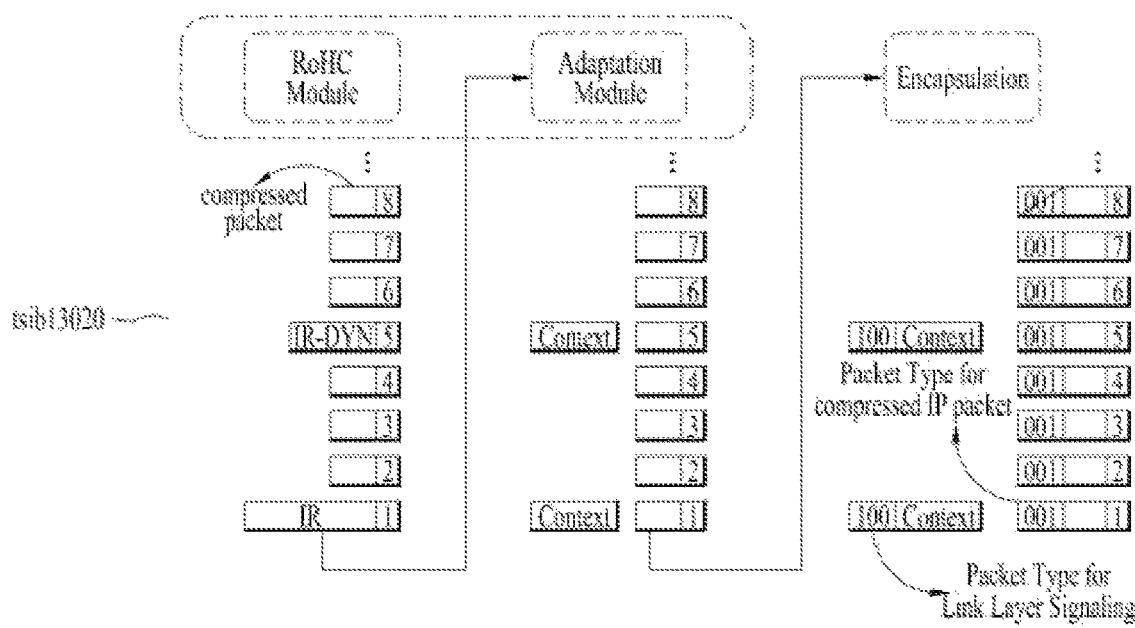

FIG. 14

| Syntax | Number of bits | Mnemonic |
|---|---|---|
| Link_Mapping_Table() { | | |
|   signaling_type | 8 | "0x01" |
|   PLP_ID | 6 | uimsbf |
|   Reserved | 2 | uimsbf |
|   num_session | 8 | uimsbf |
|   for(j=0; j < num_session; j++) { | | |
|     src_IP_add | 32 | uimsbf |
|     dst_IP_add | 32 | uimsbf |
|     src_UDP_port | 16 | uimsbf |
|     dst_UDP_port | 16 | uimsbf |
|     SID_flag | 1 | bslbf |
|     compressed_flag | 1 | bslbf |
|     reserved | 6 | '000000' |
|     if(SID_flag == '1') { | | |
|       SID | 8 | uimsbf |
|     } | | |
|     if(compressed_flag == '1') { | | |
|       context_id | 8 | uimsbf |
|     } | | |
|   } | | |
| } | | |

| Syntax | Number of bits | Mnemonic |
|---|---|---|
| ROHC-U_description_table{ | | |
|   signaling_type | 8 | "0x02" |
|   PLP_ID | 6 | uimsbf |
|   adaptation_mode | 2 | uimsbf |
|   context_config | 2 | uimsbf |
|   reserved | 6 | uimsbf |
|   context_id | 8 | uimsbf |
|   context_profile | 8 | uimsbf |
|   if(context_config==0x01) { | | |
|     context_length | 8 | uimsbf |
|     static_chain_byte () | var | var |
|   } | | |
|   else if(context_config==0x02) { | | |
|     context_length | 8 | uimsbf |
|     dynamic_chain_byte () | var | var |
|   } | | |
|   else if(context_config==0x03) { | | |
|     context_length | 8 | uimsbf |
|     static_chain_byte () | var | var |
|     dynamic_chain_byte () | var | var |
|   } | | |
| } | | | table14010 → first table
table14020 → second table

[Figure 15]
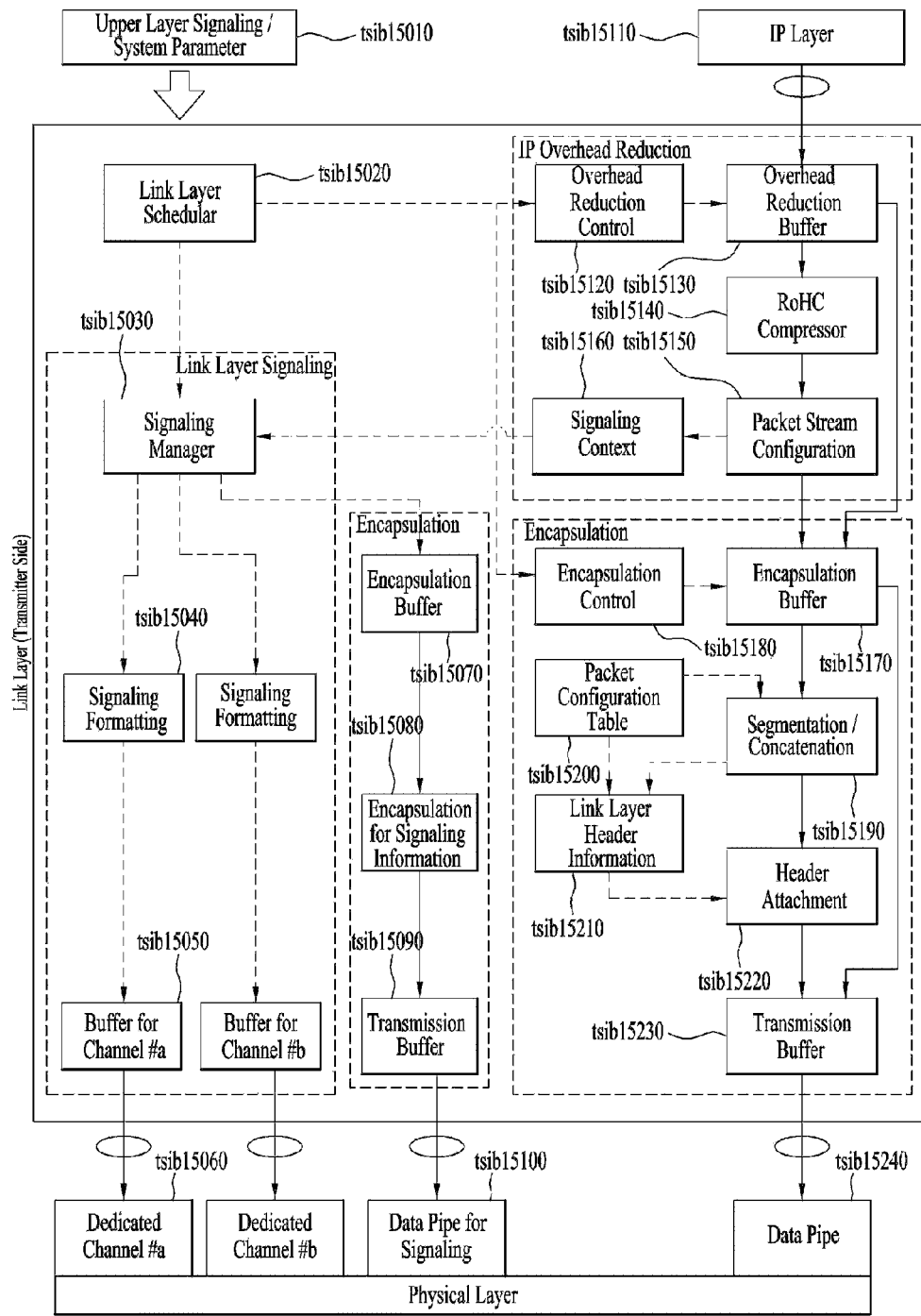

[Figure 16]
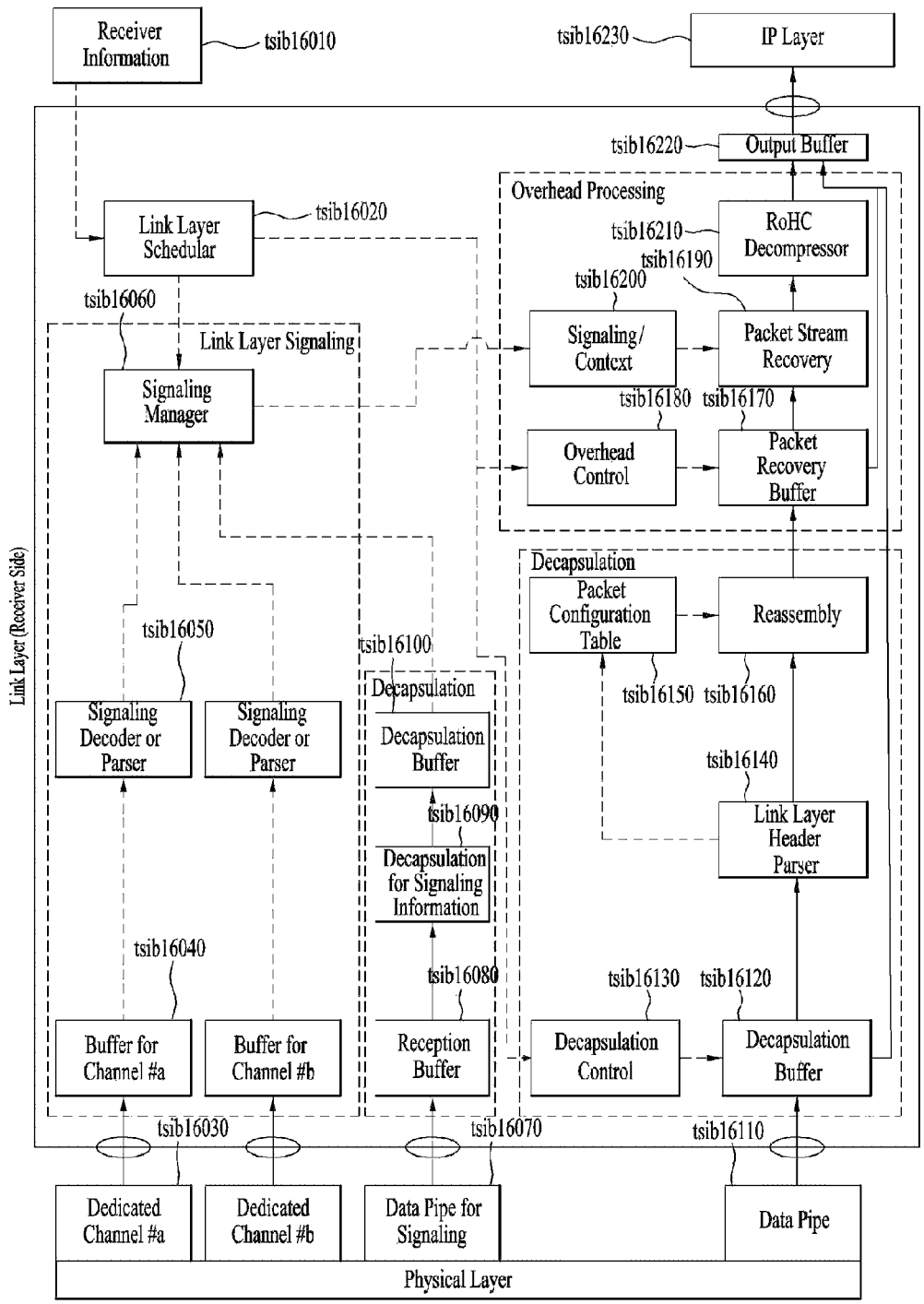

[Figure 17]
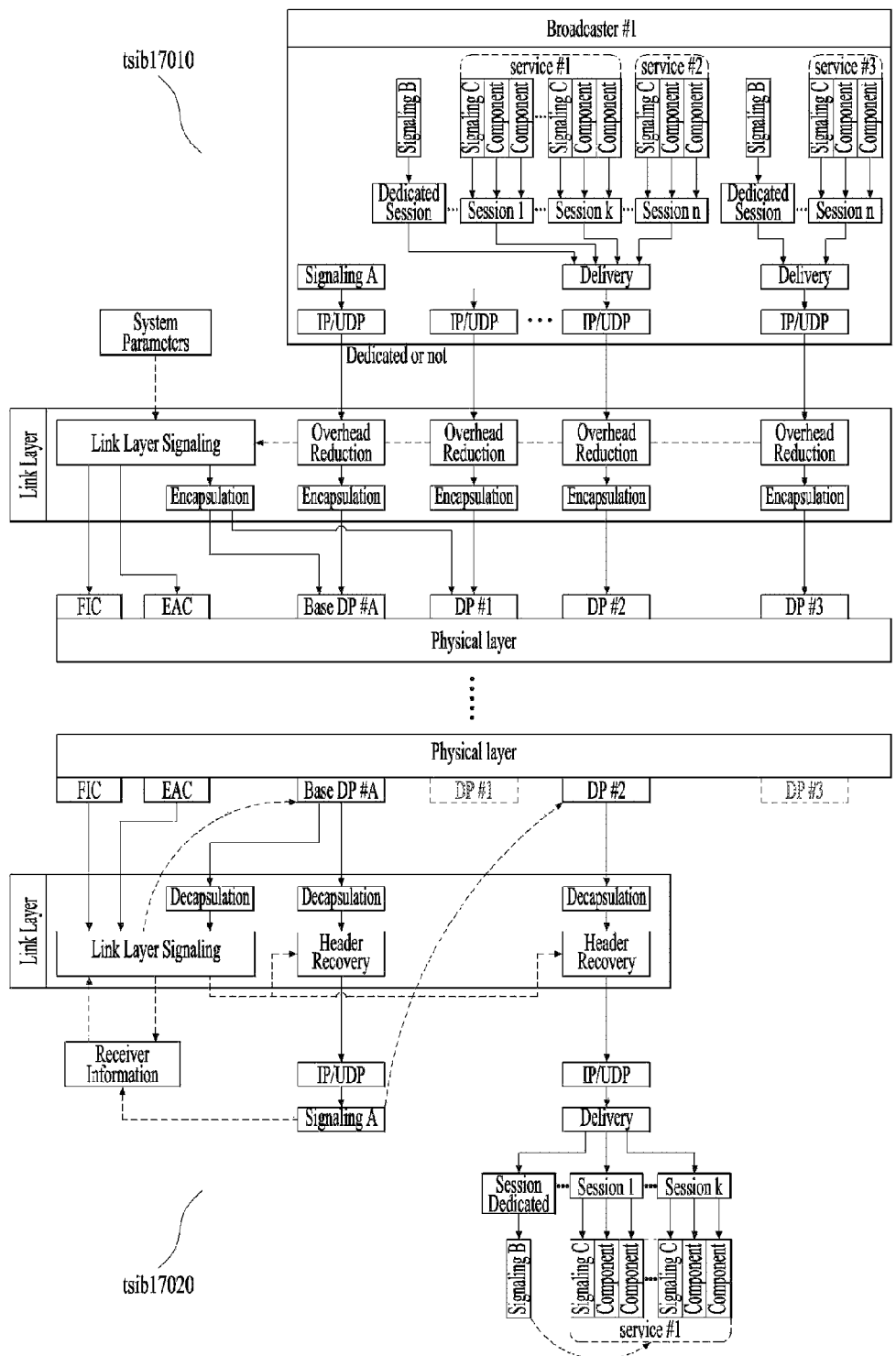

(a)
$S_{demux\_in}(i) = \{b_i(0), b_i(1), b_i(2), ..., b_i(\eta_{MOD}-1)\}$,
$S_{demux\_out}(i) = \{c_i(0), c_i(1), c_i(2), ..., c_i(\eta_{MOD}-1)\}$,
$c_i(1) = b_i(i\%\eta_{MOD}), c_i(2) = b_i((i+1)\%\eta_{MOD}), ..., c_i(\eta_{MOD}-1) = b_i((i+1)\%\eta_{MOD})$ (b)
a) Bit-Interleaving Output
b) Bit-Demultiplexer Output

[Figure 23]
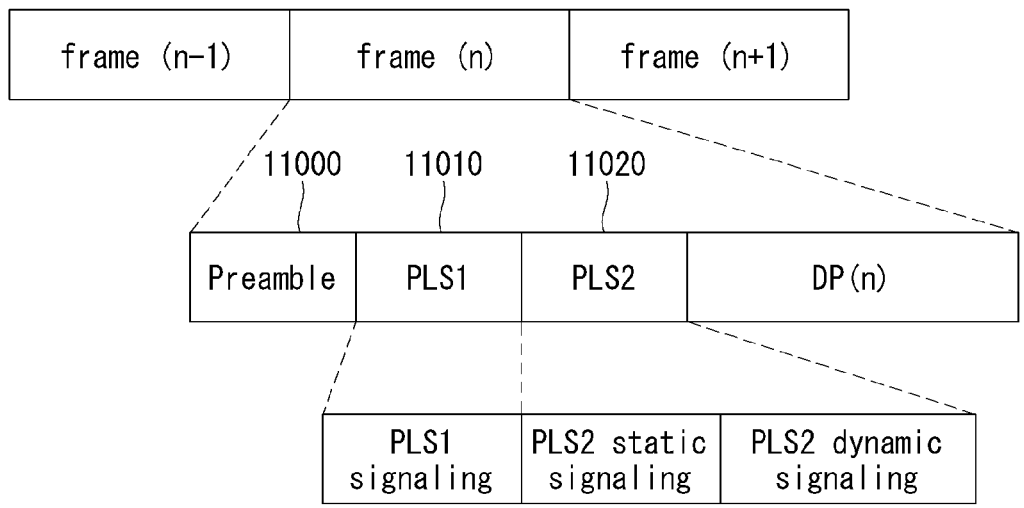

[Figure 24]

| Content | Bits |
|---|---|
| PREAMBLE_DATA | 20 |
| NUM_FRAME_FRU | 2 |
| PAYLOAD_TYPE | 3 |
| NUM_FSS | 2 |
| SYSTEM_VERSION | 8 |
| CELL_ID | 16 |
| NETWORK_ID | 16 |
| SYSTEM_ID | 16 |
| for i = 0:3<br>    FRU_PHY_PROFILE<br>    FRU_FRAME_LENGTH<br>    FRU_GI_FRACTION<br>    RESERVED<br>end | <br>3<br>2<br>3<br>4 |
| PLS2_FEC_TYPE | 2 |
| PLS2_MOD | 3 |
| PLS2_SIZE_CELL | 15 |
| PLS2_STAT_SIZE_BIT | 14 |
| PLS2_DYN_SIZE_BIT | 14 |
| PLS2_REP_FLAG | 1 |
| PLS2_REP_SIZE_CELL | 15 |
| PLS2_NEXT_FEC_TYPE | 2 |
| PLS2_NEXT_MODE | 3 |
| PLS2_NEXT_REP_FLAG | 1 |
| PLS2_NEXT_REP_SIZE_CELL | 15 |
| PLS2_NEXT_REP_STAT_SIZE_BIT | 14 |
| PLS2_NEXT_REP_DYN_SIZE_BIT | 14 |
| PLS2_AP_MODE | 2 |
| PLS2_AP_SIZE_CELL | 15 |
| PLS2_NEXT_AP_MODE | 2 |
| PLS2_NEXT_AP_SIZE_CELL | 15 |
| RESERVED | 32 |
| CRC 32 | 32 |

[Figure 25]

| Content | Bits |
|---|---|
| FIC_FLAG | 1 |
| AUX_FLAG | 1 |
| NUM_DP | 6 |
| for i = 1: NUM_DP | |
|     DP_ID | 6 |
|     DP_TYPE | 3 |
|     DP_GROUP_ID | 8 |
|     BASE_DP_ID | 6 |
|     DP_FEC_TYPE | 2 |
|     DP_COD | 4 |
|     DP_MOD | 4 |
|     DP_SSD_FLAG | 1 |
|     if PHY_PROFILE = '010' | |
|         DP_MIMO | 3 |
|     end | |
|     DP_TI_TYPE | 1 |
|     DP_TI_LENGTH | 2 |
|     DP_TI_BYPASS | 1 |
|     DP_FRAME_INTERVAL | 2 |
|     DP_FIRST_FRAME_IDX | 5 |
|     DP_NUM_BLOCK_MAX | 10 |
|     DP_PAYLOAD_TYPE | 2 |
|     DP_INBAND_MODE | 2 |
|     DP_PROTOCOL_TYPE | 2 |
|     DP_CRC_MODE | 2 |
|     if DP_PAYLOAD_TYPE == TS('00') | |
|         DNP_MODE | 2 |
|         ISSY_MODE | 2 |
|         HC_MODE_TS | 2 |
|         if HC_MODE_TS == '01' or '10' | |
|             PID | 13 |
|         end | |
|     if DP_PAYLOAD_TYPE == IP('01') | |
|         HC_MODE_IP | 2 |
|     end | |
|     RESERVED | 8 |
| end | |
| if FIC_FLAG == 1 | |
|     FIC_VERSION | 8 |
|     FIC_LENGTH_BYTE | 13 |
|     RESERVED | 8 |
| end | |
| if AUX_FLAG == 1 | |
|     NUM_AUX | 4 |
|     AUX_CONFIG_RFU | 8 |
|     for -1: NUM_AUX | |
|         AUX_STREAM_TYPE | 4 |
|         AUX_PRIVATE_CONF | 28 |
|     end | |
| end | |

[Figure 26]

| Content | | Bit |
|---|---|---|
| FRAME_INDEX | | 5 |
| PLS_CHANGE_COUNTER | | 4 |
| FIC_CHANGE_COUNTER | | 4 |
| RESERVED | | 16 |
| for i = 1: NUM_DP | | |
| | DP_ID | 6 |
| | DP_START | 15 (or13) |
| | DP_NUM_BLOCK | 10 |
| end | RESERVED | 8 |
| EAC_FLAG | | 1 |
| EAS_WAKE_UP_VERSION_NUM | | 8 |
| if EAC_FLAG == 1 | | |
| | EAC_LENGTH_BYTE | 12 |
| else | | |
| | EAC_COUNTER | 12 |
| end | | |
| for i=1:NUM_AUX | | |
| | AUX_PRIVATE_DYN | 48 |
| end | | |
| CRC 32 | | 32 |

[Figure 27]

| Preamble | PLS1 | PLS2 | EAC | FIC | DPs | Auxiliary streams | Dummy |
|---|---|---|---|---|---|---|---|

[Figure 28]
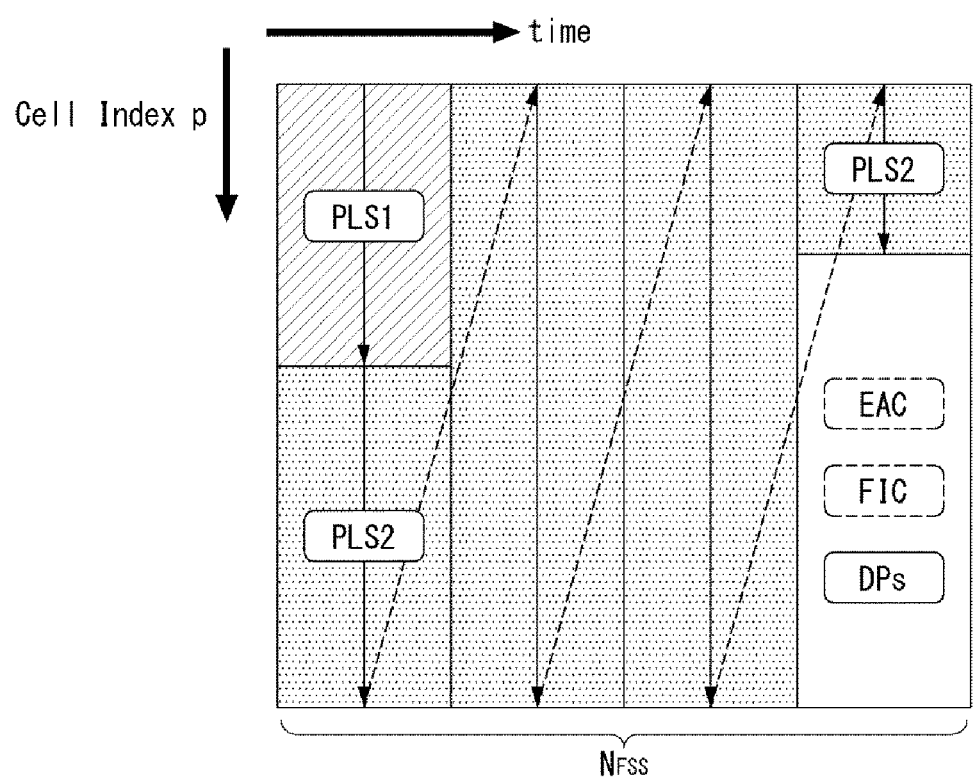

[Figure 29]
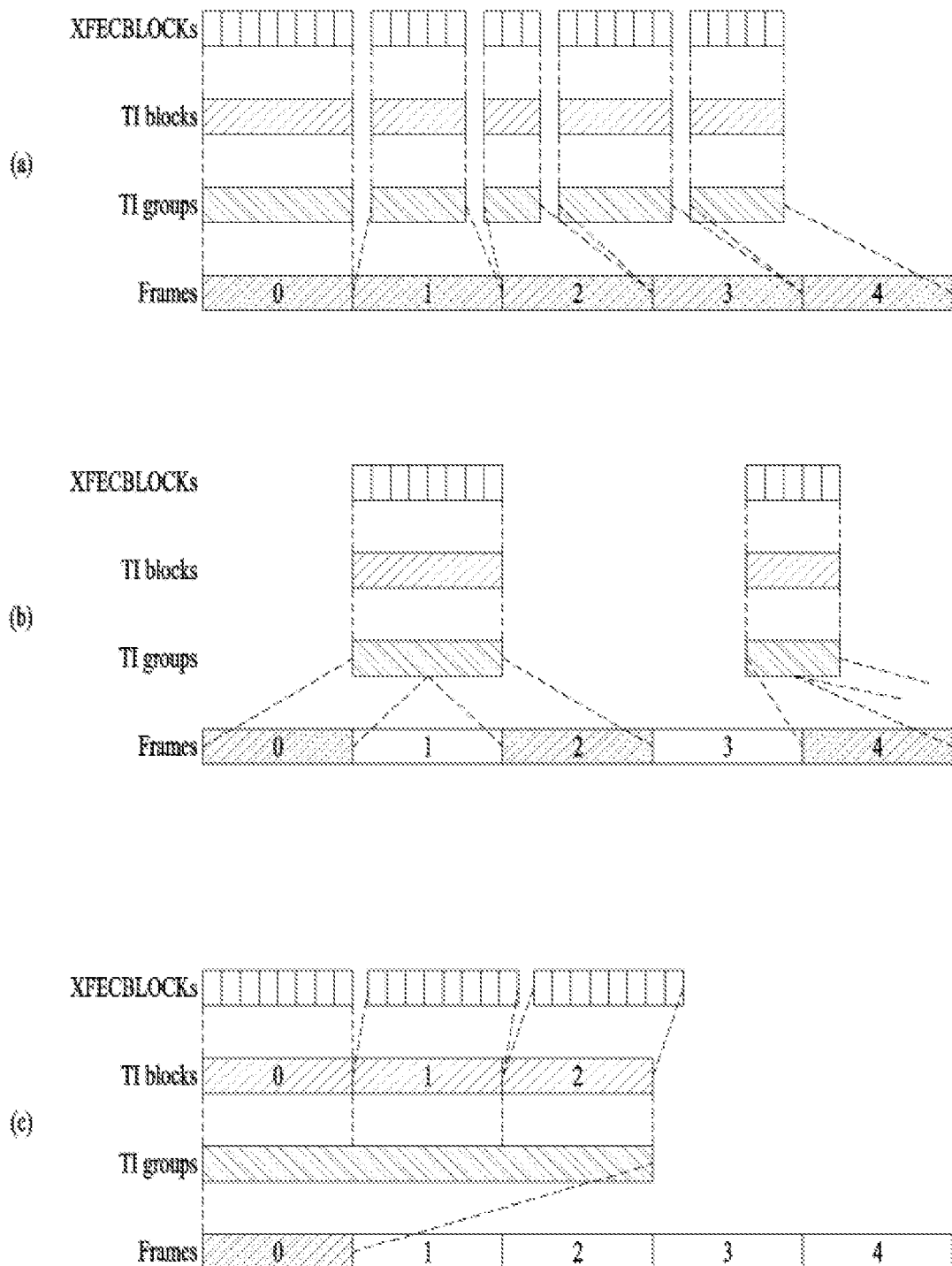

[Figure 30]
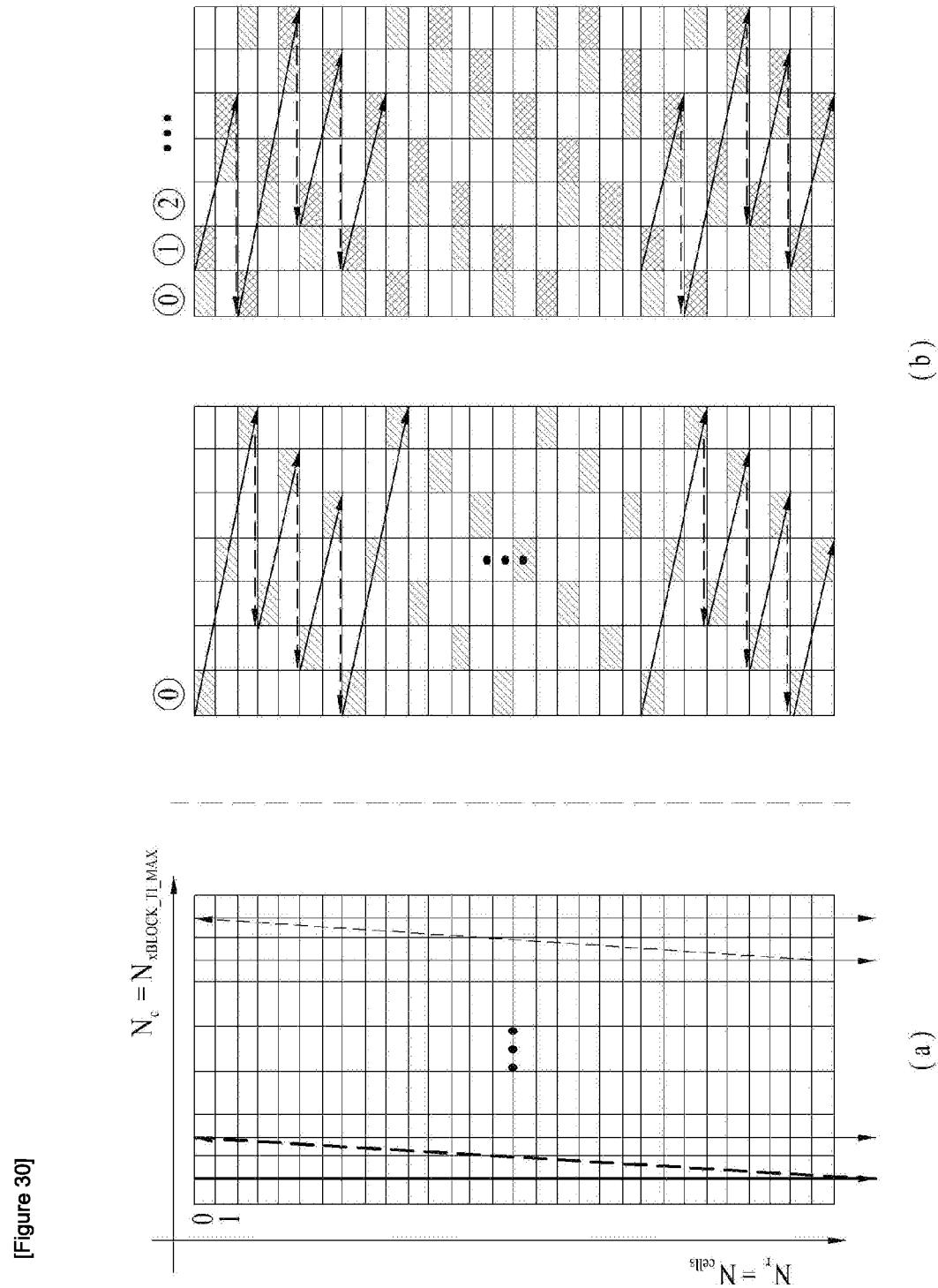

FIG. 33

The main-PRBS generator is defined based on the $(N'_a-1)$-bit binary word sequence $R_n$ with $N'_a = \log_2 N_{max}$ $0 \le n < 2$
  $R_n[N'_a-2, N'_a-3, \ldots, 1, 0] = 0, 0, \ldots, 0, 0$
$n = 2$
  $R_n[N'_a-2, N'_a-3, \ldots, 1, 0] = 0, 0, \ldots, 0, 1$
$2 < n < N_{max}$
  $R_n[N'_a-3, N'_a-4, \ldots, 1, 0] = R_{n-1}[N'_a-2, N'_a-3, \ldots, 2, 1]$
where
$R_n[N'_a-2]$ is defined as:

in 8K FFT mode: $R_n[11] = R_{n-1}[0] \oplus R_{n-1}[1] \oplus R_{n-1}[4] \oplus R_{n-1}[6]$
in 16K FFT mode: $R_n[12] = R_{n-1}[0] \oplus R_{n-1}[1] \oplus R_{n-1}[4] \oplus R_{n-1}[5] \oplus R_{n-1}[9] \oplus R_{n-1}$
in 32K FFT mode: $R_n[13] = R_{n-1}[0] \oplus R_{n-1}[1] \oplus R_{n-1}[2] \oplus R_{n-1}[12]$ (a)

| FFT mode | Nmax |
|---|---|
| 8K | 8192 |
| 16K | 16384 |
| 32K | 32768 |

The sub-PRBS generator is defined based on the $(N_s-1)$-bit binary word sequence $G_k$ with $N_s = \log_2(0.5 N_{max})$ $0 \leq k < 4$
$\quad G_k[N_s-2, N_s-3, \ldots, 1, 0] = 0, 0, \ldots, 0, 0$ $k = 4$
$\quad G_k[N_s-2, N_s-3, \ldots, 1, 0] = 1, 1, \ldots, 1, 1$ $4 < k < N_{max}$
$\quad G_k[N_s-3, N_s-4, \ldots, 1, 0] = G_{k-1}[N_s-2, N_s-3, \ldots, 2, 1]$ where
$\quad G_k[N_s-2]$ is defined as in 8K FFT mode: $G_k[10] = G_{k-1}[0] \oplus G_{k-1}[2]$
in 16K FFT mode: $G_k[11] = G_{k-1}[0] \oplus G_{k-1}[1] \oplus G_{k-1}[4] \oplus G_{k-1}[6]$
in 32K FFT mode: $G_k[12] = G_{k-1}[0] \oplus G_{k-1}[1] \oplus G_{k-1}[4] \oplus G_{k-1}[5] \oplus G_{k-1}[9] \oplus G_{k-1}[11]$ (a)

$p = 0;$
for $(n = 0; n < N_{max}; n = n+1)$
$\quad \{ T(n) = (n \bmod 2) \cdot 2^{N_s-1} + \sum_{i=0}^{N_s-2} (2^i \cdot R_n[i]);$
$\quad S_l(n) = (T(n) + A_{\lfloor l/2 \rfloor}) \bmod N_{max};$
$\quad \text{if } S_l(n) < N_{data}$
$\quad\quad \{ H_l(p) = S_l(n);$
$\quad\quad\ p = p+1; \}$
$\quad \}$ $(n \bmod 2) \cdot 2^{N_s-1}$ denotes 1-bit toggling, i.e., $R_n[N_s-1] = 0, 1, 0, 1, \ldots$ and
the cyclic-shifting value $A_{\lfloor l/2 \rfloor}$ is calculated for every OFDM symbol pair (b)

FIG. 35

| PLP_NUM | 1 | >1 |
|---|---|---|
| interleaving type | CI | CI+BI |

| Syntax | No. of Bits | Format |
|---|---|---|
| fast_information_table() { | | |
|   FIT_protocol_version | 8 | uimsbf |
|   broadcast_stream_id | 16 | uimsbf |
|   FIT_section_number | 4 | |
|   totalFIT_section_number | 4 | |
|   FIT_section_version | 4 | |
|   FIT_section_length | 12 | |
|   num_services | 8 | uimsbf |
|   for (i=0; i<num_services;i++) { | | |
|     service_id | 16 | uimsbf |
|     SLS_data_version | 8 | uimsbf |
|     service_category | 5 | uimsbf |
|     short_service_name_length | 3 | uimsbf |
|     for (j=0; j<short_name_length; j++) { | | |
|       short_service_name_byte_pair() | 16*m | bslbf |
|     } | | |
|     provider_id | 8 | uimsbf |
|     service_status | 3 | uimsbf |
|     sp_indicator | 1 | bslbf |
|     num_service_level_descriptors | 4 | uimsbf |
|     for (j=0;j<num_service_level_descriptors;j++) { | | |
|       service_level_descriptor() | var | |
|     } | | |
|   } | | |
|   reserved | 4 | '1111' |
|   num_FIT_level_descriptors | 4 | uimsbf |
|   for (n=0; n<num_FIT_level_descriptors; n++) { | | |
|     FIT_level_descriptor() | var | |
|   } | | |
| } | | |

[Figure 45]

| Descriptor Name | Descriptor Tag | ATSC3.0 Broadcast | |
| --- | --- | --- | --- |
| | | Service level | FIT level |
| broadcast_signaling_location_descriptor() | TBD | M | |
| inet_signaling_location_descriptor() | TBD | O | O |
| capability_descriptor() | TBD | O | |

List and Location of ATSC3.0 Fast Information Table Descriptors

[Figure 46]

| Syntax | No. of Bits | Format |
| --- | --- | --- |
| broadcast_signaling_location_descriptor() { | | |
|     descriptor_tag | 8 | TBD |
|     descriptor_length | 8 | |
|     reserved | 6 | '111111' |
|     IP_version_flag | 1 | bslbf |
|     SLS_source_IP_address_flag | 1 | bslbf |
|     if (SLS_source_IP_address_flag) { | | |
|         SLS_source_IP_address | 32 or 128 | uimsbf |
|     } | | |
|     SLS_destination_IP_address | 32 or 128 | uimsbf |
|     SLS_destination_UDP_port | 16 | uimsbf |
|     SLS_TSI | 16 | uimsbf |
|     SLS_PLP_ID | 8 | uimsbf |
| } | | |

Bit Stream Syntax for broadcast_signaling_location_descriptor()

[Figure 47]

| Syntax | No. of Bits | Format |
|---|---|---|
| inet_signaling_location_descriptor() { | | |
|     descriptor_tag | 8 | TBD |
|     descriptor_length | 8 | |
|     provider_id | 8 | uimsbf |
|     URL_type | 8 | uimsbf |
|     URL_bytes() | descriptor_length-2 | |
| { | | |

[Figure 48]

| Resource(s) Requested | Query Term(s) |
|---|---|
| SLS Set | ? SLS = ALL [ &svc=<service_id>] |
| SLS Diff Set | ? SLS = Diff ALL [ &svc=<service_id>] |
| SLS Template | ?SLS=Template[&svc=<service_id>] |
| USD | ? SLS = USD [ &svc=<service_id>] |
| S-TSID | ? SLS =S-TSID[&svc=<service_id>] |
| ESG | ? ESG [ &prv =< prv >] |

[Figure 49]

| Table(s) Requested | Query Term(s) |
|---|---|
| SLS Set | ? SLS = ALL |
| SLS Diff Set | ?SLS=DiffALL |
| SLS Template | ?SLS=Template |
| USD | ? SLS = USD |
| S-TSID | ? SLS =S-TSID |
| MPD | ? SLS = MPD |

[Figure 50]

| Element or Attribute Name | | | | Use |
|---|---|---|---|---|
| fit | | | | |
| | @bsid | | | M |
| | @fitSectionNumber | | | M |
| | @totalFitSectionNumber | | | M |
| | @fitSectionVersion | | | M |
| | Service | | | 1…N |
| | | @serviceId | | M |
| | | @providerId | | O |
| | | @serviceCategory | | O |
| | | @spIndicator | | O |
| | | @serviceStatus | | O |
| | | @shortServiceName | | O |
| | | @SLSVersion | | M |
| | | capabilityCode | | 0…1 |
| | | inetSignalingLocation | | 0…1 |
| | | | @urlType | M |
| | | | @url | M |
| | | broadcastSignalingLocation | | 1 |
| | | | @IPVersion | OD |
| | | | @sourceIPAddress | O |
| | | | @destinationIPAddress | M |
| | | | @destinationUdpPort | M |
| | | | @TSI | O |
| | | | @PLPID | O |
| | inetSignalingLocation | | | 0…1 |
| | | @providerId | | O |
| | | @urlType | | M |
| | | @url | | M |
| Legend: For attributes: M=Mandatory, O=Optional, OD=Optional with Default Value, CM=Conditionally Mandatory. For elements: <minOccurs>…<maxOccurs> (N=unbounded) Elements are bold; attributes are non-bold and preceded with an @. | | | | |

[Figure 51]
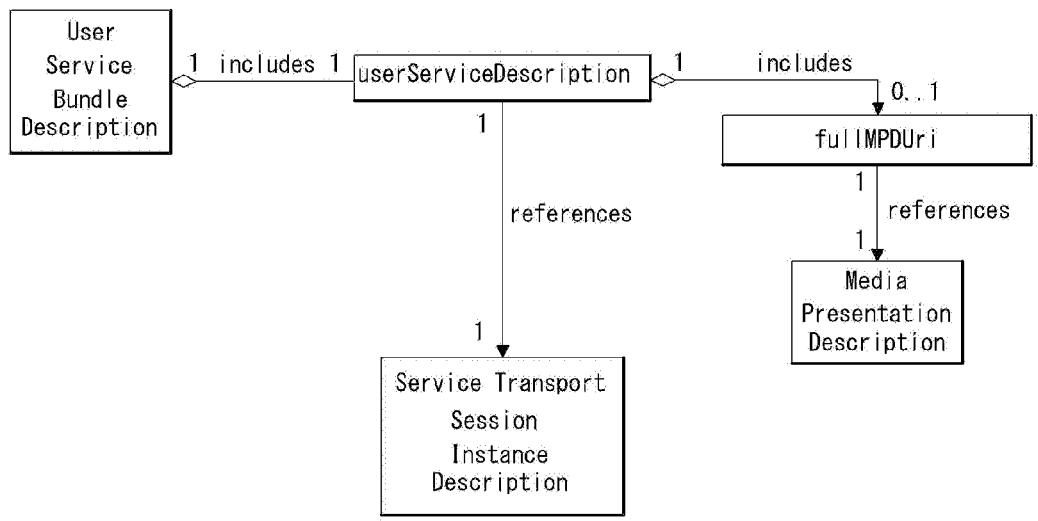

[Figure 52]

| Element or Attribute Name | | | | Use |
|---|---|---|---|---|
| bundleDescription | | | | |
| | userServiceDescription | | | |
| | | @serviceId | | M |
| | | @atsc:serviceId | | M |
| | | @atsc:fullMPDUri | | M |
| | | @atsc:sTSIDUri | | M |
| | | name | | 0...N |
| | | | lang | CM |
| | | serviceLanguage | | 0...N |
| | | atsc:capabilityCode | | 0...1 |
| | | deliveryMethod | | 1...N |
| | | | atsc:broadcastAppService | 1...N |
| | | | basePattern | 1...N |
| | | | atsc:unicastAppService | 0...N |
| | | | basePattern | 1...N |
| Legend: | | | | |
| For attributes: M=Mandatory, O=Optional, OD=Optional with Default Value, CM=Conditionally Mandatory. | | | | |
| For elements: <minOccurs>...<maxOccurs> (N=unbounded) | | | | |
| Note that the conditions only holds without using xlink:href. If linking is used, then all attributes are "optional" and <minOccurs=0> | | | | |
| Elements are bold; attributes are non-bold and preceded with an @. | | | | |

[Figure 53]

| Element/@Attribute | | | Use |
|---|---|---|---|
| S - TSID | | | |
| | @serviceId | | O |
| | RS | | 0..N |
| | | @bsid | OD |
| | | @sIpAddr | OD |
| | | @dIpAddr | OD |
| | | @dport | OD |
| | | @PLPID | OD |
| | | LS | 1..N |
| | | | @tsi | M |
| | | | @PLPID | OD |
| | | | @bw | O |
| | | | @startTime | O |
| | | | @endTime | O |
| | | | SrcFlow | 0..1 |
| | | | RprFlow | 0..1 |
| | MS | | 0..1 |
| | | @versionNumber | OD |
| | | @bsid | OD |
| | | @ sIpAddr | O |
| | | @dIpAddr | M |
| | | @dport | M |
| | | @packetId | OD |
| | | @PLPID | OD |
| | | @bw | O |
| | | @startTime | O |
| | | @endTime | O |
| Legend: | | | |
| For attributes: M=Mandatory, O=Optional, OD=Optional with Default Value, CM=Conditionally Mandatory. For elements: <minOccurs>...<maxOccurs> (N=unbounded) Note that the conditions only holds without using xlink:href. If linking is used, then all attributes are "optional" and <minOccurs=0> Elements are bold; attributes are non-bold and preceded with an @. | | | |

FIG. 63

```
metadataEnvelope.
<metadataEnvelope xmlns="urn:3gpp:metadata:2005:MBMS:envelope">
 <item metadataURI="SignalingInstanceID"
  version=" SignalingInstanceVersion"   - optional
  <metadataFragment>
   <![CDATA[<diffUpdate>
    <templateID>SignalingTemplateID</templateID>
    <templateVersion>SignalingTemplateVersion</templateVersion> - optional
    <update>Diff</update>
   </diffUpdate>]]>
  </metadataFragment>
 </item>
```

【Figure 64】
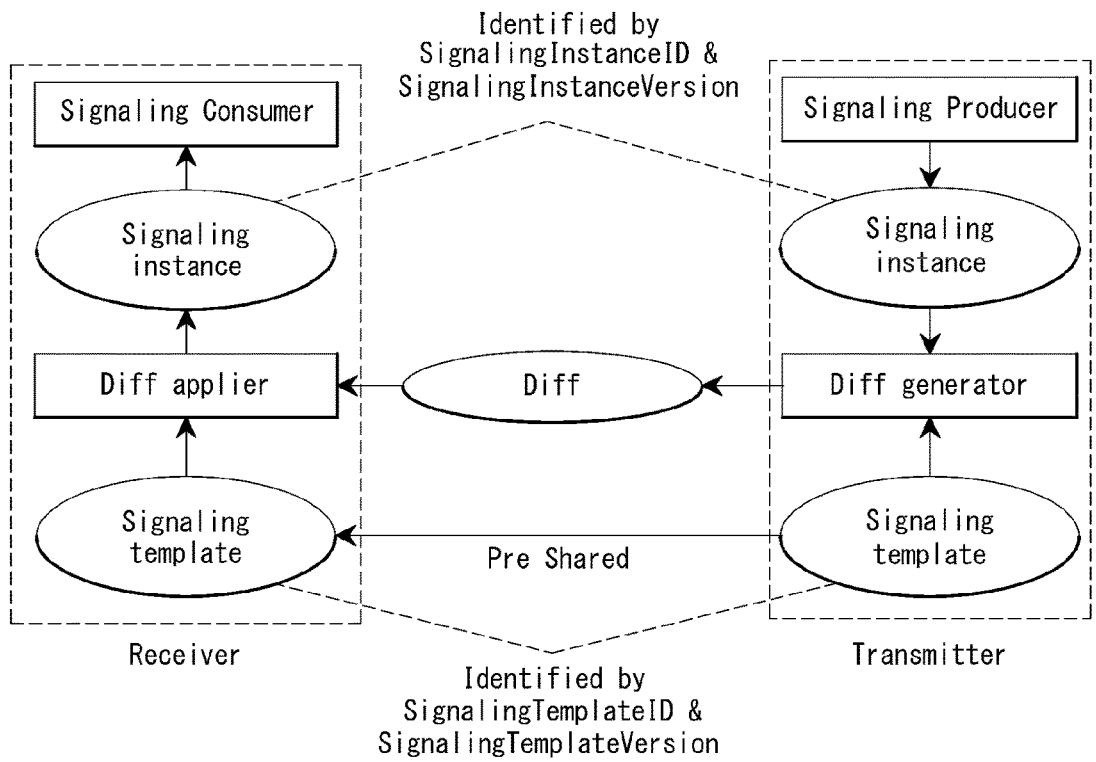
【Figure 65】
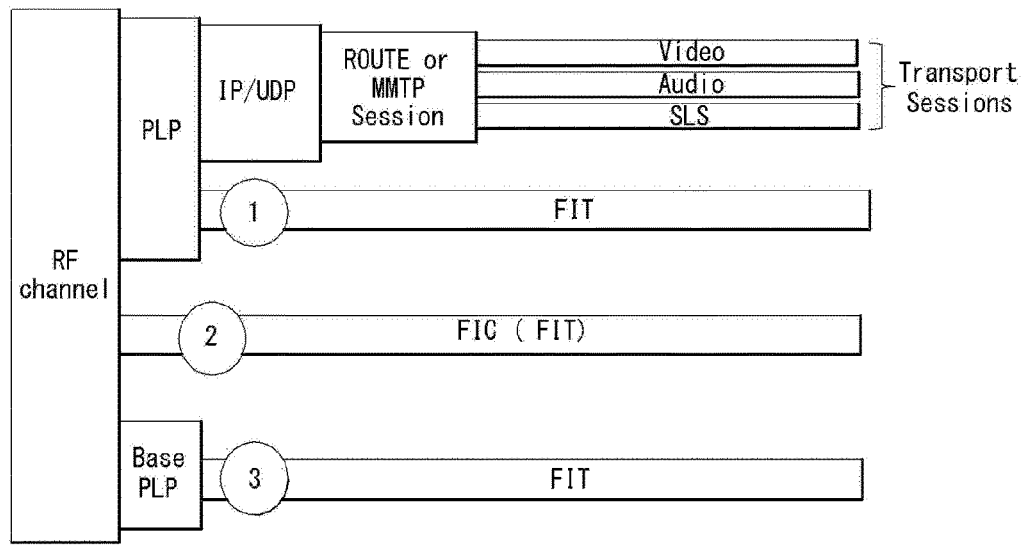

| Syntax | Num of bits |
|---|---|
| FIT{ | |
|     FIT_protocol_version | 8 |
|     Broadcast_stream_id | 16 |
|     FIT_data_version | 8 |
|     FIT_length | 13 |
|     reserved | 1 |
|     num_providers | 2 |
|     for (j=0; j<num_providers; j++) { | |
|       esg_service_id | 16 |
|       signaling_on_inet_flag | 1 |
|       provider_id | 7 |
|       if(signaling_on_inet_flag == '1') { | |
|         inet_server_URL_length | 8 |
|         for (k=0; k<inet_server_URL_length; k++) | |
|           inet_server_URL[k] | 8 |
|       } | |
|     } | |
|     num_services | 8 |
|     for(i=0; i<num_services; i++) { | |
|       service_id | 16 |
|       SLS_data_version | 8 |
|       service_category | 5 |
|       short_service_name_length | 3 |
|       for(j=0;j<short_service_name_length;j++){ | |
|         short_service_name | 16*m |
|       } | |
|       sp_indicator | 1 |
|       service_status | 3 |
|       SLS_simpleservice | 1 |
|       capability_flag | 1 |
|       signaling_broadcast_flag | 1 |
|       reserved | 1 |
|       if(capability_flag == 'true'){ | |
|         capability_code | 8 |
|       } | |
|       if(signaling_broadcast_flag == 'true'){ | |
|         signaling_broadcast_info() | var |
|       } | |
|       reserved | 4 |
|       num_service_level_descriptor | 4 |
|       for(j=0; j<num_service_level_descriptor; j++) { | |
|         service_level_descriptor() | |
|       } | |
|     } | |
|     reserved | 4 |
|     num_FIT_level_descriptor | 4 |
|     for(i=0; i<num_FIT_level_descriptor; i++) { | |
|       FIT_level_descriptor() | |
|     } | |
|     CRC() | |
| } | |

【Figure 73】

| Syntax | Description |
|---|---|
| FIT_protocol_version | Protocol version |
| Broadcast_stream_id | Broadcast Stream ID |
| FIT_data_version | The version of FIT data mapping to the FIT_version of PLS |
| FIT_length | The total length of FIT behind this field. |
| num_providers | The number of providers |
| esg_service_id | ESG Service ID of delivering ESG of the provider |
| signaling_on_inet_flag | Indicates if there is broadband signaling is delivered |
| provider_id | Provider identifier |
| inet_server_URL_length | Length of inet_server_URL |
| inet_server_URL[k] | Inet_server_URL |
| num_services | Number of services |
| service_id | service_id |
| SLS_data_version | Signaling data version |
| service_category | Service category(liner TV, NRT, ESG, audio, etc.) |
| short_service_name_length | Length of service name |
| short_service_name | Service name |
| sp_indicator | Service protection indicator |
| service_status | Service status |
| SLS_simpleservice | Broadcast simple service or not |
| capability_flag | Indicate if there is capability code of this service |
| signaling_broadcast_flag | Indicate if there is broadcast signaling information is delivered |
| capability_code | Capability code of this service |
| signaling_broadcast_info( ) | SLS_bootstrapping information (source IP address/destination IP address/ destination Port / SLS_PLP_ID / SLS_TSI) |
| num_service_level_descriptor | number of service level descriptor |
| service_level_descriptor( ) | Service level descriptor |
| num_FIT_level_descriptor | number of FIT level descriptor |
| FIT_level_descriptor( ) | FIT level descriptor |
| CRC( ) | |

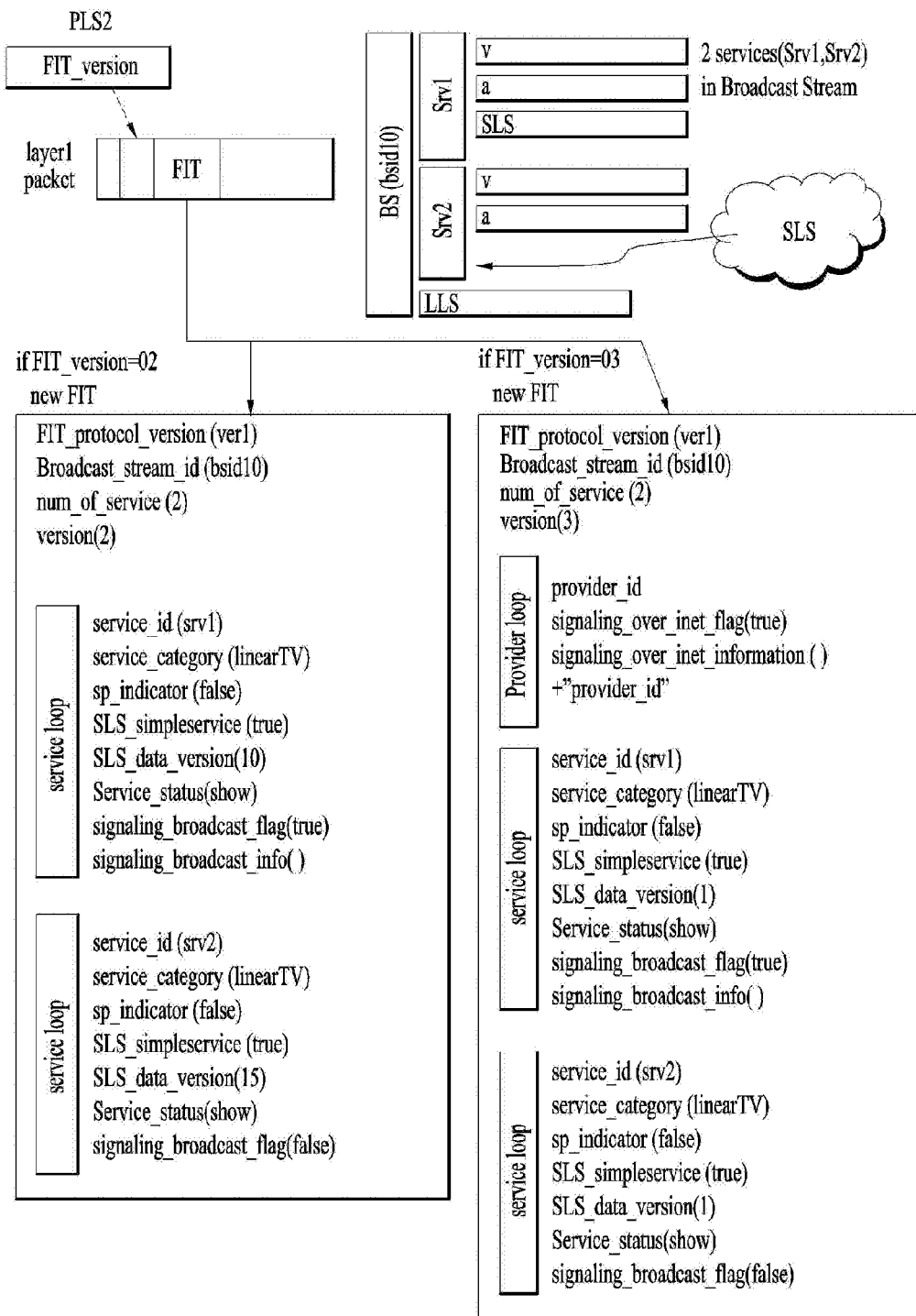
[Figure 74]

[Figure 75]

| Syntax | Num of bits |
|---|---|
| FIT{ | |
|     FIT_protocol_version | 8 |
|     Broadcast_stream_id | 16 |
|     FIT_data_version | 8 |
|     FIT_length | 13 |
|     reserved | 1 |
|     num_providers | 2 |
|     for (j=0; j<num_providers; j++) { | |
|       num_services | 8 |
|       for(i=0; i<num_services; i++) { | |
|         service_id | 16 |
|         SLS_data_version | 8 |
|         service_category | 5 |
|         short_service_name_length | 3 |
|         for(k=0;k<short_service_name_length;k++){ | |
|           short_service_name( ) | 16*m |
|         } | |
|         sp_indicator | 1 |
|         service_status | 3 |
|         SLS_simpleservice | 1 |
|         reserved | 7 |
|         num_service_level_descriptor | 4 |
|         for(k=0; k<num_service_level_descriptor; k++) { | |
|           service_level_descriptor( ) | var |
|         } | |
|       } /*service_loop*/ | |
|       reserved | 4 |
|       num_provider_level_descriptor | 4 |
|       for(k=0; k<num_provider_level_descriptor; k++) { | |
|         provider_level_descriptor( ) | var |
|       } | |
|     } /*provider_loop*/ | |
|     reserved | 4 |
|     num_FIT_level_descriptor | 4 |
|     for(i=0; i<num_FIT_level_descriptor; i++) { | |
|       FIT_level_descriptor( ) | var |
|     } | |
|     CRC( ) | |
| } | |

【Figure 76】

| descriptor( ) | service | provider | FIT |
|---|---|---|---|
| capability_descriptor | 0 | - | - |
| signaling_broadcast_descriptor | 0 | - | - |
| signaling_over_internet_descriptor | - | 0 | - |

【Figure 77】

| Syntax | Num of bits | Mnemonic | Description |
|---|---|---|---|
| signaling_broadcast_descriptor{ | | | |
|   descriptor_tag | 8 | uimsbf | descriptor tag |
|   descriptor_length | 8 | uimsbf | descriptor length |
|   IP_version_flag | 1 | bslbf | IP version flag |
|   SLS_src_IP_addr_flag | 1 | bslbf | source IP address flag (IPv4 for IPv6) |
|   reserved | 6 | bslbf | |
|   if(SLS_src_IP_addr_flag) { | | | |
|     SLS_src_IP_addr | 32 or 128 | uimsbf | source IP address |
|   } | | | |
|   SLS_dst_IP_addr | 32 or 128 | uimsbf | SLS destination IP address |
|   SLS_dst_port_num | 16 | uimsbf | SLS destination port number |
|   SLS_TSI | 16 | uimsbf | SLS TSI |
|   SLS_PLP_id | 8 | uimsbf | SLS PLP ID |
| } | | | |

[Figure 78]

| Syntax | Num of bits | Mnemonic | Description |
|---|---|---|---|
| signaling_on_inet_descriptor{ | | | |
|   descriptor_tag | 8 | uimsbf | descriptor tag |
|   descriptor_length | 8 | uimsbf | descriptor length |
|   num_inet_URL | 8 | uimsbf | number of inet URL |
|   for(i=0;i<num_inet_URL;i++){ | | | |
|     inet_server_URL_type | 8 | uimsbf | Type of inet URL |
|     inet_server_URL_length | 8 | uimsbf | Length of URL |
|     inet_server_URL | var | | URL |
|   } | | | |
| } | | | |

| Value | Description |
|---|---|
| 0 x 00 | Not Specified |
| 0 x 01 | SLS |
| 0 x 02 | ESG |
| 0 x 03 | Template |
| 0 x 04 | All |
| 0 x 05 - 0 x FF | Reserved for the future use |

[Figure 79]

| Syntax | Num of bits | Mnemonic | Description |
|---|---|---|---|
| capability_descriptor{ | | | |
|   descriptor_tag | 8 | uimsbf | descriptor tag |
|   descriptor_length | 8 | uimsbf | descriptor length |
|   num_capability | 8 | uimsbf | number of capabilitiesl |
|   for(i=0;i<num_capability;i++){ | | | |
|     capability_category | 4 | bslbf | Category of capability |
|     capability_code_type | 2 | bslbf | Type of capability_code |
|     reserved | 2 | | |
|     if(capability_type == '01') { | | | |
|       capability_code_int | 8 | uimsbf | Integer type of capability code |
|     } | | | |
|     else if(capability_type == '10') { | | | |
|       capability_code_string_length | 8 | uimsbf | String length of capability code |
|       capability_code_string | var | | String type of capability code |
|     } | | | |
|   } | | | |
| } | | | |

| Value | Description |
|---|---|
| 0 x 00 | Not Specified |
| 0 x 01 | Download protocol |
| 0 x 02 | FEC Algorithms |
| 0 x 03 | Wrapper/Archive Formats |
| 0 x 04 | Compression Algorithms |
| 0 x 05 | Media Types |
| 0 x 06 | Delivery Protocols |
| 0 x 07 - 0 x 0F | Reserved for the future use |

[Figure 80]

| Syntax | Num of bits |
|---|---|
| FIT{ | |
|     FIT_protocol_version | 8 |
|     Broadcast_stream_id | 16 |
|     FIT_data_version | 8 |
|     FIT_length | 13 |
|     reserved | 1 |
|     num_providers | 2 |
|     for (j=0; j<num_providers; j++) { | |
|       num_services | 8 |
|       for(i=0; i<num_services; i++) { | |
|         service_id | 16 |
|         SLS_data_version | 8 |
|         service_category | 5 |
|         short_service_name_length | 3 |
|         for(k=0;k<short_service_name_length;k++){ | |
|           short_service_name( ) | 16*m |
|         } | |
|         sp_indicator | 1 |
|         service_status | 3 |
|         SLS_simpleservice | 1 |
|         signaling_broadcast_flag | 1 |
|         reserved | 1 |
|         if(signaling_broadcast_flag == 'true'){ | |
|           IP_version_flag | 1 |
|           SLS_src_IP_addr_flag | 1 |
|           reserved | 6 |
|           if(SLS_src_IP_addr_flag) { | |
|             SLS_src_IP_addr | 32 or 128 |
|           } | |
|           SLS_dst_IP_addr | 32 or 128 |
|           SLS_dst_port_num | 16 |
|           SLS_TSI | 16 |
|           SLS_PLP_id | 8 |
|         } | |
|         reserved | 4 |
|         num_service_level_descriptor | 4 |
|         for(k=0; k<num_service_level_descriptor; k++) { | |
|           service_level_descriptor( ) | |
|         } | |
|       } /*service_loop*/ | |
|       reserved | 4 |
|       num_provider_level_descriptor | 4 |
|       for(k=0; k<num_provider_level_descriptor; k++) { | |
|         provider_level_descriptor( ) | var |
|       } | |
|     } /*provider_loop*/ | |
|     reserved | 4 |
|     num_FIT_level_descriptor | 4 |
|     for(i=0; i<num_FIT_level_descriptor; i++) { | |
|       FIT_level_descriptor( ) | |
|     } | |
|     CRC( ) | |
| } | |

[Figure 81]

signaling_broadcast_descriptor

| Syntax | Num of bits | Mnemonic | Description |
|---|---|---|---|
| signaling_broadcast_descriptor{ _descriptor{ | | | |
|   descriptor_tag | 8 | uimsbf | descriptor tag |
|   descriptor_length | 8 | uimsbf | descriptor length |
|   IP_version_flag | 1 | bslbf | IP version flag |
|   SLS_src_IP_addr_flag | 1 | bslbf | source IP address flag (IPv4 for IPv6) |
|   reserved | 6 | bslbf | |
|   if(SLS_src_IP_addr_flag) { | | | |
|     SLS_src_IP_addr | 32 or 128 | uimsbf | source IP address |
|   } | | | |
|   SLS_dst_IP_addr | 32 or 128 | uimsbf | SLS destination IP address |
|   SLS_dst_port_num | 16 | uimsbf | SLS destination port number |
|   SLS_TSI | 16 | uimsbf | SLS TSI |
|   SLS_PLP_id | 8 | uimsbf | SLS PLP ID |
| } | | | |

We can save 2bytes if we use signaling_broadcast_flag and signaling_broadcast_info as above.

signaling_broadcast_info

| Syntax | Num of bits | Mnemonic | Description |
|---|---|---|---|
| signaling_broadcast_info{ | | | |
|   IP_version_flag | 1 | bslbf | IP version flag |
|   SLS_src_IP_addr_flag | 1 | bslbf | source IP address flag (IPv4 for IPv6) |
|   reserved | 6 | bslbf | |
|   if(SLS_src_IP_addr_flag) { | | | |
|     SLS_src_IP_addr | 32 or 128 | uimsbf | source IP address |
|   } | | | |
|   SLS_dst_IP_addr | 32 or 128 | uimsbf | SLS destination IP address |
|   SLS_dst_port_num | 16 | uimsbf | SLS destination port number |
|   SLS_TSI | 16 | uimsbf | SLS TSI |
|   SLS_PLP_id | 8 | uimsbf | SLS PLP ID |
| } | | | |

【Figure 82】

| descriptor( ) | service | provider | FIT |
|---|---|---|---|
| capability_descriptor | 0 | - | - |
| signaling_over_internet_descriptor | - | 0 | - |

【Figure 83】

| Syntax | | | Cardinality | |
|---|---|---|---|---|
| FIT | | | 1 | |
| | @protocol_version | | required | xs:string (e.g. 1.0, 2.0, 3.0) |
| | @Broadcast_stream_id | | required | xs:unsignedInt |
| | @FIT_data_version | | required | xs:unsignedInt |
| | Provider | | 0..N | |
| | | inet_server_URL | 0..N | xs:string |
| | | @type | required | xs:unsignedInt |
| | | Service | 0..N | |
| | | @service_id | required | xs:unsignedInt |
| | | @SLS_data_version | required | xs:unsignedInt |
| | | @service_category | required | xs:unsignedInt |
| | | @service_name | optional | xs:string |
| | | @sp_indicator | required | xs:boolean |
| | | @service_status | required | xs:unsignedInt |
| | | @SLS_simpleservice | required | xs:boolean |
| | | Capability | 0..N | |
| | | signaling_broadcast | 0..N | |
| | | service_level_descriptor | 0..N | |
| | signaling_on_inet_URL | | 0..N | |
| | Provider_level_descriptor( ) | | 0..N | |
| FIT_level_descriptor( ) | | | 0..N | |
| CRC( ) | | | 0..1 | |

[Figure 84]

| Syntax | Description |
|---|---|
| FIT_protocol_version | Protocol version |
| Broadcast_stream_id | Broadcast Stream ID |
| FIT_data_version | The version of FIT data mapping to the FIT_version of PLS |
| FIT_length | The total length of FIT behind this field. |
| num_providers | The number of providers |
| num_services | Number of services |
| service_id | Service ID |
| SLS_data_version | Signaling data version |
| service_category | Service category(liner TV, NRT, ESG, audio, etc.) |
| short_service_name_length | Length of service name |
| short_service_name | Service name |
| sp_indicator | Service protection indicator |
| service_status | Service status |
| SLS_simpleservice | Broadcast simple service or not |
| capability_flag | Indicate if there is capability code of this service |
| signaling_broadcast_flag | Indicate if there is broadcast signaling information is delivered |
| capability_code | Capability code of this service |
| num_service_level_descriptor | number of service level descriptor |
| service_level_descriptor( ) | Service level descriptor |
| num_provider_level_descriptor | number of providerlevel descriptor |
| provider_level_descriptor( ) | Provider level descriptor |
| num_FIT_level_descriptor | number of FIT level descriptor |
| FIT_level_descriptor( ) | FIT level descriptor |
| CRC( ) | CRC |

[Figure 85]
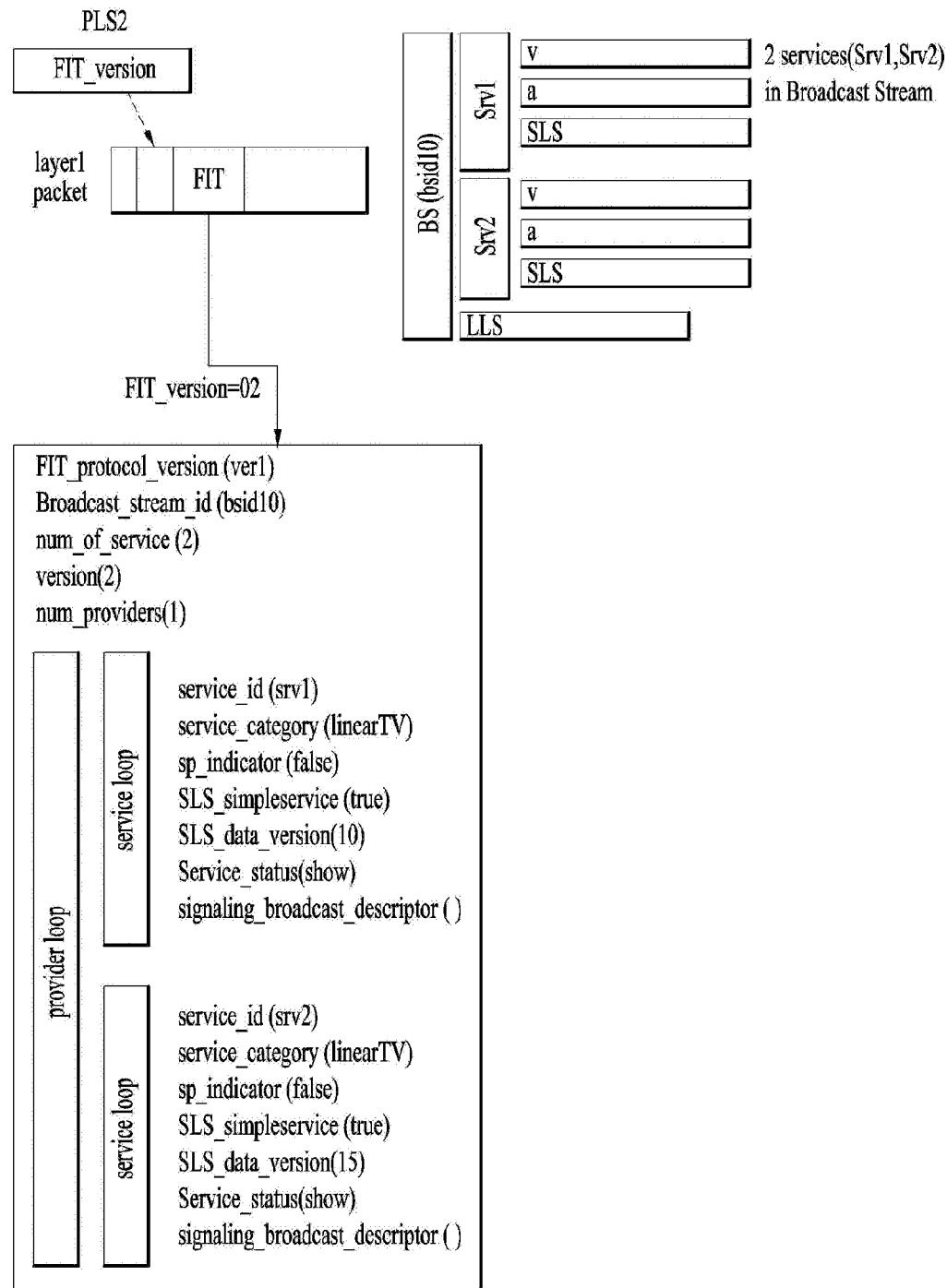

[Figure 86]
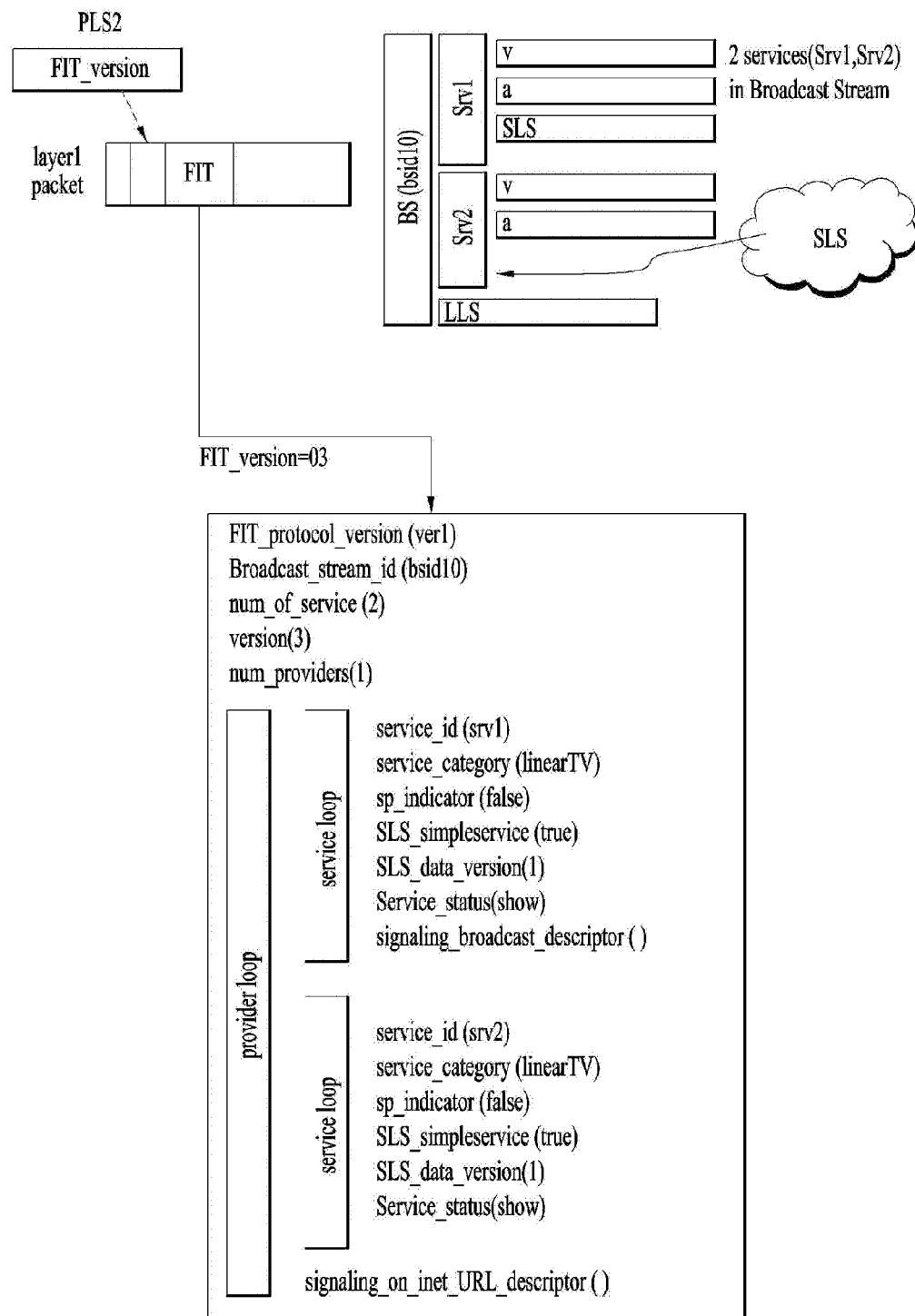

FIG. 87

| Syntax | Num of bits | Mnemonic | Description |
|---|---|---|---|
| Template_Delivery_Table | | | |
| Table_id | 8 | uimsbf | Table ID |
| Version_number | 8 | uimsbf | Versionof table |
| Table_length | 12 | uimsbf | Length of table |
| encoding_type | 4 | bslbf | encoding type |
| Table_id_extension | 16 | bslbf | Table id extension |
| current_segment_number | 8 | Uimsbf | Last segmentation number of descriptor |
| last_segment_number | 8 | Uimsbf | Currentsegmentation number |
| Signaling_id | 8 | Uimsbf | ID of signaling |
| Signaling_version | 8 | Uimsbf | Version of signaling |
| Template_id | 8 | Uimsbf | ID of template |
| Template_version | 8 | uimsbf | Version of Template |
| template_length | 12 | uimsbf | template length |
| reserved | 4 | | |
| template | 8*N | uimsbf | template |

[Figure 88]

| descriptor() | service | FIT |
|---|---|---|
| capability_descriptor | 0 | - |
| signaling_broadcast_descriptor | 0 | - |
| signaling_on_internet_descriptor | 0 | 0 |

[Figure 89]

| Syntax | |
|---|---|
| FIT{ | |
|     FIT_protocol_version | |
|     Broadcast_stream_id | |
| | |
|     FIT_data_version | |
|     FIT_length | |
|     num_services | |
|     for(i=0;i<num_services;i++) { | |
|         service_id | |
|         provider_id | |
|         service_category | |
|         sp_indicator | |
|         SLS_data_version | |
|         service_status | |
|         short_service_name_length | |
|         short_service_name | |
|         SLS_simpleservice | |
|         reserved | |
|         num_service_level_descriptor | signaling_on_inet_descriptor |
|         for(i=0;num_service_level_descriptor;i++) { | signaling_broadcast_descriptor |
|             service_level_descriptor() | capability descriptor |
|         } | |
|     } | |
|     reserved | |
|     num_FIT_level_descriptor | |
|     for(i=0;i<num_FIT_level_descriptor;i++) { | signaling_on_inet descriptor |
|         FIT_level_descriptor() | |
|     } | |
|     CRC() | |
| } | |

[Figure 90]

| descriptor() | groupID 1 | groupID 2 | groupID 3 |
|---|---|---|---|
| service_status_descriptor | O | O | O |
| service_name_descriptor | O | O | O |
| capability_descriptor | - | O | O |
| service_bootstrap_descriptor | - | O | O |
| signaling_template_descriptor | - | - | O |
| signaling_on_internet_descriptor | - | - | O |

[Figure 91]

| Syntax | |
|---|---|
| FIT{ | |
|    FIT_protocol_version | |
|    Broadcast_stream_id | |
|    group_id | |
|    version | |
| | |
|    num_services | |
|    for(i=0;i<num_services;i++) { | |
|       service_id | |
|       provider_id | |
|       service_category | |
|       sp_indicator | |
|       SLS_data_version | |
|       service_status | status desc |
|       short_service_name_length | |
|       short_service_name | name desc |
|       SLS_simpleservice | |
|       reserved | |
|       num_service_level_descriptor | signaling_on_inet_desc |
|       for(i=0;num_service_level_descriptor;i++) { | signaling_broadcast_desc |
|          service_level_descriptor() | capability descriptor |
|       } | template desc |
|    } | |
|    reserved | |
|    num_FIT_level_descriptor | |
|    for(i=0;i<num_FIT_level_descriptor;i++) { | |
|       FIT_level_descriptor() | |
|    } | |
| | |
| } | |

[Figure 92]
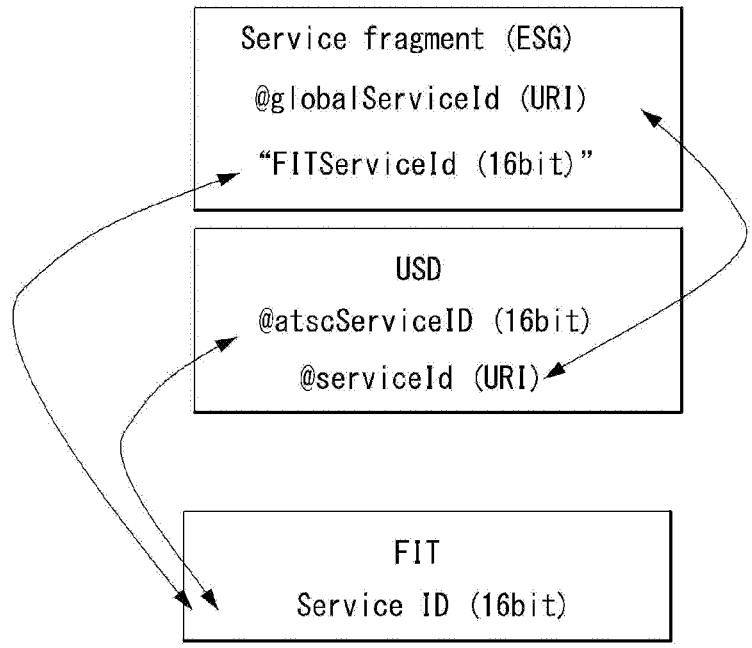
[Figure 93]
```
<?xml version="1.0" encoding="UTF-8"?>
<Service
  xmlns:bcast= "urn:oma:xml:bcast:sg:fragments:1.1"
  id= "bcast://lge.com/Service/1" version="1„
  FITServiceId = "0x1001"> ①
    <Name>ABC</Name>
    <Description>ABC Linear Service</Description>
    <FITServiceId>0x1001</FITServiceId> ②
    ...
    < PrivateExt > ③
        <FITServiceId>0x1001</FITServiceId>
    </PrivateExt>
</Service>
```

[Figure 95]
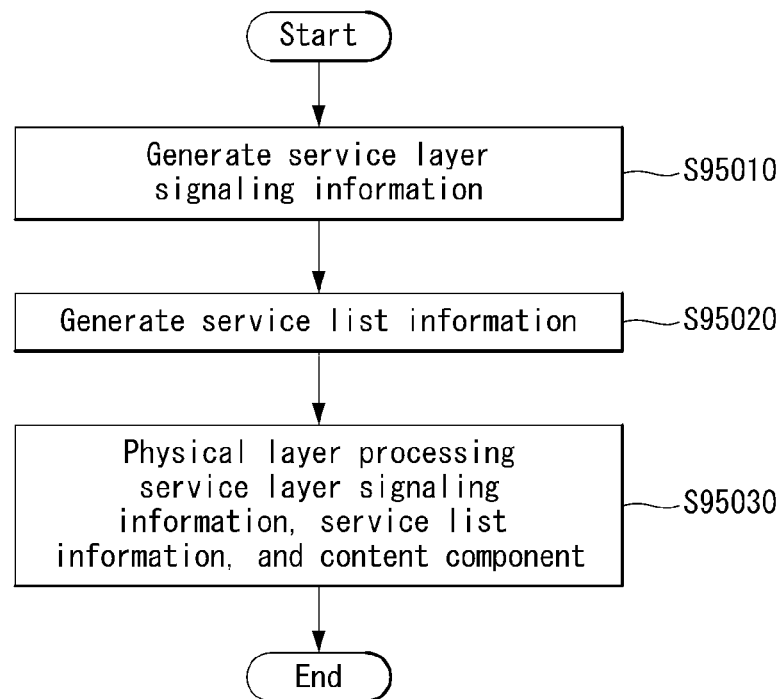

[Figure 96]
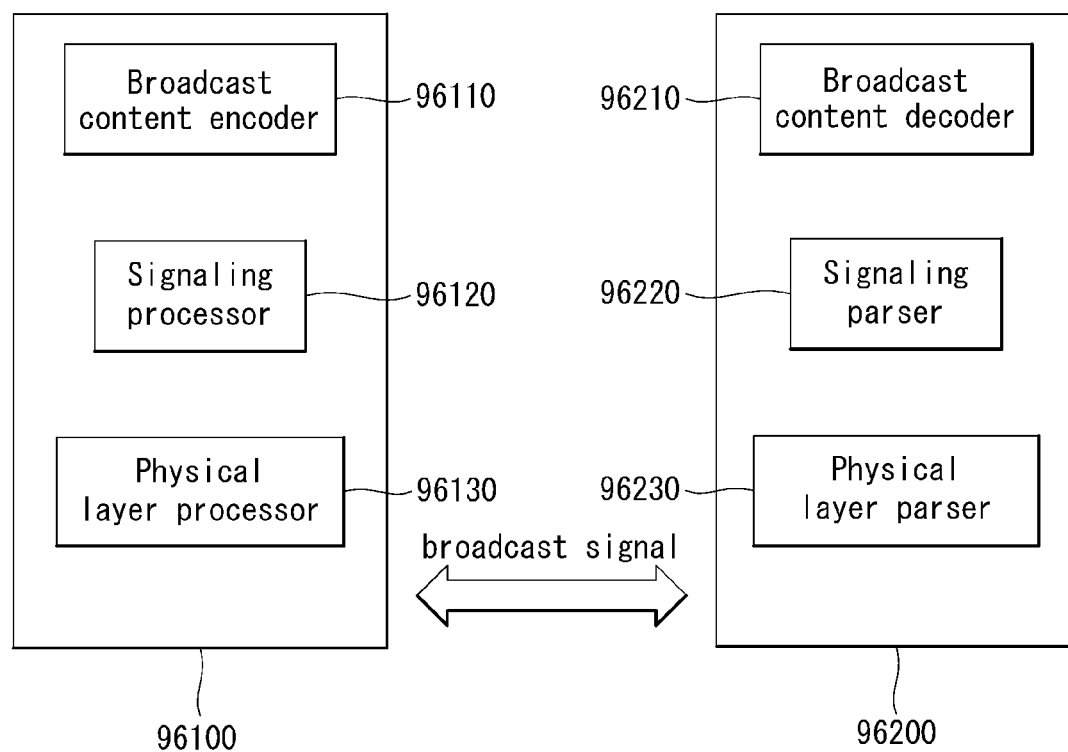

APPARATUS AND METHOD FOR TRANSCEIVING BROADCAST SIGNAL

This application is a Continuation of application Ser. No. 17/387,675 filed Jun. 28, 2021, which is a Continuation of application Ser. No. 15/555,385 filed Sep. 1, 2017, which is a U.S. National Phase Application under 35 U.S.C. § 371 of International Application PCT/KR2016/002018, filed on Feb. 29, 2016, which claims the benefit of U.S. Provisional Application No. 62/127,288, filed on Mar. 2, 2015, and U.S. Provisional Application No. 62/128,528, filed on Mar. 5, 2015, and U.S. Provisional Application No. 62/133,963, filed on Mar. 16, 2015, the entire contents of which are hereby incorporated by reference in their entireties.

TECHNICAL FIELD

The present invention relates to an apparatus for transmitting a broadcast signal, an apparatus for receiving a broadcast signal and methods for transmitting and receiving a broadcast signal.

BACKGROUND ART

As analog broadcast signal transmission comes to an end, various technologies for transmitting/receiving digital broadcast signals are being developed. A digital broadcast signal may include a larger amount of video/audio data than an analog broadcast signal and further include various types of additional data in addition to the video/audio data.

Technical Problem

A digital broadcast system can provide HD (high definition) images, multichannel audio and various additional services. However, data transmission efficiency for transmission of large amounts of data, robustness of transmission/reception networks and network flexibility in consideration of mobile reception equipment need to be improved for digital broadcast.

Technical Solution

To solve the technical problem, a method and an apparatus for transmitting a broadcast signal are disclosed.

A method for transmitting a broadcast signal including a content component of a broadcast service according to an embodiment of the present invention comprises generating service layer signaling information for discovery and acquisition of a broadcast service and a content component of the broadcast service; generating service list information including for service list building and discovery of the service layer signaling information; and physical layer processing of the service list information, service layer signaling information, and content component, wherein the service layer signaling information and the content component may be transmitted by using at least one delivery protocol of the ROUTE (Real-Time Object Delivery over Unidirectional Transport) protocol or MMT (MPEG Media Transport) protocol.

In a method for transmitting a broadcast signal according to an embodiment of the present invention, the service list information may include first signaling information at a service list information level and second signaling information at a service level. Also, the first signaling information may include capability information indicating capability required for processing of a broadcast service, broadcast signaling location information including address information required for acquiring service layer signaling information, and first URL signaling information indicating a URL at which an ESG or a service layer signaling file for all of the services may be obtained; and the second signaling information may include second URL signaling information indicating a URL at which an ESG or a service layer signaling file for the corresponding service may be obtained.

Also, in a method for transmitting a broadcast signal according to an embodiment of the present invention, the capability information, the broadcast signaling location information, and the first URL signaling information of the first signaling information; and the second URL signaling information of the second signaling information may be included selectively in the service list information.

Also, the service list information may include service ID information of 16-bit integer format for identifying the broadcast service, and the service layer signaling information may include the service ID information and global service ID information of URI format for identifying the broadcast service. Also, the global service ID may be included in an ESG transmitted over broadband.

Also, in a method for transmitting a broadcast signal according to an embodiment of the present invention, the service layer signaling information may be stored as a signaling template, and when a signaling instance which changes the service signaling information is generated, transmitting the difference between the template and the signaling instance as Diff information may be further included.

An apparatus for transmitting a broadcast signal according to an embodiment of the present invention may comprise a broadcast content encoder processing a content component of a broadcast service; a signaling processor generating signaling information about a broadcast service; and a physical layer processor performing physical layer processing on the content component and the signaling information, wherein the signaling information may include service layer signaling information for discovery and acquisition of the broadcast service and the content component of the broadcast service; and service list information including information for service list building and discovery of the service layer signaling information; and the service layer signaling information and the content component may be transmitted by using at least one delivery protocol of the ROUTE (Real-Time Object Delivery over Unidirectional Transport) protocol or MMT (MPEG Media Transport) protocol.

Advantageous Effects

The present invention can control quality of service (QoS) with respect to services or service components by processing data on the basis of service characteristics, thereby providing various broadcast services.

The present invention can achieve transmission flexibility by transmitting various broadcast services through the same radio frequency (RF) signal bandwidth.

The present invention can provide methods and apparatuses for transmitting and receiving broadcast signals, which enable digital broadcast signals to be received without error even when a mobile reception device is used or even in an indoor environment.

The present invention can effectively support future broadcast services in an environment supporting future hybrid broadcasting using terrestrial broadcast networks and the Internet.

In what follows, additional effects of the present invention may be described along with the description of the invention.

DESCRIPTION OF DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIG. 3 illustrates an SLT according to an embodiment of the present invention;

FIG. 5 illustrates a USBD fragment for ROUTE/DASH according to an embodiment of the present invention;

FIG. 6 illustrates an S-TSID fragment for ROUTE/DASH according to an embodiment of the present invention;

FIG. 7 illustrates a USBD/USD fragment for MMT according to an embodiment of the present invention;

FIG. 8 illustrates a link layer protocol architecture according to an embodiment of the present invention;

FIG. 9 illustrates a structure of a base header of a link layer packet according to an embodiment of the present invention;

FIG. 10 illustrates a structure of an additional header of a link layer packet according to an embodiment of the present invention;

FIG. 13 illustrates an example of adaptation modes in IP header compression according to an embodiment of the present invention (transmitting side);

FIG. 14 illustrates a link mapping table (LMT) and an RoHC-U description table according to an embodiment of the present invention;

FIG. 15 illustrates a structure of a link layer on a transmitter side according to an embodiment of the present invention;

FIG. 16 illustrates a structure of a link layer on a receiver side according to an embodiment of the present invention;

FIG. 17 illustrates a configuration of signaling transmission through a link layer according to an embodiment of the present invention (transmitting/receiving sides);

FIG. 23 illustrates a signaling hierarchy structure of a frame according to an embodiment of the present invention;

FIG. 24 is a table illustrating PLS1 data according to an embodiment of the present invention;

FIG. 25 is a table illustrating PLS2 data according to an embodiment of the present invention;

FIG. 26 is a table illustrating PLS2 data according to another embodiment of the present invention;

FIG. 27 illustrates a logical structure of a frame according to an embodiment of the present invention;

FIG. 28 illustrates PLS mapping according to an embodiment of the present invention;

FIG. 29 illustrates time interleaving according to an embodiment of the present invention;

FIG. 30 illustrates a basic operation of a twisted row-column block interleaver according to an embodiment of the present invention;

FIG. 33 illustrates a main PRBS used for all FFT modes according to an embodiment of the present invention;

FIG. 34 illustrates a sub-PRBS used for FFT modes and an interleaving address for frequency interleaving according to an embodiment of the present invention;

FIG. 35 illustrates a write operation of a time interleaver according to an embodiment of the present invention;

FIG. 36 is a table illustrating an interleaving type applied according to the number of PLPs;

FIG. 44 illustrates an FIT according to an embodiment of the present invention.

FIG. 45 an FIT descriptor according to an embodiment of the present invention.

FIG. 46 illustrates an embodiment of broadcast_signaling_location_descriptor( ).

FIG. 47 illustrates an embodiment of inet_signaling_location_descriptor( ).

FIG. 48 illustrates an embodiment of a query term when inet_signaling_location_descriptor( ) is located at FIT level.

FIG. 49 illustrates an embodiment of a query term when inet_signaling_location_descriptor( ) is located at service level.

FIG. 50 illustrates an XML format of the FIT shown and described in FIGS. 44 to 49.

FIG. 51 illustrates a service layer signaling data model according to an embodiment of the present invention.

FIG. 52 illustrates USBD according to one embodiment of the present invention.

FIG. 53 illustrates an S-TSID according to one embodiment of the present invention.

FIG. 63 is an XML instance notation illustrating a method for encapsulating Diff in a metadataEnvelope element.

FIG. 64 illustrates a method for template pre-sharing and diff-patching according to an embodiment of the present invention.

FIG. 65 illustrates an FIT delivery method according to an embodiment of the present invention.

FIG. 72 illustrates a syntax of a fast information table (FIT) according to an embodiment of the present invention.

FIG. 73 illustrates description about information included in the FIT according to an embodiment of the present invention.

FIG. 74 illustrates a signaling connecting structure in a procedure in which a receiver acquires a service according to an embodiment of the present invention.

FIG. 75 illustrates a syntax of an FIT according to another embodiment of the present invention.

FIG. 76 is a table showing descriptor type and locations at which descriptors can be included according to an embodiment of the present invention.

FIG. 77 illustrates a signaling_broadcast_descriptor according to an embodiment of the present invention.

FIG. 78 illustrates meaning of a signaling_on_inet_descriptor (or signaling_over_internet_descriptor) and values of inet_server_URL_type information according to an embodiment of the present invention.

FIG. 79 illustrates meaning of a capability_descriptor and values of capability_category information according to an embodiment of the present invention.

FIG. 80 illustrates a syntax of an FIT according to another embodiment of the present invention.

FIG. 81 compares methods of signaling information about service level signaling transmitted through a broadcast network according to an embodiment of the present invention.

FIG. 82 is a table showing descriptor type and locations at which descriptors can be included according to an embodiment of the present invention.

FIG. 83 illustrates an FIT in XML format according to another embodiment of the present invention.

FIG. 84 illustrates description about information included in an FIT according to an embodiment of the present invention.

FIG. 85 illustrates a signaling connecting structure in a procedure in which a receiver acquires a service according to an embodiment of the present invention.

FIG. 86 illustrates a signaling connecting structure in a procedure in which a receiver acquires a service according to another embodiment of the present invention.

FIG. 87 illustrates a template delivery table according to an embodiment of the present invention.

FIG. 88 illustrates a level descriptor according to an embodiment of the present invention.

FIG. 89 illustrates an FIT to which level descriptors are applied according to an embodiment of the present invention.

FIG. 90 illustrates descriptors for the respective levels according to an embodiment of the present invention.

FIG. 91 illustrates an FIT to which level descriptors are applied according to an embodiment of the present invention.

FIG. 92 illustrates a method for signaling a service ID according to an embodiment of the present invention.

FIG. 93 illustrates an embodiment of an ESG service fragment including service ID information of an FIT.

FIG. 95 illustrates a method for transmitting a broadcast signal according to an embodiment of the present invention.

FIG. 96 illustrates a broadcast signal transmitter and a broadcast signal receiver according to an embodiment of the present invention.

BEST MODE

Reference will now be made in detail to the preferred embodiments of the present invention, examples of which are illustrated in the accompanying drawings. The detailed description, which will be given below with reference to the accompanying drawings, is intended to explain exemplary embodiments of the present invention, rather than to show the only embodiments that can be implemented according to the present invention. The following detailed description includes specific details in order to provide a thorough understanding of the present invention. However, it will be apparent to those skilled in the art that the present invention may be practiced without such specific details.

Although the terms used in the present invention are selected from generally known and used terms, some of the terms mentioned in the description of the present invention have been selected by the applicant at his or her discretion, the detailed meanings of which are described in relevant parts of the description herein. Furthermore, it is required that the present invention is understood, not simply by the actual terms used but by the meanings of each term lying within.

The present invention provides apparatuses and methods for transmitting and receiving broadcast signals for future broadcast services. Future broadcast services according to an embodiment of the present invention include a terrestrial broadcast service, a mobile broadcast service, an ultra high definition television (UHDTV) service, etc. The present invention may process broadcast signals for the future broadcast services through non-MIMO (Multiple Input Multiple Output) or MIMO according to one embodiment. A non-MIMO scheme according to an embodiment of the present invention may include a MISO (Multiple Input Single Output) scheme, a SISO (Single Input Single Output) scheme, etc.

Figure 1:
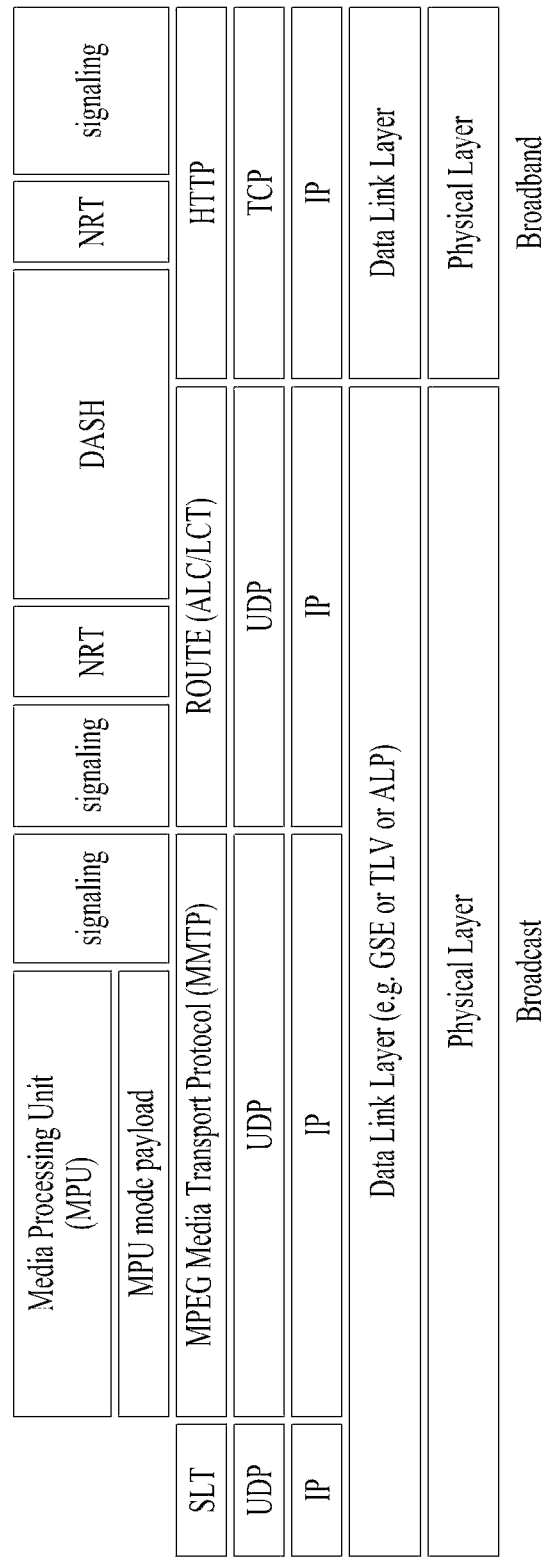
FIG. 1 illustrates a receiver protocol stack according to an embodiment of the present invention.

FIG. 1 illustrates a receiver protocol stack according to an embodiment of the present invention.

Two schemes may be used in broadcast service delivery through a broadcast network.

In a first scheme, media processing units (MPUs) are transmitted using an MMT protocol (MMTP) based on MPEG media transport (MMT). In a second scheme, dynamic adaptive streaming over HTTP (DASH) segments may be transmitted using real time object delivery over unidirectional transport (ROUTE) based on MPEG DASH.

Non-timed content including NRT media, EPG data, and other files is delivered with ROUTE. Signaling may be delivered over MMTP and/or ROUTE, while bootstrap signaling information is provided by the means of the Service List Table (SLT).

In hybrid service delivery, MPEG DASH over HTTP/TCP/IP is used on the broadband side. Media files in ISO Base Media File Format (BMFF) are used as the delivery, media encapsulation and synchronization format for both broadcast and broadband delivery. Here, hybrid service delivery may refer to a case in which one or more program elements are delivered through a broadband path.

Services are delivered using three functional layers. These are the physical layer, the delivery layer and the service management layer. The physical layer provides the mechanism by which signaling, service announcement and IP packet streams are transported over the broadcast physical layer and/or broadband physical layer. The delivery layer provides object and object flow transport functionality. It is enabled by the MMTP or the ROUTE protocol, operating on a UDP/IP multicast over the broadcast physical layer, and enabled by the HTTP protocol on a TCP/IP unicast over the broadband physical layer. The service management layer enables any type of service, such as linear TV or HTML5 application service, to be carried by the underlying delivery and physical layers.

In this figure, a protocol stack part on a broadcast side may be divided into a part transmitted through the SLT and the MMTP, and a part transmitted through ROUTE.

The SLT may be encapsulated through UDP and IP layers. Here, the SLT will be described below. The MMTP may transmit data formatted in an MPU format defined in MMT, and signaling information according to the MMTP. The data may be encapsulated through the UDP and IP layers. ROUTE may transmit data formatted in a DASH segment form, signaling information, and non-timed data such as NRT data, etc. The data may be encapsulated through the UDP and IP layers. According to a given embodiment, some or all processing according to the UDP and IP layers may be omitted. Here, the illustrated signaling information may be signaling information related to a service.

The part transmitted through the SLT and the MMTP and the part transmitted through ROUTE may be processed in the UDP and IP layers, and then encapsulated again in a data link layer. The link layer will be described below. Broadcast data processed in the link layer may be multicast as a broadcast signal through processes such as encoding/interleaving, etc. in the physical layer.

In this figure, a protocol stack part on a broadband side may be transmitted through HTTP as described above. Data formatted in a DASH segment form, signaling information, NRT information, etc. may be transmitted through HTTP. Here, the illustrated signaling information may be signaling information related to a service. The data may be processed through the TCP layer and the IP layer, and then encapsulated into the link layer. According to a given embodiment, some or all of the TCP, the IP, and the link layer may be omitted. Broadband data processed thereafter may be transmitted by unicast in the broadband through a process for transmission in the physical layer.

Service can be a collection of media components presented to the user in aggregate; components can be of multiple media types; a Service can be either continuous or intermittent; a Service can be Real Time or Non-Real Time; Real Time Service can consist of a sequence of TV programs.

Figure 2:
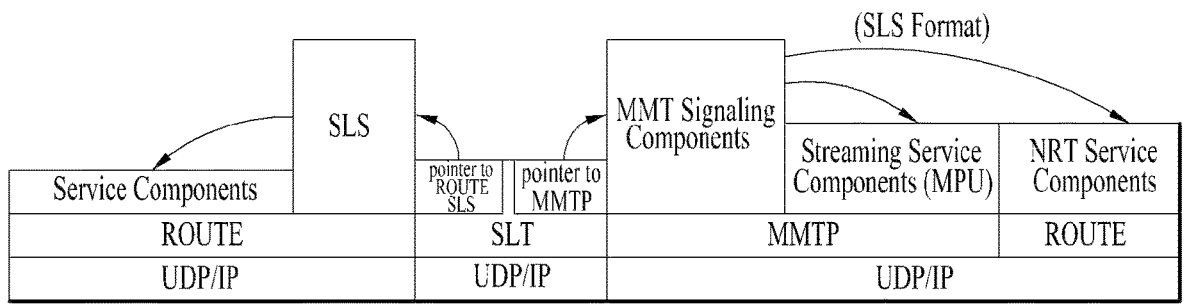
FIG. 2 illustrates a relation between an SLT and service layer signaling (SLS) according to an embodiment of the present invention.

FIG. 2 illustrates a relation between the SLT and SLS according to an embodiment of the present invention.

Service signaling provides service discovery and description information, and comprises two functional components: Bootstrap signaling via the Service List Table (SLT) and the Service Layer Signaling (SLS). These represent the information which is necessary to discover and acquire user services. The SLT enables the receiver to build a basic service list, and bootstrap the discovery of the SLS for each service.

The SLT can enable very rapid acquisition of basic service information. The SLS enables the receiver to discover and access services and their content components. Details of the SLT and SLS will be described below.

As described in the foregoing, the SLT may be transmitted through UDP/IP. In this instance, according to a given embodiment, data corresponding to the SLT may be delivered through the most robust scheme in this transmission.

The SLT may have access information for accessing SLS delivered by the ROUTE protocol. In other words, the SLT may be bootstrapped into SLS according to the ROUTE protocol. The SLS is signaling information positioned in an upper layer of ROUTE in the above-described protocol stack, and may be delivered through ROUTE/UDP/IP. The SLS may be transmitted through one of LCT sessions included in a ROUTE session. It is possible to access a service component corresponding to a desired service using the SLS.

In addition, the SLT may have access information for accessing an MMT signaling component delivered by MMTP. In other words, the SLT may be bootstrapped into SLS according to the MMTP. The SLS may be delivered by an MMTP signaling message defined in MMT. It is possible to access a streaming service component (MPU) corresponding to a desired service using the SLS. As described in the foregoing, in the present invention, an NRT service component is delivered through the ROUTE protocol, and the SLS according to the MMTP may include information for accessing the ROUTE protocol. In broadband delivery, the SLS is carried over HTTP(S)/TCP/IP.

FIG. 3 illustrates an SLT according to an embodiment of the present invention.

First, a description will be given of a relation among respective logical entities of service management, delivery, and a physical layer.

Services may be signaled as being one of two basic types. First type is a linear audio/video or audio-only service that may have an app-based enhancement. Second type is a service whose presentation and composition is controlled by a downloaded application that is executed upon acquisition of the service. The latter can be called an "app-based" service.

The rules regarding presence of ROUTE/LCT sessions and/or MMTP sessions for carrying the content components of a service may be as follows.

For broadcast delivery of a linear service without app-based enhancement, the service's content components can be carried by either (but not both): (1) one or more ROUTE/LCT sessions, or (2) one or more MMTP sessions.

For broadcast delivery of a linear service with app-based enhancement, the service's content components can be carried by: (1) one or more ROUTE/LCT sessions, and (2) zero or more MMTP sessions.

In certain embodiments, use of both MMTP and ROUTE for streaming media components in the same service may not be allowed.

For broadcast delivery of an app-based service, the service's content components can be carried by one or more ROUTE/LCT sessions.

Each ROUTE session comprises one or more LCT sessions which carry as a whole, or in part, the content components that make up the service. In streaming services delivery, an LCT session may carry an individual component of a user service such as an audio, video or closed caption stream. Streaming media is formatted as DASH Segments.

Each MMTP session comprises one or more MMTP packet flows which carry MMT signaling messages or as a whole, or in part, the content component. An MMTP packet flow may carry MMT signaling messages or components formatted as MPUs.

For the delivery of NRT User Services or system metadata, an LCT session carries file-based content items. These content files may consist of continuous (time-based) or discrete (non-time-based) media components of an NRT service, or metadata such as Service Signaling or ESG fragments. Delivery of system metadata such as service signaling or ESG fragments may also be achieved through the signaling message mode of MMTP.

A broadcast stream is the abstraction for an RF channel, which is defined in terms of a carrier frequency centered within a specified bandwidth. It is identified by the pair [geographic area, frequency]. A physical layer pipe (PLP) corresponds to a portion of the RF channel. Each PLP has certain modulation and coding parameters. It is identified by a PLP identifier (PLPID), which is unique within the broadcast stream it belongs to. Here, PLP can be referred to as DP (data pipe).

Each service is identified by two forms of service identifier: a compact form that is used in the SLT and is unique only within the broadcast area; and a globally unique form that is used in the SLS and the ESG. A ROUTE session is identified by a source IP address, destination IP address and destination port number. An LCT session (associated with the service component(s) it carries) is identified by a transport session identifier (TSI) which is unique within the scope of the parent ROUTE session. Properties common to the LCT sessions, and certain properties unique to individual LCT sessions, are given in a ROUTE signaling structure called a service-based transport session instance description (S-TSID), which is part of the service layer signaling. Each LCT session is carried over a single physical layer pipe. According to a given embodiment, one LCT session may be transmitted through a plurality of PLPs. Different LCT sessions of a ROUTE session may or may not be contained in different physical layer pipes. Here, the ROUTE session may be delivered through a plurality of PLPs. The properties described in the S-TSID include the TSI value and PLPID for each LCT session, descriptors for the delivery objects/files, and application layer FEC parameters.

A MMTP session is identified by destination IP address and destination port number. An MMTP packet flow (associated with the service component(s) it carries) is identified by a packet_id which is unique within the scope of the parent MMTP session. Properties common to each MMTP packet flow, and certain properties of MMTP packet flows, are given in the SLT. Properties for each MMTP session are given by MMT signaling messages, which may be carried within the MMTP session. Different MMTP packet flows of a MMTP session may or may not be contained in different physical layer pipes. Here, the MMTP session may be delivered through a plurality of PLPs. The properties described in the MMT signaling messages include the packet_id value and PLPID for each MMTP packet flow. Here, the MMT signaling messages may have a form defined in MMT, or have a deformed form according to embodiments to be described below.

Hereinafter, a description will be given of low level signaling (LLS).

Signaling information which is carried in the payload of IP packets with a well-known address/port dedicated to this function is referred to as low level signaling (LLS). The IP address and the port number may be differently configured depending on embodiments. In one embodiment, LLS can be transported in IP packets with address 224.0.23.60 and destination port 4937/udp. LLS may be positioned in a portion expressed by "SLT" on the above-described protocol stack. However, according to a given embodiment, the LLS may be transmitted through a separate physical channel (dedicated channel) in a signal frame without being subjected to processing of the UDP/IP layer.

UDP/IP packets that deliver LLS data may be formatted in a form referred to as an LLS table. A first byte of each UDP/IP packet that delivers the LLS data may correspond to a start of the LLS table. The maximum length of any LLS table is limited by the largest IP packet that can be delivered from the PHY layer, 65,507 bytes.

The LLS table may include an LLS table ID field that identifies a type of the LLS table, and an LLS table version field that identifies a version of the LLS table. According to a value indicated by the LLS table ID field, the LLS table may include the above-described SLT or a rating region table (RRT). The RRT may have information about content advisory rating.

Hereinafter, the SLT will be described. LLS can be signaling information which supports rapid channel scans and bootstrapping of service acquisition by the receiver, and SLT can be a table of signaling information which is used to build a basic service listing and provide bootstrap discovery of SLS.

The function of the SLT is similar to that of the program association table (PAT) in MPEG-2 Systems, and the fast information channel (FIC) found in ATSC Systems. For a receiver first encountering the broadcast emission, this is the place to start. SLT supports a rapid channel scan which allows a receiver to build a list of all the services it can receive, with their channel name, channel number, etc., and SLT provides bootstrap information that allows a receiver to discover the SLS for each service. For ROUTE/DASH-delivered services, the bootstrap information includes the destination IP address and destination port of the LCT session that carries the SLS. For MMT/MPU-delivered services, the bootstrap information includes the destination IP address and destination port of the MMTP session carrying the SLS.

The SLT supports rapid channel scans and service acquisition by including the following information about each service in the broadcast stream. First, the SLT can include information necessary to allow the presentation of a service list that is meaningful to viewers and that can support initial service selection via channel number or up/down selection. Second, the SLT can include information necessary to locate the service layer signaling for each service listed. That is, the SLT may include access information related to a location at which the SLS is delivered.

The illustrated SLT according to the present embodiment is expressed as an XML document having an SLT root element. According to a given embodiment, the SLT may be expressed in a binary format or an XML document.

The SLT root element of the SLT illustrated in the figure may include @bsid, @sltSectionVersion, @sltSectionNumber, @totalSltSectionNumbers, @language, @capabilities, InetSigLoc and/or Service. According to a given embodiment, the SLT root element may further include @providerId. According to a given embodiment, the SLT root element may not include @language.

The service element may include @serviceId, @SLTserviceSeqNumber, @protected, @majorChannelNo, @minorChannelNo, @serviceCategory, @shortServiceName, @hidden, @slsProtocolType, BroadcastSignaling, @slsPlpId, @slsDestinationIpAddress, @slsDestinationUdpPort, @slsSourceIpAddress, @slsMajorProtocolVersion, @SlsMinorProtocolVersion, @serviceLanguage, @broadbandAccessRequired, @capabilities and/or InetSigLoc.

According to a given embodiment, an attribute or an element of the SLT may be added/changed/deleted. Each element included in the SLT may additionally have a separate attribute or element, and some attribute or elements according to the present embodiment may be omitted. Here, a field which is marked with @ may correspond to an attribute, and a field which is not marked with @ may correspond to an element.

@bsid is an identifier of the whole broadcast stream. The value of BSID may be unique on a regional level.

@providerId can be an index of broadcaster that is using part or all of this broadcast stream. This is an optional attribute. When it's not present, it means that this broadcast stream is being used by one broadcaster. @providerId is not illustrated in the figure.

@sltSectionVersion can be a version number of the SLT section. The sltSectionVersion can be incremented by 1 when a change in the information carried within the sit occurs. When it reaches maximum value, it wraps around to 0.

@sltSectionNumber can be the number, counting from 1, of this section of the SLT. In other words, @sltSectionNumber may correspond to a section number of the SLT section. When this field is not used, @sltSectionNumber may be set to a default value of 1.

@totalSltSectionNumbers can be the total number of sections (that is, the section with the highest sltSectionNumber) of the SLT of which this section is part. sltSectionNumber and totalSltSectionNumbers together can be considered to indicate "Part M of N" of one portion of the SLT when it is sent in fragments. In other words, when the SLT is transmitted, transmission through fragmentation may be supported. When this field is not used, @totalSltSectionNumbers may be set to a default value of 1. A case in which this field is not used may correspond to a case in which the SLT is not transmitted by being fragmented.

@language can indicate primary language of the services included in this slt instance. According to a given embodiment, a value of this field may have be a three-character language code defined in the ISO. This field may be omitted.

@capabilities can indicate required capabilities for decoding and meaningfully presenting the content for all the services in this slt instance.

InetSigLoc can provide a URL telling the receiver where it can acquire any requested type of data from external server(s) via broadband. This element may include @urlType as a lower field. According to a value of the @urlType field, a type of a URL provided by InetSigLoc may be indicated. According to a given embodiment, when the @urlType field has a value of 0, InetSigLoc may provide a URL of a signaling server. When the @urlType field has a value of 1, InetSigLoc may provide a URL of an ESG server. When the @urlType field has other values, the field may be reserved for future use.

The service field is an element having information about each service, and may correspond to a service entry. Service element fields corresponding to the number of services indicated by the SLT may be present. Hereinafter, a description will be given of a lower attribute/element of the service field.

@serviceId can be an integer number that uniquely identify this service within the scope of this broadcast area. According to a given embodiment, a scope of @serviceId may be changed. @SLTserviceSeqNumber can be an integer number that indicates the sequence number of the SLT service information with service ID equal to the serviceId attribute above. SLTserviceSeqNumber value can start at 0 for each service and can be incremented by 1 every time any attribute in this service element is changed. If no attribute values are changed compared to the previous Service element with a particular value of ServiceID then SLTserviceSeqNumber would not be incremented. The SLTserviceSeqNumber field wraps back to 0 after reaching the maximum value.

@protected is flag information which may indicate whether one or more components for significant reproduction of the service are in a protected state. When set to "1" (true), that one or more components necessary for meaningful presentation is protected. When set to "0" (false), this flag indicates that no components necessary for meaningful presentation of the service are protected. Default value is false.

@majorChannelNo is an integer number representing the "major" channel number of the service. An example of the field may have a range of 1 to 999.

@minorChannelNo is an integer number representing the "minor" channel number of the service. An example of the field may have a range of 1 to 999.

@serviceCategory can indicate the category of this service. This field may indicate a type that varies depending on embodiments. According to a given embodiment, when this field has values of 1, 2, and 3, the values may correspond to a linear A/V service, a linear audio only service, and an app-based service, respectively. When this field has a value of 0, the value may correspond to a service of an undefined category. When this field has other values except for 1, 2, and 3, the field may be reserved for future use. @shortServiceName can be a short string name of the Service.

@hidden can be boolean value that when present and set to "true" indicates that the service is intended for testing or proprietary use, and is not to be selected by ordinary TV receivers. The default value is "false" when not present.

@slsProtocolType can be an attribute indicating the type of protocol of Service Layer Signaling used by this service. This field may indicate a type that varies depending on embodiments. According to a given embodiment, when this field has values of 1 and 2, protocols of SLS used by respective corresponding services may be ROUTE and MMTP, respectively. When this field has other values except for 0, the field may be reserved for future use. This field may be referred to as @slsProtocol.

BroadcastSignaling and lower attributes/elements thereof may provide information related to broadcast signaling. When the BroadcastSignaling element is not present, the child element InetSigLoc of the parent service element can be present and its attribute urlType includes URL_type 0x00 (URL to signaling server). In this case attribute url supports the query parameter svc=<service_id> where service_id corresponds to the serviceId attribute for the parent service element.

Alternatively when the BroadcastSignaling element is not present, the element InetSigLoc can be present as a child element of the slt root element and the attribute urlType of that InetSigLoc element includes URL_type 0x00 (URL to signaling server). In this case, attribute url for URL_type 0x00 supports the query parameter svc=<service_id> where service_id corresponds to the serviceId attribute for the parent Service element.

@slsPlpId can be a string representing an integer number indicating the PLP ID of the physical layer pipe carrying the SLS for this service.

@slsDestinationIpAddress can be a string containing the dotted-IPv4 destination address of the packets carrying SLS data for this service.

@slsDestinationUdpPort can be a string containing the port number of the packets carrying SLS data for this service. As described in the foregoing, SLS bootstrapping may be performed by destination IP/UDP information.

@slsSourceIpAddress can be a string containing the dotted-IPv4 source address of the packets carrying SLS data for this service.

@slsMajorProtocolVersion can be major version number of the protocol used to deliver the service layer signaling for this service. Default value is 1.

@SlsMinorProtocolVersion can be minor version number of the protocol used to deliver the service layer signaling for this service. Default value is 0.

@serviceLanguage can be a three-character language code indicating the primary language of the service. A value of this field may have a form that varies depending on embodiments.

@broadbandAccessRequired can be a Boolean indicating that broadband access is required for a receiver to make a meaningful presentation of the service. Default value is false. When this field has a value of True, the receiver needs to access a broadband for significant service reproduction, which may correspond to a case of hybrid service delivery.

@capabilities can represent required capabilities for decoding and meaningfully presenting the content for the service with service ID equal to the service Id attribute above.

InetSigLoc can provide a URL for access to signaling or announcement information via broadband, if available. Its data type can be an extension of the any URL data type, adding an @urlType attribute that indicates what the URL gives access to. An @urlType field of this field may indicate the same meaning as that of the @urlType field of InetSigLoc described above. When an InetSigLoc element of attribute URL_type 0x00 is present as an element of the SLT, it can be used to make HTTP requests for signaling metadata. The HTTP POST message body may include a service term. When the InetSigLoc element appears at the section level, the service term is used to indicate the service to which the requested signaling metadata objects apply. If the service term is not present, then the signaling metadata objects for all services in the section are requested. When the InetSigLoc appears at the service level, then no service term is needed to designate the desired service. When an InetSigLoc element of attribute URL_type 0x01 is provided, it can be used to retrieve ESG data via broadband. If the element appears as a child element of the service element, then the URL can be used to retrieve ESG data for that service. If the element appears as a child element of the SLT element, then the URL can be used to retrieve ESG data for all services in that section.

In another example of the SLT, @sltSectionVersion, @sltSectionNumber, @totalSltSectionNumbers and/or @language fields of the SLT may be omitted In addition, the above-described InetSigLoc field may be replaced by @sltInetSigUri and/or @sltInetEsgUri field. The two fields may include the URI of the signaling server and URI information of the ESG server, respectively. The InetSigLoc field corresponding to a lower field of the SLT and the InetSigLoc field corresponding to a lower field of the service field may be replaced in a similar manner.

The suggested default values may vary depending on embodiments. An illustrated "use" column relates to the respective fields. Here, "1" may indicate that a corresponding field is an essential field, and "0 . . . 1" may indicate that a corresponding field is an optional field.

Figure 4:
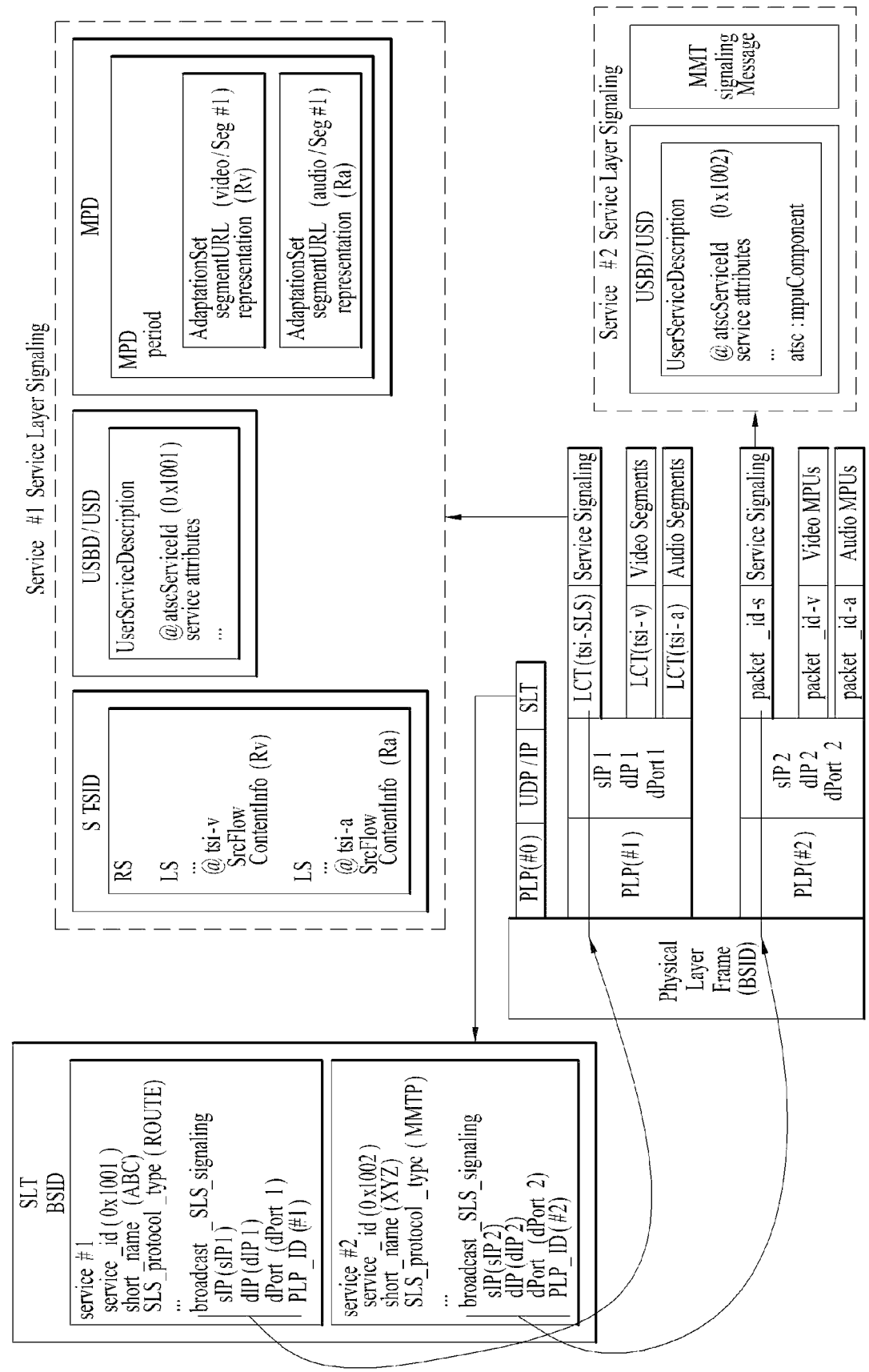
FIG. 4 illustrates SLS bootstrapping and a service discovery process according to an embodiment of the present invention.

FIG. 4 illustrates SLS bootstrapping and a service discovery process according to an embodiment of the present invention.

Hereinafter, SLS will be described.

SLS can be signaling which provides information for discovery and acquisition of services and their content components.

For ROUTE/DASH, the SLS for each service describes characteristics of the service, such as a list of its components and where to acquire them, and the receiver capabilities required to make a meaningful presentation of the service. In the ROUTE/DASH system, the SLS includes the user service bundle description (USBD), the S-TSID and the DASH media presentation description (MPD). Here, USBD or user service description (USD) is one of SLS XML fragments, and may function as a signaling herb that describes specific descriptive information. USBD/USD may be extended beyond 3GPP MBMS. Details of USBD/USD will be described below.

The service signaling focuses on basic attributes of the service itself, especially those attributes needed to acquire the service. Properties of the service and programming that are intended for viewers appear as service announcement, or ESG data.

Having separate Service Signaling for each service permits a receiver to acquire the appropriate SLS for a service of interest without the need to parse the entire SLS carried within a broadcast stream.

For optional broadband delivery of Service Signaling, the SLT can include HTTP URLs where the Service Signaling files can be obtained, as described above.

LLS is used for bootstrapping SLS acquisition, and subsequently, the SLS is used to acquire service components delivered on either ROUTE sessions or MMTP sessions. The described figure illustrates the following signaling sequences. Receiver starts acquiring the SLT described above. Each service identified by service_id delivered over ROUTE sessions provides SLS bootstrapping information: PLPID(#1), source IP address (sIP1), destination IP address (dIP1), and destination port number (dPort1). Each service identified by service_id delivered over MMTP sessions provides SLS bootstrapping information: PLPID(#2), destination IP address (dIP2), and destination port number (dPort2).

For streaming services delivery using ROUTE, the receiver can acquire SLS fragments carried over the IP/UDP/LCT session and PLP; whereas for streaming services delivery using MMTP, the receiver can acquire SLS fragments carried over an MMTP session and PLP. For service delivery using ROUTE, these SLS fragments include USBD/USD fragments, S-TSID fragments, and MPD fragments. They are relevant to one service. USBD/USD fragments describe service layer properties and provide URI references to S-TSID fragments and URI references to MPD fragments. In other words, the USBD/USD may refer to S-TSID and MPD. For service delivery using MMTP, the USBD references the MMT signaling's MPT message, the MP Table of which provides identification of package ID and location information for assets belonging to the service. Here, an asset is a multimedia data entity, and may refer to a data entity which is combined into one unique ID and is used to generate one multimedia presentation. The asset may correspond to a service component included in one service. The MPT message is a message having the MP table of MMT. Here, the MP table may be an MMT package table having information about content and an MMT asset. Details may be similar to a definition in MMT. Here, media presentation may correspond to a collection of data that establishes bounded/unbounded presentation of media content.

The S-TSID fragment provides component acquisition information associated with one service and mapping between DASH Representations found in the MPD and in the TSI corresponding to the component of the service. The S-TSID can provide component acquisition information in the form of a TSI and the associated DASH representation identifier, and PLPID carrying DASH segments associated with the DASH representation. By the PLPID and TSI values, the receiver collects the audio/video components from the service and begins buffering DASH media segments then applies the appropriate decoding processes.

For USBD listing service components delivered on MMTP sessions, as illustrated by "Service #2" in the described figure, the receiver also acquires an MPT message with matching MMT_package_id to complete the SLS. An MPT message provides the full list of service components comprising a service and the acquisition information for each component. Component acquisition information includes MMTP session information, the PLPID carrying the session and the packet_id within that session.

According to a given embodiment, for example, in ROUTE, two or more S-TSID fragments may be used. Each fragment may provide access information related to LCT sessions delivering content of each service.

In ROUTE, S-TSID, USBD/USD, MPD, or an LCT session delivering S-TSID, USBD/USD or MPD may be referred to as a service signaling channel. In MMTP, USBD/UD, an MMT signaling message, or a packet flow delivering the MMTP or USBD/UD may be referred to as a service signaling channel.

Unlike the illustrated example, one ROUTE or MMTP session may be delivered through a plurality of PLPs. In other words, one service may be delivered through one or more PLPs. As described in the foregoing, one LCT session may be delivered through one PLP. Unlike the figure, according to a given embodiment, components included in one service may be delivered through different ROUTE sessions. In addition, according to a given embodiment, components included in one service may be delivered through different MMTP sessions. According to a given embodiment, components included in one service may be delivered separately through a ROUTE session and an MMTP session. Although not illustrated, components included in one service may be delivered via broadband (hybrid delivery).

FIG. 5 illustrates a USBD fragment for ROUTE/DASH according to an embodiment of the present invention.

Hereinafter, a description will be given of SLS in delivery based on ROUTE.

SLS provides detailed technical information to the receiver to enable the discovery and access of services and their content components. It can include a set of XML-encoded metadata fragments carried over a dedicated LCT session. That LCT session can be acquired using the bootstrap information contained in the SLT as described above. The SLS is defined on a per-service level, and it describes the characteristics and access information of the service, such as a list of its content components and how to acquire them, and the receiver capabilities required to make a meaningful presentation of the service. In the ROUTE/DASH system, for linear services delivery, the SLS consists of the following metadata fragments: USBD, S-TSID and the DASH MPD. The SLS fragments can be delivered on a dedicated LCT transport session with TSI=0. According to a given embodiment, a TSI of a particular LCT session (dedicated LCT session) in which an SLS fragment is delivered may have a different value. According to a given embodiment, an LCT session in which an SLS fragment is delivered may be signaled using the SLT or another scheme.

ROUTE/DASH SLS can include the user service bundle description (USBD) and service-based transport session instance description (S-TSID) metadata fragments. These service signaling fragments are applicable to both linear and application-based services. The USBD fragment contains service identification, device capabilities information, references to other SLS fragments required to access the service and constituent media components, and metadata to enable the receiver to determine the transport mode (broadcast and/or broadband) of service components. The S-TSID fragment, referenced by the USBD, provides transport session descriptions for the one or more ROUTE/LCT sessions in which the media content components of a service are delivered, and descriptions of the delivery objects carried in those LCT sessions. The USBD and S-TSID will be described below.

In streaming content signaling in ROUTE-based delivery, a streaming content signaling component of SLS corresponds to an MPD fragment. The MPD is typically associated with linear services for the delivery of DASH Segments as streaming content. The MPD provides the resource identifiers for individual media components of the linear/streaming service in the form of Segment URLs, and the context of the identified resources within the Media Presentation. Details of the MPD will be described below.

In app-based enhancement signaling in ROUTE-based delivery, app-based enhancement signaling pertains to the delivery of app-based enhancement components, such as an application logic file, locally-cached media files, network content items, or a notification stream. An application can also retrieve locally-cached data over a broadband connection when available.

Hereinafter, a description will be given of details of USBD/USD illustrated in the figure.

The top level or entry point SLS fragment is the USBD fragment. An illustrated USBD fragment is an example of the present invention, basic fields of the USBD fragment not illustrated in the figure may be additionally provided according to a given embodiment. As described in the foregoing, the illustrated USBD fragment has an extended form, and may have fields added to a basic configuration.

The illustrated USBD may have a bundleDescription root element. The bundleDescription root element may have a userServiceDescription element. The userServiceDescription element may correspond to an instance for one service.

The userServiceDescription element may include @serviceId, @atsc:serviceId, @atsc:serviceStatus, @atsc:fullMPDUri, @atsc:sTSIDUri, name, serviceLanguage, atsc: capabilityCode and/or deliveryMethod.

@serviceId can be a globally unique URI that identifies a service, unique within the scope of the BSID. This parameter can be used to link to ESG data (Service@globalServiceID).

@atsc:serviceId is a reference to corresponding service entry in LLS(SLT). The value of this attribute is the same value of serviceId assigned to the entry.

@atsc:serviceStatus can specify the status of this service. The value indicates whether this service is active or inactive. When set to "1" (true), that indicates service is active. When this field is not used, @atsc:serviceStatus may be set to a default value of 1.

@atsc:fullMPDUri can reference an MPD fragment which contains descriptions for contents components of the service delivered over broadcast and optionally, also over broadband.

@atsc:sTSIDUri can reference the S-TSID fragment which provides access related parameters to the Transport sessions carrying contents of this service.

name can indicate name of the service as given by the lang attribute. name element can include lang attribute, which indicating language of the service name. The language can be specified according to XML data types.

serviceLanguage can represent available languages of the service. The language can be specified according to XML data types.

atsc:capabilityCode can specify the capabilities required in the receiver to be able to create a meaningful presentation of the content of this service. According to a given embodiment, this field may specify a predefined capability group. Here, the capability group may be a group of capability attribute values for significant presentation. This field may be omitted according to a given embodiment.

deliveryMethod can be a container of transport related information pertaining to the contents of the service over broadcast and (optionally) broadband modes of access. Referring to data included in the service, when the number of the data is N, delivery schemes for respective data may be described by this element. The deliveryMethod may include an r12:broadcastAppService element and an r12:unicastAppService element. Each lower element may include a basePattern element as a lower element.

r12:broadcastAppService can be a DASH Representation delivered over broadcast, in multiplexed or non-multiplexed form, containing the corresponding media component(s) belonging to the service, across all Periods of the affiliated media presentation. In other words, each of the fields may indicate DASH representation delivered through the broadcast network.

r12:unicastAppService can be a DASH Representation delivered over broadband, in multiplexed or non-multiplexed form, containing the constituent media content component(s) belonging to the service, across all periods of the affiliated media presentation. In other words, each of the fields may indicate DASH representation delivered via broadband.

basePattern can be a character pattern for use by the receiver to match against any portion of the segment URL used by the DASH client to request media segments of a parent representation under its containing period. A match implies that the corresponding requested media segment is carried over broadcast transport. In a URL address for receiving DASH representation expressed by each of the r12:broadcastAppService element and the r12:unicastAppService element, a part of the URL, etc. may have a particular pattern. The pattern may be described by this field. Some data may be distinguished using this information. The proposed default values may vary depending on embodiments. The "use" column illustrated in the figure relates to each field. Here, M may denote an essential field, O may denote an optional field, OD may denote an optional field having a default value, and CM may denote a conditional essential field. 0 . . . 1 to 0 . . . N may indicate the number of available fields.

FIG. 6 illustrates an S-TSID fragment for ROUTE/DASH according to an embodiment of the present invention.

Hereinafter, a description will be given of the S-TSID illustrated in the figure in detail.

S-TSID can be an SLS XML fragment which provides the overall session description information for transport session(s) which carry the content components of a service. The S-TSID is the SLS metadata fragment that contains the overall transport session description information for the zero or more ROUTE sessions and constituent LCT sessions in which the media content components of a service are delivered. The S-TSID also includes file metadata for the delivery object or object flow carried in the LCT sessions of the service, as well as additional information on the payload formats and content components carried in those LCT sessions.

Each instance of the S-TSID fragment is referenced in the USBD fragment by the @atsc:sTSIDUri attribute of the userServiceDescription element. The illustrated S-TSID according to the present embodiment is expressed as an XML document. According to a given embodiment, the S-TSID may be expressed in a binary format or as an XML document.

The illustrated S-TSID may have an S-TSID root element. The S-TSID root element may include @serviceId and/or RS.

@serviceID can be a reference corresponding service element in the USD. The value of this attribute can reference a service with a corresponding value of service_id.

The RS element may have information about a ROUTE session for delivering the service data. Service data or service components may be delivered through a plurality of ROUTE sessions, and thus the number of RS elements may be 1 to N.

The RS element may include @bsid, @slpAddr, @dlpAddr, @dport, @PLPID and/or LS.

@bsid can be an identifier of the broadcast stream within which the content component(s) of the broadcastAppService are carried. When this attribute is absent, the default broadcast stream is the one whose PLPs carry SLS fragments for this service. Its value can be identical to that of the broadcast_stream_id in the SLT.

@slpAddr can indicate source IP address. Here, the source IP address may be a source IP address of a ROUTE session for delivering a service component included in the service. As described in the foregoing, service components of one service may be delivered through a plurality of ROUTE sessions. Thus, the service components may be transmitted using another ROUTE session other than the ROUTE session for delivering the S-TSID. Therefore, this field may be used to indicate the source IP address of the ROUTE session. A default value of this field may be a source IP address of a current ROUTE session. When a service component is delivered through another ROUTE session, and thus the ROUTE session needs to be indicated, a value of this field may be a value of a source IP address of the ROUTE session. In this case, this field may correspond to M, that is, an essential field.

@dlpAddr can indicate destination IP address. Here, a destination IP address may be a destination IP address of a ROUTE session that delivers a service component included in a service. For a similar case to the above description of @slpAddr, this field may indicate a destination IP address of a ROUTE session that delivers a service component. A default value of this field may be a destination IP address of a current ROUTE session. When a service component is delivered through another ROUTE session, and thus the ROUTE session needs to be indicated, a value of this field may be a value of a destination IP address of the ROUTE session. In this case, this field may correspond to M, that is, an essential field.

@dport can indicate destination port. Here, a destination port may be a destination port of a ROUTE session that delivers a service component included in a service. For a similar case to the above description of @slpAddr, this field may indicate a destination port of a ROUTE session that delivers a service component. A default value of this field may be a destination port number of a current ROUTE session. When a service component is delivered through another ROUTE session, and thus the ROUTE session needs to be indicated, a value of this field may be a destination port number value of the ROUTE session. In this case, this field may correspond to M, that is, an essential field.

@PLPID may be an ID of a PLP for a ROUTE session expressed by an RS. A default value may be an ID of a PLP of an LCT session including a current S-TSID. According to a given embodiment, this field may have an ID value of a PLP for an LCT session for delivering an S-TSID in the ROUTE session, and may have ID values of all PLPs for the ROUTE session.

An LS element may have information about an LCT session for delivering a service data. Service data or service components may be delivered through a plurality of LCT sessions, and thus the number of LS elements may be 1 to N.

The LS element may include @tsi, @PLPID, @bw, @startTime, @endTime, SrcFlow and/or RprFlow.

@tsi may indicate a TSI value of an LCT session for delivering a service component of a service.

@PLPID may have ID information of a PLP for the LCT session. This value may be overwritten on a basic ROUTE session value.

@bw may indicate a maximum bandwidth value. @startTime may indicate a start time of the LCT session. @endTime may indicate an end time of the LCT session. A SrcFlow element may describe a source flow of ROUTE. A RprFlow element may describe a repair flow of ROUTE.

The proposed default values may be varied according to an embodiment. The "use" column illustrated in the figure relates to each field. Here, M may denote an essential field, O may denote an optional field, OD may denote an optional field having a default value, and CM may denote a conditional essential field. 0 . . . 1 to 0 . . . N may indicate the number of available fields.

Hereinafter, a description will be given of MPD for ROUTE/DASH.

The MPD is an SLS metadata fragment which contains a formalized description of a DASH Media Presentation, corresponding to a linear service of a given duration defined by the broadcaster (for example a single TV program, or the set of contiguous linear TV programs over a period of time). The contents of the MPD provide the resource identifiers for Segments and the context for the identified resources within the Media Presentation. The data structure and semantics of the MPD fragment can be according to the MPD defined by MPEG DASH.

One or more of the DASH Representations conveyed in the MPD can be carried over broadcast. The MPD may describe additional Representations delivered over broadband, e.g. in the case of a hybrid service, or to support service continuity in handoff from broadcast to broadcast due to broadcast signal degradation (e.g. driving through a tunnel).

FIG. 7 illustrates a USBD/USD fragment for MMT according to an embodiment of the present invention.

MMT SLS for linear services comprises the USBD fragment and the MMT Package (MP) table. The MP table is as described above. The USBD fragment contains service identification, device capabilities information, references to other SLS information required to access the service and constituent media components, and the metadata to enable the receiver to determine the transport mode (broadcast and/or broadband) of the service components. The MP table for MPU components, referenced by the USBD, provides transport session descriptions for the MMTP sessions in which the media content components of a service are delivered and the descriptions of the Assets carried in those MMTP sessions.

The streaming content signaling component of the SLS for MPU components corresponds to the MP table defined in MMT. The MP table provides a list of MMT assets where each asset corresponds to a single service component and the description of the location information for this component.

USBD fragments may also contain references to the S-TSID and the MPD as described above, for service components delivered by the ROUTE protocol and the broadband, respectively. According to a given embodiment, in delivery through MMT, a service component delivered through the ROUTE protocol is NRT data, etc. Thus, in this case, MPD may be unnecessary. In addition, in delivery through MMT, information about an LCT session for delivering a service component, which is delivered via broadband, is unnecessary, and thus an S-TSID may be unnecessary. Here, an MMT package may be a logical collection of media data delivered using MMT. Here, an MMTP packet may refer to a formatted unit of media data delivered using MMT. An MPU may refer to a generic container of independently decodable timed/non-timed data. Here, data in the MPU is media codec agnostic.

Hereinafter, a description will be given of details of the USBD/USD illustrated in the figure.

The illustrated USBD fragment is an example of the present invention, and basic fields of the USBD fragment may be additionally provided according to an embodiment. As described in the foregoing, the illustrated USBD fragment has an extended form, and may have fields added to a basic structure.

The illustrated USBD according to an embodiment of the present invention is expressed as an XML document. According to a given embodiment, the USBD may be expressed in a binary format or as an XML document.

The illustrated USBD may have a bundleDescription root element. The bundleDescription root element may have a userServiceDescription element. The userServiceDescription element may be an instance for one service.

The userServiceDescription element may include @serviceId, @atsc:serviceId, name, serviceLanguage, atsc:capabilityCode, atsc:Channel, atsc:mpuComponent, atsc:routeComponent, atsc:broadbandComponent and/or atsc:ComponentInfo.

Here, @serviceId, @atsc:serviceId, name, serviceLanguage, and atsc:capabilityCode may be as described above. The lang field below the name field may be as described above. atsc:capabilityCode may be omitted according to a given embodiment.

The userServiceDescription element may further include an atsc:contentAdvisoryRating element according to an embodiment. This element may be an optional element. atsc:contentAdvisoryRating can specify the content advisory rating. This field is not illustrated in the figure.

atsc:Channel may have information about a channel of a service. The atsc:Channel element may include @atsc:majorChannelNo, @atsc:minorChannelNo, @atsc:serviceLang, @atsc:serviceGenre, @atsc:serviceIcon and/or atsc:ServiceDescription. @atsc:majorChannelNo, @atsc:minorChannelNo, and @atsc:serviceLang may be omitted according to a given embodiment.

@atsc:majorChannelNo is an attribute that indicates the major channel number of the service.

@atsc:minorChannelNo is an attribute that indicates the minor channel number of the service.

@atsc:serviceLang is an attribute that indicates the primary language used in the service.

@atsc:serviceGenre is an attribute that indicates primary genre of the service.

@atsc:serviceIcon is an attribute that indicates the Uniform Resource Locator (URL) for the icon used to represent this service.

atsc:ServiceDescription includes service description, possibly in multiple languages. atsc:ServiceDescription includes can include @atsc:serviceDescrText and/or @atsc:serviceDescrLang.

@atsc:serviceDescrText is an attribute that indicates description of the service.

@atsc:serviceDescrLang is an attribute that indicates the language of the serviceDescrText attribute above.

atsc:mpuComponent may have information about a content component of a service delivered in a form of an MPU. atsc:mpuComponent may include @atsc:mmtPackageId and/or @atsc:nextMmtPackageId.

@atsc:mmtPackageId can reference a MMT Package for content components of the service delivered as MPUs.

@atsc:nextMmtPackageId can reference a MMT Package to be used after the one referenced by @atsc:mmtPackageId in time for content components of the service delivered as MPUs.

atsc:routeComponent may have information about a content component of a service delivered through ROUTE. atsc:routeComponent may include @atsc:sTSIDUri, @sTSIDPlpId, @sTSIDDestinationIpAddress, @sTSIDDestinationUdpPort, @sTSIDSourceIpAddress, @sTSIDMajorProtocolVersion and/or @sTSIDMinorProtocolVersion.

@atsc:sTSIDUri can be a reference to the S-TSID fragment which provides access related parameters to the Transport sessions carrying contents of this service. This field may be the same as a URI for referring to an S-TSID in USBD for ROUTE described above. As described in the foregoing, in service delivery by the MMTP, service components, which are delivered through NRT, etc., may be delivered by ROUTE. This field may be used to refer to the S-TSID therefor.

@sTSIDPlpId can be a string representing an integer number indicating the PLP ID of the physical layer pipe carrying the S-TSID for this service. (default: current physical layer pipe).

@sTSIDDestinationIpAddress can be a string containing the dotted-IPv4 destination address of the packets carrying S-TSID for this service. (default: current MMTP session's source IP address)

@sTSIDDestinationUdpPort can be a string containing the port number of the packets carrying S-TSID for this service.

@sTSIDSourceIpAddress can be a string containing the dotted-IPv4 source address of the packets carrying S-TSID for this service.

@sTSIDMajorProtocolVersion can indicate major version number of the protocol used to deliver the S-TSID for this service. Default value is 1.

@sTSIDMinorProtocolVersion can indicate minor version number of the protocol used to deliver the S-TSID for this service. Default value is 0.

atsc:broadbandComponent may have information about a content component of a service delivered via broadband. In other words, atsc:broadbandComponent may be a field on the assumption of hybrid delivery. atsc:broadbandComponent may further include @atsc:fullfMPDUri.

@atsc:fullfMPDUri can be a reference to an MPD fragment which contains descriptions for contents components of the service delivered over broadband.

An atsc:ComponentInfo field may have information about an available component of a service. The atsc:ComponentInfo field may have information about a type, a role, a name, etc. of each component. The number of atsc:ComponentInfo fields may correspond to the number (N) of respective components. The atsc:ComponentInfo field may include @atsc:componentType, @atsc:componentRole, @atsc:componentProtectedFlag, @atsc:componentId and/or @atsc:componentName.

@atsc:componentType is an attribute that indicates the type of this component. Value of 0 indicates an audio component. Value of 1 indicates a video component. Value of 2 indicated a closed caption component. Value of 3 indicates an application component. Values 4 to 7 are reserved. A meaning of a value of this field may be differently set depending on embodiments.

@atsc:componentRole is an attribute that indicates the role or kind of this component.

For audio (when componentType attribute above is equal to 0): values of componentRole attribute are as follows: 0=Complete main, 1=Music and Effects, 2=Dialog, 3=Commentary, 4=Visually Impaired, 5=Hearing Impaired, 6=Voice-Over, 7-254=reserved, 255=unknown.

For video (when componentType attribute above is equal to 1) values of componentRole attribute are as follows: 0=Primary video, 1=Alternative camera view, 2=Other alternative video component, 3=Sign language inset, 4=Follow subject video, 5=3D video left view, 6=3D video right view, 7=3D video depth information, 8=Part of video array <x,y> of <n,m>, 9=Follow-Subject metadata, 10-254=reserved, 255=unknown.

For Closed Caption component (when componentType attribute above is equal to 2) values of componentRole attribute are as follows: 0=Normal, 1=Easy reader, 2-254=reserved, 255=unknown.

When componentType attribute above is between 3 to 7, inclusive, the componentRole can be equal to 255. A meaning of a value of this field may be differently set depending on embodiments.

@atsc:componentProtectedFlag is an attribute that indicates if this component is protected (e.g. encrypted). When this flag is set to a value of 1 this component is protected (e.g. encrypted). When this flag is set to a value of 0 this component is not protected (e.g. encrypted). When not present the value of componentProtectedFlag attribute is inferred to be equal to 0. A meaning of a value of this field may be differently set depending on embodiments.

@atsc:componentId is an attribute that indicates the identifier of this component. The value of this attribute can be the same as the asset_id in the MP table corresponding to this component.

@atsc:componentName is an attribute that indicates the human readable name of this component.

The proposed default values may vary depending on embodiments. The "use" column illustrated in the figure relates to each field. Here, M may denote an essential field, O may denote an optional field, OD may denote an optional field having a default value, and CM may denote a conditional essential field. 0 . . . 1 to 0 . . . N may indicate the number of available fields.

Hereinafter, a description will be given of MPD for MMT.

The Media Presentation Description is an SLS metadata fragment corresponding to a linear service of a given duration defined by the broadcaster (for example a single TV program, or the set of contiguous linear TV programs over a period of time). The contents of the MPD provide the resource identifiers for segments and the context for the identified resources within the media presentation. The data structure and semantics of the MPD can be according to the MPD defined by MPEG DASH.

In the present embodiment, an MPD delivered by an MMTP session describes Representations delivered over broadband, e.g. in the case of a hybrid service, or to support service continuity in handoff from broadcast to broadband due to broadcast signal degradation (e.g. driving under a mountain or through a tunnel).

Hereinafter, a description will be given of an MMT signaling message for MMT.

When MMTP sessions are used to carry a streaming service, MMT signaling messages defined by MMT are delivered by MMTP packets according to signaling message mode defined by MMT. The value of the packet_id field of MMTP packets carrying service layer signaling is set to '00' except for MMTP packets carrying MMT signaling messages specific to an asset, which can be set to the same packet_id value as the MMTP packets carrying the asset. Identifiers referencing the appropriate package for each service are signaled by the USBD fragment as described above. MMT Package Table (MPT) messages with matching MMT_package_id can be delivered on the MMTP session signaled in the SLT. Each MMTP session carries MMT signaling messages specific to its session or each asset delivered by the MMTP session.

In other words, it is possible to access USBD of the MMTP session by specifying an IP destination address/port number, etc. of a packet having the SLS for a particular service in the SLT. As described in the foregoing, a packet ID of an MMTP packet carrying the SLS may be designated as a particular value such as 00, etc. It is possible to access an MPT message having a matched packet ID using the above-described package IP information of USBD. As described below, the MPT message may be used to access each service component/asset.

The following MMTP messages can be delivered by the MMTP session signaled in the SLT.

MMT Package Table (MPT) message: This message carries an MP (MMT Package) table which contains the list of all Assets and their location information as defined by MMT. If an Asset is delivered by a PLP different from the current PLP delivering the MP table, the identifier of the PLP carrying the asset can be provided in the MP table using physical layer pipe identifier descriptor. The physical layer pipe identifier descriptor will be described below.

MMT ATSC3 (MA3) message mmt_atsc3_message( ): This message carries system metadata specific for services including service layer signaling as described above. mmt_atsc3_message( ) will be described below.

The following MMTP messages can be delivered by the MMTP session signaled in the SLT, if required.

Media Presentation Information (MPI) message: This message carries an MPI table which contains the whole document or a subset of a document of presentation information. An MP table associated with the MPI table also can be delivered by this message.

Clock Relation Information (CRI) message: This message carries a CRI table which contains clock related information for the mapping between the NTP timestamp and the MPEG-2 STC. According to a given embodiment, the CRI message may not be delivered through the MMTP session.

The following MMTP messages can be delivered by each MMTP session carrying streaming content.

Hypothetical Receiver Buffer Model message: This message carries information required by the receiver to manage its buffer.

Hypothetical Receiver Buffer Model Removal message: This message carries information required by the receiver to manage its MMT de-capsulation buffer.

Hereinafter, a description will be given of mmt_atsc3_message( ) corresponding to one of MMT signaling messages. An MMT Signaling message mmt_atsc3_message( ) is defined to deliver information specific to services according to the present invention described above. The signaling message may include message ID, version, and/or length fields corresponding to basic fields of the MMT signaling message. A payload of the signaling message may include service ID information, content type information, content version information, content compression information and/or URI information. The content type information may indicate a type of data included in the payload of the signaling message. The content version information may indicate a version of data included in the payload, and the content compression information may indicate a type of compression applied to the data. The URI information may have URI information related to content delivered by the message.

Hereinafter, a description will be given of the physical layer pipe identifier descriptor.

The physical layer pipe identifier descriptor is a descriptor that can be used as one of descriptors of the MP table described above. The physical layer pipe identifier descriptor provides information about the PLP carrying an asset. If an asset is delivered by a PLP different from the current PLP delivering the MP table, the physical layer pipe identifier descriptor can be used as an asset descriptor in the associated MP table to identify the PLP carrying the asset. The physical layer pipe identifier descriptor may further include BSID information in addition to PLP ID information. The BSID may be an ID of a broadcast stream that delivers an MMTP packet for an asset described by the descriptor.

FIG. 8 illustrates a link layer protocol architecture according to an embodiment of the present invention.

Hereinafter, a link layer will be described.

The link layer is the layer between the physical layer and the network layer, and transports the data from the network layer to the physical layer at the sending side and transports the data from the physical layer to the network layer at the receiving side. The purpose of the link layer includes abstracting all input packet types into a single format for processing by the physical layer, ensuring flexibility and future extensibility for as yet undefined input types. In addition, processing within the link layer ensures that the input data can be transmitted in an efficient manner, for example by providing options to compress redundant information in the headers of input packets. The operations of encapsulation, compression and so on are referred to as the link layer protocol and packets created using this protocol are called link layer packets. The link layer may perform functions such as packet encapsulation, overhead reduction and/or signaling transmission, etc.

Hereinafter, packet encapsulation will be described. Link layer protocol allows encapsulation of any type of packet, including ones such as IP packets and MPEG-2 TS. Using link layer protocol, the physical layer need only process one single packet format, independent of the network layer protocol type (here we consider MPEG-2 TS packet as a kind of network layer packet.) Each network layer packet or input packet is transformed into the payload of a generic link layer packet. Additionally, concatenation and segmentation can be performed in order to use the physical layer resources efficiently when the input packet sizes are particularly small or large.

As described in the foregoing, segmentation may be used in packet encapsulation. When the network layer packet is too large to process easily in the physical layer, the network layer packet is divided into two or more segments. The link layer packet header includes protocol fields to perform segmentation on the sending side and reassembly on the receiving side. When the network layer packet is segmented, each segment can be encapsulated to link layer packet in the same order as original position in the network layer packet. Also each link layer packet which includes a segment of network layer packet can be transported to PHY layer consequently.

As described in the foregoing, concatenation may be used in packet encapsulation. When the network layer packet is small enough for the payload of a link layer packet to include several network layer packets, the link layer packet header includes protocol fields to perform concatenation. The concatenation is combining of multiple small sized network layer packets into one payload. When the network layer packets are concatenated, each network layer packet can be concatenated to payload of link layer packet in the same order as original input order. Also each packet which constructs a payload of link layer packet can be whole packet, not a segment of packet.

Hereinafter, overhead reduction will be described. Use of the link layer protocol can result in significant reduction in overhead for transport of data on the physical layer. The link layer protocol according to the present invention may provide IP overhead reduction and/or MPEG-2 TS overhead reduction. In IP overhead reduction, IP packets have a fixed header format, however some of the information which is needed in a communication environment may be redundant in a broadcast environment. Link layer protocol provides mechanisms to reduce the broadcast overhead by compressing headers of IP packets. In MPEG-2 TS overhead reduction, link layer protocol provides sync byte removal, null packet deletion and/or common header removal (compression). First, sync byte removal provides an overhead reduction of one byte per TS packet, secondly a null packet deletion mechanism removes the 188 byte null TS packets in a manner that they can be re-inserted at the receiver and finally a common header removal mechanism.

For signaling transmission, in the link layer protocol, a particular format for the signaling packet may be provided for link layer signaling, which will be described below.

In the illustrated link layer protocol architecture according to an embodiment of the present invention, link layer protocol takes as input network layer packets such as IPv4, MPEG-2 TS and so on as input packets. Future extension indicates other packet types and protocol which is also possible to be input in link layer. Link layer protocol also specifies the format and signaling for any link layer signaling, including information about mapping to specific channel to the physical layer. Figure also shows how ALP incorporates mechanisms to improve the efficiency of transmission, via various header compression and deletion algorithms. In addition, the link layer protocol may basically encapsulate input packets.

FIG. 9 illustrates a structure of a base header of a link layer packet according to an embodiment of the present invention. Hereinafter, the structure of the header will be described.

A link layer packet can include a header followed by the data payload. The header of a link layer packet can include a base header, and may include an additional header depending on the control fields of the base header. The presence of an optional header is indicated from flag fields of the additional header. According to a given embodiment, a field indicating the presence of an additional header and an optional header may be positioned in the base header.

Hereinafter, the structure of the base header will be described. The base header for link layer packet encapsulation has a hierarchical structure. The base header can be two bytes in length and is the minimum length of the link layer packet header.

The illustrated base header according to the present embodiment may include a Packet_Type field, a PC field and/or a length field. According to a given embodiment, the base header may further include an HM field or an S/C field.

Packet_Type field can be a 3-bit field that indicates the original protocol or packet type of the input data before encapsulation into a link layer packet. An IPv4 packet, a compressed IP packet, a link layer signaling packet, and other types of packets may have the base header structure and may be encapsulated. However, according to a given embodiment, the MPEG-2 TS packet may have a different particular structure, and may be encapsulated. When the value of Packet_Type is "000", "001" "100" or "111", that is the original data type of an ALP packet is one of an IPv4 packet, a compressed IP packet, link layer signaling or extension packet. When the MPEG-2 TS packet is encapsulated, the value of Packet_Type can be "010". Other values of the Packet_Type field may be reserved for future use.

Payload_Configuration (PC) field can be a 1-bit field that indicates the configuration of the payload. A value of 0 can indicate that the link layer packet carries a single, whole input packet and the following field is the Header_Mode field. A value of 1 can indicate that the link layer packet carries more than one input packet (concatenation) or a part of a large input packet (segmentation) and the following field is the Segmentation_Concatenation field.

Header Mode (HM) field can be a 1-bit field, when set to 0, that can indicate there is no additional header, and that the length of the payload of the link layer packet is less than 2048 bytes. This value may be varied depending on embodiments. A value of 1 can indicate that an additional header for single packet defined below is present following the Length field. In this case, the length of the payload is larger than 2047 bytes and/or optional features can be used (sub stream identification, header extension, etc.). This value may be varied depending on embodiments. This field can be present only when Payload_Configuration field of the link layer packet has a value of 0.

Segmentation_Concatenation (S/C) field can be a 1-bit field, when set to 0, that can indicate that the payload carries a segment of an input packet and an additional header for segmentation defined below is present following the Length field. A value of 1 can indicate that the payload carries more than one complete input packet and an additional header for concatenation defined below is present following the Length field. This field can be present only when the value of Payload_Configuration field of the ALP packet is 1.

Length field can be a 11-bit field that indicates the 11 least significant bits (LSBs) of the length in bytes of payload carried by the link layer packet. When there is a Length_MSB field in the following additional header, the length field is concatenated with the Length_MSB field, and is the LSB to provide the actual total length of the payload. The number of bits of the length field may be changed to another value rather than 11 bits.

Following types of packet configuration are thus possible: a single packet without any additional header, a single packet with an additional header, a segmented packet and a concatenated packet. According to a given embodiment, more packet configurations may be made through a combination of each additional header, an optional header, an additional header for signaling information to be described below, and an additional header for time extension.

FIG. 10 illustrates a structure of an additional header of a link layer packet according to an embodiment of the present invention.

Various types of additional headers may be present. Hereinafter, a description will be given of an additional header for a single packet.

This additional header for single packet can be present when Header_Mode (HM)="1". The Header_Mode (HM) can be set to 1 when the length of the payload of the link layer packet is larger than 2047 bytes or when the optional fields are used. The additional header for single packet is shown in Figure (tsib10010).

Length_MSB field can be a 5-bit field that can indicate the most significant bits (MSBs) of the total payload length in bytes in the current link layer packet, and is concatenated with the Length field containing the 11 least significant bits (LSBs) to obtain the total payload length. The maximum length of the payload that can be signaled is therefore 65535 bytes. The number of bits of the length field may be changed to another value rather than 11 bits. In addition, the number of bits of the Length_MSB field may be changed, and thus a maximum expressible payload length may be changed. According to a given embodiment, each length field may indicate a length of a whole link layer packet rather than a payload.

SIF (Sub stream Identifier Flag) field can be a 1-bit field that can indicate whether the sub stream ID (SID) is present after the HEF field or not. When there is no SID in this link layer packet, SIF field can be set to 0. When there is a SID after HEF field in the link layer packet, SIF can be set to 1. The detail of SID is described below.

HEF (Header Extension Flag) field can be a 1-bit field that can indicate, when set to 1 additional header is present for future extension. A value of 0 can indicate that this extension header is not present.

Hereinafter, a description will be given of an additional header when segmentation is used.

This additional header (tsib10020) can be present when Segmentation_Concatenation (S/C)="0". Segment_Sequence_Number can be a 5-bit unsigned integer that can indicate the order of the corresponding segment carried by the link layer packet. For the link layer packet which carries the first segment of an input packet, the value of this field can be set to 0x0. This field can be incremented by one with each additional segment belonging to the segmented input packet.

Last_Segment_Indicator (LSI) can be a 1-bit field that can indicate, when set to 1, that the segment in this payload is the last one of input packet. A value of 0, can indicate that it is not last segment.

SIF (Sub stream Identifier Flag) can be a 1-bit field that can indicate whether the SID is present after the HEF field or not. When there is no SID in the link layer packet, SIF field can be set to 0. When there is a SID after the HEF field in the link layer packet, SIF can be set to 1.

HEF (Header Extension Flag) can be a This 1-bit field that can indicate, when set to 1, that the optional header extension is present after the additional header for future extensions of the link layer header. A value of 0 can indicate that optional header extension is not present.

According to a given embodiment, a packet ID field may be additionally provided to indicate that each segment is generated from the same input packet. This field may be unnecessary and thus be omitted when segments are transmitted in order.

Hereinafter, a description will be given of an additional header when concatenation is used.

This additional header (tsib10030) can be present when Segmentation_Concatenation (S/C)="1".

Length_MSB can be a 4-bit field that can indicate MSB bits of the payload length in bytes in this link layer packet. The maximum length of the payload is 32767 bytes for concatenation. As described in the foregoing, a specific numeric value may be changed.

Count can be a field that can indicate the number of the packets included in the link layer packet. The number of the packets included in the link layer packet, 2 can be set to this field. So, its maximum value of concatenated packets in a link layer packet is 9. A scheme in which the count field indicates the number may be varied depending on embodiments. That is, the numbers from 1 to 8 may be indicated.

HEF (Header Extension Flag) can be a 1-bit field that can indicate, when set to 1 the optional header extension is present after the additional header for future extensions of the link layer header. A value of 0, can indicate extension header is not present.

Component_Length can be a 12-bit length field that can indicate the length in byte of each packet. Component_Length fields are included in the same order as the packets present in the payload except last component packet. The number of length field can be indicated by (Count+1). According to a given embodiment, length fields, the number of which is the same as a value of the count field, may be present. When a link layer header consists of an odd number of Component_Length, four stuffing bits can follow after the last Component_Length field. These bits can be set to 0. According to a given embodiment, a Component_length field indicating a length of a last concatenated input packet may not be present. In this case, the length of the last concatenated input packet may correspond to a length obtained by subtracting a sum of values indicated by respective Component_length fields from a whole payload length.

Hereinafter, the optional header will be described.

As described in the foregoing, the optional header may be added to a rear of the additional header. The optional header field can contain SID and/or header extension. The SID is used to filter out specific packet stream in the link layer level. One example of SID is the role of service identifier in a link layer stream carrying multiple services. The mapping information between a service and the SID value corresponding to the service can be provided in the SLT, if applicable. The header extension contains extended field for future use. Receivers can ignore any header extensions which they do not understand.

SID (Sub stream Identifier) can be a 8-bit field that can indicate the sub stream identifier for the link layer packet. If there is optional header extension, SID present between additional header and optional header extension.

Header_Extension ( ) can include the fields defined below.

Extension_Type can be an 8-bit field that can indicate the type of the Header_Extension ( ).

Extension_Length can be an 8-bit field that can indicate the length of the Header Extension ( ) in bytes counting from the next byte to the last byte of the Header_Extension ( ).

Extension_Byte can be a byte representing the value of the Header_Extension ( ).

Figure 11:
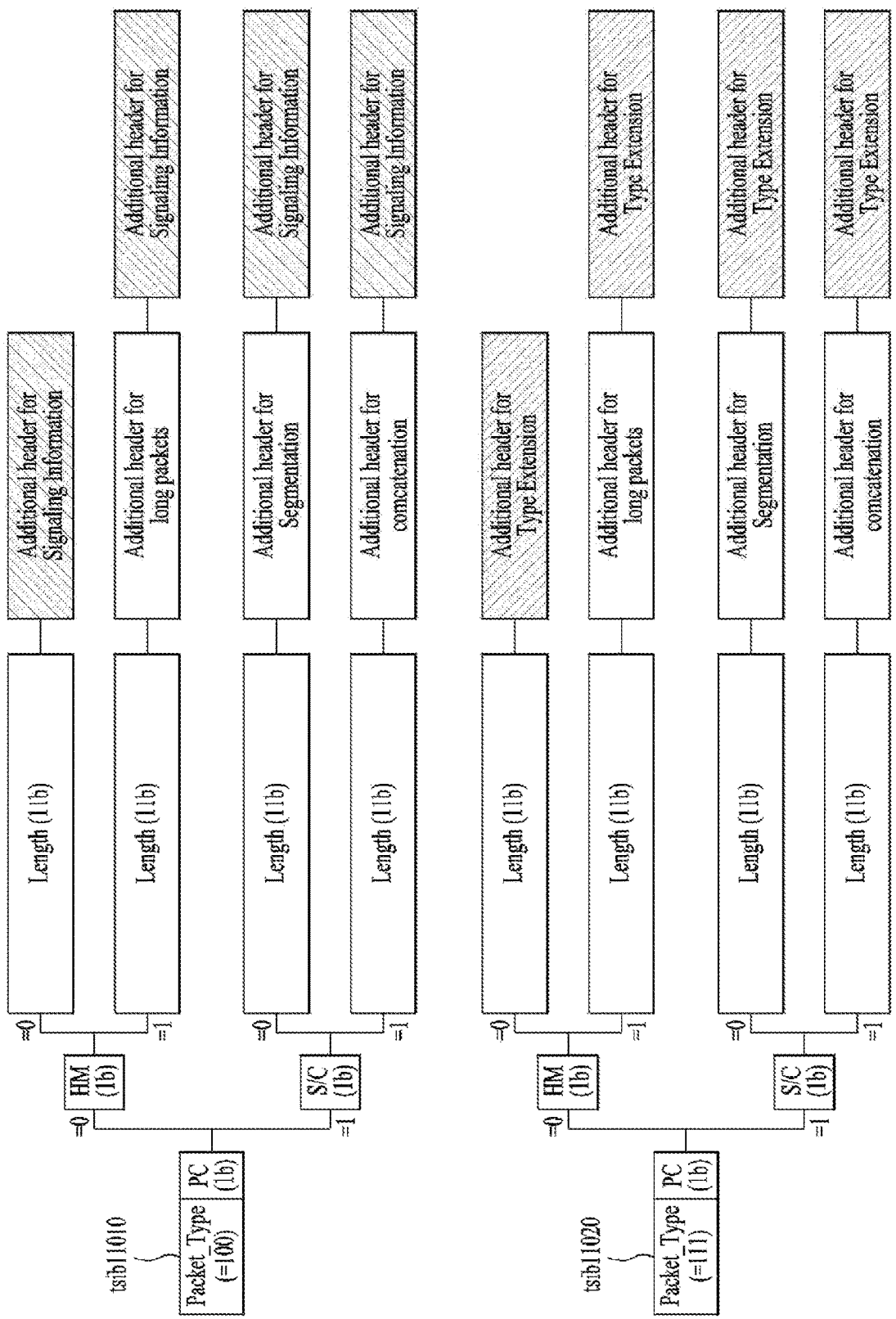
FIG. 11 illustrates a structure of an additional header of a link layer packet according to another embodiment of the present invention.

FIG. 11 illustrates a structure of an additional header of a link layer packet according to another embodiment of the present invention.

Hereinafter, a description will be given of an additional header for signaling information.

How link layer signaling is incorporated into link layer packets are as follows. Signaling packets are identified by when the Packet_Type field of the base header is equal to 100.

Figure (tsib11010) shows the structure of the link layer packets containing additional header for signaling information. In addition to the link layer header, the link layer packet can consist of two additional parts, additional header for signaling information and the actual signaling data itself. The total length of the link layer signaling packet is shown in the link layer packet header.

The additional header for signaling information can include following fields. According to a given embodiment, some fields may be omitted.

Signaling_Type can be an 8-bit field that can indicate the type of signaling.

Signaling_Type_Extension can be a 16-bit filed that can indicate the attribute of the signaling. Detail of this field can be defined in signaling specification.

Signaling_Version can be an 8-bit field that can indicate the version of signaling.

Signaling_Format can be a 2-bit field that can indicate the data format of the signaling data. Here, a signaling format may refer to a data format such as a binary format, an XML format, etc.

Signaling_Encoding can be a 2-bit field that can specify the encoding/compression format. This field may indicate whether compression is not performed and which type of compression is performed.

Hereinafter, a description will be given of an additional header for packet type extension.

In order to provide a mechanism to allow an almost unlimited number of additional protocol and packet types to be carried by link layer in the future, the additional header is defined. Packet type extension can be used when Packet_type is 111 in the base header as described above. Figure (tsib11020) shows the structure of the link layer packets containing additional header for type extension.

The additional header for type extension can include following fields. According to a given embodiment, some fields may be omitted.

extended_type can be a 16-bit field that can indicate the protocol or packet type of the input encapsulated in the link layer packet as payload. This field cannot be used for any protocol or packet type already defined by Packet_Type field.

Figure 12:
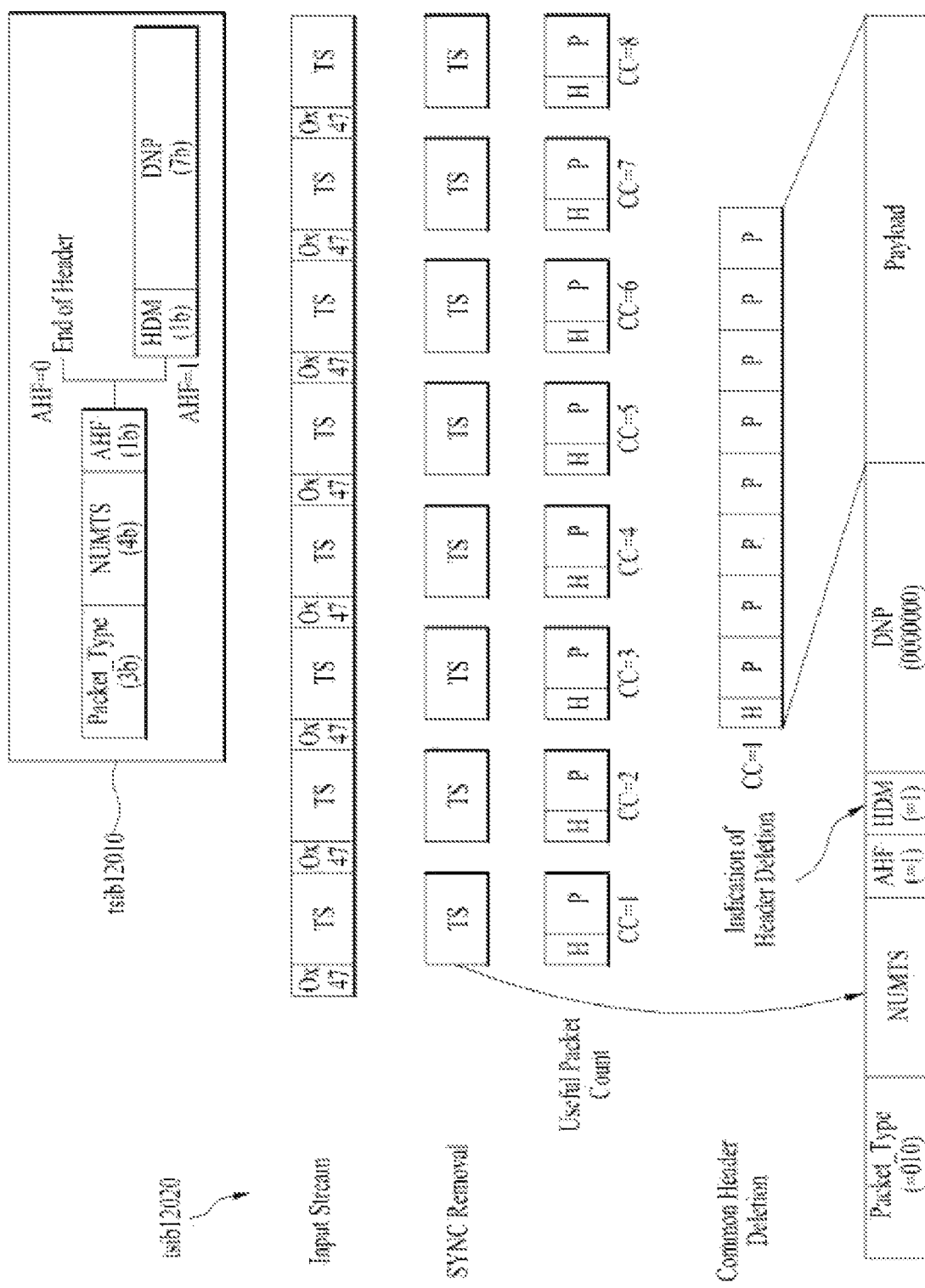
FIG. 12 illustrates a header structure of a link layer packet for an MPEG-2 TS packet and an encapsulation process thereof according to an embodiment of the present invention.

FIG. 12 illustrates a header structure of a link layer packet for an MPEG-2 TS packet and an encapsulation process thereof according to an embodiment of the present invention.

Hereinafter, a description will be given of a format of the link layer packet when the MPEG-2 TS packet is input as an input packet.

In this case, the Packet_Type field of the base header is equal to 010. Multiple TS packets can be encapsulated within each link layer packet. The number of TS packets is signaled via the NUMTS field. In this case, as described in the foregoing, a particular link layer packet header format may be used.

Link layer provides overhead reduction mechanisms for MPEG-2 TS to enhance the transmission efficiency. The sync byte (0x47) of each TS packet can be deleted. The option to delete NULL packets and similar TS headers is also provided.

In order to avoid unnecessary transmission overhead, TS null packets (PID=0x1FFF) may be removed. Deleted null packets can be recovered in receiver side using DNP field.

The DNP field indicates the count of deleted null packets. Null packet deletion mechanism using DNP field is described below.

In order to achieve more transmission efficiency, similar header of MPEG-2 TS packets can be removed. When two or more successive TS packets have sequentially increased continuity counter fields and other header fields are the same, the header is sent once at the first packet and the other headers are deleted. HDM field can indicate whether the header deletion is performed or not. Detailed procedure of common TS header deletion is described below.

When all three overhead reduction mechanisms are performed, overhead reduction can be performed in sequence of sync removal, null packet deletion, and common header deletion. According to a given embodiment, a performance order of respective mechanisms may be changed. In addition, some mechanisms may be omitted according to a given embodiment.

The overall structure of the link layer packet header when using MPEG-2 TS packet encapsulation is depicted in Figure (tsib12010).

Hereinafter, a description will be given of each illustrated field. Packet_Type can be a 3-bit field that can indicate the protocol type of input packet as describe above. For MPEG-2 TS packet encapsulation, this field can always be set to 010.

NUMTS (Number of TS packets) can be a 4-bit field that can indicate the number of TS packets in the payload of this link layer packet. A maximum of 16 TS packets can be supported in one link layer packet. The value of NUMTS=0 can indicate that 16 TS packets are carried by the payload of the link layer packet. For all other values of NUMTS, the same number of TS packets are recognized, e.g. NUMTS=0001 means one TS packet is carried.

AHF (Additional Header Flag) can be a field that can indicate whether the additional header is present of not. A value of 0 indicates that there is no additional header. A value of 1 indicates that an additional header of length 1-byte is present following the base header. If null TS packets are deleted or TS header compression is applied this field can be set to 1. The additional header for TS packet encapsulation consists of the following two fields and is present only when the value of AHF in this link layer packet is set to 1.

HDM (Header Deletion Mode) can be a 1-bit field that indicates whether TS header deletion can be applied to this link layer packet. A value of 1 indicates that TS header deletion can be applied. A value of "0" indicates that the TS header deletion method is not applied to this link layer packet.

DNP (Deleted Null Packets) can be a 7-bit field that indicates the number of deleted null TS packets prior to this link layer packet. A maximum of 128 null TS packets can be deleted. When HDM=0 the value of DNP=0 can indicate that 128 null packets are deleted. When HDM=1 the value of DNP=0 can indicate that no null packets are deleted. For all other values of DNP, the same number of null packets are recognized, e.g. DNP=5 means 5 null packets are deleted.

The number of bits of each field described above may be changed. According to the changed number of bits, a minimum/maximum value of a value indicated by the field may be changed. These numbers may be changed by a designer.

Hereinafter, SYNC byte removal will be described.

When encapsulating TS packets into the payload of a link layer packet, the SYNC byte (0x47) from the start of each TS packet can be deleted. Hence the length of the MPEG2-TS packet encapsulated in the payload of the link layer packet is always of length 187 bytes (instead of 188 bytes originally).

Hereinafter, null packet deletion will be described.

Transport Stream rules require that bit rates at the output of a transmitter's multiplexer and at the input of the receiver's de-multiplexer are constant in time and the end-to-end delay is also constant. For some Transport Stream input signals, null packets may be present in order to accommodate variable bitrate services in a constant bitrate stream. In this case, in order to avoid unnecessary transmission overhead, TS null packets (that is TS packets with PID=0x1FFF) may be removed. The process is carried-out in a way that the removed null packets can be re-inserted in the receiver in the exact place where they were originally, thus guaranteeing constant bitrate and avoiding the need for PCR time stamp updating.

Before generation of a link layer packet, a counter called DNP (Deleted Null-Packets) can first be reset to zero and then incremented for each deleted null packet preceding the first non-null TS packet to be encapsulated into the payload of the current link layer packet. Then a group of consecutive useful TS packets is encapsulated into the payload of the current link layer packet and the value of each field in its header can be determined. After the generated link layer packet is injected to the physical layer, the DNP is reset to zero. When DNP reaches its maximum allowed value, if the next packet is also a null packet, this null packet is kept as a useful packet and encapsulated into the payload of the next link layer packet. Each link layer packet can contain at least one useful TS packet in its payload.

Hereinafter, TS packet header deletion will be described. TS packet header deletion may be referred to as TS packet header compression.

When two or more successive TS packets have sequentially increased continuity counter fields and other header fields are the same, the header is sent once at the first packet and the other headers are deleted. When the duplicated MPEG-2 TS packets are included in two or more successive TS packets, header deletion cannot be applied in transmitter side. HDM field can indicate whether the header deletion is performed or not. When TS header deletion is performed, HDM can be set to 1. In the receiver side, using the first packet header, the deleted packet headers are recovered, and the continuity counter is restored by increasing it in order from that of the first header.

An example tsib12020 illustrated in the figure is an example of a process in which an input stream of a TS packet is encapsulated into a link layer packet. First, a TS stream including TS packets having SYNC byte (0x47) may be input. First, sync bytes may be deleted through a sync byte deletion process. In this example, it is presumed that null packet deletion is not performed.

Here, it is presumed that packet headers of eight TS packets have the same field values except for CC, that is, a continuity counter field value. In this case, TS packet deletion/compression may be performed. Seven remaining TS packet headers are deleted except for a first TS packet header corresponding to CC=1. The processed TS packets may be encapsulated into a payload of the link layer packet.

In a completed link layer packet, a Packet_Type field corresponds to a case in which TS packets are input, and thus may have a value of 010. A NUMTS field may indicate the number of encapsulated TS packets. An AHF field may be set to 1 to indicate the presence of an additional header since packet header deletion is performed. An HDM field may be set to 1 since header deletion is performed. DNP may be set to 0 since null packet deletion is not performed.

FIG. 13 illustrates an example of adaptation modes in IP header compression according to an embodiment of the present invention (transmitting side).

Hereinafter, IP header compression will be described.

In the link layer, IP header compression/decompression scheme can be provided. IP header compression can include two parts: header compressor/decompressor and adaptation module. The header compression scheme can be based on the Robust Header Compression (RoHC). In addition, for broadcasting usage, adaptation function is added.

In the transmitter side, ROHC compressor reduces the size of header for each packet. Then, adaptation module extracts context information and builds signaling information from each packet stream. In the receiver side, adaptation module parses the signaling information associated with the received packet stream and attaches context information to the received packet stream. ROHC decompressor reconstructs the original IP packet by recovering the packet header.

The header compression scheme can be based on the RoHC as described above. In particular, in the present system, an RoHC framework can operate in a unidirctional mode (U mode) of the RoHC. In addition, in the present system, it is possible to use an RoHC UDP header compression profile which is identified by a profile identifier of 0x0002.

Hereinafter, adaptation will be described.

In case of transmission through the unidirectional link, if a receiver has no information of context, decompressor cannot recover the received packet header until receiving full context. This may cause channel change delay and turn on delay. For this reason, context information and configuration parameters between compressor and decompressor can be always sent with packet flow.

The Adaptation function provides out-of-band transmission of the configuration parameters and context information. Out-of-band transmission can be done through the link layer signaling. Therefore, the adaptation function is used to reduce the channel change delay and decompression error due to loss of context information.

Hereinafter, extraction of context information will be described.

Context information may be extracted using various schemes according to adaptation mode. In the present invention, three examples will be described below. The scope of the present invention is not restricted to the examples of the adaptation mode to be described below. Here, the adaptation mode may be referred to as a context extraction mode.

Adaptation Mode 1 (not illustrated) may be a mode in which no additional operation is applied to a basic RoHC packet stream. In other words, the adaptation module may operate as a buffer in this mode. Therefore, in this mode, context information may not be included in link layer signaling In Adaptation Mode 2 (tsib13010), the adaptation module can detect the IR packet from ROHC packet flow and extract the context information (static chain). After extracting the context information, each IR packet can be converted to an IR-DYN packet. The converted IR-DYN packet can be included and transmitted inside the ROHC packet flow in the same order as IR packet, replacing the original packet.

In Adaptation Mode 3 (tsib13020), the adaptation module can detect the IR and IR-DYN packet from ROHC packet flow and extract the context information. The static chain and dynamic chain can be extracted from IR packet and dynamic chain can be extracted from IR-DYN packet. After extracting the context information, each IR and IR-DYN packet can be converted to a compressed packet. The compressed packet format can be the same with the next packet of IR or IR-DYN packet. The converted compressed packet can be included and transmitted inside the ROHC packet flow in the same order as IR or IR-DYN packet, replacing the original packet.

Signaling (context) information can be encapsulated based on transmission structure. For example, context information can be encapsulated to the link layer signaling. In this case, the packet type value can be set to "100".

In the above-described Adaptation Modes 2 and 3, a link layer packet for context information may have a packet type field value of 100. In addition, a link layer packet for compressed IP packets may have a packet type field value of 001. The values indicate that each of the signaling information and the compressed IP packets are included in the link layer packet as described above.

Hereinafter, a description will be given of a method of transmitting the extracted context information.

The extracted context information can be transmitted separately from ROHC packet flow, with signaling data through specific physical data path. The transmission of context depends on the configuration of the physical layer path. The context information can be sent with other link layer signaling through the signaling data pipe.

In other words, the link layer packet having the context information may be transmitted through a signaling PLP together with link layer packets having other link layer signaling information (Packet_Type=100). Compressed IP packets from which context information is extracted may be transmitted through a general PLP (Packet_Type=001). Here, depending on embodiments, the signaling PLP may refer to an L1 signaling path. In addition, depending on embodiments, the signaling PLP may not be separated from the general PLP, and may refer to a particular and general PLP through which the signaling information is transmitted.

At a receiving side, prior to reception of a packet stream, a receiver may need to acquire signaling information. When receiver decodes initial PLP to acquire the signaling information, the context signaling can be also received. After the signaling acquisition is done, the PLP to receive packet stream can be selected. In other words, the receiver may acquire the signaling information including the context information by selecting the initial PLP. Here, the initial PLP may be the above-described signaling PLP. Thereafter, the receiver may select a PLP for acquiring a packet stream. In this way, the context information may be acquired prior to reception of the packet stream.

After the PLP for acquiring the packet stream is selected, the adaptation module can detect IR-DYN packet form received packet flow. Then, the adaptation module parses the static chain from the context information in the signaling data. This is similar to receiving the IR packet. For the same context identifier, IR-DYN packet can be recovered to IR packet. Recovered ROHC packet flow can be sent to ROHC decompressor. Thereafter, decompression may be started.

FIG. 14 illustrates a link mapping table (LMT) and an RoHC-U description table according to an embodiment of the present invention.

Hereinafter, link layer signaling will be described.

Generally, link layer signaling is operates under IP level. At the receiver side, link layer signaling can be obtained earlier than IP level signaling such as Service List Table (SLT) and Service Layer Signaling (SLS). Therefore, link layer signaling can be obtained before session establishment.

For link layer signaling, there can be two kinds of signaling according input path: internal link layer signaling and external link layer signaling. The internal link layer signaling is generated in link layer at transmitter side. And the link layer takes the signaling from external module or protocol. This kind of signaling information is considered as external link layer signaling. If some signaling need to be obtained prior to IP level signaling, external signaling is transmitted in format of link layer packet.

The link layer signaling can be encapsulated into link layer packet as described above. The link layer packets can carry any format of link layer signaling, including binary and XML. The same signaling information may not be transmitted in different formats for the link layer signaling.

Internal link layer signaling may include signaling information for link mapping. The Link Mapping Table (LMT) provides a list of upper layer sessions carried in a PLP. The LMT also provides addition information for processing the link layer packets carrying the upper layer sessions in the link layer.

An example of the LMT (tsib14010) according to the present invention is illustrated.

signaling_type can be an 8-bit unsigned integer field that indicates the type of signaling carried by this table. The value of signaling_type field for Link Mapping Table (LMT) can be set to 0x01.

PLP_ID can be an 8-bit field that indicates the PLP corresponding to this table.

num_session can be an 8-bit unsigned integer field that provides the number of upper layer sessions carried in the PLP identified by the above PLP_ID field. When the value of signaling_type field is 0x01, this field can indicate the number of UDP/IP sessions in the PLP.

src_IP_add can be a 32-bit unsigned integer field that contains the source IP address of an upper layer session carried in the PLP identified by the PLP_ID field.

dstIP_add can be a 32-bit unsigned integer field that contains the destination IP address of an upper layer session carried in the PLP identified by the PLP_ID field.

src_UDP_port can be a 16-bit unsigned integer field that represents the source UDP port number of an upper layer session carried in the PLP identified by the PLP_ID field.

dst_UDP_port can be a 16-bit unsigned integer field that represents the destination UDP port number of an upper layer session carried in the PLP identified by the PLP_ID field.

SID_flag can be a 1-bit Boolean field that indicates whether the link layer packet carrying the upper layer session identified by above 4 fields, Src_IP_add, Dst_IP_add, Src_UDP_Port and Dst_UDP_Port, has an SID field in its optional header. When the value of this field is set to 0, the link layer packet carrying the upper layer session may not have an SID field in its optional header. When the value of this field is set to 1, the link layer packet carrying the upper layer session can have an SID field in its optional header and the value the SID field can be same as the following SID field in this table.

compressed_flag can be a 1-bit Boolean field that indicates whether the header compression is applied the link layer packets carrying the upper layer session identified by above 4 fields, Src_IP_add, Dst_IP_add, Src_UDP_Port and Dst_UDP_Port. When the value of this field is set to 0, the link layer packet carrying the upper layer session may have a value of 0x00 of Packet_Type field in its base header. When the value of this field is set to 1, the link layer packet carrying the upper layer session may have a value of 0x01 of Packet_Type field in its base header and the Context_ID field can be present.

SID can be an 8-bit unsigned integer field that indicates sub stream identifier for the link layer packets carrying the upper layer session identified by above 4 fields, Src_IP_add, Dst IP_add, Src_UDP_Port and Dst_UDP_Port. This field can be present when the value of SID_flag is equal to 1.

context_id can be an 8-bit field that provides a reference for the context id (CID) provided in the ROHC-U description table. This field can be present when the value of compressed_flag is equal to 1.

An example of the RoHC-U description table (tsib14020) according to the present invention is illustrated. As described in the foregoing, the RoHC-U adaptation module may generate information related to header compression.

signaling_type can be an 8-bit field that indicates the type of signaling carried by this table. The value of signaling_type field for ROHC-U description table (RDT) can be set to "0x02".

PLP_ID can be an 8-bit field that indicates the PLP corresponding to this table.

context_id can be an 8-bit field that indicates the context id (CID) of the compressed IP stream. In this system, 8-bit CID can be used for large CID.

context_profile can be an 8-bit field that indicates the range of protocols used to compress the stream. This field can be omitted.

adaptation_mode can be a 2-bit field that indicates the mode of adaptation module in this PLP. Adaptation modes have been described above.

context_config can be a 2-bit field that indicates the combination of the context information. If there is no context information in this table, this field may be set to "0x0". If the static_chain( ) or dynamic_chain( ) byte is included in this table, this field may be set to "0x01" or "0x02" respectively. If both of the static_chain( ) and dynamic_chain( ) byte are included in this table, this field may be set to "0x03".

context_length can be an 8-bit field that indicates the length of the static chain byte sequence. This field can be omitted.

static_chain_byte ( ) can be a field that conveys the static information used to initialize the ROHC-U decompressor. The size and structure of this field depend on the context profile.

dynamic_chain_byte ( ) can be a field that conveys the dynamic information used to initialize the ROHC-U decompressor. The size and structure of this field depend on the context profile.

The static_chain_byte can be defined as sub-header information of IR packet. The dynamic_chain_byte can be defined as sub-header information of IR packet and IR-DYN packet.

FIG. 15 illustrates a structure of a link layer on a transmitter side according to an embodiment of the present invention.

The present embodiment presumes that an IP packet is processed. From a functional point of view, the link layer on the transmitter side may broadly include a link layer signaling part in which signaling information is processed, an overhead reduction part, and/or an encapsulation part. In addition, the link layer on the transmitter side may include a scheduler for controlling and scheduling an overall operation of the link layer and/or input and output parts of the link layer.

First, signaling information of an upper layer and/or a system parameter tsib15010 may be delivered to the link layer. In addition, an IP stream including IP packets may be delivered to the link layer from an IP layer tsib15110.

As described above, the scheduler tsib15020 may determine and control operations of several modules included in the link layer. The delivered signaling information and/or system parameter tsib15010 may be filterer or used by the scheduler tsib15020. Information, which corresponds to a part of the delivered signaling information and/or system parameter tsib15010, necessary for a receiver may be delivered to the link layer signaling part. In addition, information, which corresponds to a part of the signaling information, necessary for an operation of the link layer may be delivered to an overhead reduction controller tsib15120 or an encapsulation controller tsib15180.

The link layer signaling part may collect information to be transmitted as a signal in a physical layer, and convert/configure the information in a form suitable for transmission. The link layer signaling part may include a signaling manager tsib15030, a signaling formatter tsib15040, and/or a buffer for channels tsib15050.

The signaling manager tsib15030 may receive signaling information delivered from the scheduler tsib15020 and/or signaling (and/or context) information delivered from the overhead reduction part. The signaling manager tsib15030 may determine a path for transmission of the signaling information for delivered data. The signaling information may be delivered through the path determined by the signaling manager tsib15030. As described in the foregoing, signaling information to be transmitted through a divided channel such as the FIC, the EAS, etc. may be delivered to the signaling formatter tsib15040, and other signaling information may be delivered to an encapsulation buffer tsib15070.

The signaling formatter tsib15040 may format related signaling information in a form suitable for each divided channel such that signaling information may be transmitted through a separately divided channel. As described in the foregoing, the physical layer may include separate physically/logically divided channels. The divided channels may be used to transmit FIC signaling information or EAS-related information. The FIC or EAS-related information may be sorted by the signaling manager tsib15030, and input to the signaling formatter tsib15040. The signaling formatter tsib15040 may format the information based on each separate channel. When the physical layer is designed to transmit particular signaling information through a separately divided channel other than the FIC and the EAS, a signaling formatter for the particular signaling information may be additionally provided. Through this scheme, the link layer may be compatible with various physical layers.

The buffer for channels tsib15050 may deliver the signaling information received from the signaling formatter tsib15040 to separate dedicated channels tsib15060. The number and content of the separate channels may vary depending on embodiments.

As described in the foregoing, the signaling manager tsib15030 may deliver signaling information, which is not delivered to a particular channel, to the encapsulation buffer tsib15070. The encapsulation buffer tsib15070 may function as a buffer that receives the signaling information which is not delivered to the particular channel.

An encapsulation block for signaling information tsib15080 may encapsulate the signaling information which is not delivered to the particular channel. A transmission buffer tsib15090 may function as a buffer that delivers the encapsulated signaling information to a DP for signaling information tsib15100. Here, the DP for signaling information tsib15100 may refer to the above-described PLS region.

The overhead reduction part may allow efficient transmission by removing overhead of packets delivered to the link layer. It is possible to configure overhead reduction parts corresponding to the number of IP streams input to the link layer.

An overhead reduction buffer tsib15130 may receive an IP packet delivered from an upper layer. The received IP packet may be input to the overhead reduction part through the overhead reduction buffer tsib15130.

An overhead reduction controller tsib15120 may determine whether to perform overhead reduction on a packet stream input to the overhead reduction buffer tsib15130. The overhead reduction controller tsib15120 may determine whether to perform overhead reduction for each packet stream. When overhead reduction is performed on a packet stream, packets may be delivered to a robust header compression (RoHC) compressor tsib15140 to perform overhead reduction. When overhead reduction is not performed on a packet stream, packets may be delivered to the encapsulation part to perform encapsulation without overhead reduction. Whether to perform overhead reduction of packets may be determined based on the signaling information tsib15010 delivered to the link layer. The signaling information may be delivered to the encapsulation controller tsib15180 by the scheduler tsib15020.

The RoHC compressor tsib15140 may perform overhead reduction on a packet stream. The RoHC compressor tsib15140 may perform an operation of compressing a header of a packet. Various schemes may be used for overhead reduction. Overhead reduction may be performed using a scheme proposed by the present invention. The present invention presumes an IP stream, and thus an expression "RoHC compressor" is used. However, the name may be changed depending on embodiments. The operation is not restricted to compression of the IP stream, and overhead reduction of all types of packets may be performed by the RoHC compressor tsib15140.

A packet stream configuration block tsib15150 may separate information to be transmitted to a signaling region and information to be transmitted to a packet stream from IP packets having compressed headers. The information to be transmitted to the packet stream may refer to information to be transmitted to a DP region. The information to be transmitted to the signaling region may be delivered to a signaling and/or context controller tsib15160. The information to be transmitted to the packet stream may be transmitted to the encapsulation part.

The signaling and/or context controller tsib15160 may collect signaling and/or context information and deliver the signaling and/or context information to the signaling manager in order to transmit the signaling and/or context information to the signaling region.

The encapsulation part may perform an operation of encapsulating packets in a form suitable for a delivery to the physical layer. It is possible to configure encapsulation parts corresponding to the number of IP streams.

An encapsulation buffer tsib15170 may receive a packet stream for encapsulation. Packets subjected to overhead reduction may be received when overhead reduction is performed, and an input IP packet may be received without change when overhead reduction is not performed.

An encapsulation controller tsib15180 may determine whether to encapsulate an input packet stream. When encapsulation is performed, the packet stream may be delivered to a segmentation/concatenation block tsib15190. When encapsulation is not performed, the packet stream may be delivered to a transmission buffer tsib15230. Whether to encapsulate packets may be determined based on the signaling information tsib15010 delivered to the link layer. The signaling information may be delivered to the encapsulation controller tsib15180 by the scheduler tsib15020.

In the segmentation/concatenation block tsib15190, the above-described segmentation or concatenation operation may be performed on packets. In other words, when an input IP packet is longer than a link layer packet corresponding to an output of the link layer, one IP packet may be segmented into several segments to configure a plurality of link layer packet payloads. On the other hand, when an input IP packet is shorter than a link layer packet corresponding to an output of the link layer, several IP packets may be concatenated to configure one link layer packet payload.

A packet configuration table tsib15200 may have configuration information of a segmented and/or concatenated link layer packet. A transmitter and a receiver may have the same information in the packet configuration table tsib15200. The transmitter and the receiver may refer to the information of the packet configuration table tsib15200. An index value of the information of the packet configuration table tsib15200 may be included in a header of the link layer packet.

A link layer header information block tsib15210 may collect header information generated in an encapsulation process. In addition, the link layer header information block tsib15210 may collect header information included in the packet configuration table tsib15200. The link layer header information block tsib15210 may configure header information according to a header structure of the link layer packet.

A header attachment block tsib15220 may add a header to a payload of a segmented and/or concatenated link layer packet. The transmission buffer tsib15230 may function as a buffer to deliver the link layer packet to a DP tsib15240 of the physical layer.

The respective blocks, modules, or parts may be configured as one module/protocol or a plurality of modules/protocols in the link layer.

FIG. 16 illustrates a structure of a link layer on a receiver side according to an embodiment of the present invention.

The present embodiment presumes that an IP packet is processed. From a functional point of view, the link layer on the receiver side may broadly include a link layer signaling part in which signaling information is processed, an overhead processing part, and/or a decapsulation part. In addition, the link layer on the receiver side may include a scheduler for controlling and scheduling overall operation of the link layer and/or input and output parts of the link layer.

First, information received through a physical layer may be delivered to the link layer. The link layer may process the information, restore an original state before being processed at a transmitter side, and then deliver the information to an upper layer. In the present embodiment, the upper layer may be an IP layer.

Information, which is separated in the physical layer and delivered through a particular channel tsib16030, may be delivered to a link layer signaling part. The link layer signaling part may determine signaling information received from the physical layer, and deliver the determined signaling information to each part of the link layer.

A buffer for channels tsib16040 may function as a buffer that receives signaling information transmitted through particular channels. As described in the foregoing, when physically/logically divided separate channels are present in the physical layer, it is possible to receive signaling information transmitted through the channels. When the information received from the separate channels is segmented, the segmented information may be stored until complete information is configured.

A signaling decoder/parser tsib16050 may verify a format of the signaling information received through the particular channel, and extract information to be used in the link layer. When the signaling information received through the particular channel is encoded, decoding may be performed. In addition, according to a given embodiment, it is possible to verify integrity, etc. of the signaling information.

A signaling manager tsib16060 may integrate signaling information received through several paths. Signaling information received through a DP for signaling tsib16070 to be described below may be integrated in the signaling manager tsib16060. The signaling manager tsib16060 may deliver signaling information necessary for each part in the link layer. For example, the signaling manager tsib16060 may deliver context information, etc. for recovery of a packet to the overhead processing part. In addition, the signaling manager tsib16060 may deliver signaling information for control to a scheduler tsib16020.

General signaling information, which is not received through a separate particular channel, may be received through the DP for signaling tsib16070. Here, the DP for signaling may refer to PLS, L1, etc. Here, the DP may be referred to as a PLP. A reception buffer tsib16080 may function as a buffer that receives signaling information delivered from the DP for signaling. In a decapsulation block for signaling information tsib16090, the received signaling information may be decapsulated. The decapsulated signaling information may be delivered to the signaling manager tsib16060 through a decapsulation buffer tsib16100. As described in the foregoing, the signaling manager tsib16060 may collate signaling information, and deliver the collated signaling information to a necessary part in the link layer.

The scheduler tsib16020 may determine and control operations of several modules included in the link layer. The scheduler tsib16020 may control each part of the link layer using receiver information tsib16010 and/or information delivered from the signaling manager tsib16060. In addition, the scheduler tsib16020 may determine an operation mode, etc. of each part. Here, the receiver information tsib16010 may refer to information previously stored in the receiver. The scheduler tsib16020 may use information changed by a user such as channel switching, etc. to perform a control operation.

The decapsulation part may filter a packet received from a DP tsib16110 of the physical layer, and separate a packet according to a type of the packet. It is possible to configure decapsulation parts corresponding to the number of DPs that can be simultaneously decoded in the physical layer.

The decapsulation buffer tsib16100 may function as a buffer that receives a packet stream from the physical layer to perform decapsulation. A decapsulation controller tsib16130 may determine whether to decapsulate an input packet stream. When decapsulation is performed, the packet stream may be delivered to a link layer header parser tsib16140. When decapsulation is not performed, the packet stream may be delivered to an output buffer tsib16220. The signaling information received from the scheduler tsib16020 may be used to determine whether to perform decapsulation.

The link layer header parser tsib16140 may identify a header of the delivered link layer packet. It is possible to identify a configuration of an IP packet included in a payload of the link layer packet by identifying the header. For example, the IP packet may be segmented or concatenated.

A packet configuration table tsib16150 may include payload information of segmented and/or concatenated link layer packets. The transmitter and the receiver may have the same information in the packet configuration table tsib16150. The transmitter and the receiver may refer to the information of the packet configuration table tsib16150. It is possible to find a value necessary for reassembly based on index information included in the link layer packet.

A reassembly block tsib16160 may configure payloads of the segmented and/or concatenated link layer packets as packets of an original IP stream. Segments may be collected and reconfigured as one IP packet, or concatenated packets may be separated and reconfigured as a plurality of IP packet streams. Recombined IP packets may be delivered to the overhead processing part.

The overhead processing part may perform an operation of restoring a packet subjected to overhead reduction to an original packet as a reverse operation of overhead reduction performed in the transmitter. This operation may be referred to as overhead processing. It is possible to configure overhead processing parts corresponding to the number of DPs that can be simultaneously decoded in the physical layer.

A packet recovery buffer tsib16170 may function as a buffer that receives a decapsulated RoHC packet or IP packet to perform overhead processing.

An overhead controller tsib16180 may determine whether to recover and/or decompress the decapsulated packet. When recovery and/or decompression are performed, the packet may be delivered to a packet stream recovery block tsib16190. When recovery and/or decompression are not performed, the packet may be delivered to the output buffer tsib16220. Whether to perform recovery and/or decompression may be determined based on the signaling information delivered by the scheduler tsib16020.

The packet stream recovery block tsib16190 may perform an operation of integrating a packet stream separated from the transmitter with context information of the packet stream. This operation may be a process of restoring a packet stream such that an RoHC decompressor tsib16210 can perform processing. In this process, it is possible to receive signaling information and/or context information from a signaling and/or context controller tsib16200. The signaling and/or context controller tsib16200 may determine signaling information delivered from the transmitter, and deliver the signaling information to the packet stream recovery block tsib16190 such that the signaling information may be mapped to a stream corresponding to a context ID.

The RoHC decompressor tsib16210 may restore headers of packets of the packet stream. The packets of the packet stream may be restored to forms of original IP packets through restoration of the headers. In other words, the RoHC decompressor tsib16210 may perform overhead processing.

The output buffer tsib16220 may function as a buffer before an output stream is delivered to an IP layer tsib16230.

The link layers of the transmitter and the receiver proposed in the present invention may include the blocks or modules described above. In this way, the link layer may independently operate irrespective of an upper layer and a lower layer, overhead reduction may be efficiently performed, and a supportable function according to an upper/lower layer may be easily defined/added/deleted.

FIG. 17 illustrates a configuration of signaling transmission through a link layer according to an embodiment of the present invention (transmitting/receiving sides).

In the present invention, a plurality of service providers (broadcasters) may provide services within one frequency band. In addition, a service provider may provide a plurality of services, and one service may include one or more components. It can be considered that the user receives content using a service as a unit.

The present invention presumes that a transmission protocol based on a plurality of sessions is used to support an IP hybrid broadcast. Signaling information delivered through a signaling path may be determined based on a transmission configuration of each protocol. Various names may be applied to respective protocols according to a given embodiment.

In the illustrated data configuration tsib17010 on the transmitting side, service providers (broadcasters) may provide a plurality of services (Service #1, #2, . . . ). In general, a signal for a service may be transmitted through a general transmission session (signaling C). However, the signal may be transmitted through a particular session (dedicated session) according to a given embodiment (signaling B).

Service data and service signaling information may be encapsulated according to a transmission protocol. According to a given embodiment, an IP/UDP layer may be used. According to a given embodiment, a signal in the IP/UDP layer (signaling A) may be additionally provided. This signaling may be omitted.

Data processed using the IP/UDP may be input to the link layer. As described in the foregoing, overhead reduction and/or encapsulation may be performed in the link layer. Here, link layer signaling may be additionally provided. Link layer signaling may include a system parameter, etc. Link layer signaling has been described above.

The service data and the signaling information subjected to the above process may be processed through PLPs in a physical layer. Here, a PLP may be referred to as a DP. The example illustrated in the figure presumes a case in which a base DP/PLP is used. However, depending on embodiments, transmission may be performed using only a general DP/PLP without the base DP/PLP.

In the example illustrated in the figure, a particular channel (dedicated channel) such as an FIC, an EAC, etc. is used. A signal delivered through the FIC may be referred to as a fast information table (FIT), and a signal delivered through the EAC may be referred to as an emergency alert table (EAT). The FIT may be identical to the above-described SLT. The particular channels may not be used depending on embodiments. When the particular channel (dedicated channel) is not configured, the FIT and the EAT may be transmitted using a general link layer signaling transmission scheme, or transmitted using a PLP via the IP/UDP as other service data.

According to a given embodiment, system parameters may include a transmitter-related parameter, a service provider-related parameter, etc. Link layer signaling may include IP header compression-related context information and/or identification information of data to which the context is applied. Signaling of an upper layer may include an IP address, a UDP number, service/component information, emergency alert-related information, an IP/UDP address for service signaling, a session ID, etc. Detailed examples thereof have been described above.

In the illustrated data configuration tsib17020 on the receiving side, the receiver may decode only a PLP for a corresponding service using signaling information without having to decode all PLPs.

First, when the user selects or changes a service desired to be received, the receiver may be tuned to a corresponding frequency and may read receiver information related to a corresponding channel stored in a DB, etc. The information stored in the DB, etc. of the receiver may be configured by reading an SLT at the time of initial channel scan.

After receiving the SLT and the information about the corresponding channel, information previously stored in the DB is updated, and information about a transmission path of the service selected by the user and information about a path, through which component information is acquired or a signal necessary to acquire the information is transmitted, are acquired. When the information is not determined to be changed using version information of the SLT, decoding or parsing may be omitted.

The receiver may verify whether SLT information is included in a PLP by parsing physical signaling of the PLP in a corresponding broadcast stream (not illustrated), which may be indicated through a particular field of physical signaling. It is possible to access a position at which a service layer signal of a particular service is transmitted by accessing the SLT information. The service layer signal may be encapsulated into the IP/UDP and delivered through a transmission session. It is possible to acquire information about a component included in the service using this service layer signaling. A specific SLT-SLS configuration is as described above.

In other words, it is possible to acquire transmission path information, for receiving upper layer signaling information (service signaling information) necessary to receive the service, corresponding to one of several packet streams and PLPs currently transmitted on a channel using the SLT. The transmission path information may include an IP address, a UDP port number, a session ID, a PLP ID, etc. Here, depending on embodiments, a value previously designated by the IANA or a system may be used as an IP/UDP address. The information may be acquired using a scheme of accessing a DB or a shared memory, etc.

When the link layer signal and service data are transmitted through the same PLP, or only one PLP is operated, service data delivered through the PLP may be temporarily stored in a device such as a buffer, etc. while the link layer signal is decoded.

It is possible to acquire information about a path through which the service is actually transmitted using service signaling information of a service to be received. In addition, a received packet stream may be subjected to decapsulation and header recovery using information such as overhead reduction for a PLP to be received, etc.

In the illustrated example (tsib17020), the FIC and the EAC are used, and a concept of the base DP/PLP is presumed. As described in the foregoing, concepts of the FIC, the EAC, and the base DP/PLP may not be used.

While MISO or MIMO uses two antennas in the following for convenience of description, the present invention is applicable to systems using two or more antennas. The present invention proposes a physical profile (or system) optimized to minimize receiver complexity while attaining the performance required for a particular use case. Physical (PHY) profiles (base, handheld and advanced profiles) according to an embodiment of the present invention are subsets of all configurations that a corresponding receiver should implement. The PHY profiles share most of the functional blocks but differ slightly in specific blocks and/or parameters. For the system evolution, future profiles may also be multiplexed with existing profiles in a single radio frequency (RF) channel through a future extension frame (FEF). The base profile and the handheld profile according to the embodiment of the present invention refer to profiles to which MIMO is not applied, and the advanced profile refers to a profile to which MIMO is applied. The base profile may be used as a profile for both the terrestrial broadcast service and the mobile broadcast service. That is, the base profile may be used to define a concept of a profile which includes the mobile profile. In addition, the advanced profile may be divided into an advanced profile for a base profile with MIMO and an advanced profile for a handheld profile with MIMO. Moreover, the profiles may be changed according to intention of the designer.

The following terms and definitions may be applied to the present invention. The following terms and definitions may be changed according to design.

Auxiliary stream: sequence of cells carrying data of as yet undefined modulation and coding, which may be used for future extensions or as required by broadcasters or network operators Base data pipe: data pipe that carries service signaling data Baseband frame (or BBFRAME): set of Kbch bits which form the input to one FEC encoding process (BCH and LDPC encoding)

Cell: modulation value that is carried by one carrier of orthogonal frequency division multiplexing (OFDM) transmission Coded block: LDPC-encoded block of PLS1 data or one of the LDPC-encoded blocks of PLS2 data Data pipe: logical channel in the physical layer that carries service data or related metadata, which may carry one or a plurality of service(s) or service component(s).

Data pipe unit (DPU): a basic unit for allocating data cells to a DP in a frame.

Data symbol: OFDM symbol in a frame which is not a preamble symbol (the data symbol encompasses the frame signaling symbol and frame edge symbol)

DP_ID: this 8-bit field identifies uniquely a DP within the system identified by the SYSTEM_ID Dummy cell: cell carrying a pseudo-random value used to fill the remaining capacity not used for PLS signaling, DPs or auxiliary streams Emergency alert channel (EAC): part of a frame that carries EAS information data Frame: physical layer time slot that starts with a preamble and ends with a frame edge symbol Frame repetition unit: a set of frames belonging to the same or different physical layer profiles including an FEF, which is repeated eight times in a superframe Fast information channel (FIC): a logical channel in a frame that carries mapping information between a service and the corresponding base DP FECBLOCK: set of LDPC-encoded bits of DP data FFT size: nominal FFT size used for a particular mode, equal to the active symbol period Ts expressed in cycles of an elementary period T Frame signaling symbol: OFDM symbol with higher pilot density used at the start of a frame in certain combinations of FFT size, guard interval and scattered pilot pattern, which carries a part of the PLS data Frame edge symbol: OFDM symbol with higher pilot density used at the end of a frame in certain combinations of FFT size, guard interval and scattered pilot pattern Frame group: the set of all frames having the same PHY profile type in a superframe Future extension frame: physical layer time slot within the superframe that may be used for future extension, which starts with a preamble Futurecast UTB system: proposed physical layer broadcast system, the input of which is one or more MPEG2-TS, IP or general stream(s) and the output of which is an RF signal Input stream: a stream of data for an ensemble of services delivered to the end users by the system Normal data symbol: data symbol excluding the frame signaling symbol and the frame edge symbol PHY profile: subset of all configurations that a corresponding receiver should implement PLS: physical layer signaling data including PLS1 and PLS2

PLS1: a first set of PLS data carried in a frame signaling symbol (FSS) having a fixed size, coding and modulation, which carries basic information about a system as well as parameters needed to decode PLS2

NOTE: PLS1 data remains constant for the duration of a frame group

PLS2: a second set of PLS data transmitted in the FSS, which carries more detailed PLS data about the system and the DPs PLS2 dynamic data: PLS2 data that dynamically changes frame-by-frame PLS2 static data: PLS2 data that remains static for the duration of a frame group Preamble signaling data: signaling data carried by the preamble symbol and used to identify the basic mode of the system Preamble symbol: fixed-length pilot symbol that carries basic PLS data and is located at the beginning of a frame The preamble symbol is mainly used for fast initial band scan to detect the system signal, timing thereof, frequency offset, and FFT size.

Reserved for future use: not defined by the present document but may be defined in future Superframe: set of eight frame repetition units Time interleaving block (TI block): set of cells within which time interleaving is carried out, corresponding to one use of a time interleaver memory TI group: unit over which dynamic capacity allocation for a particular DP is carried out, made up of an integer, dynamically varying number of XFECBLOCKs NOTE: The TI group may be mapped directly to one frame or may be mapped to a plurality of frames. The TI group may contain one or more TI blocks.

Figure 18:
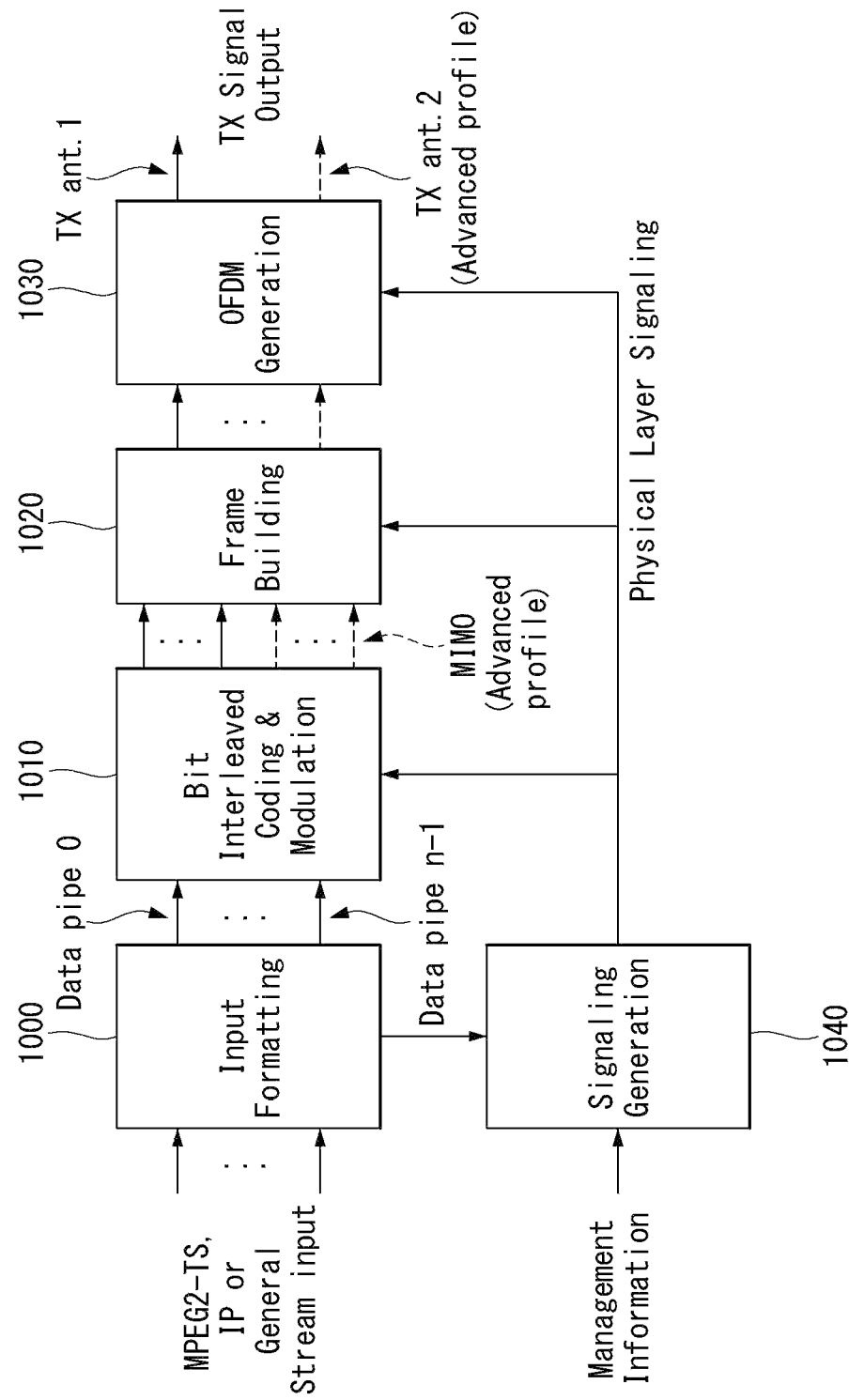
FIG. 18 is a block diagram illustrating a configuration of a broadcast signal transmission apparatus for future broadcast services according to an embodiment of the present invention.

Type 1 DP: DP of a frame where all DPs are mapped to the frame in time division multiplexing (TDM) scheme Type 2 DP: DP of a frame where all DPs are mapped to the frame in frequency division multiplexing (FDM) scheme XFECBLOCK: set of Ncells cells carrying all the bits of one LDPC FECBLOCK FIG. 18 illustrates a configuration of a broadcast signal transmission apparatus for future broadcast services according to an embodiment of the present invention.

The broadcast signal transmission apparatus for future broadcast services according to the present embodiment may include an input formatting block 1000, a bit interleaved coding & modulation (BICM) block 1010, a frame building block 1020, an OFDM generation block 1030 and a signaling generation block 1040. Description will be given of an operation of each block of the broadcast signal transmission apparatus.

In input data according to an embodiment of the present invention, IP stream/packets and MPEG2-TS may be main input formats, and other stream types are handled as general streams. In addition to these data inputs, management information is input to control scheduling and allocation of the corresponding bandwidth for each input stream. In addition, the present invention allows simultaneous input of one or a plurality of TS streams, IP stream(s) and/or a general stream(s).

The input formatting block 1000 may demultiplex each input stream into one or a plurality of data pipes, to each of which independent coding and modulation are applied. A DP is the basic unit for robustness control, which affects QoS. One or a plurality of services or service components may be carried by one DP. The DP is a logical channel in a physical layer for delivering service data or related metadata capable of carrying one or a plurality of services or service components.

In addition, a DPU is a basic unit for allocating data cells to a DP in one frame.

An input to the physical layer may include one or a plurality of data streams. Each of the data streams is delivered by one DP. The input formatting block 1000 may covert a data stream input through one or more physical paths (or DPs) into a baseband frame (BBF). In this case, the input formatting block 1000 may perform null packet deletion or header compression on input data (a TS or IP input stream) in order to enhance transmission efficiency. A receiver may have a priori information for a particular part of a header, and thus this known information may be deleted from a transmitter. A null packet deletion block 3030 may be used only for a TS input stream.

In the BICM block 1010, parity data is added for error correction and encoded bit streams are mapped to complex-value constellation symbols. The symbols are interleaved across a specific interleaving depth that is used for the corresponding DP. For the advanced profile, MIMO encoding is performed in the BICM block 1010 and an additional data path is added at the output for MIMO transmission.

The frame building block 1020 may map the data cells of the input DPs into the OFDM symbols within a frame, and perform frequency interleaving for frequency-domain diversity, especially to combat frequency-selective fading channels. The frame building block 1020 may include a delay compensation block, a cell mapper and a frequency interleaver.

The delay compensation block may adjust timing between DPs and corresponding PLS data to ensure that the DPs and the corresponding PLS data are co-timed at a transmitter side. The PLS data is delayed by the same amount as the data pipes by addressing the delays of data pipes caused by the input formatting block and BICM block. The delay of the BICM block is mainly due to the time interleaver. In-band signaling data carries information of the next TI group so that the information is carried one frame ahead of the DPs to be signaled. The delay compensation block delays in-band signaling data accordingly.

The cell mapper may map PLS, DPs, auxiliary streams, dummy cells, etc. to active carriers of the OFDM symbols in the frame. The basic function of the cell mapper 7010 is to map data cells produced by the TIs for each of the DPs, PLS cells, and EAC/FIC cells, if any, into arrays of active OFDM cells corresponding to each of the OFDM symbols within a frame. A basic function of the cell mapper is to map a data cell generated by time interleaving for each DP and PLS cell to an array of active OFDM cells (if present) corresponding to respective OFDM symbols in one frame. Service signaling data (such as program specific information (PSI)/SI) may be separately gathered and sent by a DP. The cell mapper operates according to dynamic information produced by a scheduler and the configuration of a frame structure. The frequency interleaver may randomly interleave data cells received from the cell mapper to provide frequency diversity. In addition, the frequency interleaver may operate on an OFDM symbol pair including two sequential OFDM symbols using a different interleaving-seed order to obtain maximum interleaving gain in a single frame.

The OFDM generation block 1030 modulates OFDM carriers by cells produced by the frame building block, inserts pilots, and produces a time domain signal for transmission. In addition, this block subsequently inserts guard intervals, and applies peak-to-average power ratio (PAPR) reduction processing to produce a final RF signal.

Specifically, after inserting a preamble at the beginning of each frame, the OFDM generation block 1030 may apply conventional OFDM modulation having a cyclic prefix as a guard interval. For antenna space diversity, a distributed MISO scheme is applied across transmitters. In addition, a PAPR scheme is performed in the time domain. For flexible network planning, the present invention provides a set of various FFT sizes, guard interval lengths and corresponding pilot patterns.

In addition, the present invention may multiplex signals of a plurality of broadcast transmission/reception systems in the time domain such that data of two or more different broadcast transmission/reception systems providing broadcast services may be simultaneously transmitted in the same RF signal bandwidth. In this case, the two or more different broadcast transmission/reception systems refer to systems providing different broadcast services. The different broadcast services may refer to a terrestrial broadcast service, mobile broadcast service, etc.

The signaling generation block 1040 may create physical layer signaling information used for an operation of each functional block. This signaling information is also transmitted so that services of interest are properly recovered at a receiver side. Signaling information according to an embodiment of the present invention may include PLS data. PLS provides the receiver with a means to access physical layer DPs. The PLS data includes PLS1 data and PLS2 data.

The PLS1 data is a first set of PLS data carried in an FSS symbol in a frame having a fixed size, coding and modulation, which carries basic information about the system in addition to the parameters needed to decode the PLS2 data. The PLS1 data provides basic transmission parameters including parameters required to enable reception and decoding of the PLS2 data. In addition, the PLS1 data remains constant for the duration of a frame group.

The PLS2 data is a second set of PLS data transmitted in an FSS symbol, which carries more detailed PLS data about the system and the DPs. The PLS2 contains parameters that provide sufficient information for the receiver to decode a desired DP. The PLS2 signaling further includes two types of parameters, PLS2 static data (PLS2-STAT data) and PLS2 dynamic data (PLS2-DYN data). The PLS2 static data is PLS2 data that remains static for the duration of a frame group and the PLS2 dynamic data is PLS2 data that dynamically changes frame by frame. Details of the PLS data will be described later.

The above-described blocks may be omitted or replaced by blocks having similar or identical functions.

Figure 19:
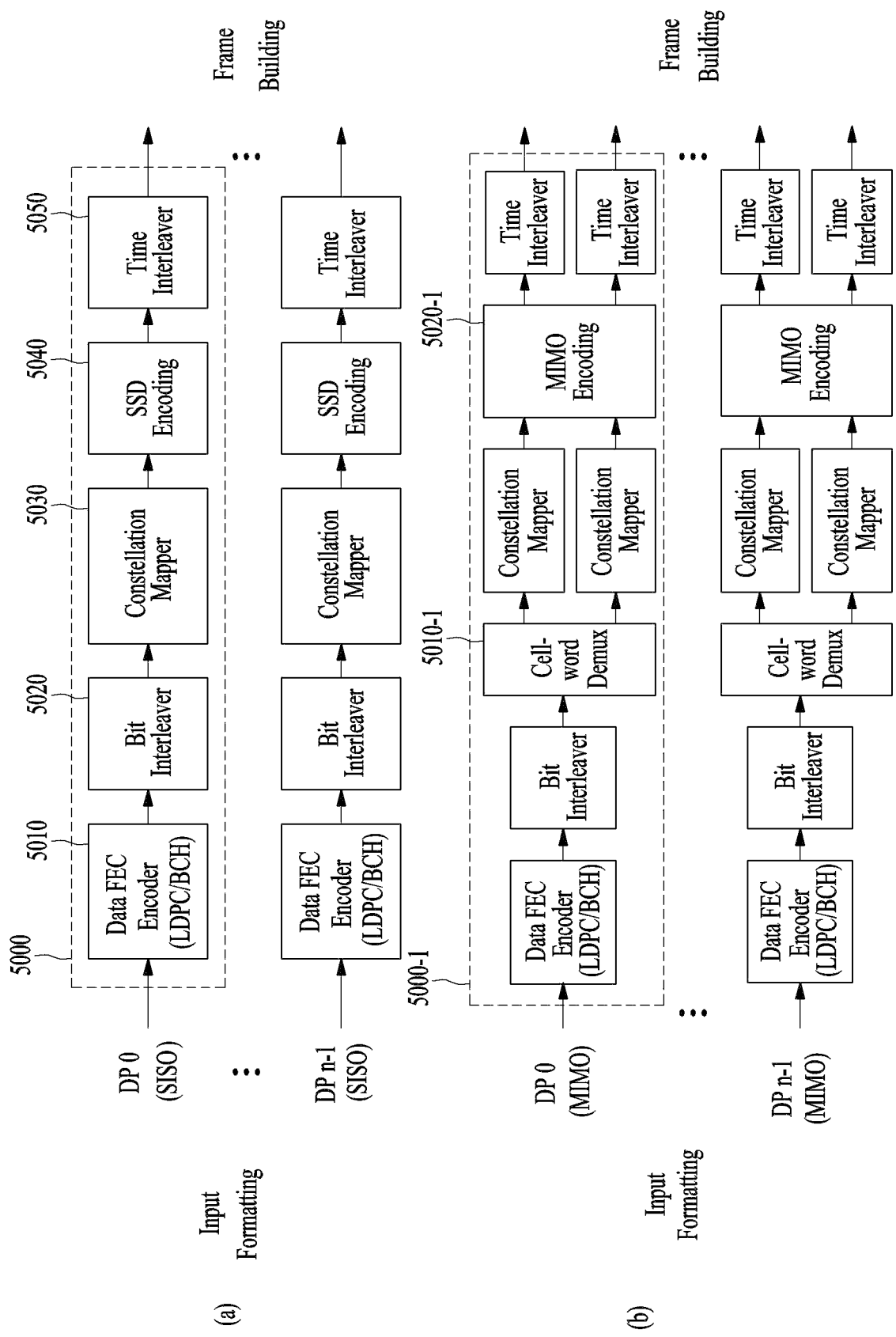
FIG. 19 is a block diagram illustrating a bit interleaved coding & modulation (BICM) block according to an embodiment of the present invention.

FIG. 19 illustrates a BICM block according to an embodiment of the present invention.

The BICM block illustrated in FIG. 19 corresponds to an embodiment of the BICM block 1010 described with reference to FIG. 18.

As described above, the broadcast signal transmission apparatus for future broadcast services according to the embodiment of the present invention may provide a terrestrial broadcast service, mobile broadcast service, UHDTV service, etc.

Since QoS depends on characteristics of a service provided by the broadcast signal transmission apparatus for future broadcast services according to the embodiment of the present invention, data corresponding to respective services needs to be processed using different schemes. Accordingly, the BICM block according to the embodiment of the present invention may independently process respective DPs by independently applying SISO, MISO and MIMO schemes to data pipes respectively corresponding to data paths. Consequently, the broadcast signal transmission apparatus for future broadcast services according to the embodiment of the present invention may control QoS for each service or service component transmitted through each DP.

(a) shows a BICM block applied to a profile (or system) to which MIMO is not applied, and (b) shows a BICM block of a profile (or system) to which MIMO is applied.

The BICM block to which MIMO is not applied and the BICM block to which MIMO is applied may include a plurality of processing blocks for processing each DP.

Description will be given of each processing block of the BICM block to which MIMO is not applied and the BICM block to which MIMO is applied.

A processing block 5000 of the BICM block to which MIMO is not applied may include a data FEC encoder 5010, a bit interleaver 5020, a constellation mapper 5030, a signal space diversity (SSD) encoding block 5040 and a time interleaver 5050.

The data FEC encoder 5010 performs FEC encoding on an input BBF to generate FECBLOCK procedure using outer coding (BCH) and inner coding (LDPC). The outer coding (BCH) is optional coding method. A detailed operation of the data FEC encoder 5010 will be described later.

The bit interleaver 5020 may interleave outputs of the data FEC encoder 5010 to achieve optimized performance with a combination of LDPC codes and a modulation scheme while providing an efficiently implementable structure. A detailed operation of the bit interleaver 5020 will be described later.

The constellation mapper 5030 may modulate each cell word from the bit interleaver 5020 in the base and the handheld profiles, or each cell word from the cell-word demultiplexer 5010-1 in the advanced profile using either QPSK, QAM-16, non-uniform QAM (NUQ-64, NUQ-256, or NUQ-1024) or non-uniform constellation (NUC-16, NUC-64, NUC-256, or NUC-1024) mapping to give a power-normalized constellation point, el. This constellation mapping is applied only for DPs. It is observed that QAM-16 and NUQs are square shaped, while NUCs have arbitrary shapes. When each constellation is rotated by any multiple of 90 degrees, the rotated constellation exactly overlaps with its original one. This "rotation-sense" symmetric property makes the capacities and the average powers of the real and imaginary components equal to each other. Both NUQs and NUCs are defined specifically for each code rate and the particular one used is signaled by the parameter DP_MOD filed in the PLS2 data.

The time interleaver 5050 may operates at a DP level. Parameters of time interleaving (TI) may be set differently for each DP. A detailed operation of the time interleaver 5050 will be described later.

A processing block 5000-1 of the BICM block to which MIMO is applied may include the data FEC encoder, the bit interleaver, the constellation mapper, and the time interleaver.

However, the processing block 5000-1 is distinguished from the processing block 5000 of the BICM block to which MIMO is not applied in that the processing block 5000-1 further includes a cell-word demultiplexer 5010-1 and a MIMO encoding block 5020-1.

In addition, operations of the data FEC encoder, the bit interleaver, the constellation mapper, and the time interleaver in the processing block 5000-1 correspond to those of the data FEC encoder 5010, the bit interleaver 5020, the constellation mapper 5030, and the time interleaver 5050 described above, and thus description thereof is omitted.

The cell-word demultiplexer 5010-1 is used for a DP of the advanced profile to divide a single cell-word stream into dual cell-word streams for MIMO processing.

The MIMO encoding block 5020-1 may process an output of the cell-word demultiplexer 5010-1 using a MIMO encoding scheme. The MIMO encoding scheme is optimized for broadcast signal transmission. MIMO technology is a promising way to obtain a capacity increase but depends on channel characteristics. Especially for broadcasting, a strong LOS component of a channel or a difference in received signal power between two antennas caused by different signal propagation characteristics makes it difficult to obtain capacity gain from MIMO. The proposed MIMO encoding scheme overcomes this problem using rotation-based precoding and phase randomization of one of MIMO output signals.

MIMO encoding is intended for a 2×2 MIMO system requiring at least two antennas at both the transmitter and the receiver. A MIMO encoding mode of the present invention may be defined as full-rate spatial multiplexing (FR-SM). FR-SM encoding may provide capacity increase with relatively small complexity increase at the receiver side. In addition, the MIMO encoding scheme of the present invention has no restriction on an antenna polarity configuration.

MIMO processing is applied at the DP level. NUQ (e1,i and e2,i) corresponding to a pair of constellation mapper outputs is fed to an input of a MIMO encoder. Paired MIMO encoder output (g1,i and g2,i) is transmitted by the same carrier k and OFDM symbol l of respective TX antennas thereof.

The above-described blocks may be omitted or replaced by blocks having similar or identical functions.

Figure 20:
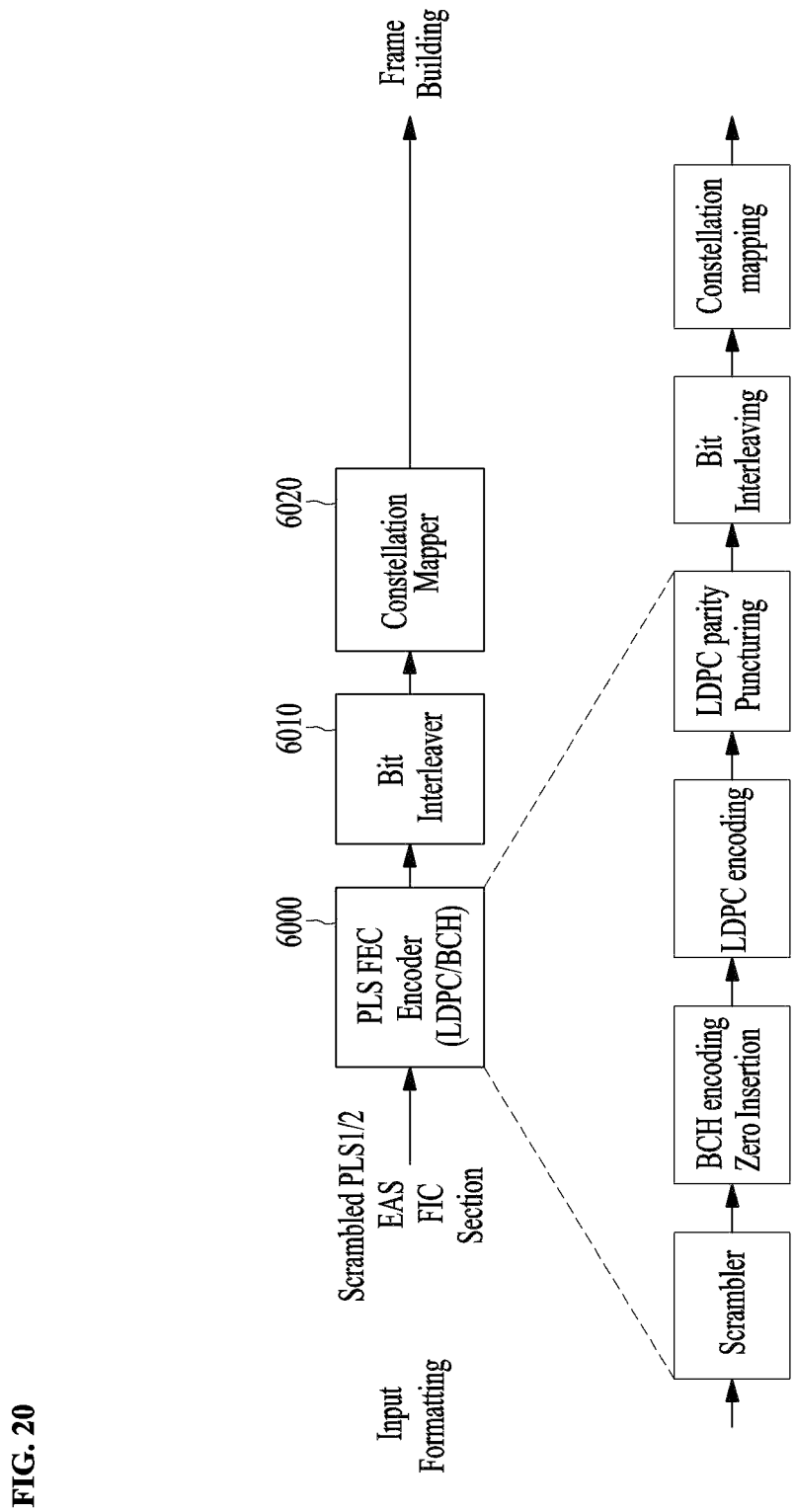
FIG. 20 is a block diagram illustrating a BICM block according to another embodiment of the present invention.

FIG. 20 illustrates a BICM block according to another embodiment of the present invention.

The BICM block illustrated in FIG. 20 corresponds to another embodiment of the BICM block 1010 described with reference to FIG. 18.

FIG. 20 illustrates a BICM block for protection of physical layer signaling (PLS), an emergency alert channel (EAC) and a fast information channel (FIC). The EAC is a part of a frame that carries EAS information data, and the FIC is a logical channel in a frame that carries mapping information between a service and a corresponding base DR Details of the EAC and FIC will be described later.

Referring to FIG. 20, the BICM block for protection of the PLS, the EAC and the FIC may include a PLS FEC encoder 6000, a bit interleaver 6010 and a constellation mapper 6020.

In addition, the PLS FEC encoder 6000 may include a scrambler, a BCH encoding/zero insertion block, an LDPC encoding block and an LDPC parity puncturing block. Description will be given of each block of the BICM block.

The PLS FEC encoder 6000 may encode scrambled PLS 1/2 data, EAC and FIC sections.

The scrambler may scramble PLS1 data and PLS2 data before BCH encoding and shortened and punctured LDPC encoding.

The BCH encoding/zero insertion block may perform outer encoding on the scrambled PLS 1/2 data using a shortened BCH code for PLS protection, and insert zero bits after BCH encoding. For PLS1 data only, output bits of zero insertion may be permutted before LDPC encoding.

The LDPC encoding block may encode an output of the BCH encoding/zero insertion block using an LDPC code. To generate a complete coded block, Cldpc and parity bits Pldpc are encoded systematically from each zero-inserted PLS information block Ildpc and appended thereto.

$$C_{ldpc}=[I_{ldpc} P_{ldpc}]=[i_0, i_1, \ldots, i_{K_{ldpc}-1}, p_0, p_1, \ldots, p_{N_{ldpc}-K_{ldpc}-1}] \quad \text{[Equation 1]}$$

The LDPC parity puncturing block may perform puncturing on the PLS1 data and the PLS2 data.

When shortening is applied to PLS1 data protection, some LDPC parity bits are punctured after LDPC encoding. In addition, for PLS2 data protection, LDPC parity bits of PLS2 are punctured after LDPC encoding. These punctured bits are not transmitted.

The bit interleaver 6010 may interleave each of shortened and punctured PLS1 data and PLS2 data.

The constellation mapper 6020 may map the bit-ineterleaved PLS1 data and PLS2 data to constellations.

The above-described blocks may be omitted or replaced by blocks having similar or identical functions.

Figure 21:
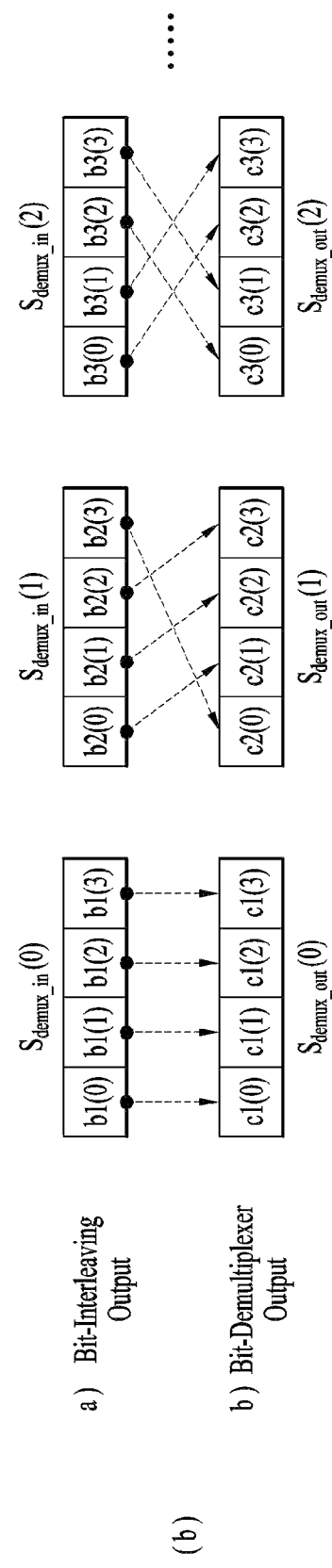
FIG. 21 illustrates a bit interleaving process of physical layer signaling (PLS) according to an embodiment of the present invention.

FIG. 21 illustrates a bit interleaving process of PLS according to an embodiment of the present invention.

Figure 22:
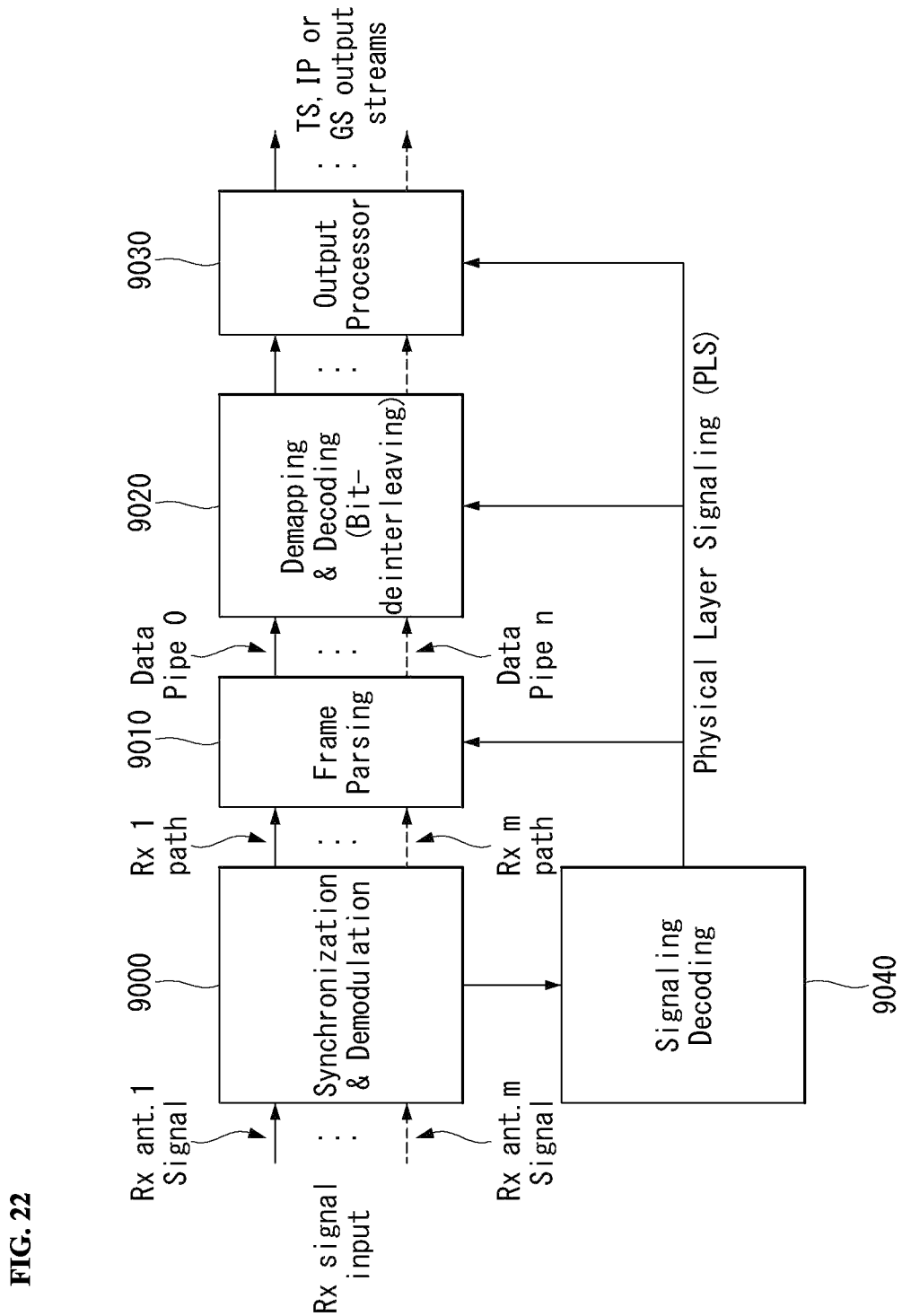
FIG. 22 is a block diagram illustrating a configuration of a broadcast signal reception apparatus for future broadcast services according to an embodiment of the present invention.

Each shortened and punctured PLS1 and PLS2 coded block is interleaved bit-by-bit as described in FIG. 22. Each block of additional parity bits is interleaved with the same block interleaving structure but separately.

In the case of BPSK, there are two branches for bit interleaving to duplicate FEC coded bits in the real and imaginary parts. Each coded block is written to the upper branch first. The bits are mapped to the lower branch by applying modulo NFEC addition with cyclic shifting value floor(NFEC/2), where NFEC is the length of each LDPC coded block after shortening and puncturing.

In other modulation cases, such as QSPK, QAM-16 and NUQ-64, FEC coded bits are written serially into the interleaver column-wise, where the number of columns is the same as the modulation order.

In the read operation, the bits for one constellation symbol are read out sequentially row-wise and fed into the bit demultiplexer block. These operations are continued until the end of the column.

Each bit interleaved group is demultiplexed bit-by-bit in a group before constellation mapping. Depending on modulation order, there are two mapping rules. In the case of BPSK and QPSK, the reliability of bits in a symbol is equal. Therefore, the bit group read out from the bit interleaving block is mapped to a QAM symbol without any operation.

In the cases of QAM-16 and NUQ-64 mapped to a QAM symbol, the rule of operation is described in FIG. 23(*a*). As shown in FIG. 23(*a*), i is bit group index corresponding to column index in bit interleaving.

FIG. 21 shows the bit demultiplexing rule for QAM-16. This operation continues until all bit groups are read from the bit interleaving block.

FIG. 22 illustrates a configuration of a broadcast signal reception apparatus for future broadcast services according to an embodiment of the present invention.

The broadcast signal reception apparatus for future broadcast services according to the embodiment of the present invention may correspond to the broadcast signal transmission apparatus for future broadcast services described with reference to FIG. 18.

The broadcast signal reception apparatus for future broadcast services according to the embodiment of the present invention may include a synchronization & demodulation module 9000, a frame parsing module 9010, a demapping & decoding module 9020, an output processor 9030 and a signaling decoding module 9040. A description will be given of operation of each module of the broadcast signal reception apparatus.

The synchronization & demodulation module 9000 may receive input signals through m Rx antennas, perform signal detection and synchronization with respect to a system corresponding to the broadcast signal reception apparatus, and carry out demodulation corresponding to a reverse procedure of a procedure performed by the broadcast signal transmission apparatus.

The frame parsing module 9010 may parse input signal frames and extract data through which a service selected by a user is transmitted. If the broadcast signal transmission apparatus performs interleaving, the frame parsing module 9010 may carry out deinterleaving corresponding to a reverse procedure of interleaving. In this case, positions of a signal and data that need to be extracted may be obtained by decoding data output from the signaling decoding module 9040 to restore scheduling information generated by the broadcast signal transmission apparatus.

The demapping & decoding module 9020 may convert input signals into bit domain data and then deinterleave the same as necessary. The demapping & decoding module 9020 may perform demapping of mapping applied for transmission efficiency and correct an error generated on a transmission channel through decoding. In this case, the demapping & decoding module 9020 may obtain transmission parameters necessary for demapping and decoding by decoding data output from the signaling decoding module 9040.

The output processor 9030 may perform reverse procedures of various compression/signal processing procedures which are applied by the broadcast signal transmission apparatus to improve transmission efficiency. In this case, the output processor 9030 may acquire necessary control information from data output from the signaling decoding module 9040. An output of the output processor 9030 corresponds to a signal input to the broadcast signal transmission apparatus and may be MPEG-TSs, IP streams (v4 or v6) and generic streams.

The signaling decoding module 9040 may obtain PLS information from a signal demodulated by the synchronization & demodulation module 9000. As described above, the frame parsing module 9010, the demapping & decoding module 9020 and the output processor 9030 may execute functions thereof using data output from the signaling decoding module 9040.

A frame according to an embodiment of the present invention is further divided into a number of OFDM symbols and a preamble. As shown in (d), the frame includes a preamble, one or more frame signaling symbols (FSSs), normal data symbols and a frame edge symbol (FES).

The preamble is a special symbol that enables fast futurecast UTB system signal detection and provides a set of basic transmission parameters for efficient transmission and reception of a signal. Details of the preamble will be described later.

A main purpose of the FSS is to carry PLS data. For fast synchronization and channel estimation, and hence fast decoding of PLS data, the FSS has a dense pilot pattern than a normal data symbol. The FES has exactly the same pilots as the FSS, which enables frequency-only interpolation within the FES and temporal interpolation, without extrapolation, for symbols immediately preceding the FES.

FIG. 23 illustrates a signaling hierarchy structure of a frame according to an embodiment of the present invention.

FIG. 23 illustrates the signaling hierarchy structure, which is split into three main parts corresponding to preamble signaling data 11000, PLS1 data 11010 and PLS2 data 11020. A purpose of a preamble, which is carried by a preamble symbol in every frame, is to indicate a transmission type and basic transmission parameters of the frame. PLS1 enables the receiver to access and decode the PLS2 data, which contains the parameters to access a DP of interest. PLS2 is carried in every frame and split into two main parts corresponding to PLS2-STAT data and PLS2-DYN data. Static and dynamic portions of PLS2 data are followed by padding, if necessary.

Preamble signaling data according to an embodiment of the present invention carries 21 bits of information that are needed to enable the receiver to access PLS data and trace DPs within the frame structure. Details of the preamble signaling data are as follows.

FFT_SIZE: This 2-bit field indicates an FFT size of a current frame within a frame group as described in the following Table 1.

TABLE 1

| Value | FFT size |
|---|---|
| 00 | 8K FFT |
| 01 | 16K FFT |
| 10 | 32K FFT |
| 11 | Reserved |

GI_FRACTION: This 3-bit field indicates a guard interval fraction value in a current superframe as described in the following Table 2.

TABLE 2

| Value | GI_FRACTION |
|---|---|
| 000 | 1/5 |
| 001 | 1/10 |
| 010 | 1/20 |
| 011 | 1/40 |
| 100 | 1/80 |
| 101 | 1/160 |
| 110 to 111 | Reserved |

EAC_FLAG: This 1-bit field indicates whether the EAC is provided in a current frame. If this field is set to '1', an emergency alert service (EAS) is provided in the current frame. If this field set to '0', the EAS is not carried in the current frame. This field may be switched dynamically within a superframe.

PILOT_MODE: This 1-bit field indicates whether a pilot mode is a mobile mode or a fixed mode for a current frame in a current frame group. If this field is set to '0', the mobile pilot mode is used. If the field is set to '1', the fixed pilot mode is used.

PAPR_FLAG: This 1-bit field indicates whether PAPR reduction is used for a current frame in a current frame group. If this field is set to a value of '1', tone reservation is used for PAPR reduction. If this field is set to a value of '0', PAPR reduction is not used.

RESERVED: This 7-bit field is reserved for future use.

FIG. 24 illustrates PLS1 data according to an embodiment of the present invention.

PLS1 data provides basic transmission parameters including parameters required to enable reception and decoding of PLS2. As mentioned above, the PLS1 data remain unchanged for the entire duration of one frame group. A detailed definition of the signaling fields of the PLS1 data is as follows.

PREAMBLE_DATA: This 20-bit field is a copy of preamble signaling data excluding EAC_FLAG.

NUM_FRAME_FRU: This 2-bit field indicates the number of the frames per FRU.

PAYLOAD_TYPE: This 3-bit field indicates a format of payload data carried in a frame group. PAYLOAD_TYPE is signaled as shown in Table 3.

TABLE 3

| Value | Payload type |
|---|---|
| 1XX | TS is transmitted. |
| X1X | IP stream is transmitted. |
| XX1 | GS is transmitted. |

NUM_FSS: This 2-bit field indicates the number of FSSs in a current frame.

SYSTEM_VERSION: This 8-bit field indicates a version of a transmitted signal format. SYSTEM_VERSION is divided into two 4-bit fields: a major version and a minor version.

Major version: The MSB corresponding to four bits of the SYSTEM_VERSION field indicate major version information. A change in the major version field indicates a non-backward-compatible change. A default value is '0000'. For a version described in this standard, a value is set to '0000'.

Minor version: The LSB corresponding to four bits of SYSTEM_VERSION field indicate minor version information. A change in the minor version field is backwards compatible.

CELL_ID: This is a 16-bit field which uniquely identifies a geographic cell in an ATSC network. An ATSC cell coverage area may include one or more frequencies depending on the number of frequencies used per futurecast UTB system. If a value of CELL_ID is not known or unspecified, this field is set to '0'.

NETWORK_ID: This is a 16-bit field which uniquely identifies a current ATSC network.

SYSTEM_ID: This 16-bit field uniquely identifies the futurecast UTB system within the ATSC network. The futurecast UTB system is a terrestrial broadcast system whose input is one or more input streams (TS, IP, GS) and whose output is an RF signal. The futurecast UTB system carries one or more PHY profiles and FEF, if any. The same futurecast UTB system may carry different input streams and use different RFs in different geographical areas, allowing local service insertion. The frame structure and scheduling are controlled in one place and are identical for all transmissions within the futurecast UTB system. One or more futurecast UTB systems may have the same SYSTEM_ID meaning that they all have the same physical layer structure and configuration.

The following loop includes FRU_PHY_PROFILE, FRU_FRAME_LENGTH, FRU_GI_FRACTION, and RESERVED which are used to indicate an FRU configuration and a length of each frame type. A loop size is fixed so that four PHY profiles (including an FEF) are signaled within the FRU. If NUM_FRAME_FRU is less than 4, unused fields are filled with zeros.

FRU_PHY_PROFILE: This 3-bit field indicates a PHY profile type of an (i+1)th (i is a loop index) frame of an associated FRU. This field uses the same signaling format as shown in Table 8.

FRU_FRAME_LENGTH: This 2-bit field indicates a length of an (i+1)th frame of an associated FRU. Using FRU_FRAME_LENGTH together with FRU_GI_FRACTION, an exact value of a frame duration may be obtained.

FRU_GI_FRACTION: This 3-bit field indicates a guard interval fraction value of an (i+1)th frame of an associated FRU. FRU_GI_FRACTION is signaled according to Table 7.

RESERVED: This 4-bit field is reserved for future use.

The following fields provide parameters for decoding the PLS2 data.

PLS2_FEC_TYPE: This 2-bit field indicates an FEC type used by PLS2 protection. The FEC type is signaled according to Table 4. Details of LDPC codes will be described later.

TABLE 4

| Content | PLS2 EEC type |
|---|---|
| 00 | 4K-1/4 and 7K-3/10 LDPC codes |
| 01 to 11 | Reserved |

PLS2_MOD: This 3-bit field indicates a modulation type used by PLS2. The modulation type is signaled according to Table 5.

TABLE 5

| Value | PLS2_MODE |
|---|---|
| 000 | BPSK |
| 001 | QPSK |
| 010 | QAM-16 |
| 011 | NUQ-64 |
| 100 to 111 | Reserved |

PLS2_SIZE_CELL: This 15-bit field indicates Ctotal_partial_block, a size (specified as the number of QAM cells) of the collection of full coded blocks for PLS2 that is carried in a current frame group. This value is constant during the entire duration of the current frame group.

PLS2_STAT_SIZE_BIT: This 14-bit field indicates a size, in bits, of PLS2-STAT for a current frame group. This value is constant during the entire duration of the current frame group.

PLS2_DYN_SIZE_BIT: This 14-bit field indicates a size, in bits, of PLS2-DYN for a current frame group. This value is constant during the entire duration of the current frame group.

PLS2_REP_FLAG: This 1-bit flag indicates whether a PLS2 repetition mode is used in a current frame group. When this field is set to a value of the PLS2 repetition mode is activated. When this field is set to a value of '0', the PLS2 repetition mode is deactivated.

PLS2_REP_SIZE_CELL: This 15-bit field indicates Ctotal_partial_block, a size (specified as the number of QAM cells) of the collection of partial coded blocks for PLS2 carried in every frame of a current frame group, when PLS2 repetition is used. If repetition is not used, a value of this field is equal to 0. This value is constant during the entire duration of the current frame group.

PLS2_NEXT_FEC_TYPE: This 2-bit field indicates an FEC type used for PLS2 that is carried in every frame of a next frame group. The FEC type is signaled according to Table 10.

PLS2_NEXT_MOD: This 3-bit field indicates a modulation type used for PLS2 that is carried in every frame of a next frame group. The modulation type is signaled according to Table 11.

PLS2_NEXT_REP_FLAG: This 1-bit flag indicates whether the PLS2 repetition mode is used in a next frame group. When this field is set to a value of '1', the PLS2 repetition mode is activated. When this field is set to a value of '0', the PLS2 repetition mode is deactivated.

PLS2_NEXT_REP_SIZE_CELL: This 15-bit field indicates Ctotal_full_block, a size (specified as the number of QAM cells) of the collection of full coded blocks for PLS2 that is carried in every frame of a next frame group, when PLS2 repetition is used. If repetition is not used in the next frame group, a value of this field is equal to 0. This value is constant during the entire duration of a current frame group.

PLS2_NEXT_REP_STAT_SIZE_BIT: This 14-bit field indicates a size, in bits, of PLS2-STAT for a next frame group. This value is constant in a current frame group.

PLS2_NEXT_REP_DYN_SIZE_BIT: This 14-bit field indicates the size, in bits, of the PLS2-DYN for a next frame group. This value is constant in a current frame group.

PLS2_AP_MODE: This 2-bit field indicates whether additional parity is provided for PLS2 in a current frame group. This value is constant during the entire duration of the current frame group. Table 6 below provides values of this field. When this field is set to a value of '00', additional parity is not used for the PLS2 in the current frame group.

TABLE 6

| Value | PLS2-AP mode |
| --- | --- |
| 00 | AP is not provided |
| 01 | AP1 mode |
| 10 to 11 | Reserved |

PLS2_AP_SIZE_CELL: This 15-bit field indicates a size (specified as the number of QAM cells) of additional parity bits of PLS2. This value is constant during the entire duration of a current frame group.

PLS2_NEXT_AP_MODE: This 2-bit field indicates whether additional parity is provided for PLS2 signaling in every frame of a next frame group. This value is constant during the entire duration of a current frame group. Table 12 defines values of this field.

PLS2_NEXT_AP_SIZE_CELL: This 15-bit field indicates a size (specified as the number of QAM cells) of additional parity bits of PLS2 in every frame of a next frame group. This value is constant during the entire duration of a current frame group.

RESERVED: This 32-bit field is reserved for future use.

CRC_32: A 32-bit error detection code, which is applied to all PLS1 signaling.

FIG. 25 illustrates PLS2 data according to an embodiment of the present invention.

FIG. 25 illustrates PLS2-STAT data of the PLS2 data. The PLS2-STAT data is the same within a frame group, while PLS2-DYN data provides information that is specific for a current frame.

Details of fields of the PLS2-STAT data are described below.

FIC_FLAG: This 1-bit field indicates whether the FIC is used in a current frame group. If this field is set to '1', the FIC is provided in the current frame. If this field set to '0', the FIC is not carried in the current frame. This value is constant during the entire duration of a current frame group.

AUX_FLAG: This 1-bit field indicates whether an auxiliary stream is used in a current frame group. If this field is set to '1', the auxiliary stream is provided in a current frame. If this field set to '0', the auxiliary stream is not carried in the current frame. This value is constant during the entire duration of current frame group.

NUM_DP: This 6-bit field indicates the number of DPs carried within a current frame. A value of this field ranges from 1 to 64, and the number of DPs is NUM_DP+1.

DP_ID: This 6-bit field identifies uniquely a DP within a PHY profile.

DP_TYPE: This 3-bit field indicates a type of a DP. This is signaled according to the following Table 7.

TABLE 7

| Value | DP Type |
| --- | --- |
| 000 | DP Type 1 |
| 001 | DP Type 2 |
| 010 to 111 | Reserved |

DP_GROUP_ID: This 8-bit field identifies a DP group with which a current DP is associated. This may be used by the receiver to access DPs of service components associated with a particular service having the same DP_GROUP_ID.

BASE_DP_ID: This 6-bit field indicates a DP carrying service signaling data (such as PSI/SI) used in a management layer. The DP indicated by BASE_DP_ID may be either a normal DP carrying the service signaling data along with service data or a dedicated DP carrying only the service signaling data.

DP_FEC_TYPE: This 2-bit field indicates an FEC type used by an associated DP. The FEC type is signaled according to the following Table 8.

TABLE 8

| Value | FEC_TYPE |
| --- | --- |
| 00 | 16K LDPC |
| 01 | 64K LDPC |
| 10 to 11 | Reserved |

DP_COD: This 4-bit field indicates a code rate used by an associated DP. The code rate is signaled according to the following Table 9.

TABLE 9

| Value | Code rate |
| --- | --- |
| 0000 | 5/15 |
| 0001 | 6/15 |
| 0010 | 7/15 |
| 0011 | 8/15 |
| 0100 | 9/15 |
| 0101 | 10/15 |
| 0110 | 11/15 |
| 0111 | 12/15 |
| 1000 | 13/15 |
| 1001 to 1111 | Reserved |

DP_MOD: This 4-bit field indicates modulation used by an associated DP. The modulation is signaled according to the following Table 10.

TABLE 10

| Value | Modulation |
| --- | --- |
| 0000 | QPSK |
| 0001 | QAM-16 |
| 0010 | NUQ-64 |
| 0011 | NUQ-256 |
| 0100 | NUQ-1024 |
| 0101 | NUC-16 |
| 0110 | NUC-64 |
| 0111 | NUC-256 |
| 1000 | NUC-1024 |
| 1001 to 1111 | Reserved |

DP_SSD_FLAG: This 1-bit field indicates whether an SSD mode is used in an associated DR If this field is set to a value of '1', SSD is used. If this field is set to a value of '0', SSD is not used.

The following field appears only if PHY_PROFILE is equal to '010', which indicates the advanced profile:

DP_MIMO: This 3-bit field indicates which type of MIMO encoding process is applied to an associated DR A type of MIMO encoding process is signaled according to the following Table 11.

TABLE 11

| Value | MIMO encoding |
| --- | --- |
| 000 | FR-SM |
| 001 | FRFD-SM |
| 010 to 111 | Reserved |

DP_TI_TYPE: This 1-bit field indicates a type of time interleaving. A value of '0' indicates that one TI group corresponds to one frame and contains one or more TI blocks. A value of '1' indicates that one TI group is carried in more than one frame and contains only one TI block.

DP_TI_LENGTH: The use of this 2-bit field (allowed values are only 1, 2, 4, and 8) is determined by values set within the DP_TI_TYPE field as follows.

If DP_TI_TYPE is set to a value of '1', this field indicates PI, the number of frames to which each TI group is mapped, and one TI block is present per TI group (NTI=1). Allowed values of PI with the 2-bit field are defined in Table 12 below.

If DP_TI_TYPE is set to a value of '0', this field indicates the number of TI blocks NTI per TI group, and one TI group is present per frame (PI=1). Allowed values of PI with the 2-bit field are defined in the following Table 12.

TABLE 12

| 2-bit field | PI | NTI |
| --- | --- | --- |
| 00 | 1 | 1 |
| 01 | 2 | 2 |
| 10 | 4 | 3 |
| 11 | 8 | 4 |

DP_FRAME_INTERVAL: This 2-bit field indicates a frame interval (IJUMP) within a frame group for an associated DP and allowed values are 1, 2, 4, and 8 (the corresponding 2-bit field is '00', '01', '10', or '11', respectively). For DPs that do not appear every frame of the frame group, a value of this field is equal to an interval between successive frames. For example, if a DP appears on frames 1, 5, 9, 13, etc., this field is set to a value of '4'. For DPs that appear in every frame, this field is set to a value of '1'.

DP_TI_BYPASS: This 1-bit field determines availability of the time interleaver 5050. If time interleaving is not used for a DP, a value of this field is set to '1'. If time interleaving is used, the value is set to '0'.

DP_FIRST_FRAME IDX: This 5-bit field indicates an index of a first frame of a superframe in which a current DP occurs. A value of DP_FIRST_FRAME IDX ranges from 0 to 31.

DP_NUM_BLOCK MAX: This 10-bit field indicates a maximum value of DP_NUM_BLOCKS for this DP. A value of this field has the same range as DP_NUM_B-LOCKS.

DP_PAYLOAD_TYPE: This 2-bit field indicates a type of payload data carried by a given DP. DP_PAYLOAD_TYPE is signaled according to the following Table 13.

TABLE 13

| Value | Payload Type |
| --- | --- |
| 00 | TS |
| 01 | IP |
| 10 | GS |
| 11 | Reserved |

DP_INBAND_MODE: This 2-bit field indicates whether a current DP carries in-band signaling information. An in-band signaling type is signaled according to the following Table 14.

TABLE 14

| Value | In-band mode |
| --- | --- |
| 00 | In-band signaling is not carried. |
| 01 | INBAND-PLS is carried |
| 10 | INBAND-ISSY is carried |
| 11 | INBAND-PLS and INBAND-ISSY are carried |

DP_PROTOCOL_TYPE: This 2-bit field indicates a protocol type of a payload carried by a given DP. The protocol type is signaled according to Table 15 below when input payload types are selected.

TABLE 15

| Value | If DP_PAY-LOAD_TYPE is TS | If DP_PAY-LOAD_TYPE is IP | If DP_PAY-LOAD_TYPE is GS |
| --- | --- | --- | --- |
| 00 | MPEG2-TS | IPv4 | (Note) |
| 01 | Reserved | IPv6 | Reserved |
| 10 | Reserved | Reserved | Reserved |
| 11 | Reserved | Reserved | Reserved |

DP_CRC_MODE: This 2-bit field indicates whether CRC encoding is used in an input formatting block. A CRC mode is signaled according to the following Table 16.

TABLE 16

| Value | CRC mode |
| --- | --- |
| 00 | Not used |
| 01 | CRC-8 |
| 10 | CRC-16 |
| 11 | CRC-32 |

DNP_MODE: This 2-bit field indicates a null-packet deletion mode used by an associated DP when DP_PAYLOAD_TYPE is set to TS ('00'). DNP_MODE is signaled according to Table 17 below. If DP_PAYLOAD_TYPE is not TS ('00'), DNP_MODE is set to a value of '00'.

TABLE 17

| Value | Null-packet deletion mode |
|---|---|
| 00 | Not used |
| 01 | DNP-NORMAL |
| 10 | DNP-OFFSET |
| 11 | Reserved |

ISSY_MODE: This 2-bit field indicates an ISSY mode used by an associated DP when DP_PAYLOAD_TYPE is set to TS ('00'). ISSY_MODE is signaled according to Table 18 below. If DP_PAYLOAD_TYPE is not TS ('00'), ISSY_MODE is set to the value of '00'.

TABLE 18

| Value | ISSY mode |
|---|---|
| 00 | Not used |
| 01 | ISSY-UP |
| 10 | ISSY-BBF |
| 11 | Reserved |

HC_MODE_TS: This 2-bit field indicates a TS header compression mode used by an associated DP when DP_PAYLOAD_TYPE is set to TS ('00'). HC_MODE_TS is signaled according to the following Table 19.

TABLE 19

| Value | Header compression mode |
|---|---|
| 00 | HC_MODE_TS 1 |
| 01 | HC_MODE_TS 2 |
| 10 | HC_MODE_TS 3 |
| 11 | HC_MODE_TS 4 |

HC_MODE_IP: This 2-bit field indicates an IP header compression mode when DP_PAYLOAD_TYPE is set to IP ('01'). HC_MODE_IP is signaled according to the following Table 20.

TABLE 20

| Value | Header compression mode |
|---|---|
| 00 | No compression |
| 01 | HC_MODE_IP 1 |
| 10 to 11 | Reserved |

PID: This 13-bit field indicates the PID number for TS header compression when DP_PAYLOAD_TYPE is set to TS ('00') and HC_MODE_TS is set to '01' or '10'.

RESERVED: This 8-bit field is reserved for future use.

The following fields appear only if FIC_FLAG is equal to '1'.

FIC_VERSION: This 8-bit field indicates the version number of the FIC.

FIC_LENGTH_BYTE: This 13-bit field indicates the length, in bytes, of the FIC.

RESERVED: This 8-bit field is reserved for future use.

The following fields appear only if AUX_FLAG is equal to '1'.

NUM_AUX: This 4-bit field indicates the number of auxiliary streams. Zero means no auxiliary stream is used.

AUX_CONFIG_RFU: This 8-bit field is reserved for future use.

AUX_STREAM_TYPE: This 4-bit is reserved for future use for indicating a type of a current auxiliary stream.

AUX_PRIVATE_CONFIG: This 28-bit field is reserved for future use for signaling auxiliary streams.

FIG. 26 illustrates PLS2 data according to another embodiment of the present invention.

FIG. 26 illustrates PLS2-DYN data of the PLS2 data. Values of the PLS2-DYN data may change during the duration of one frame group while sizes of fields remain constant.

Details of fields of the PLS2-DYN data are as below.

FRAME_INDEX: This 5-bit field indicates a frame index of a current frame within a superframe. An index of a first frame of the superframe is set to '0'.

PLS_CHANGE_COUNTER: This 4-bit field indicates the number of superframes before a configuration changes. A next superframe with changes in the configuration is indicated by a value signaled within this field. If this field is set to a value of '0000', it means that no scheduled change is foreseen. For example, a value of '1' indicates that there is a change in the next superframe.

FIC_CHANGE_COUNTER: This 4-bit field indicates the number of superframes before a configuration (i.e., content of the FIC) changes. A next superframe with changes in the configuration is indicated by a value signaled within this field. If this field is set to a value of '0000', it means that no scheduled change is foreseen. For example, a value of '0001' indicates that there is a change in the next superframe.

RESERVED: This 16-bit field is reserved for future use.

The following fields appear in a loop over NUM_DP, which describe parameters associated with a DP carried in a current frame.

DP_ID: This 6-bit field uniquely indicates a DP within a PHY profile.

DP_START: This 15-bit (or 13-bit) field indicates a start position of the first of the DPs using a DPU addressing scheme. The DP_START field has differing length according to the PHY profile and FFT size as shown in the following Table 21.

TABLE 21

| | DP_START field size | |
|---|---|---|
| PHY profile | 64K | 16K |
| Base | 13 bits | 15 bits |
| Handheld | — | 13 bits |
| Advanced | 13 bits | its |

DP_NUM_BLOCK: This 10-bit field indicates the number of FEC blocks in a current TI group for a current DP. A value of DP_NUM_BLOCK ranges from 0 to 1023.

RESERVED: This 8-bit field is reserved for future use.

The following fields indicate FIC parameters associated with the EAC.

EAC_FLAG: This 1-bit field indicates the presence of the EAC in a current frame. This bit is the same value as EAC FLAG in a preamble.

EAS_WAKE_UP_VERSION_NUM: This 8-bit field indicates a version number of a wake-up indication.

If the EAC_FLAG field is equal to '1', the following 12 bits are allocated to EAC_LENGTH_BYTE.

If the EAC_FLAG field is equal to '0', the following 12 bits are allocated to EAC_COUNTER.

EAC_LENGTH_BYTE: This 12-bit field indicates a length, in bytes, of the EAC.

EAC_COUNTER: This 12-bit field indicates the number of frames before a frame where the EAC arrives.

The following fields appear only if the AUX_FLAG field is equal to '1'.

AUX_PRIVATE_DYN: This 48-bit field is reserved for future use for signaling auxiliary streams. A meaning of this field depends on a value of AUX_STREAM_TYPE in a configurable PLS2-STAT.

CRC_32: A 32-bit error detection code, which is applied to the entire PLS2.

FIG. 27 illustrates a logical structure of a frame according to an embodiment of the present invention.

As above mentioned, the PLS, EAC, FIC, DPs, auxiliary streams and dummy cells are mapped to the active carriers of OFDM symbols in a frame. PLS1 and PLS2 are first mapped to one or more FSSs. Thereafter, EAC cells, if any, are mapped to an immediately following PLS field, followed next by FIC cells, if any. The DPs are mapped next after the PLS or after the EAC or the FIC, if any. Type 1 DPs are mapped first and Type 2 DPs are mapped next. Details of types of the DPs will be described later. In some cases, DPs may carry some special data for EAS or service signaling data. The auxiliary streams or streams, if any, follow the DPs, which in turn are followed by dummy cells. When the PLS, EAC, FIC, DPs, auxiliary streams and dummy data cells are mapped all together in the above mentioned order, i.e. the PLS, EAC, FIC, DPs, auxiliary streams and dummy data cells, cell capacity in the frame is exactly filled.

FIG. 28 illustrates PLS mapping according to an embodiment of the present invention.

PLS cells are mapped to active carriers of FSS(s). Depending on the number of cells occupied by PLS, one or more symbols are designated as FSS(s), and the number of FSS(s) NFSS is signaled by NUM_FSS in PLS1. The FSS is a special symbol for carrying PLS cells. Since robustness and latency are critical issues in the PLS, the FSS(s) have higher pilot density, allowing fast synchronization and frequency-only interpolation within the FSS.

PLS cells are mapped to active carriers of the FSS(s) in a top-down manner as shown in the figure. PLS1 cells are mapped first from a first cell of a first FSS in increasing order of cell index. PLS2 cells follow immediately after a last cell of PLS1 and mapping continues downward until a last cell index of the first FSS. If the total number of required PLS cells exceeds the number of active carriers of one FSS, mapping proceeds to a next FSS and continues in exactly the same manner as the first FSS.

After PLS mapping is completed, DPs are carried next. If an EAC, an FIC or both are present in a current frame, the EAC and the FIC are placed between the PLS and "normal" DPs.

Hereinafter, description will be given of encoding an FEC structure according to an embodiment of the present invention. As above mentioned, the data FEC encoder may perform FEC encoding on an input BBF to generate an FECBLOCK procedure using outer coding (BCH), and inner coding (LDPC). The illustrated FEC structure corresponds to the FECBLOCK. In addition, the FECBLOCK and the FEC structure have same value corresponding to a length of an LDPC codeword.

As described above, BCH encoding is applied to each BBF (Kbch bits), and then LDPC encoding is applied to BCH-encoded BBF (Kldpc bits=Nbch bits).

A value of Nldpc is either 64,800 bits (long FECBLOCK) or 16,200 bits (short FECBLOCK).

Table 22 and Table 23 below show FEC encoding parameters for the long FECBLOCK and the short FECBLOCK, respectively.

TABLE 22

| LDPC rate | Nldpc | Kldpc | Kbch | BCH error correction capability | Nbch − Kbch |
|---|---|---|---|---|---|
| 5/15 | 64800 | 21600 | 21408 | 12 | 192 |
| 6/15 | | 25920 | 25728 | | |
| 7/15 | | 30240 | 30048 | | |
| 8/15 | | 34560 | 34368 | | |
| 9/15 | | 38880 | 38688 | | |
| 10/15 | | 43200 | 43008 | | |
| 11/15 | | 47520 | 47328 | | |
| 12/15 | | 51840 | 51648 | | |
| 13/15 | | 56160 | 55968 | | |

TABLE 23

| LDPC rate | Nldpc | Kldpc | Kbch | BCH error correction capability | Nbch − Kbch |
|---|---|---|---|---|---|
| 5/15 | 16200 | 5400 | 5232 | 12 | 168 |
| 6/15 | | 6480 | 6312 | | |
| 7/15 | | 7560 | 7392 | | |
| 8/15 | | 8640 | 8472 | | |
| 9/15 | | 9720 | 9552 | | |
| 10/15 | | 10800 | 10632 | | |
| 11/15 | | 11880 | 11712 | | |
| 12/15 | | 12960 | 12792 | | |
| 13/15 | | 14040 | 13872 | | |

Detailed operations of BCH encoding and LDPC encoding are as below.

A 12-error correcting BCH code is used for outer encoding of the BBF. A BCH generator polynomial for the short FECBLOCK and the long FECBLOCK are obtained by multiplying all polynomials together.

LDPC code is used to encode an output of outer BCH encoding. To generate a completed Bldpc (FECBLOCK), Pldpc (parity bits) is encoded systematically from each Ildpc (BCH—encoded BBF), and appended to Ildpc. The completed Bldpc (FECBLOCK) is expressed by the following Equation.

$$B_{ldpc} = [I_{ldpc} P_{ldpc}] = [i_0, i_1, \ldots, i_{K_{ldpc}-1}, p_0, p_1, \ldots, p_{N_{ldpc}-K_{ldpc}-1}] \quad \text{[Equation 2]}$$

Parameters for the long FECBLOCK and the short FECBLOCK are given in the above Tables 22 and 23, respectively.

A detailed procedure to calculate Nldpc−Kldpc parity bits for the long FECBLOCK, is as follows.

Initialize the parity bits $$p_0 = p_1 = p_2 = \cdots = p_{N_{ldpc}-K_{ldpc}-1} = 0 \quad \text{[Equation 3]}$$

2) Accumulate a first information bit—i0, at a parity bit address specified in a first row of addresses of a parity check matrix. Details of the addresses of the parity check matrix will be described later. For example, for the rate of 13/15, $$p_{983} = p_{983} \oplus i_0 \qquad p_{2815} = p_{2815} \oplus i_0 \quad \text{[Equation 4]}$$

$$p_{4837} = p_{4861} \oplus i_0 \qquad p_{4989} = p_{4989} \oplus i_0$$

-continued $$p_{6138} = p_{6162} \oplus i_0 \quad p_{6458} = p_{6458} \oplus i_0$$

$$p_{6921} = p_{6945} \oplus i_0 \quad p_{6974} = p_{6974} \oplus i_0$$

$$p_{7572} = p_{7572} \oplus i_0 \quad p_{8260} = p_{8260} \oplus i_0$$

$$p_{8496} = p_{8496} \oplus i_0$$

3) For the next 359 information bits, is, s=1, 2, ..., 359, accumulate is at parity bit addresses using following Equation.

$$\{x+(s \bmod 360) \times Q_{ldpc}\} \bmod(N_{ldpc}-K_{ldpc}) \quad \text{[Equation 5]}$$

Here, x denotes an address of a parity bit accumulator corresponding to a first bit i0, and Qldpc is a code rate dependent constant specified in the addresses of the parity check matrix. Continuing with the example, Qldpc=24 for the rate of 13/15, so for an information bit i1, the following operations are performed.

$$p_{1007} = p_{1007} \oplus i_1 \quad p_{2389} = p_{2839} \oplus i_1 \quad \text{[Equation 6]}$$

$$p_{4861} = p_{4861} \oplus i_1 \quad p_{5013} = p_{5013} \oplus i_1$$

$$p_{6162} = p_{6162} \oplus i_1 \quad p_{6482} = p_{6482} \oplus i_1$$

$$p_{6945} = p_{6945} \oplus i_1 \quad p_{6998} = p_{6998} \oplus i_1$$

$$p_{7596} = p_{7596} \oplus i_1 \quad p_{8284} = p_{8284} \oplus i_1$$

$$p_{8520} = p_{8520} \oplus i_1$$

4) For a 361th information bit i360, an address of the parity bit accumulator is given in a second row of the addresses of the parity check matrix. In a similar manner, addresses of the parity bit accumulator for the following 359 information bits is, s=361, 362, ..., 719 are obtained using Equation 6, where x denotes an address of the parity bit accumulator corresponding to the information bit i360, i.e., an entry in the second row of the addresses of the parity check matrix.

5) In a similar manner, for every group of 360 new information bits, a new row from the addresses of the parity check matrix is used to find the address of the parity bit accumulator.

After all of the information bits are exhausted, a final parity bit is obtained as below.

6) Sequentially perform the following operations starting with i=1.

$$p_i = p_i \oplus p_{i-1}, i=1,2,\ldots,N_{ldpc}-K_{ldpc}-1 \quad \text{[Equation 7]}$$

Here, final content of pi (i=0, 1, ..., Nldpc−Kldpc−1) is equal to a parity bit pi.

TABLE 24

| Code rate | Qldpc |
|---|---|
| 5/15 | 120 |
| 6/15 | 108 |
| 7/15 | 96 |
| 8/15 | 84 |
| 9/15 | 72 |
| 10/15 | 60 |
| 11/15 | 48 |
| 12/15 | 36 |
| 13/15 | 24 |

This LDPC encoding procedure for the short FEC-BLOCK is in accordance with t LDPC encoding procedure for the long FECBLOCK, except that Table 24 is replaced with Table 25, and the addresses of the parity check matrix for the long FECBLOCK are replaced with the addresses of the parity check matrix for the short FECBLOCK.

TABLE 25

| Code rate | Qldpc |
|---|---|
| 5/15 | 30 |
| 6/15 | 27 |
| 7/15 | 24 |
| 8/15 | 21 |
| 9/15 | 18 |
| 10/15 | 15 |
| 11/15 | 12 |
| 12/15 | 9 |
| 13/15 | 6 |

FIG. 29 illustrates time interleaving according to an embodiment of the present invention.

to (c) show examples of a TI mode.

A time interleaver operates at the DP level. Parameters of time interleaving (TI) may be set differently for each DP.

The following parameters, which appear in part of the PLS2-STAT data, configure the TI.

DP_TI_TYPE (allowed values: 0 or 1): This parameter represents the TI mode. The value of '0' indicates a mode with multiple TI blocks (more than one TI block) per TI group. In this case, one TI group is directly mapped to one frame (no inter-frame interleaving). The value of '1' indicates a mode with only one TI block per TI group. In this case, the TI block may be spread over more than one frame (inter-frame interleaving).

DP_TI_LENGTH: If DP_TI_TYPE='0', this parameter is the number of TI blocks NTI per TI group. For DP_TI_TYPE='1', this parameter is the number of frames PI spread from one TI group.

DP_NUM_BLOCK_MAX (allowed values: 0 to 1023): This parameter represents the maximum number of XFEC-BLOCKs per TI group.

DP_FRAME_INTERVAL (allowed values: 1, 2, 4, and 8): This parameter represents the number of the frames IJUMP between two successive frames carrying the same DP of a given PHY profile.

DP_TI_BYPASS (allowed values: 0 or 1): If time interleaving is not used for a DP, this parameter is set to '1'. This parameter is set to '0' if time interleaving is used.

Additionally, the parameter DP_NUM_BLOCK from the PLS2-DYN data is used to represent the number of XFEC-BLOCKs carried by one TI group of the DP.

When time interleaving is not used for a DP, the following TI group, time interleaving operation, and TI mode are not considered. However, the delay compensation block for the dynamic configuration information from the scheduler may still be required. In each DP, the XFECBLOCKs received from SSD/MIMO encoding are grouped into TI groups. That is, each TI group is a set of an integer number of XFEC-BLOCKs and contains a dynamically variable number of XFECBLOCKs. The number of XFECBLOCKs in the TI group of index n is denoted by NxBLOCK_Group(n) and is signaled as DP_NUM_BLOCK in the PLS2-DYN data. Note that NxBLOCK_Group(n) may vary from a minimum value of 0 to a maximum value of NxBLOCKGroup_MAX (corresponding to DP_NUM_BLOCK_MAX), the largest value of which is 1023.

Each TI group is either mapped directly to one frame or spread over PI frames. Each TI group is also divided into more than one TI block (NTI), where each TI block corresponds to one usage of a time interleaver memory. The TI blocks within the TI group may contain slightly different numbers of XFECBLOCKs. If the TI group is divided into multiple TI blocks, the TI group is directly mapped to only one frame. There are three options for time interleaving (except an extra option of skipping time interleaving) as shown in the following Table 26.

TABLE 26

| Modes | Descriptions |
|---|---|
| Option 1 | Each TI group contains one TI block and is mapped directly to one frame as shown in (a). This option is signaled in PLS2-STAT by DP_TI_TYPE = '0' and DP_TI_LENGTH = '1' (NTI = 1). |
| Option 2 | Each TI group contains one TI block and is mapped to more than one frame. (b) shows an example, where one TI group is mapped to two frames, i.e., DP_TI_LENGTH = '2' (PI = 2) and DP_FRAME_INTERVAL (IJUMP = 2). This provides greater time diversity for low data-rate services. This option is signaled in PLS2-STAT by DP_TI_TYPE = '1'. |
| Option 3 | Each TI group is divided into multiple TI blocks and is mapped directly to one frame as shown in (c). Each TI block may use a full TI memory so as to provide a maximum bit-rate for a DP. This option is signaled in PLS2-STAT by DP_TI_TYPE = '0' and DP_TI_LENGTH = NTI, while PI = 1. |

Typically, the time interleaver may also function as a buffer for DP data prior to a process of frame building. This is achieved by means of two memory banks for each DP. A first TI block is written to a first bank. A second TI block is written to a second bank while the first bank is being read from and so on.

The TI is a twisted row-column block interleaver. For an sth TI block of an nth TI group, the number of rows Nr of a TI memory is equal to the number of cells Ncells, i.e., Nr=Ncells while the number of columns Nc is equal to the number NxBLOCK_TI(n,s).

FIG. 30 illustrates a basic operation of a twisted row-column block interleaver according to an embodiment of the present invention.

FIG. 30(a) shows a write operation in the time interleaver and FIG. 30(b) shows a read operation in the time interleaver. A first XFECBLOCK is written column-wise into a first column of a TI memory, and a second XFECBLOCK is written into a next column, and so on as shown in (a). Then, in an interleaving array, cells are read diagonal-wise. During diagonal-wise reading from a first row (rightwards along a row beginning with a left-most column) to a last row, Nr cells are read out as shown in (b). In detail, assuming $Z_{n,s,i}$ (i=0, ..., $N_r N_c$) as a TI memory cell position to be read sequentially, a reading process in such an interleaving array is performed by calculating a row index $R_{n,s,i}$ a column index $C_{n,s,i}$, and an associated twisting parameter $T_{n,s,i}$ as in the following Equation.

$$\text{GENERATE } (R_{n,s,j}, C_{n,s,j}) = \qquad \text{[Equation 8]}$$

$$\{$$

$$R_{n,s,i} = \text{mod}(i, N_r),$$

$$T_{n,s,i} = \text{mod}(S_{shift} \times R_{n,s,i}, N_c),$$

$$C_{n,s,i} = \text{mod}\left(T_{n,s,i} + \left\lfloor \frac{i}{N_r} \right\rfloor, N_c\right),$$

$$\}$$

Here, $S_{shift}$ is a common shift value for a diagonal-wise reading process regardless of $N_{xBLOCK\_TI}(n,s)$, and the shift value is determined by $N_{xBLOCK\_TI\_MAX}$ given in PLS2-STAT as in the following Equation.

$$\text{for } \begin{cases} N'_{xBLOCK\_TI\_MAX} = N_{xBLOCK\_TI\_MAX} + 1, & \text{if } N_{xBLOCK\_TI\_MAX} \text{mod} 2 = 0 \\ N'_{xBLOCKTIMAX} = N_{xBLOCKTIMAX}, & \text{if } N_{xBLOCKTIMAX} \text{mod} 2 = 1 \end{cases} \qquad \text{[Equation 9]}$$

$$S_{shift} = \frac{N'_{xBLOCK\_TI\_MAX} - 1}{2}$$

As a result, cell positions to be read are calculated by coordinates $Z_{n,s,i} = N_r C_{n,s,i} + R_{n,s,i}$.

Figure 31:
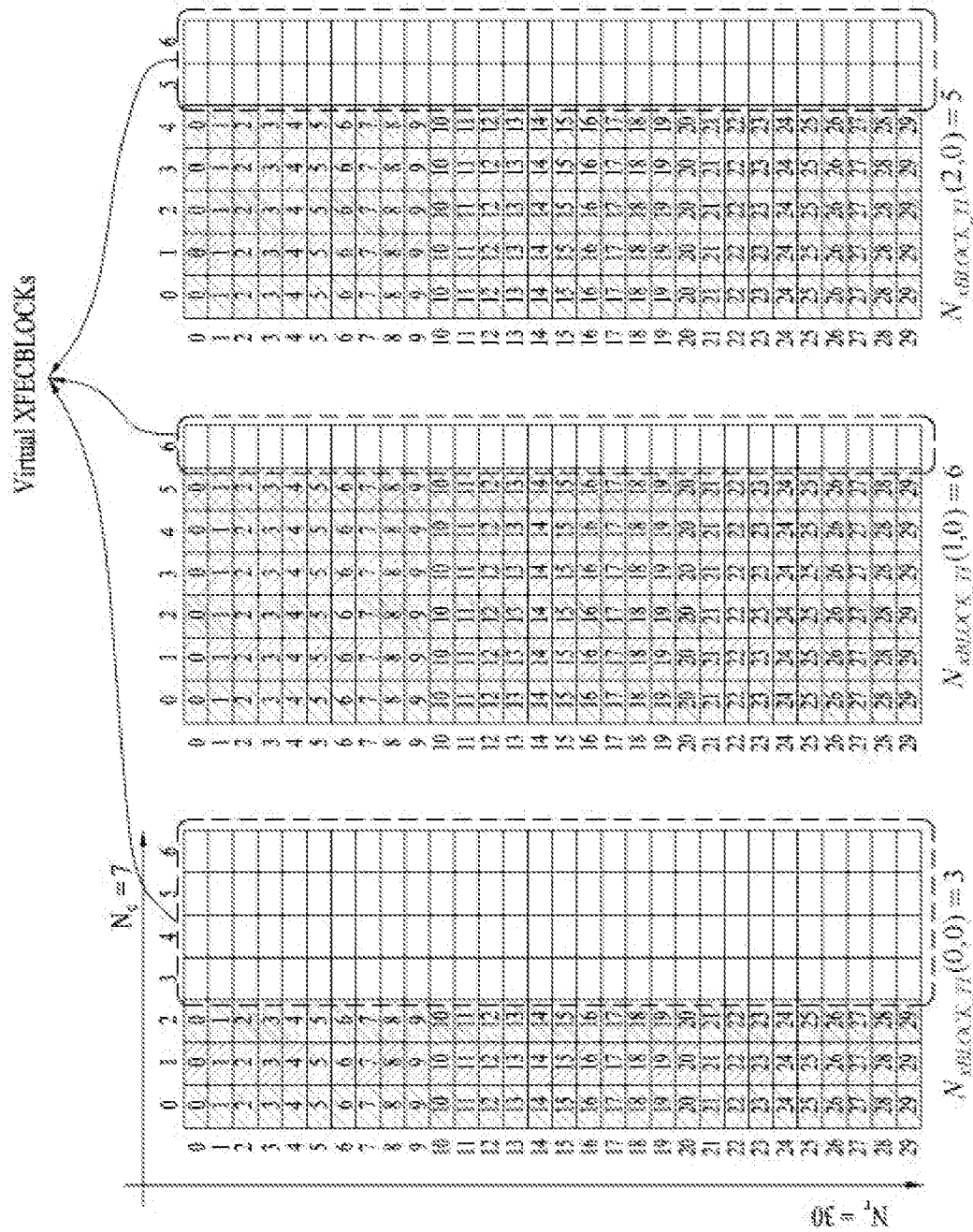
FIG. 31 illustrates an operation of a twisted row-column block interleaver according to another embodiment of the present invention.

FIG. 31 illustrates an operation of a twisted row-column block interleaver according to another embodiment of the present invention.

More specifically, FIG. 31 illustrates an interleaving array in a TI memory for each TI group, including virtual XFEC-BLOCKs when $N_{xBLOCK\_TI}(0,0)=3$, $N_{xBLOCK\_TI}(1,0)=6$ and $N_{xBLOCK\_TI}(2,0)=5$.

A variable number $(n,s)=N_r$ may be less than or equal to $N'_{xBLOCK\_TI\_MAX}$. Thus, in order to achieve single-memory deinterleaving at a receiver side regardless of $N_{xBLOCK\_TI}(n,s)$, the interleaving array for use in the twisted row-column block interleaver is set to a size of $N_r \times N_c = N_{cells} \times N'_{xBLOCK\_TI\_MAX}$ by inserting the virtual XFECBLOCKs into the TI memory and a reading process is accomplished as in the following Equation.

[Equation 10]

```
p = 0;
for i = 0;i < N_cells N'_xBLOCK_TI_MAX;i = i + 1
   {GENERATE (R_n,s,i, C_n,s,i);
```

-continued

[Equation 10]

$$V_i = N_r C_{n,s,j} + R_{n,s,j}$$
$$\text{if } V_i < N_{cells} N_{xBLOCK\_TI}(n,s)$$
$$\{$$
$$Z_{n,s,p} = V_i; \; p = p + 1;$$
$$\}$$
$$\}$$

The number of TI groups is set to 3. An option of the time interleaver is signaled in the PLS2-STAT data by DP_TI_TYPE='0', DP_FRAME_INTERVAL='1' and DP_TI_LENGTH='1', i.e., NTI=1, IJUMP=1, and PI=1. The number of XFECBLOCKs, each of which has Ncells=30 cells, per TI group is signaled in the PLS2-DYN data by NxBLOCK_TI(0,0)=3, NxBLOCK_TI(1,0)=6, and NxBLOCK_TI(2,0)=5, respectively. A maximum number of XFECBLOCKs is signaled in the PLS2-STAT data by NxBLOCK_Group_MAX, which leads to $\lfloor N_{xBLOCK\_Group\_MAX}/N_{TI} \rfloor = N_{xBLOCK\_TI\_MAX} = 6$.

The purpose of the Frequency Interleaver, which operates on data corresponding to a single OFDM symbol, is to provide frequency diversity by randomly interleaving data cells received from the frame builder. In order to get maximum interleaving gain in a single frame, a different interleaving-sequence is used for every OFDM symbol pair comprised of two sequential OFDM symbols.

Therefore, the frequency interleaver according to the present embodiment may include an interleaving address generator for generating an interleaving address for applying corresponding data to a symbol pair.

Figure 32:
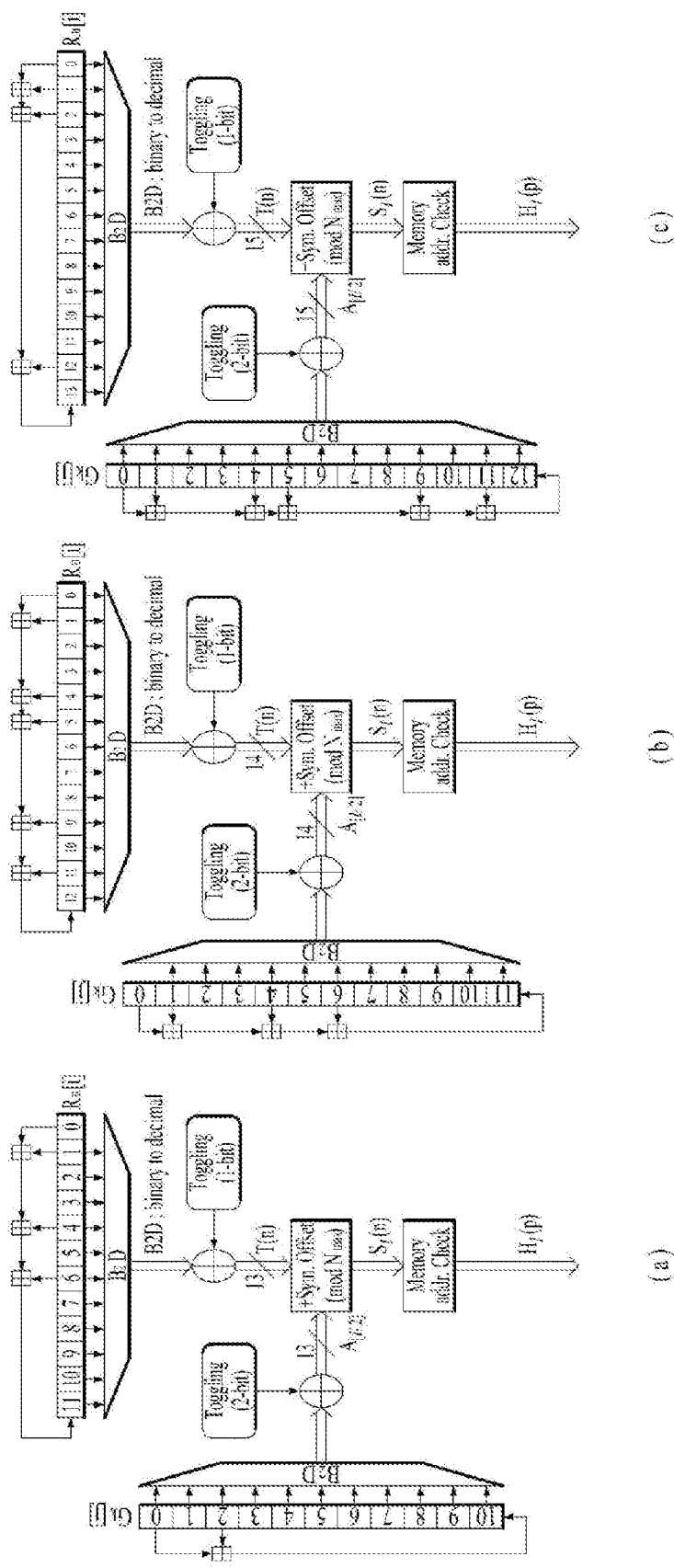
FIG. 32 is a block diagram illustrating an interlaving address generator including a main pseudo-random binary sequence (PRBS) generator and a sub-PRBS generator according to each FFT mode according to an embodiment of the present invention.

FIG. 32 illustrates an interleaving address generator including a main pseudo-random binary sequence (PRBS) generator and a sub-PRBS generator according to each FFT mode according to an embodiment of the present invention.

shows the block diagrams of the interleaving-address generator for 8K FFT mode, (b) shows the block diagrams of the interleaving-address generator for 16K FFT mode and (c) shows the block diagrams of the interleaving-address generator for 32K FFT mode.

The interleaving process for the OFDM symbol pair is described as follows, exploiting a single interleaving-sequence. First, available data cells (the output cells from the Cell Mapper) to be interleaved in one OFDM symbol Om,l is defined as $O_{m,l} = [x_{m,l,0}, \ldots, x_{m,j,p}, \ldots, x_{m,l,N_{data}-1}]$ for l=0, ..., $N_{sym}-1$, where xm,l,p is the pth cell of the lth OFDM symbol in the mth frame and Ndata is the number of data cells: Ndata=CFSS for the frame signaling symbol(s), Ndata=Cdata for the normal data, and Ndata=CFES for the frame edge symbol. In addition, the interleaved data cells are defined as $P_{m,l} = [v_{m,l,0}, \ldots, v_{m,l,N_{data}-1}]$ for l=0, ..., $N_{sym}-1$.

For the OFDM symbol pair, the interleaved OFDM symbol pair is given by $v_{m,l,H_i(p)} = x_{m,l,p}$, p=0, ..., $N_{data}-1$ for the first OFDM symbol of each pair $v_{m,l,p} = x_{m,l,H_i(p)}$, p=0, ..., $N_{data}-1$, for the second OFDM symbol of each pair, where $H_i(p)$ is the interleaving address generated by a PRBS generator.

FIG. 33 illustrates a main PRBS used for all FFT modes according to an embodiment of the present invention.

illustrates the main PRBS, and (b) illustrates a parameter Nmax for each FFT mode.

FIG. 34 illustrates a sub-PRBS used for FFT modes and an interleaving address for frequency interleaving according to an embodiment of the present invention.

illustrates a sub-PRBS generator, and (b) illustrates an interleaving address for frequency interleaving. A cyclic shift value according to an embodiment of the present invention may be referred to as a symbol offset.

Figure 35:
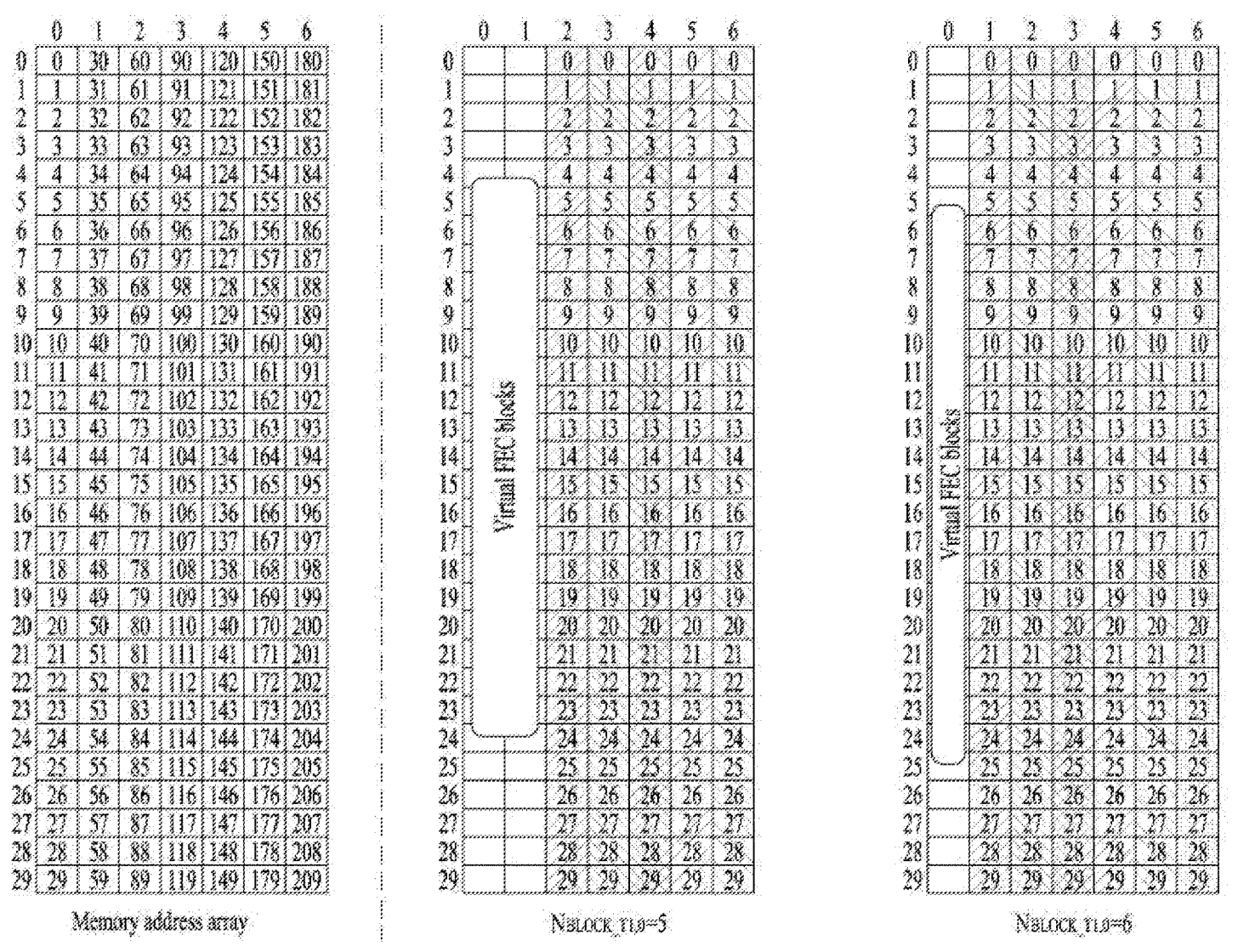

FIG. 35 illustrates a write operation of a time interleaver according to an embodiment of the present invention.

FIG. 35 illustrates a write operation for two TI groups.

A left block in the figure illustrates a TI memory address array, and right blocks in the figure illustrate a write operation when two virtual FEC blocks and one virtual FEC block are inserted into heads of two contiguous TI groups, respectively.

Hereinafter, description will be given of a configuration of a time interleaver and a time interleaving method using both a convolutional interleaver (CI) and a block interleaver (BI) or selectively using either the CI or the BI according to a physical layer pipe (PLP) mode. A PLP according to an embodiment of the present invention is a physical path corresponding to the same concept as that of the above-described DP, and a name of the PLP may be changed by a designer.

A PLP mode according to an embodiment of the present invention may include a single PLP mode or a multi-PLP mode according to the number of PLPs processed by a broadcast signal transmitter or a broadcast signal transmission apparatus. The single PLP mode corresponds to a case in which one PLP is processed by the broadcast signal transmission apparatus. The single PLP mode may be referred to as a single PLP.

The multi-PLP mode corresponds to a case in which one or more PLPs are processed by the broadcast signal transmission apparatus. The multi-PLP mode may be referred to as multiple PLPs.

In the present invention, time interleaving in which different time interleaving schemes are applied according to PLP modes may be referred to as hybrid time interleaving. Hybrid time interleaving according to an embodiment of the present invention is applied for each PLP (or at each PLP level) in the multi-PLP mode.

Figure 36:
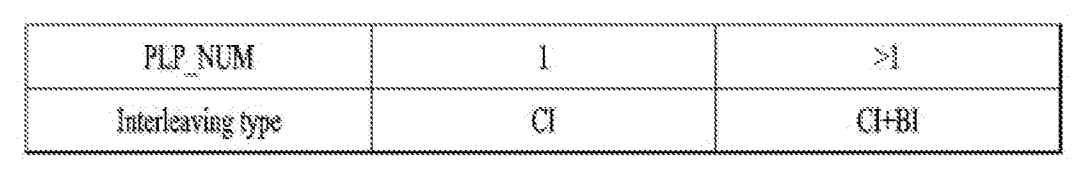

FIG. 36 illustrates an interleaving type applied according to the number of PLPs in a table.

In a time interleaving according to an embodiment of the present invention, an interleaving type may be determined based on a value of PLP_NUM. PLP_NUM is a signaling field indicating a PLP mode. When PLP_NUM has a value of 1, the PLP mode corresponds to a single PLP. The single PLP according to the present embodiment may be applied only to a CI.

When PLP_NUM has a value greater than 1, the PLP mode corresponds to multiple PLPs. The multiple PLPs according to the present embodiment may be applied to the CI and a BI. In this case, the CI may perform inter-frame interleaving, and the BI may perform intra-frame interleaving.

Figure 37:
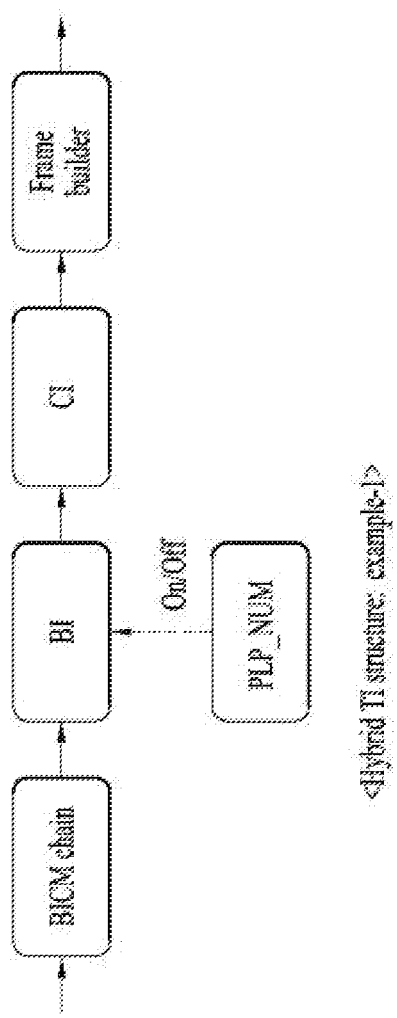
FIG. 37 is a block diagram including a first example of a structure of a hybrid time interleaver.

FIG. 37 is a block diagram including a first example of a structure of a hybrid time interleaver described above.

The hybrid time interleaver according to the first example may include a BI and a CI. The time interleaver of the present invention may be positioned between a BICM chain block and a frame builder.

Figure 38:
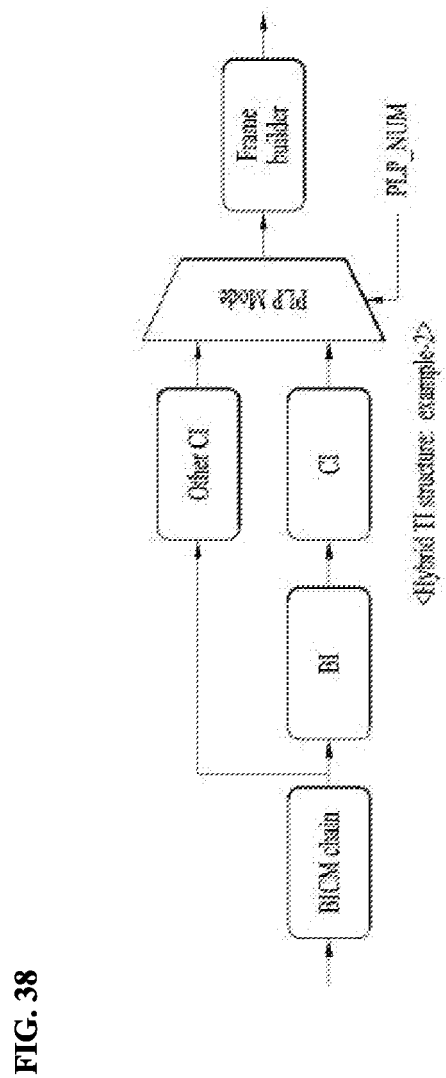
FIG. 38 is a block diagram including a second example of the structure of the hybrid time interleaver.

The BICM chain block illustrated in FIGS. 37 and 38 may include the blocks in the processing block 5000 of the BICM block illustrated in FIG. 19 except for the time interleaver 5050. The frame builder illustrated in FIGS. 37 and 38 may perform the same function as that of the frame building block 1020 of FIG. 18.

As described in the foregoing, it is possible to determine whether to apply the BI according to the first example of the structure of the hybrid time interleaver depending on values of PLP_NUM. That is, when PLP_NUM=1, the BI is not applied (BI is turned OFF) and only the CI is applied. When PLP_NUM>1, both the BI and the CI may be applied (BI is turned ON). A structure and an operation of the CI applied when PLP_NUM>1 may be the same as or similar to a structure and an operation of the CI applied when PLP_NUM=1.

FIG. 38 is a block diagram including a second example of the structure of the hybrid time interleaver described above.

An operation of each block included in the second example of the structure of the hybrid time interleaver is the same as the above description in FIG. 20. It is possible to determine whether to apply a BI according to the second example of the structure of the hybrid time interleaver depending on values of PLP_NUM. Each block of the hybrid time interleaver according to the second example may perform operations according to embodiments of the present invention. In this instance, an applied structure and operation of a CI may be different between a case of PLP_NUM=1 and a case of PLP_NUM>1.

Figure 39:
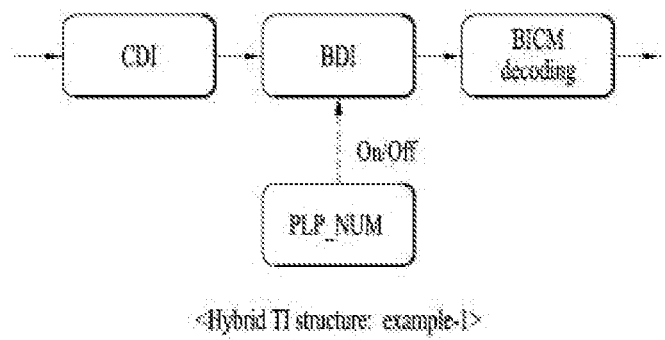
FIG. 39 is a block diagram including a first example of a structure of a hybrid time deinterleaver.

FIG. 39 is a block diagram including a first example of a structure of a hybrid time deinterleaver.

The hybrid time deinterleaver according to the first example may perform an operation corresponding to a reverse operation of the hybrid time interleaver according to the first example described above. Therefore, the hybrid time deinterleaver according to the first example of FIG. 39 may include a convolutional deinterleaver (CDI) and a block deinterleaver (BDI).

A structure and an operation of the CDI applied when PLP_NUM>1 may be the same as or similar to a structure and an operation of the CDI applied when PLP_NUM=1.

It is possible to determine whether to apply the BDI according to the first example of the structure of the hybrid time deinterleaver depending on values of PLP_NUM. That is, when PLP_NUM=1, the BDI is not applied (BDI is turned OFF) and only the CDI is applied.

The CDI of the hybrid time deinterleaver may perform inter-frame deinterleaving, and the BDEI may perform intra-frame deinterleaving. Details of inter-frame deinterleaving and intra-frame deinterleaving are the same as the above description.

Figure 40:
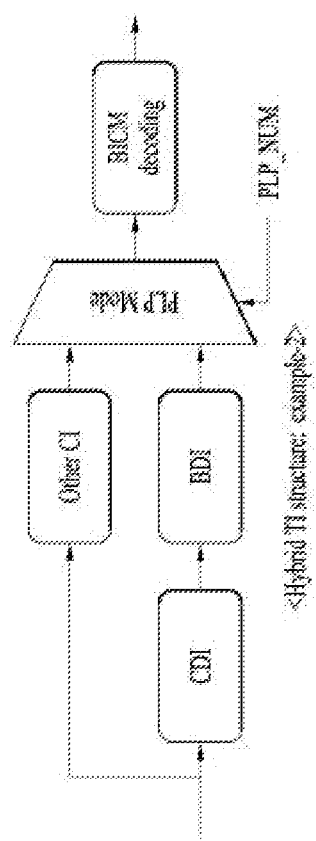
FIG. 40 is a block diagram including a second example of the structure of the hybrid time deinterleaver.

A BICM decoding block illustrated in FIGS. 39 and 40 may perform a reverse operation of the BICM chain block of FIGS. 37 and 38.

FIG. 40 is a block diagram including a second example of the structure of the hybrid time deinterleaver.

The hybrid time deinterleaver according to the second example may perform an operation corresponding to a reverse operation of the hybrid time interleaver according to the second example described above. An operation of each block included in the second example of the structure of the hybrid time deinterleaver may be the same as the above description in FIG. 39.

It is possible to determine whether to apply a BDI according to the second example of the structure of the hybrid time deinterleaver depending on values of PLP_NUM. Each block of the hybrid time deinterleaver according to the second example may perform operations according to embodiments of the present invention. In this instance, an applied structure and operation of a CDI may be different between a case of PLP_NUM=1 and a case of PLP_NUM>1.

In what follows, a method for transmitting and receiving content data and a signaling method in a broadcast system are described. In particular, described in more detail will be a signal processing method applied before physical layer signal processing.

In the present invention, FIT (Fast Information Table) may be called LLS (Link Layer Signaling) or LLS (Low Level Signaling). In the present invention, all of the fields/elements of each table may not be included but included selectively depending on the needs.

Figure 41:
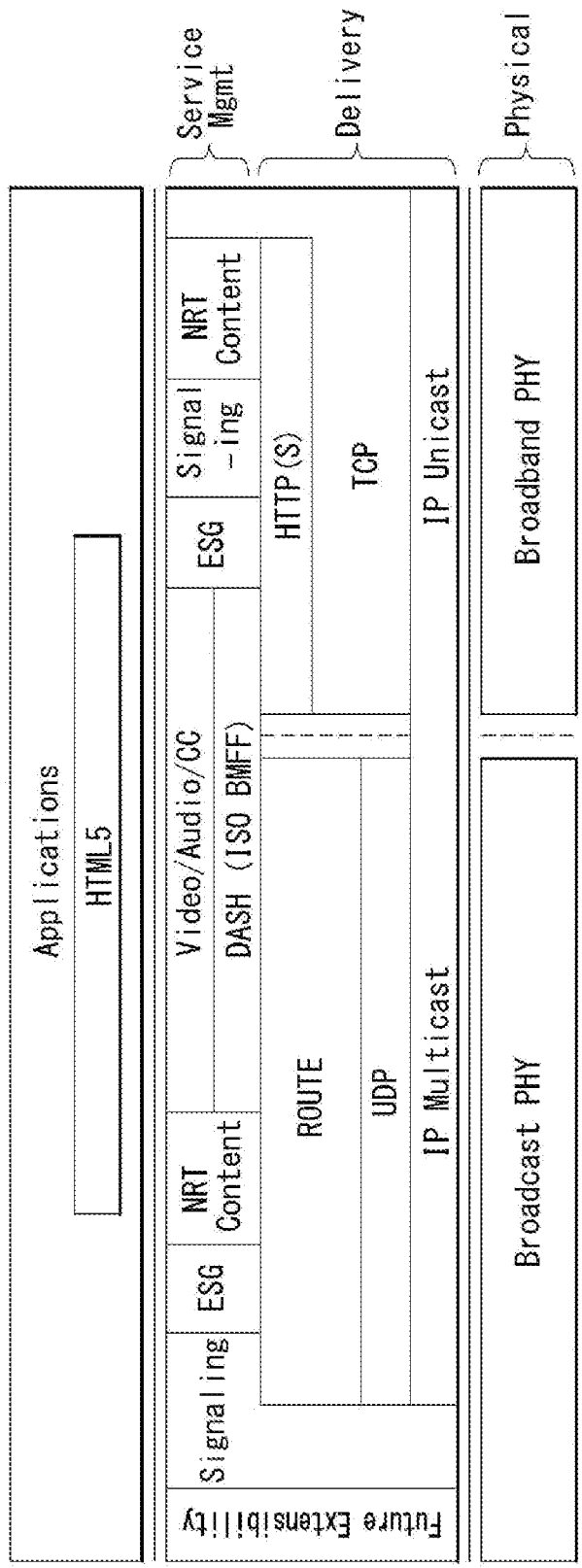
FIG. 41 is a receiver protocol stack according to an embodiment of the present invention.

FIG. 41 is a receiver protocol stack according to an embodiment of the present invention.

A broadcast service may be delivered by using three functional layers. The three functional layers comprise a physical layer, a delivery layer, and a service management layer. The physical layer may provide a mechanism by which signaling, service announcement, and IP streams are transported to the broadcast/broadband physical layer. The delivery layer may transport an object by using the ROUTE (Real-Time Object Delivery over Unidirectional Transport) protocol. The ROUTE protocol based on UDP/IP multicast operation over the broadcast physical layer and the HTTP protocol based on the TCP/IP unicast operation over the broadband physical layer may be used in the delivery layer. The service management layer supports a service of arbitrary type such as a linear TV or HTML4 application service to be delivered in the delivery layer and the physical layer.

Service signaling may provide service discovery and description information and include two functional components—bootstrap signaling (FIT, LLS, and so on) and service layer signaling (SLS). These are the information required to discover and acquire a user service. By using the FIT, a receiver builds a basic service list and provides bootstrapping and discovery of SLS with respect to each broadcast service. As an embodiment, an FIT may be delivered by using layer-2 packets as link layer signaling. The FIT may be delivered from each physical layer frame and acquired immediately. SLS may provide information used or required for a receiver to discover or access a broadcast service and a content component of the broadcast service. In an embodiment, if SLS is delivered over broadcast, it may be delivered by using ROUTE/UDP/IP protocol from one of an LCT transport session including the ROUTE session and may be delivered with an appropriate carousel rate supporting fast channel joining and switching. If SLS is delivered over broadband, it may be delivered by using HTTP/TCP/IP protocol.

Figure 42:
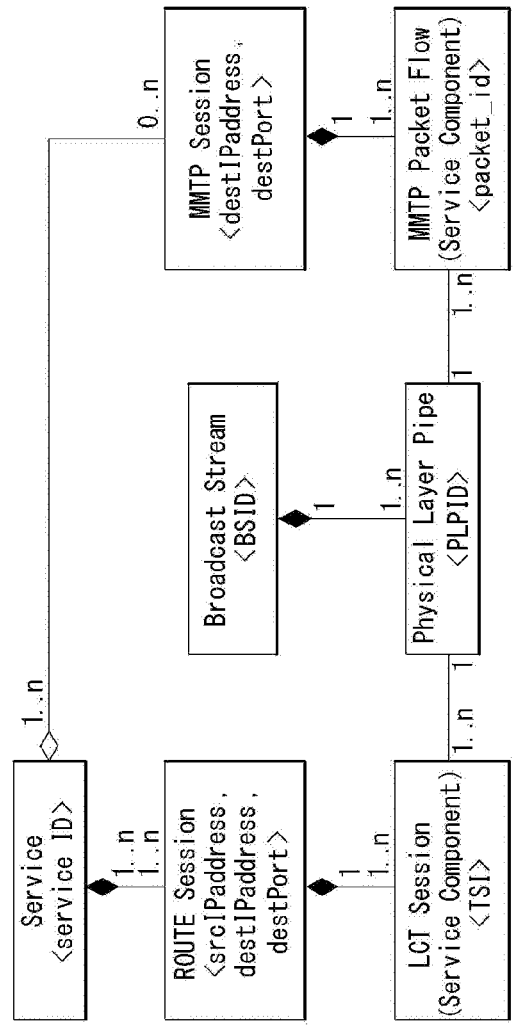
FIG. 42 illustrates logical entities of service management, delivery, and physical layer and their relationship according to one embodiment of the present invention.

FIG. 42 illustrates logical entities of service management, delivery, and physical layer and their relationship according to one embodiment of the present invention.

The ROUTE/LCT session and/or MMTP sessions delivering a content component of a broadcast service may be comprised as follows. A service content component may be delivered by at least one ROUTE/LCT session or at least one MMTP session with respect to a broadcast delivery of a linear service which does not exhibit app-based enhancement. For broadcast delivery of a linear service showing app-based enhancement, a service content component may be delivered by at least one ROUTE/LCT session or zero or more MMTP sessions. For streaming of media components in the same service, MMTP and ROUTE sessions may be prohibited from being used together. In the case of broadcast delivery of an app-based service, service content components may be delivered by at least one ROUTE/LCT session.

Each ROUTE session includes at least one LCT session delivering a content component which comprises a broadcast service. For delivery of a streaming service, an LCT session may deliver an individual component of a user service such as a video or caption stream. A streaming media may be formatted for each MPEG-DASH as DASG segments. Each MMTP session may include at least one MMTP packet flow delivering a content component or MMT signaling. An MMTP packet flow employs MPUs to deliver a component or MMT signaling message formatted per MMT. For delivery of an NRT user service or system metadata, an LCT session may deliver a file-based content item. A content file may include continuous (time-based) or discrete (non-time based) media component of an NRT service or include service signaling or metadata such as an ESG fragment.

A broadcast stream is extracted from an RF channel, which may be defined as a carrier frequency located in the center of specific bandwidth. PLP corresponds to a portion of an RF channel. Each PLP has a specific modulation and coding parameter. A PLP may be identified by a unique PLP identifier (PLPID) within a broadcast stream to which the PLP belongs.

Each service may be identified by two types of forms for a service identifier. One of them is a compact form used in an FIT, which is unique only within a broadcast area, and the other one is a globally unique form, used in the SLS and ESG. A ROUTE session may be identified by a source IP address, destination IP address, and destination port number. An LCT session may be identified by a TSI (Transport Session Identifier) unique within a ROUTE session. Those properties common to LCT sessions and specific properties unique for each LCT session may be provided by a ROUTE signaling structure which is called S-TSID (Service-based Transport Session Instance Description), and S-TSID forms part of service level signaling. Each LCT session may be delivered by one PLP. Different LCT sessions of a ROUTE session may be included in the respective PLPs. Properties described for S-TSID may include a TSI value and PLPID of each LCT session, a descriptor about a delivery object/files, and application layer FEC parameters.

Figure 43:
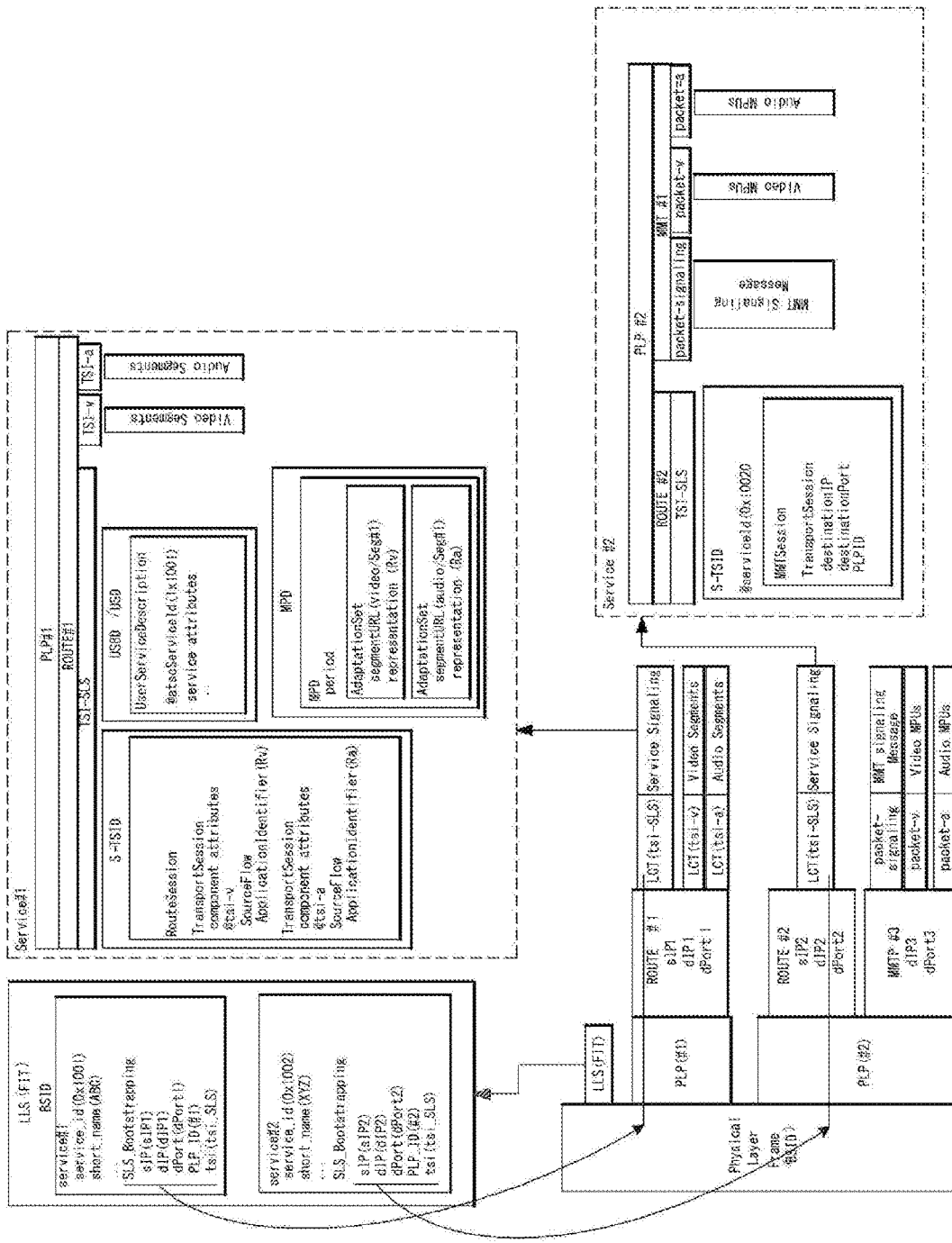
FIG. 43 illustrates a method for using service signaling for bootstrapping and service discovery according to an embodiment of the present invention.

FIG. 43 illustrates a method for using service signaling for bootstrapping and service discovery according to an embodiment of the present invention.

In an embodiment of the present invention, signaling information may be delivered directly in the form of a link layer packet or content of a dedicated channel instead of being processed by IP packet encapsulation, which may be called LLS (Link Layer Signaling) or FIT (Fast Information Table). The time a receiver starts operation upon receiving a broadcast signal may become the LLS. LLS may be used for a receiver to build a list of services received by the receiver, such as a channel name and a channel number. Also, LLS may provide bootstrap information with which a receiver discovers SLS for each service. The bootstrap information may include TSI of an LCT session, which delivers a destination IP address, destination port, and SLS.

SLS for each service may describe the properties of a service for making meaningful presentation of the service such as capability of a receiver required, location at which the service may be obtained, and a list of components. In the ROUTE/DASH system, SLS may include USBD (User Service Bundle Description), S-TSID, and DASH MPD (Media Presentation Description). A detailed description of the USBD will be given later.

Since separate service signaling is used for each service, a receiver is allowed to obtain only the SLS related to a desired service without parsing all of the SLS within a broadcast stream, thereby reducing an unnecessary processing load on the receiver. For optional broadband delivery of service signaling, an FIT may include an HTTP URL at which a service signaling file may be obtained. If SLS signaling is updated, that event may be detected from the version field of the FIT. And updated signaling may be obtained from a broadcast or broadband signal.

As shown in FIG. 43, LLS may be used to obtain SLS, and SLS may be used to obtain a service component delivered to a ROUTE/LCT transport session. A receiver may obtain an FIT delivered to a physical layer frame of a specific frequency identified by a BSID (Broadcast Stream ID). Each service identified by a service ID may provide SLS bootstrapping information. The SLS bootstrapping information may include PLPID, source IP address (sIP1), destination IP address (dIP1), destination port number (dPort1), and TSI (tsi-SLS). The receiver may obtain SLS fragments delivered through an IP/UDP/LCT session and PLP. These fragments may be associated with one service. A USBD/USD fragment may include an URI which describes a service level attribute and refers to an S-TSID fragment and an URI which refers to an MPD fragment. An S-TSID fragment may provide component acquisition information related to one service, DASH representation found in the MPD, and mapping to the TSI corresponding to a service component. The S-TSID may provide component acquisition information of a TSI form, DASH representation identifier, and ID of a PLP delivering a DASH segment related to the DASH representation. By using the PLPID and TSI value, the receiver may collect audio/video components and buffer DASH media segments by applying appropriate decoding processing. The hierarchical signaling architecture of a broadcast system will be described in more detail below.

Service signaling provide bootstrap and discovery information about a service which is currently "on the air". ESG (Electronic Service Guide) provides user service declaration which declares contents accompanied by detailed information including device capability, content rating, and presentation schedule; available broadcast service; and a list of contents. The ESG information may be provided so that a user may select a service or content by using the ESG information. The ESG information may be needed for a receiver to determine whether the user is allowed to watch content or use a service. Linkage between an ESG service and an SLS service may be described by a service identifier.

In general, link layer signaling may operate under the IP level. At the receiver-side, link layer signaling may be obtained faster than IP level signaling. The link layer signaling may be obtained before session establishment. Link layer signaling may be used for performing fast channel scan and fast service acquisition in an efficient manner. Link layer signaling may include binding information between service signaling and PLP.

SLS may include USBD and S-TSID metadata fragments. USBD may include service identification and device capability information. Also, USBD may include other SLS fragments needed to access a service and a media component; and metadata needed for a receiver to determine a transport mode (broadcast and/or broadband). An S-TSID fragment may provide a transport session description about an MMTP session or ROUTE/LCT session to which a media content component is delivered and provide a description about delivery objects delivered from the LCT session.

The streaming content signaling component of the SLS may correspond to MPD (Media Presentation Description). The MPD, a streaming content, may be associated with linear services for delivery of DASH segments. The MPD may be used for supporting app-based services and being associated with a DASH-formatted content component, may be used for controlling play-out of the content. The MPD may provide a resource identifier for an individual media component of a linear/streaming service in the form of a segment URL and provide context of identified resources within the media presentation. App-based enhancement signaling may be applied to delivery of an app-based enhancement component such as an application logical file, NRT media file, on-demand content component, or notification stream.

FIG. 44 illustrates an FIT according to an embodiment of the present invention

An FIT supports channel scan and service acquisition. An FIT enables presentation of a service list meaningful for the user and includes information supporting service selection through channel up/down zapping. Also, an FIT includes information for locating the location of broadcast/broadband-based service layer signaling depending on availability of signaling. The bitstream syntax of the FIT is shown in FIG. 44. In the following, description of each field is provided.

FIT_protocol_version: 8-bit unsigned integer indicating the version of the structure of FIT broadcast_stream_id: 16-bit unsigned integer for identifying the overall broadcast stream FIT_section_number: this 4-bit field indicates a section number. An FIT may include a plurality of FIT sections.

Total_FIT_section_number: this 4-bit field indicates a total number of FIT sections.

FIT_section_version: this 4-bit field indicates the version number of the FIT section and may be increased by one if information of the FIT section changes.

FIT_section_length: this 12-bit field may represent the number of bytes of the FIT section.

num_services: an 8-bit unsigned integer value, which may indicate the number of services described by an instance of the FIT. A service for at least one component within each broadcast stream may be included.

service_id: a 16-bit unsigned integer value, which identifies the corresponding service within the scope of the broadcast area.

SLS_data_version: an 8-bit unsigned integer number which is increased when a change occurs in a service entry within the FIT or in a signaling table for a service delivered through SLS. By monitoring the FIT only, a receiver may recognize the change of signaling with respect to a service.

service_category: this 5-bit field indicates the service category. Examples of the service category are as shown below.

0x00: service category not indicated by the service_category

0x01: A/V service

0x02: audio service

0x03: app-based service

0x04-0x07: reserved for future use

0x08: ESG (Electronic Service Guide)

0x09-0x1F: reserved for future use provider_id: an 8-bit field for identifying a provider which broadcasts a service short_service_name_length: a 3-bit field, which indicates the number of byte pairs of the short_service_name field. If no short name is given to a service, this field may be set to 0.

short_service_name: indicates a short name of a service service_status: indicates the status of a service (active/inactive, hidden/shown). The MSB may indicate the active/inactive status, and the LSB may indicate the hidden/shown status.

sp_indicator: needed for meaningful presentation, which indicates whether at least one component has been protected.

num_service_level_descriptors: indicates the number of service level descriptors for the corresponding service.

service_level_descriptor( ): may include zero or more descriptors which provide additional information of a service num_FIT_level_descriptors: indicates the number of FIT-level descriptors for the corresponding FIT.

FIT_level_descriptor( ): may include zero or more descriptors which provide additional information of the corresponding FIT.

FIG. 45 an FIT descriptor according to an embodiment of the present invention.

Zero or more descriptors providing additional information for a service or FIT may be included in the FIT. FIG. 45 shows locations of individual descriptors or descriptor tags for descriptors being referenced. Descriptors do not necessarily be included in the table but may be included optionally or selectively. If a descriptor is used, the descriptor may be located at a specified location (denoted by "M") or located at other location (denoted by "O"). FIGS. 46 to 48 illustrate embodiments of individual descriptors shown in FIG. 45.

FIG. 46 illustrates an embodiment of broadcast_signaling_location_descriptor( ).

descriptor_tag: identifies the corresponding descriptor.

descriptor_length: identifies the length of the corresponding descriptor.

IP_version_flag: 1-bit indicator which indicates whether SLS_source_IP_address and SLS_source_IP_address use IPv4 address or IPv6 address.

SLS_source_IP_address_flag: indicates whether a service signaling channel source IP address for the corresponding service exists.

SLS_source_IP_address: includes a source IP address of a service layer signaling LCT channel of the corresponding service. It may use IPv4 or IPv6 address depending on the IP_version_flag field.

SLS_destination_IP_address: includes a destination IP address of the service layer signaling LCT channel of the corresponding service. It may use IPv4 or IPv6 address depending on the IP version flag field.

SLS_destination_UDP_port: indicates a destination UDP port number of the service layer signaling LCT channel of the corresponding service.

SLS_TSI: indicates TSI of the service layer signaling LCT channel of the corresponding service.

SLS_PLP_ID: may indicate the identifier of PLP which includes the service layer signaling LCT channel of the corresponding service. This PLP may be more robust than the PLP of the service.

FIG. 47 illustrates an embodiment of inet_signaling_location_descriptor( ).

Inet_signaling_location_descriptor( ) include URL information with which a receiver may obtain arbitrary type of data requested by an external server(s) through broadband. FIG. 47 illustrates the structure of this descriptor. If a single URL is used together with a query term which obtains a signaling description via broadband, the descriptor may be included at the service level or FIT level.

descriptor_tag: a descriptor tag for identifying a descriptor descriptor_length: indicates the length of a descriptor provider_id: identifies a provider which broadcasts a service URL_type: indicates the type of URL the identification types of which according to the codes are given below.

URL_type-0x00: URL for a signaling server
URL_type-0x01: URL for an ESG server
URL_type-0x02-0xFF: reserved for future use
URL_bytes( ): represents a URL each character of which may be UTF-8 encoded and used by a query term.

If resources are available in a broadband network environment, inet_signaling_location_descriptor( ) may provide the URL of the resources.

Suppose the resource type is SLS. If inet_signaling_location_descriptor( ) information is located at the FIT level, a receiver may retrieve the SLS for all of the services described in the FIT by using the URL of the descriptor through broadband. If the resource is ESG, inet_signaling_location_descriptor( ) information may provide a single URL at which the receiver may retrieve the ESG for all of the providers described in the FIT through broadband.

If the resource type is SLS and inet_signaling_location_descriptor( ) information is located at the service level descriptor, the receiver may retrieve the SLS for the corresponding service by using the URL of the descriptor through broadband. If the resource is ESG, inet_signaling_location_descriptor( ) information may provide a single URL at which the receiver may retrieve the ESG for the corresponding service through broadband.

FIG. 48 illustrates an embodiment of a query term when inet_signaling_location_descriptor( ) is located at FIT level, and FIG. 49 illustrates an embodiment of a query term when inet_signaling_location_descriptor( ) is located at service level.

capabilities_descriptor( ) provides a list of capabilities required for processing of a service (for example, download protocol, FEC algorithm, wrapper/archive format, compression algorithm, and media type). A receiver may avoid proposing a service with an unsupported performance to the user by parsing and processing a performance descriptor.

FIG. 50 illustrates an XML format of the FIT shown and described in FIGS. 44 to 49. Descriptions about the elements given in the XML format do not overlap with the descriptions of the aforementioned fields. However, in the XML format, inclusion of the aforementioned descriptor may be indicated by the use field, and those elements specified as 0-n in the use field may not be included.

The embodiment of the structure of the field names and positional relationship thereof shown in FIG. 50 may be different from the embodiments of FIGS. 44 to 49, and the description of an actual field may be applied to the same field.

FIG. 51 illustrates a service layer signaling data model according to an embodiment of the present invention.

SLS may provide detailed technical information with which a broadcast receiver may discover and access a broadcast service and a content component of the broadcast service. SLS may include a set of XML-encoded metadata fragments delivered to a dedicated LCT session. The LCT session delivering SLS may be obtained from the bootstrap information included in the FIT. SLS is defined at the service level and describes service properties and access information. SLS may include a list of content components, information about how the list may be obtained, information about receiver performance required for generating meaningful presentation of a service, and so on. In the ROUTE/DASH system for linear service delivery, SLS may include USBD, S-TSID, and DASH MPD. SLS fragments may be delivered through an LCT transport session with a known TSI value.

FIG. 52 illustrates USBD according to one embodiment of the present invention.

USBD of FIG. 52 is another embodiment of the USBD of FIG. 5, and descriptions common to both of the embodiments will not be repeated. USBD is the top-level or entry-point SLS fragment.

Descriptions of elements (attributes) included in the USBD of FIG. 52 are as follows.

bundleDescription: root element of USBD userServiceDescription: single instance of ATSC 3.0 service @serviceId: globally unique identifier of ATSC 3.0 service @atsc:serviceId: reference for the corresponding service entry within LLT (FIT). The value of a service identifier assigned to the entry is the same as the value of this attribute.

@atsc:fullMPDUri: reference to an MPU fragment including description for a content component of the ATSC 3.0 service delivered over broadcast or optionally broadband.

@atsc:sTSIDUri: reference to an S-TSID fragment providing access to the parameters related to a transport session carrying the content of the ATSC 3.0 service.

name: name of the ATSC 3.0 service assigned by the lang attribute lang: language of the ATSC 3.0 service name. The language may be specified according to the XML datatype (XML Schema Part 2 [7]).

serviceLanguage: available language of the ATSC 3.0 service. The language may be specified according to the XML datatype (XML Schema Part 2 [7]).

atsc:capabilityCode: represents performance and a performance group defined in the ATSC 3.0 service announcement and personalization standard and represents performance of a receiver capable of generating meaningful expression of the corresponding ATSC service content. The format of this element may be the same as the atsc:capabilities element described based on the ATSC 3.0 service announcement and content fragmentation of a personalized document.

deliveryMethod: container of transport related information pertaining to the contents of the service over broadcast and (optionally) broadband modes of access atsc:broadcastAppService: DASH representation delivered over broadcast, in multiplexed or non-multiplexed form, containing the corresponding media component(s) belonging to the ATSC 3.0 Service, across all Periods of the affiliated Media Presentation.

basePattern: A character pattern for use by the ATSC receiver to match against any portion of the Segment URL used by the DASH client to request Media Segments of a parent Representation under its containing Period. A match implies that the corresponding requested Media Segment is carried over broadcast transport.

FIG. 53 illustrates S-TSID according to one embodiment of the present invention.

S-TSID of FIG. 53 is another embodiment of the S-TSID of FIG. 6, and descriptions common to both of the embodiments will not be repeated. The S-TSID includes the overall transport session description about the ROUTE session, LOT session, or MMTP session to which media content components delivering a service are delivered. The S-TSID may include a delivery object delivered in the LCT session or metadata about object flow. The S-TSID may include additional information about a content component and payload format delivered through the LCT session. The S-TSID is signaling data in service units.

Description of the element (attribute) included in the S-TSID of FIG. 53 is given below.

@serviceId: reference to the corresponding service element within the LLS (FIT). The value of this attribute refers to the service within the FIT like the corresponding value of the service ID. This attribute may be used when the ROUTE session and the MMTP session without the USD are used for broadcast delivery of the linear service.

RS: ROUTE session

@bsid: identifier of a broadcast stream within a content component delivering broadAppService. If this attribute is not present, the default broadcast stream includes PLP which carries an SLS fragment for the ATSC 3.0 service. The ID value may be the same as the value of the broadcast stream ID within the FIT.

@slpAddr: source IP address (default: source address of a current ROUTE session; M for the non-primary session)

@dlpAddr: destination IP address (default: destination address of a current ROUTE session; it is M for the non-primary session)

@dport: destination port (default: destination port of a current ROUTE session; it is M for the non-primary session)

@PLPID: PIP ID for the ROUTE session (default: current PLP)

LS: LCT session

@tsi: TSI value

@PLPID: PLP ID (overrides default ROUTE session value)

@bw: maximum bandwidth

@startTime: start time

@endTime: end time

SrcFlow: source flow defined by the ATSC 3.0 delivery & synchronization spec [3]

RprFlow: repair flow defined by the ATSC3.0 delivery & synchronization spec [3]

MS: MMTP session

@versionNumber: the version number of the MMTP protocol used in this MMTP session @bsid: identifier of a broadcast stream delivering a content component. If this attribute is not present, the default broadcast stream includes PLP which carries an SLS fragment for the ATSC 3.0 service. The ID value may be the same as the value of the broadcast stream ID within the FIT.

@slpAddr: source IP address

@dlpAddr: destination IP address

@dport: destination port

@packetId: ID (default: 0x00) of the MMTP packet carrying an MMT signaling message of the MMTP session @PLPID: PLP ID for the MMTP session (default: current PLP)

@bw: Maximum bandwidth

@startTime: start time of the MMTP session

@endTime: end time of the MMTP session

Each instance of the S-TSID may be referred to by the USBD fragment.

MPD is an SLS metadata fragment which corresponds to a linear service of the duration defined by a broadcaster and which includes a formalized description of the DASH media presentation. Contents of the MPD provide context for identified resources within the media presentation and resource identifiers for the segments. In the context of a broadcast service, at least one representation conveyed by the MPD may be transmitted over broadcast.

If the MMTP session delivers a broadcast streaming service, the MMT signaling message may be delivered by the MMTP. Each MMTP session may include the MMT signaling message, its component, and a packet delivering the MMT signaling message.

In an embodiment, the service signaling fragment is encapsulated by the metadata envelop defined in the 3GPP MBMS, allowing identification, versioning, and update of included fragments.

In what follows, signaling embodiments of the present invention will be described.

Figure 54:
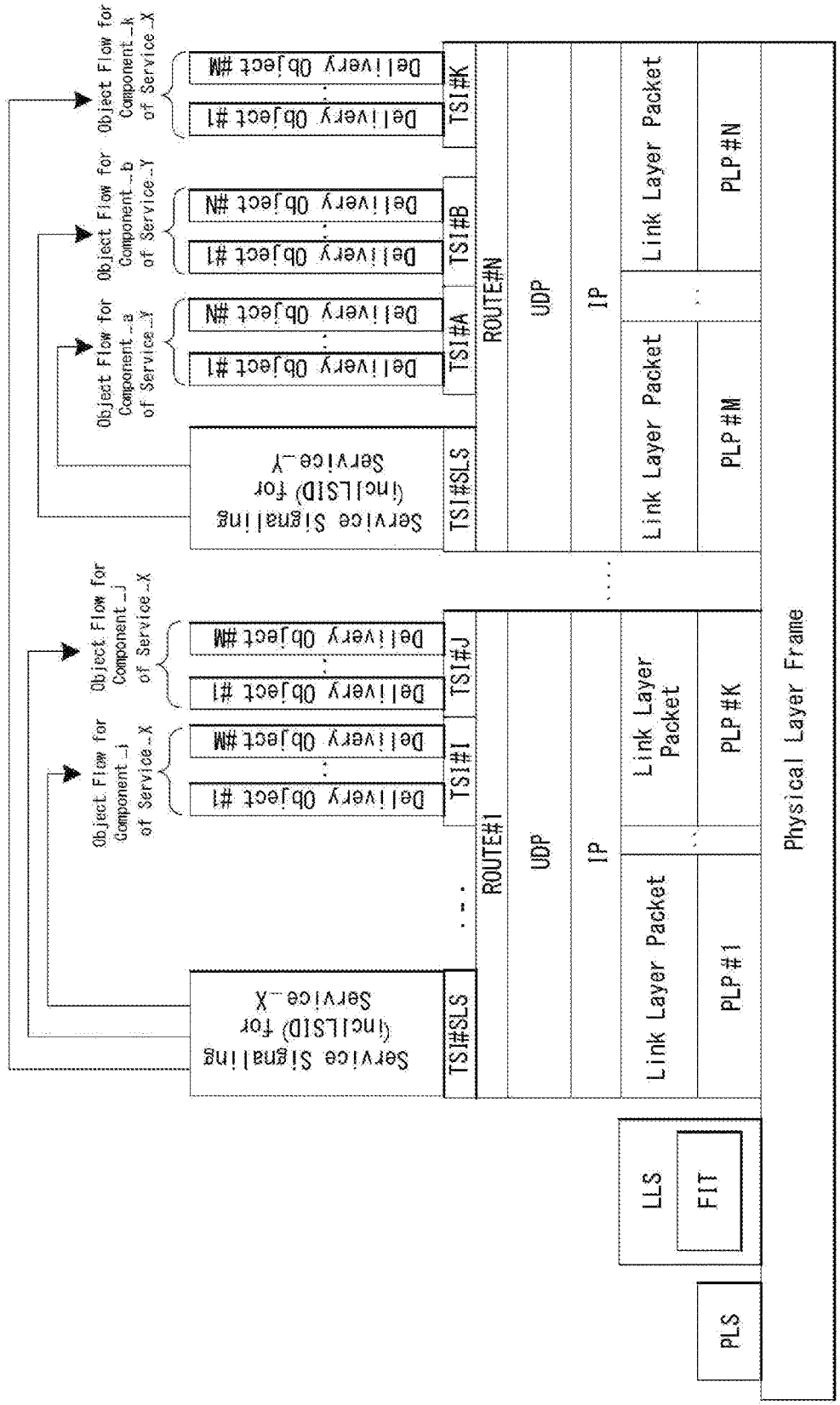
FIG. 54 illustrates hierarchical signaling architecture according to an embodiment of the present invention.

FIG. 54 illustrates hierarchical signaling architecture according to an embodiment of the present invention.

In the embodiment of FIG. 54, two S-TSID instances may be delivered over the ROUTE. The first S-TSID may provide access information about the LCT sessions belonging to the ROUTE session #1DP delivering content components of the service X. The second S-TSID may provide access information about the LCT sessions belonging to the ROUTE session #N delivering content components of the service Y.

As shown in FIG. 54, the S-TSID includes signaling information about the LCT sessions in service units.

Figure 55:
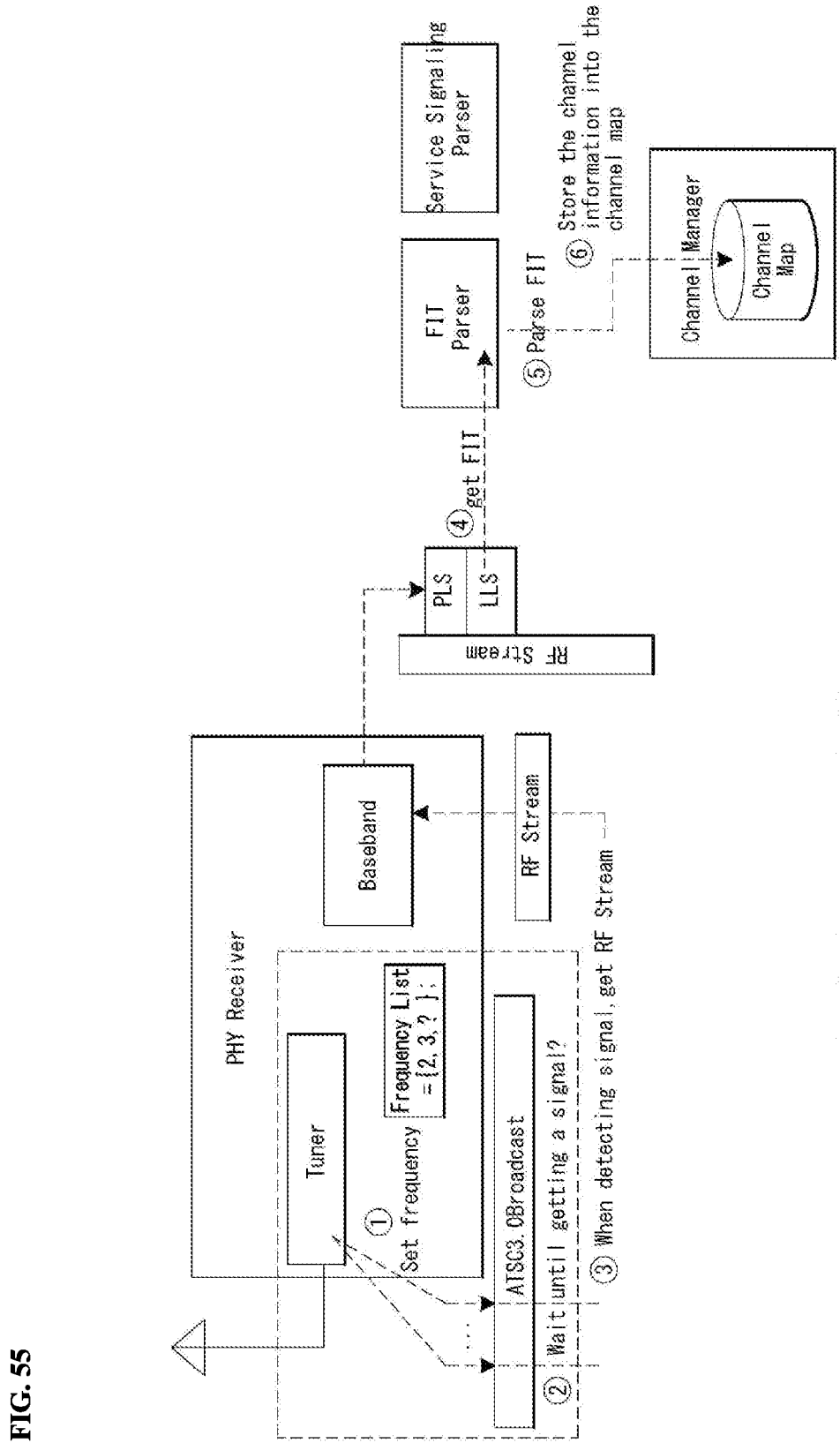
FIG. 55 illustrates a fast service scan signaling flow according to one embodiment of the present invention.

FIG. 55 illustrates a fast service scan signaling flow according to one embodiment of the present invention.

A receiver may comprise a tuner, baseband processor, and internal storage. The receiver may perform fast service scan by using the FIT.

The tuner of the receiver may tune to a specific frequency by using a predefined frequency list. And for each frequency, the tuner may wait for signal acquisition.

If a signal is detected from the frequency list, the baseband processor may extract the FIT and deliver the extracted FIT to the middleware module. The middleware module may deliver the FIT to the FIT parser.

The FIT parser may extract FIT information and parse data. Even if the FIG information is the same as the last scanned version number, it may be preferable to parse the FIT information. And the receiver may store the parsed information in the channel map.

Figure 56:
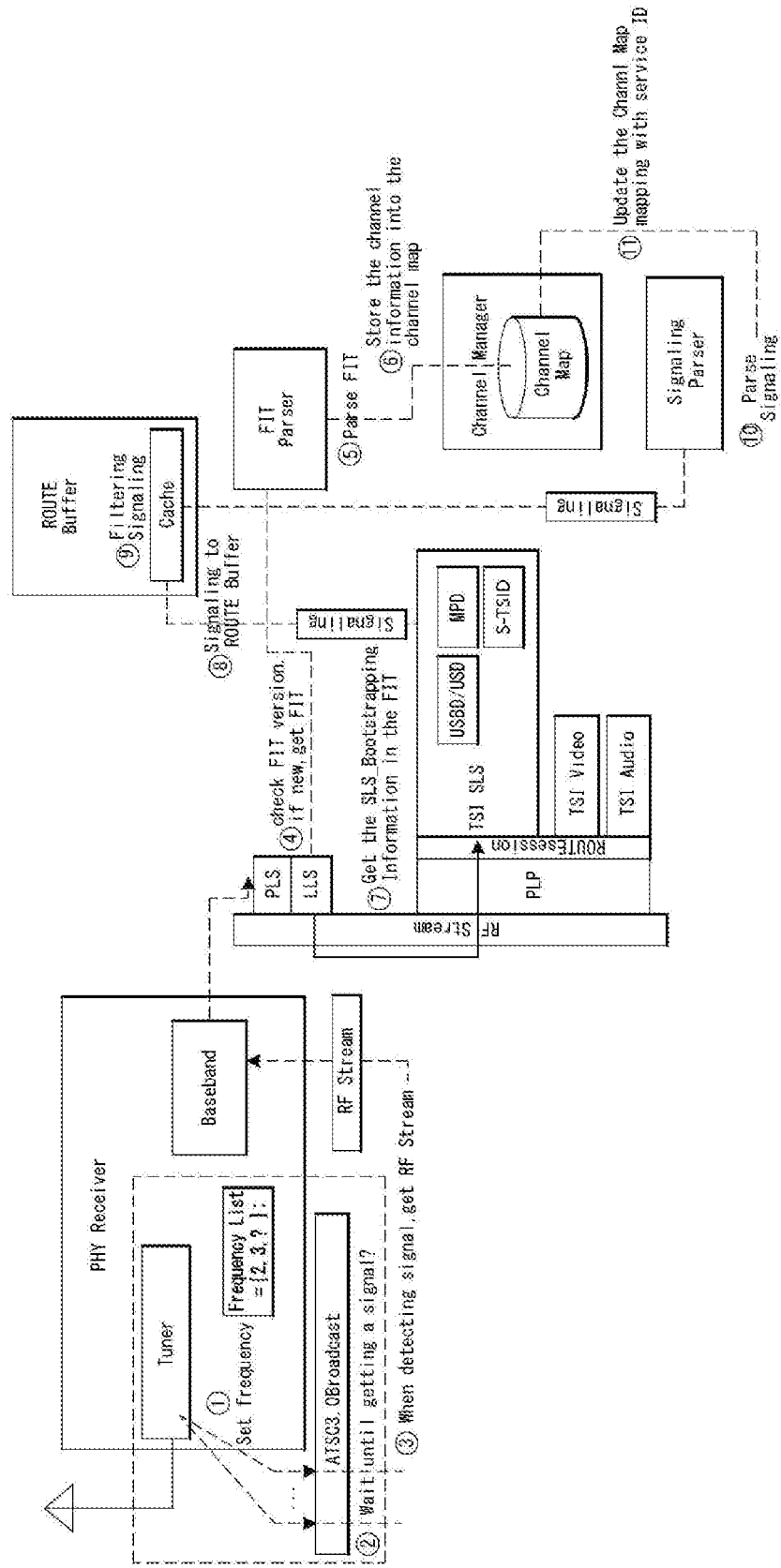
FIG. 56 illustrates a full channel scan signaling flow according to an embodiment of the present invention.

FIG. 56 illustrates a full channel scan signaling flow according to an embodiment of the present invention.

If the receiver performs full-scan by using service signaling (USBD or USD) with respect to an individual service, the receiver may store more abundant information. For example, a longer service name may be obtained from the USD, and a channel map may be stored by matching service ID values of the USD and FIT. The singling flow is described below.

The receiver may be tuned to a frequency by using a predefined frequency list and wait for signal acquisition with respect to individual frequency. If a signal is detected from the frequency list, the baseband processor may extract the FIT and deliver the extracted FIT to the middleware module.

The receiver may check the FIT version information and parse the FIT information according to the checking result. In an embodiment, if the version is new, the middleware module may gather the FIT and deliver the gathered FIT to the FIT parser. The FIT parser may parse the data (FIT) and extract information. The extracted information may be stored in a channel map.

The receiver may obtain SLS boot strapping information from the FIT. The receiver may deliver the SLS bootstrapping information to the ROUTE client. The receiver may extract the USD from the SLS and store the extracted USD by using a signaling filtering scheme. The USD may be parsed by the signaling parser. And the receiver may update the channel map by mapping the service ID.

Figure 57:
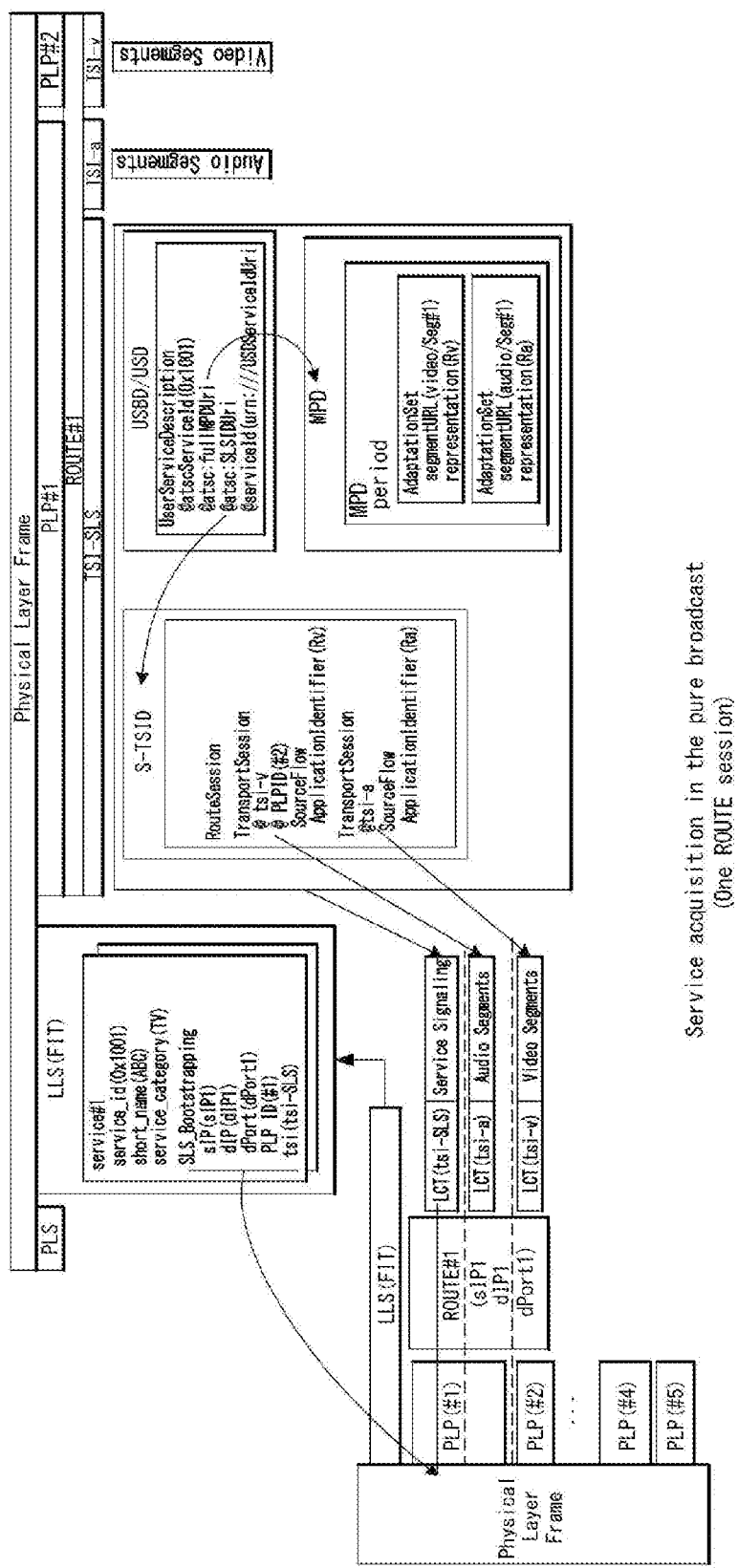
FIG. 57 illustrates a service acquisition method in the pure broadcast according to an embodiment of the present invention.

FIG. 57 illustrates a service acquisition method in the pure broadcast according to an embodiment of the present invention.

A video and audio segment may be delivered over pure broadcast by using one ROUTE session; in this case, the service signaling structure will be described below with reference to FIG. 57.

The USD, S-TSID, and MPD may be obtained and parsed. All of the tables are needed for service acquisition.

A representation to be provided may be selected. In this case, the S-TSID may be checked to determine which representation to deliver over broadcast.

The receiver may transmit the information obtained from signaling (UDS, S-TSID, and MPD) to the segment acquisition module. Therefore, the receiver may provide a user preference. For example, the user preference may indicate that the user prefers Spanish audio language to English audio language.

The segment acquisition module may determine by using the information described in the USD whether a component of a broadcast stream may be extracted. If the DASH client requests a segment from an internal proxy server, the internal proxy server has to know whether to request the segment from a remote broadband server or whether to wait to appear in the broadcast stream. The USD may describe the unicast "base pattern" and multicast "base pattern" in a delivery-Method element. The proxy server may check whether the unicast base pattern or multicast base pattern is a sub-string of the URL presented by the DASH player and operate according to the checking result.

In the case of pure broadcast, the receiver may not know the location at which a component may be obtained if the deliveryMethod element of the USD is unavailable.

Figure 58:
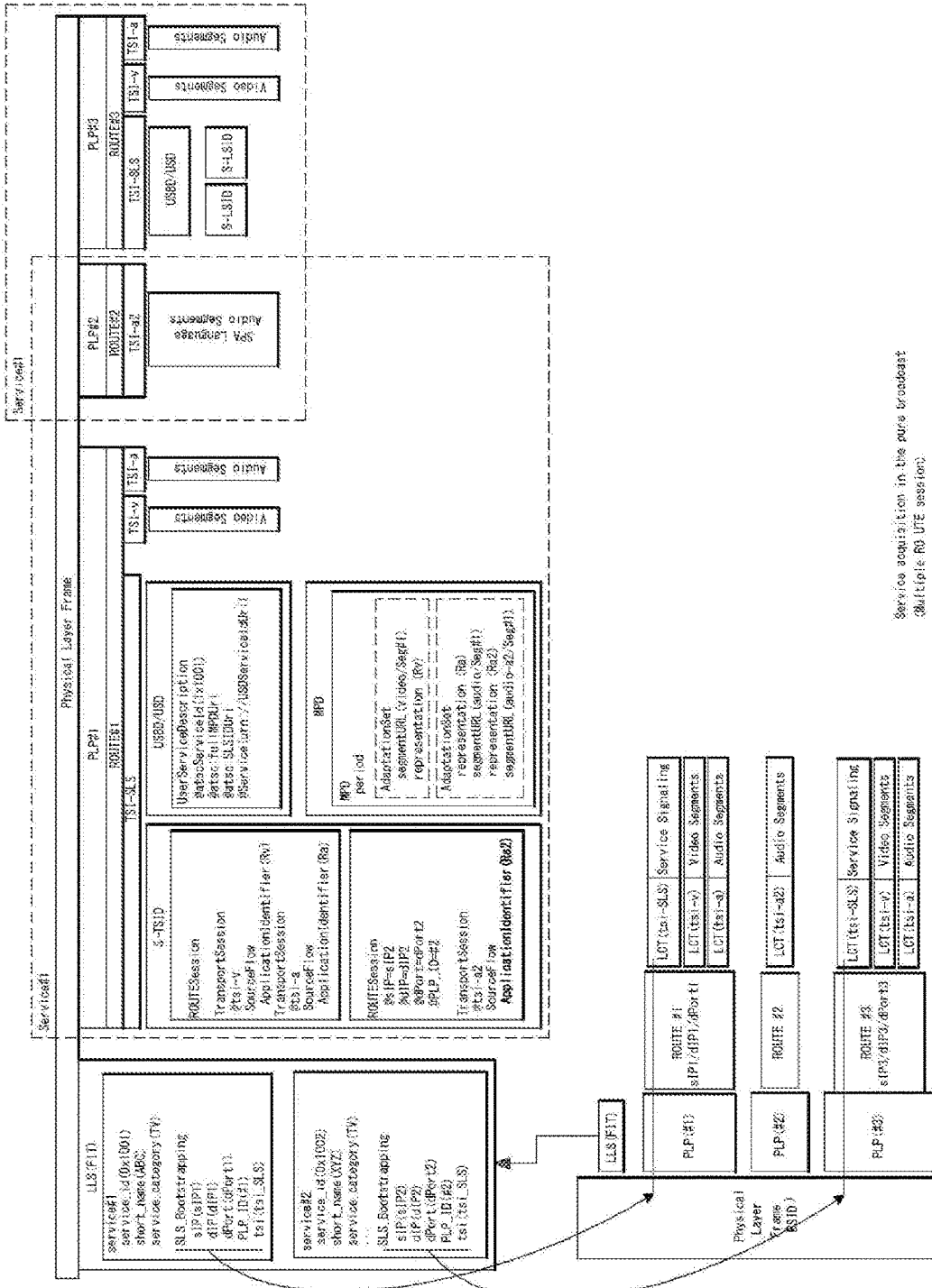
FIG. 58 illustrates a service acquisition method in the pure broadcast according to an embodiment of the present invention.

FIG. 58 illustrates a service acquisition method in the pure broadcast according to an embodiment of the present invention.

One service may be included in a plurality of ROUTE sessions. In this case, the S-TSID may allow access to all of the representations including additional ROUTE session information. However, the additional information may be optional for rendering a service.

Figure 59:
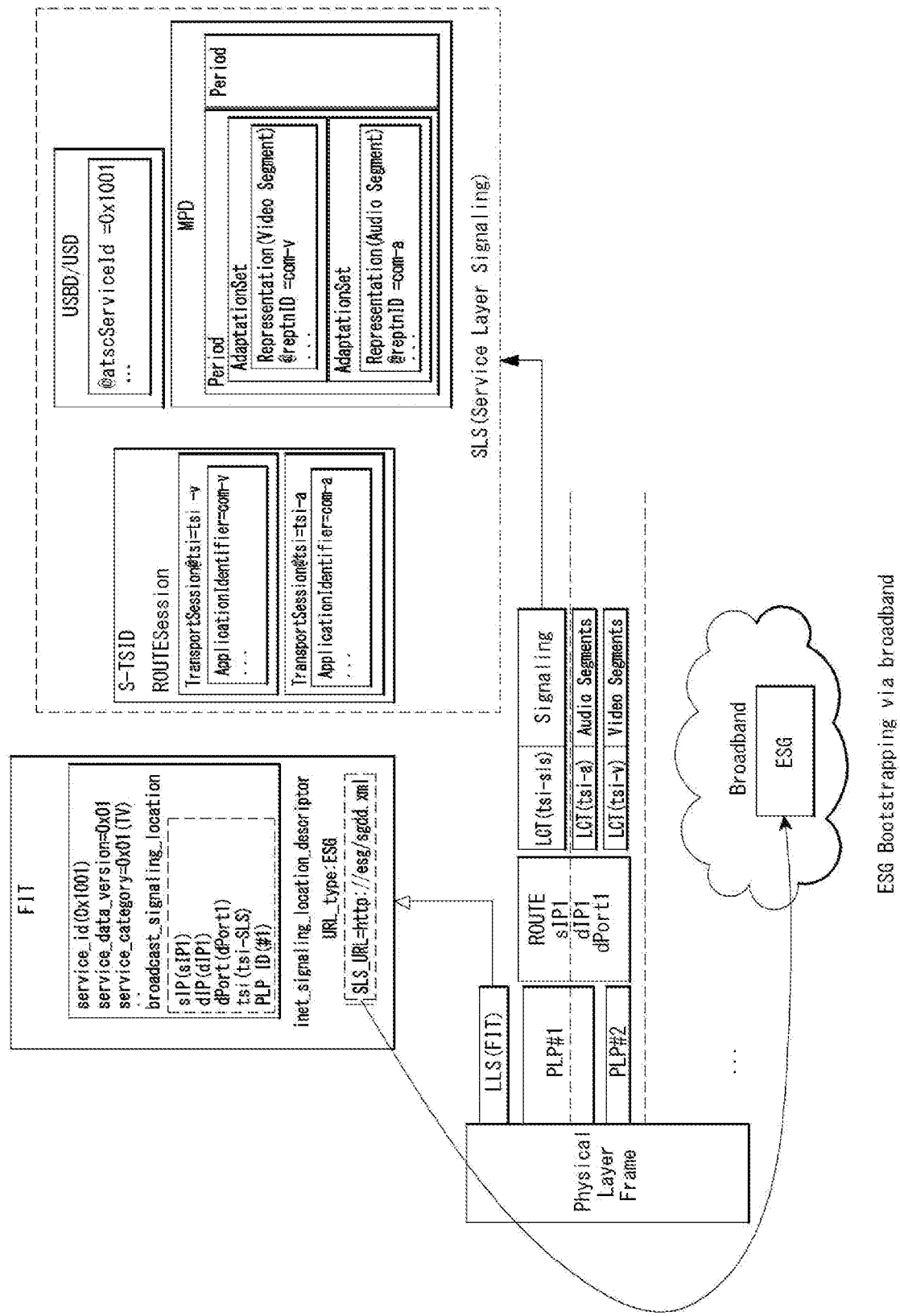
FIG. 59 illustrates an ESG information acquisition method according to an embodiment of the present invention.

FIG. 59 illustrates an ESG information acquisition method according to an embodiment of the present invention.

The ESG bootstrapping information via broadband may be signaled in the FIT. In an embodiment, all of ESG data may be delivered via broadband. Therefore, the ESG broadcast bootstrapping information may be replaced with the ESG bootstrapping information. The URL type field of the aforementioned inet_signaling_location_descriptor( ) may indicate the type of ESG or other information.

Figure 60:
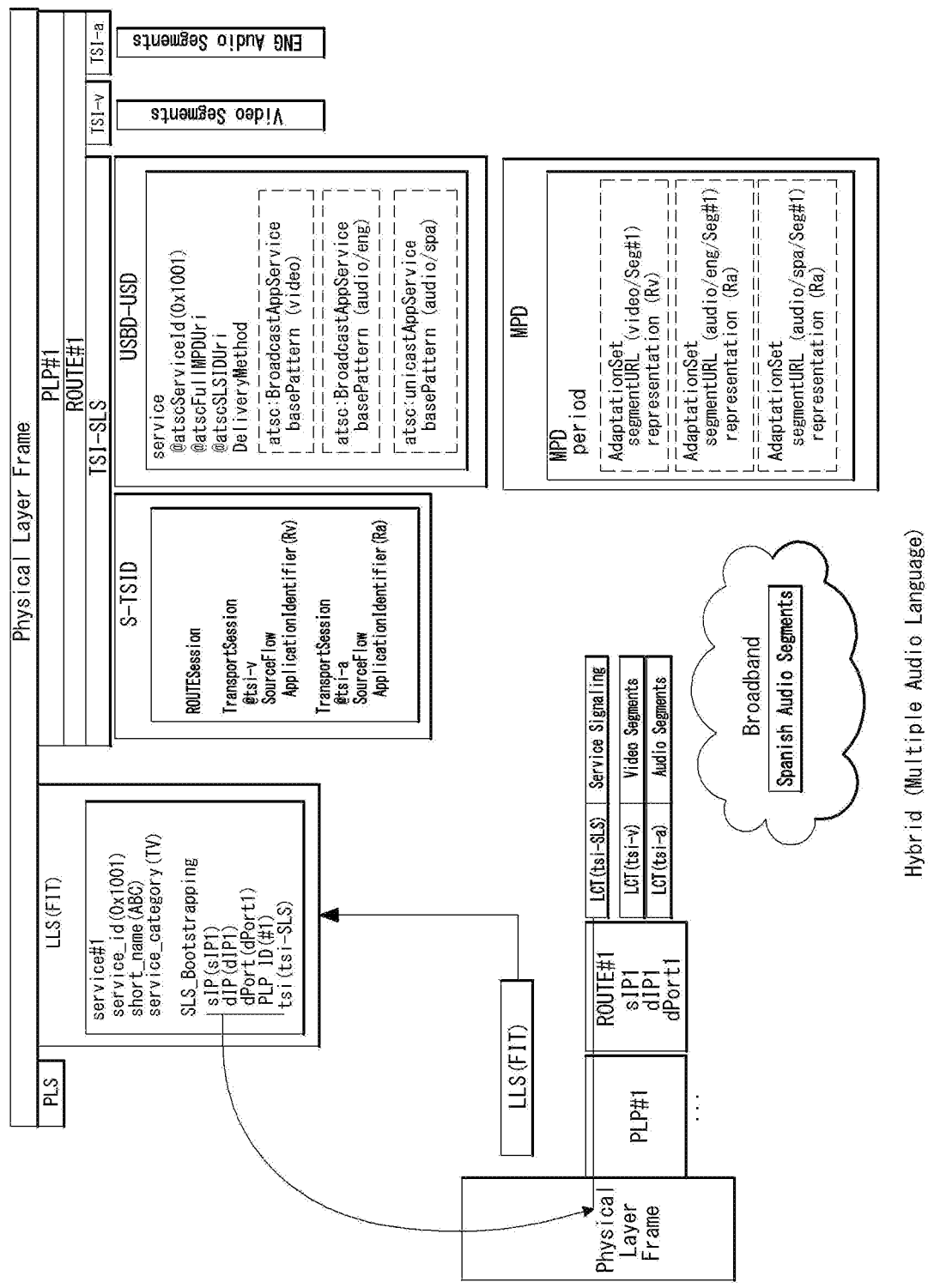
FIG. 60 illustrates a method for receiving a hybrid (multi-audio language) service according to an embodiment of the present invention.

FIG. 60 illustrates a method for receiving a hybrid (multi-audio language) service according to an embodiment of the present invention.

Two or more audio components corresponding to different languages may be delivered via separate delivery paths (one is broadcast and the other is broadband). In this case, the S-TSID may describe all of the broadcast components so that the ROUTE client obtain a desired component. Also, the USD may include URL patterns for broadband and URL patterns for broadcast. Therefore, if the DASH client issues a request for a segment, the receiver middleware may describe which segment is delivered via which path. Therefore, the middleware may know which segment is to be requested from a remote broadband server and which segment is to be searched for from broadcast.

Figure 61:
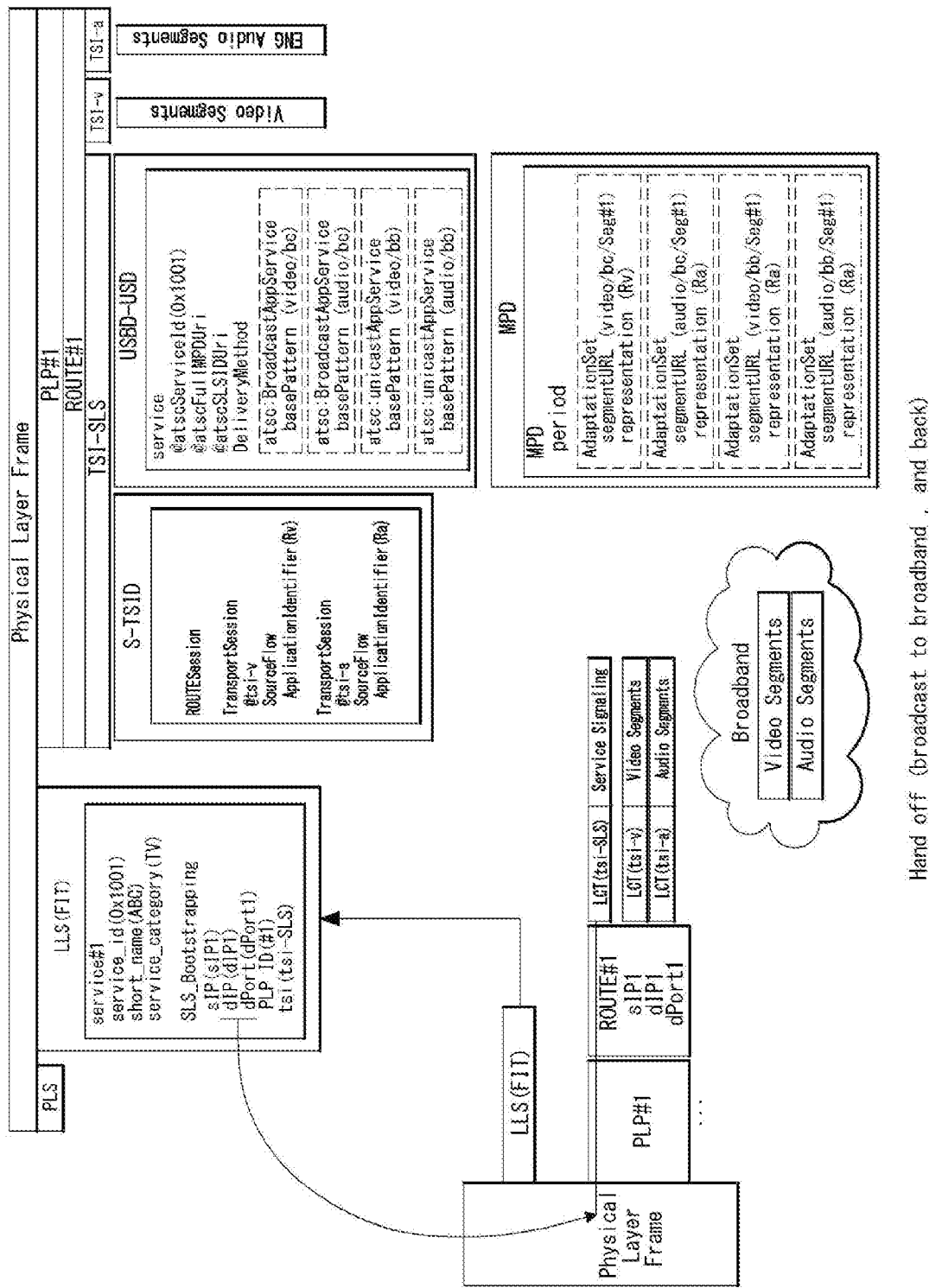
FIG. 61 illustrates a method for receiving a broadcast signal employing handoff according to an embodiment of the present invention.

FIG. 61 illustrates a method for receiving a broadcast signal employing handoff according to an embodiment of the present invention.

The receiver may perform handoff reception from broadcast to broadband or from broadband to broadcast by using the signaling described in the USD. The USD describes which component is delivered via broadcast or broadband. The receiver middleware may receive a component via broadcast or broadband if broadcast reception fails.

Figure 62:
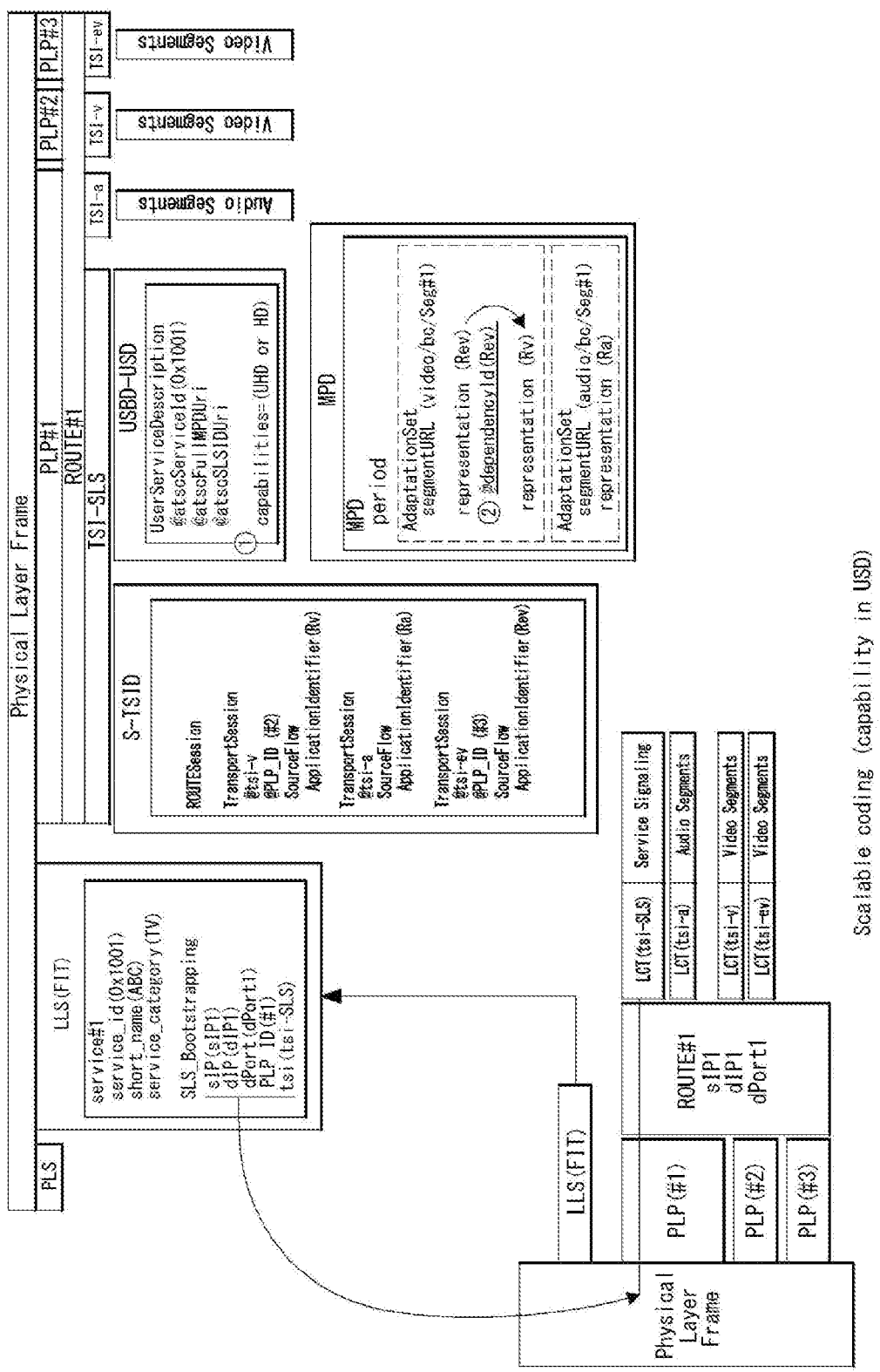
FIG. 62 illustrates a method for receiving a broadcast signal employing scalable coding according to an embodiment of the present invention.

FIG. 62 illustrates a method for receiving a broadcast signal employing scalable coding according to an embodiment of the present invention.

The USD include performance information essential for rendering a service. In an embodiment, as the performance information essential for decoding video, video resolution information may be included in the USD. And the USD may have a value such as the 'HD or UHD'. This indicates that the corresponding service may be provided as an HD or UHD service.

The receiver may identify the components required for rendering an UHD service or HD service by using the MPD.

**Method for Filtering Signaling Fragments

The LCT TOI (Transmission Object Identifier) field is split into three parts so that the receiver may quickly filter target signaling fragments.

The first part is a fragment type part allocated for identifying the type of a signaling fragment. The fragment type field may be allocated to identify an individual type of the SLS fragment carried by an object. The type value of each fragment may represent 'bundled' for 0x00, USBD/USD for 0x01, S-TSID for 0x02, MPD for 0x03 and 'reserved' for those value larger than 0x04, for example.

The second part is a fragment type extension part allocated for identifying the sub-type of a fragment. One embodiment of allocating a sub-type represents types of fragments included in an object in a bitmap format so that individual fragments may be filtered out when multiple fragments are carried. Another embodiment indicates an instance identifier when multiple instances of a signaling fragment of the same fragment type are delivered.

The fragment type extension field may be a bitmap indicating which fragments are included when an object includes multiple fragments. When an object includes one fragment, a value for identifying each sub-type of a service signaling fragment based on a filtering request may be allocated. Values of fragment type extension fields according to an embodiment are shown in Table 27.

TABLE 27

| Fragment Type Value | Fragment Type Extension Value | | Description |
|---|---|---|---|
| 0x00 | Value generated by OR operation applied on the following values | 0b0000000000000001 | USBD/USD is contained in this bundle |
| | | 0b0000000000000010 | S-TSID is contained in this bundle |
| | | 0b0000000000000100 | MPD is contained in this bundle |
| 0x01-0x03 | 16-bits hashed value derived from the url of Service Layer Signaling fragment | | To enable the client to filter the fragment that has instance url in question before assembling LCT packets |
| ≥0x04 . . . | Reserved | | |

The third part is a version part. The version part identifies the version of an object identified by the fragment type and fragment type extension part. When an object contains one fragment, the version field contains the version number of the fragment. When an object is a set of fragments, this field may contain the version number of the object and identify which fragment of the object has been changed.

**Template-Based Compression

The XML signaling fragment may be compressed by not only a compression tool such as Gzip but also an alternative means such as diff and patch tool. In the diff and patch process, the XML signaling template may be shared in advance between a transmitter and a receiver. A transmitter may compare two XML files—XML signaling template and XML signaling instance—and generate and output the differences as Diff.

Diff is a generic XML signaling instance and may be encapsulated by the element MetadataEnvelope. If Diff is generated at the transmitter-side, Diff may be encapsulated by the MetadataEnvelope element after being encapsulated by the content of the update element. And the MetadataEnvelope may be transmitted to multiple receivers through a signaling channel. If a received metadatafragment element contains a diffupdate element, the receiver may recognize that the information has been processed through the corresponding compression mode.

The receiver searches the cache which stores pre-shared signaling templates for the signaling template with the metadata URI attribute; if the signaling template is not found, the receiver may attempt to obtain the signaling template by using the URL of the SignalingTemplateID.

The receiver may recover the signaling instance by applying the delivered Diff to a retrieved signaling template. The instance of the signaling fragment may have the pair of attribute metadataURI (SignalingInstanceID) and attribute version (SignalingInstanceVersion). Then only the difference from the part updated with respect to the template has to be transmitted, and the complete file doesn't have to be transmitted. Therefore, in particular, if the difference from the original complete fragment is small, the diff and patch operation may be operated very efficiently compared with the conventional compression scheme. In an embodiment, even when there is no update in the server-side, a Diff message of "no Duff" may be delivered.

FIG. 63 is an XML instance notation illustrating a method for encapsulating Diff in a metadataEnvelope element.

FIG. 64 illustrates a method for template pre-sharing and diff-patching according to an embodiment of the present invention.

Signaling of a template fragment may be identified by the URL included in the content of the templateID element. The template itself may be pre-shared as it is patched through HTTP over broadband. When a receiver obtains a Diff message for the first time, the template may be cached for the use in a future. In an embodiment, the template may be received at particular time as a fragment instance, and a subsequent Diff message may be applied to instance generation.

As shown in FIG. 64, a signaling template may be pre-shared and identified by signaling template ID information and/or signaling template version information. A transmitter includes a Diff generator which compares the template with a signaling instance and generates the difference between them as Diff. A receiver includes a Diff applier which may apply the received Diff to the template and recover the signaling instance. The transmitter-side may correspond to the consumer while the receiver-side may correspond to the signaling producer. The signaling instance may be identified by the signaling instance ID information and/or signaling instance version information.

FIG. 65 illustrates an FIT delivery method according to an embodiment of the present invention.

Figure 68:
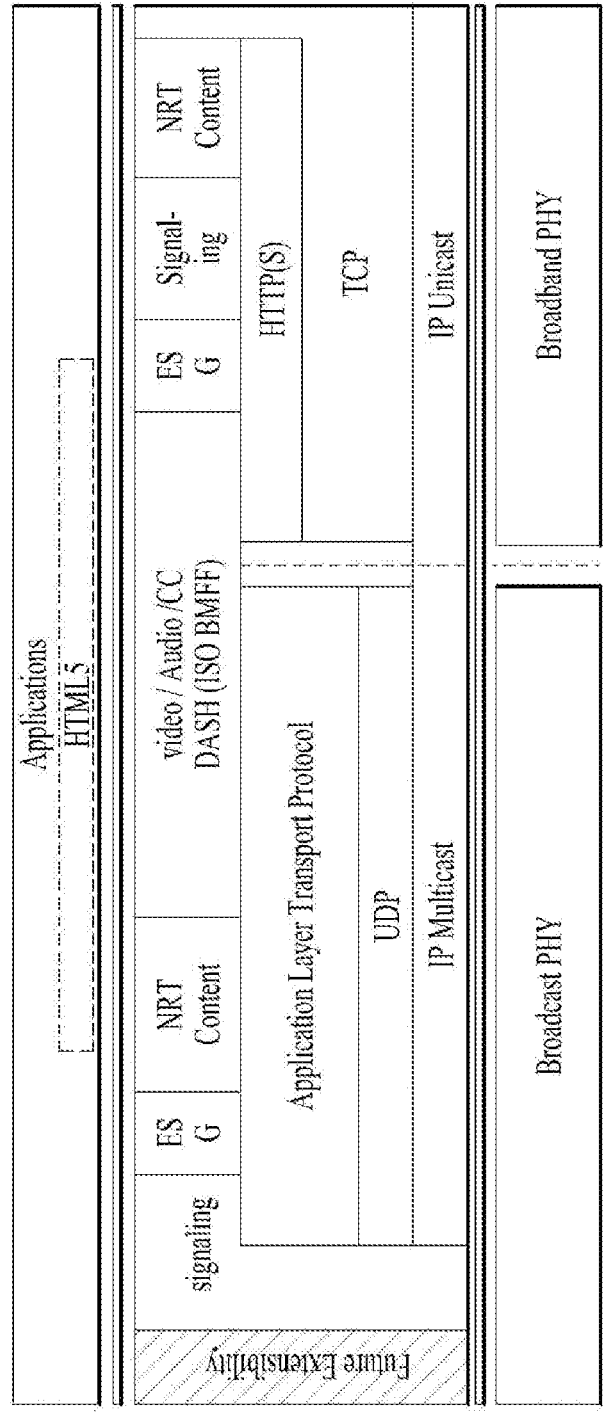
FIG. 68 illustrates a protocol stack of a future hybrid broadcast system according to an embodiment of the present invention.

In the description above, described was an embodiment in which the FIT is signaled in the link layer. However, as shown in FIG. 68, the FIT may be delivered in a different method.

In the example of (1), the FIT may be delivered by being included in the PLP such as a service component. Alternatively, as shown in the example of (2), the FIT may be delivered through a dedicated logical channel of the physical layer. Or as shown in the example of (3), the FIT may be delivered through a specific PLP, called a basic PLP, which delivers signaling information.

SLS may be transmitted in the IP/UDP layer according to the MMTP or ROUTE protocol.

Figure 66:
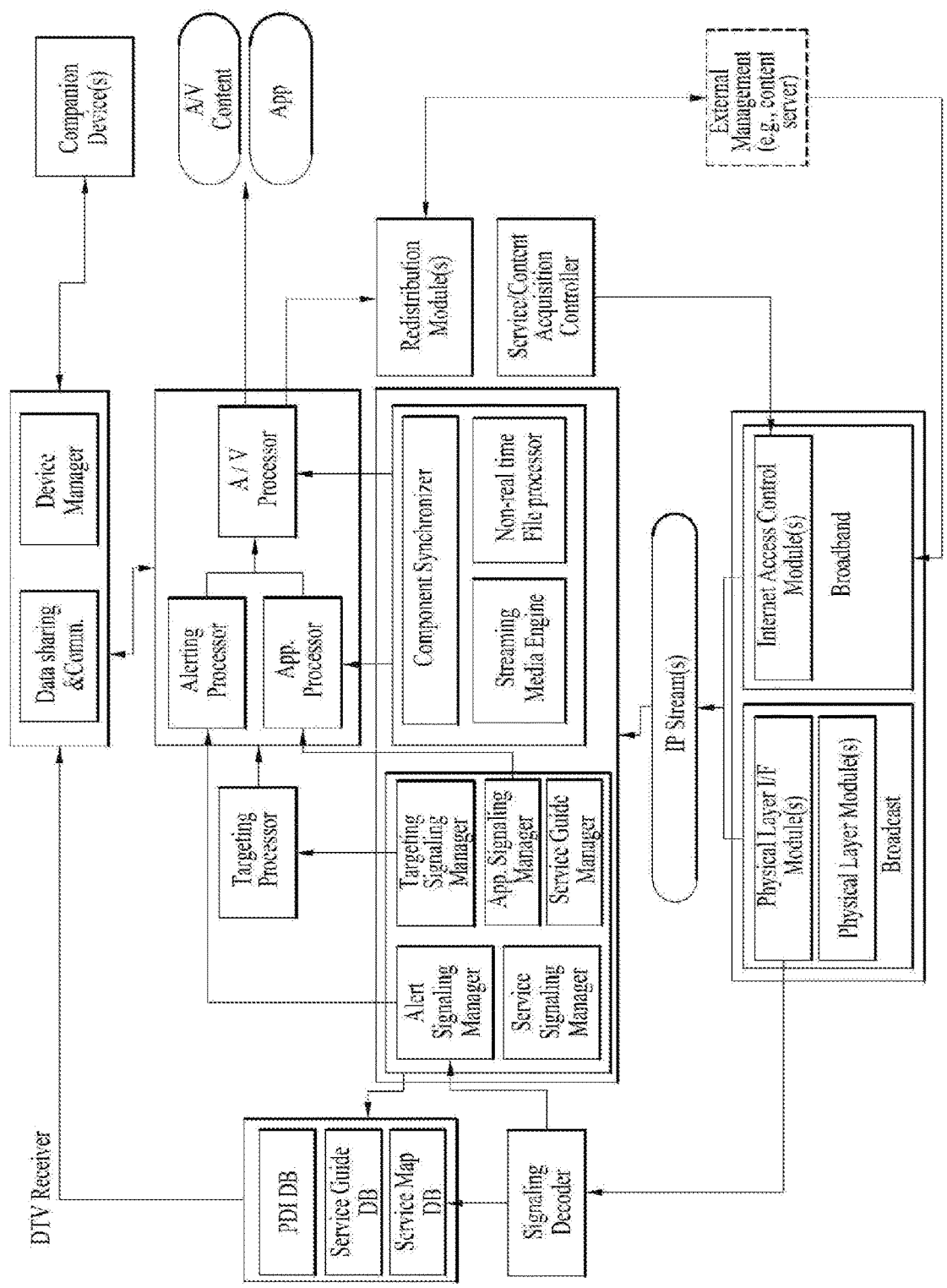
FIG. 66 is a block diagram illustrating a hybrid broadcast reception apparatus according to an embodiment of the present invention.

FIG. 66 is a block diagram illustrating a hybrid broadcast reception apparatus according to an embodiment of the present invention.

A hybrid broadcast system can transmit broadcast signals in connection with terrestrial broadcast networks and the Internet. The hybrid broadcast reception apparatus can receive broadcast signals through terrestrial broadcast networks (broadcast networks) and the Internet (broadband). The hybrid broadcast reception apparatus may include physical layer module(s), physical layer I/F module(s), service/content acquisition controller, Internet access control module(s), a signaling decoder, a service signaling manager, a service guide manager, an application signaling manager, an alert signal manager, an alert signaling parser, a targeting signaling parser, a streaming media engine, a non-real time file processor, a component synchronizer, a targeting processor, an application processor, an A/V processor, a device manager, a data sharing and communication unit, redistribution module(s), companion device(s) and/or an external management module.

The physical layer module(s) can receive a broadcast related signal through a terrestrial broadcast channel, process the received signal, convert the processed signal into an appropriate format and deliver the signal to the physical layer I/F module(s).

The physical layer I/F module(s) can acquire an IP datagram from information obtained from the physical layer module. In addition, the physical layer I/F module can convert the acquired IP datagram into a specific frame (e.g., RS frame, GSE, etc.).

The service/content acquisition controller can perform control operation for acquisition of services, content and signaling data related thereto through broadcast channels and/or broadband channels.

The Internet access control module(s) can control receiver operations for acquiring service, content, etc. through broadband channels.

The signaling decoder can decode signaling information acquired through broadcast channels.

The service signaling manager can extract signaling information related to service scan and/or content from the IP datagram, parse the extracted signaling information and manage the signaling information.

The service guide manager can extract announcement information from the IP datagram, manage a service guide (SG) database and provide a service guide.

The application signaling manager can extract signaling information related to application acquisition from the IP datagram, parse the signaling information and manage the signaling information.

The alert signaling parser can extract signaling information related to alerting from the IP datagram, parse the extracted signaling information and manage the signaling information.

The targeting signaling parser can extract signaling information related to service/content personalization or targeting from the IP datagram, parse the extracted signaling information and manage the signaling information. In addition, the targeting signaling parser can deliver the parsed signaling information to the targeting processor.

The streaming media engine can extract audio/video data for A/V streaming from the IP datagram and decode the audio/video data.

The non-real time file processor can extract NRT data and file type data such as applications, decode and manage the extracted data.

The component synchronizer can synchronize content and services such as streaming audio/video data and NRT data.

The targeting processor can process operations related to service/content personalization on the basis of the targeting signaling data received from the targeting signaling parser.

The application processor can process application related information and downloaded application state and represent parameters.

The A/V processor can perform audio/video rendering related operations on the basis of decoded audio/video data and application data.

The device manager can perform connection and data exchange with external devices. In addition, the device manager can perform operations of managing external devices connectable thereto, such as addition/deletion/update of the external devices.

The data sharing and communication unit can process information related to data transmission and exchange between a hybrid broadcast receiver and external devices. Here, data that can be transmitted and exchanged between the hybrid broadcast receiver and external devices may be signaling data, A/V data and the like.

The redistribution module(s) can acquire information related to future broadcast services and content when the broadcast receiver cannot directly receive terrestrial broadcast signals. In addition, the redistribution module can support acquisition of future broadcast services and content by future broadcast systems when the broadcast receiver cannot directly receive terrestrial broadcast signals.

The companion device(s) can share audio, video or signaling data by being connected to the broadcast receiver according to the present invention. The companion device may be an external device connected to the broadcast receiver.

The external management module can refer to a module for broadcast services/content provision. For example, the external management module can be a future broadcast services/content server. The external management module may be an external device connected to the broadcast receiver.

Figure 67:
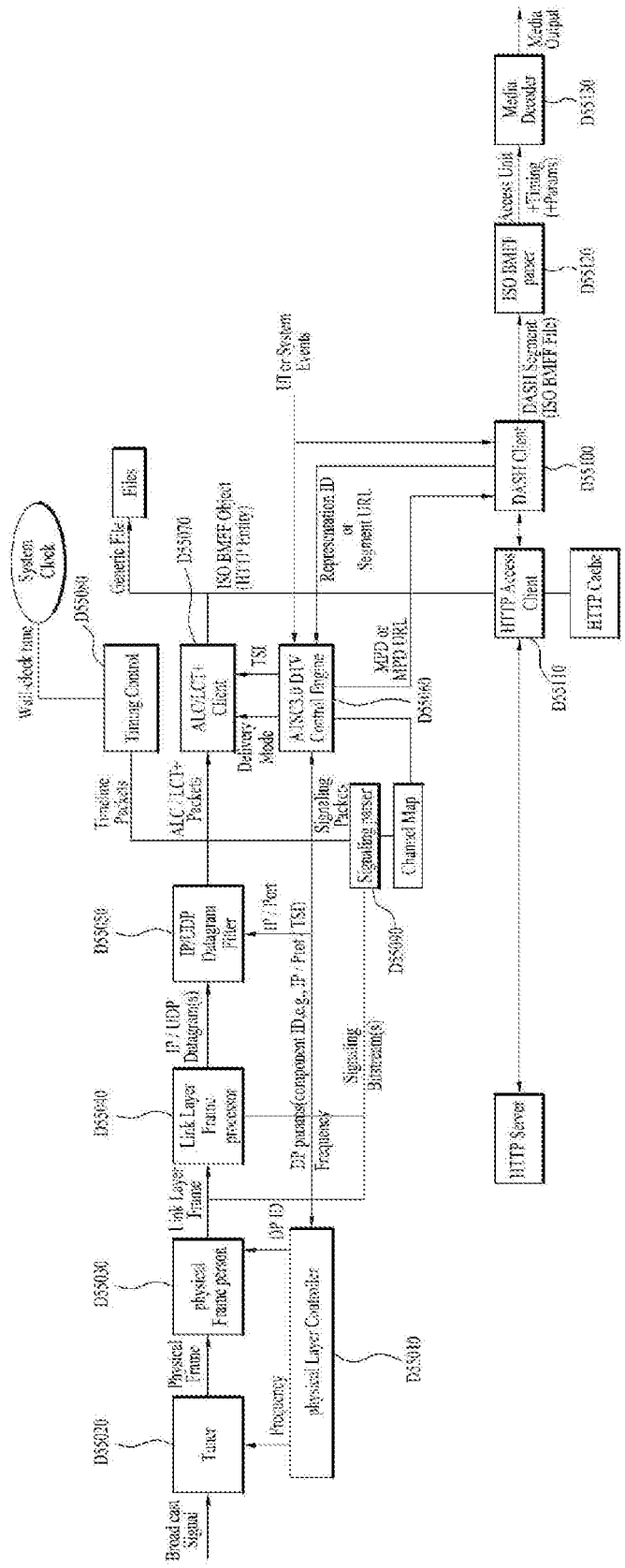
FIG. 67 is a block diagram illustrating a hybrid broadcast receiver according to an embodiment of the present invention.

FIG. 67 is a block diagram illustrating a hybrid broadcast receiver according to an embodiment of the present invention.

The hybrid broadcast receiver can receive hybrid broadcast services through interworking of terrestrial broadcasting and a broadband network in DTV services of a future broadcast system. The hybrid broadcast receiver can receive broadcast audio/video (AN) content transmitted through terrestrial broadcasting and receive enhancement data related thereto or part of broadcast A/V content through the broadband network in real time. In the specification, the broadcast AN content can be referred to as media content.

The hybrid broadcast receiver may include a physical layer controller D55010, a tuner D55020, a physical frame parser D55030, a link layer frame parser D55040, an IP/UDP datagram filter D55050, an ATSC 3.0 digital TV (DTV) control engine D55060, an ALC/LCT+ client D55070, a timing controller D55080, a signaling parser D55090, a dynamic adaptive streaming over HTTP (DASH) client D55100, an HTTP access client D55110, an ISO base media file format (BMFF) parser D55120 and/or a media decoder D55130.

The physical layer controller D55010 can control operations of the tuner D55020 and the physical frame parser D55030 using radio frequency (RF) information of a terrestrial broadcast channel that the hybrid broadcast receiver intends to receive.

The tuner D55020 can receive a broadcast related signal through a terrestrial broadcast channel, process the received signal and convert the signal into an appropriate format. For example, the tuner D55020 can convert a received terrestrial broadcast signal into physical frames.

The physical frame parser D55030 can parse a received physical frame and acquire a link layer frame through processing related thereto.

The link layer parser D55040 can execute related operations for acquisition of link layer signaling or an IP/UDP datagram from the link layer frame. The link layer parser D55040 can output at least one IP/UDP datagram.

The IP/UDP datagram filter D55050 can filter a specific IP/UDP datagram from the received at least one IP/UDP datagram. That is, the IP/UDP datagram filter D55050 can selectively filter an IP/UDP datagram, which is selected by the ATSC 3.0 DTV control engine, from the at least one IP/UDP datagram output from the link layer parser D55040. The IP/UDP datagram filter D55050 can output an application layer transport protocol packet such as ALC/LCT+.

The ATSC 3.0 DTV control engine D55060 can serve as an interface between modules included in the hybrid broadcast receiver. In addition, the ATSC 3.0 DTV control engine D55060 can deliver parameters necessary for each module to each module and control operation of each module through the parameters. In the present invention, the ATSC 3.0 DTV control engine D55060 can transfer media presentation description (MPD) and/or an MPD URL to the DASH client D55100. In addition, the ATSC 3.0 DTV control engine D55060 can transfer a delivery mode and/or a transport session identifier (TSI) to the ALC/LCT+ client D55070. Here, the TSI indicates an identifier of a session in which a transport packet including a signaling message such as MPD or MPD URL related signaling is transmitted, for example, ALC/LCT+ session corresponding to application layer transport protocol or FLUTE session. In addition, the TSI can correspond to an asset ID of an MMT.

The ALC/LCT+ client D55070 can generate one or more ISO base media file format (ISO MMFF) objects by processing an application layer transport protocol packet such as ALC/LCT+ and collecting and processing a plurality of packets. The application layer transport protocol packet may include an ALC/LCT packet, an ALC/LCT+ packet, a ROUTE packet and/or an MMTP packet.

The timing controller D55080 can process a packet including system time information and control a system clock according thereto.

The signaling parser D55090 can acquire and parse DTV broadcast service related signaling, and generate and manage a channel map on the basis of the parsed signaling. In the present invention, the signaling parser can parse MPD or MPD related information extended from signaling information.

The DASH client D55100 can execute operations related to real-time streaming or adaptive streaming. The DASH client D55100 can receive DASH content from an HTTP server through the HTTP access client D55110. The DASH client D55100 can process a received DASH segment and output an ISO BMFF object. In the present invention, the DASH client D55100 can deliver a fully qualified representation ID or a segment URL to the ATSC 3.0 DTV control engine D55060. Here, the fully qualified representation ID can refer to an ID corresponding to a combination of an MPD URL, period@id and representation@id, for example. In addition, the DASH client D55100 can receive the MPD or MPD URL from the ATSC 3.0 DTV control engine D55060. The DASH client D55100 can receive a desired media stream or DASH segment from the HTTP server using the received MPD or MPD URL. In the specification, the DASH client D55100 may be referred to as a processor.

The HTTP access client D55110 can request that the HTTP server provide specific information, receive a response to the request from the HTTP server and process the response. Here, the HTTP server can process the request received from the HTTP access client and provide a response to the request.

The ISO BMFF parser D55120 can extract audio/video data from the ISO BMFF object.

The media decoder D55130 can decode the received audio/video data and perform processing for presentation of the decoded audio/video data.

To provide hybrid broadcast services through interworking of a terrestrial broadcast network and a broadband network according to the hybrid broadcast receiver of the present invention, MPD needs to be extended or modified. The aforementioned terrestrial broadcast system can transmit extended or modified MPD and the hybrid broadcast receiver can receive content through broadcasting or a broadband network using the extended or modified MPD. That is, the hybrid broadcast receiver can receive the extended or modified MPD through terrestrial broadcasting and receive content through terrestrial broadcasting or a broadband network on the basis of the MPD. A description will be given of elements or attributes that need to be additionally included in the extended or modified MPD, compared to the conventional MPD. In the following, the extended or modified MPD is referred to as MPD.

The MPD can be extended or modified to represent ATSC 3.0 service. The extended or modified MPD can additionally include MPD@anchorPresentationTime, Common@presentable, Common.Targeting, Common.TargetDevice and/or Common@associatedTo.

MPD@anchorPresentationTime can indicate presentation time anchor of segments included in the MPD, that is, base time. In the following, MPD@anchorPresentationTime can be used as effective time of the MPD. MPD@anchorPresentationTime can indicate the earliest playback time from among segments included in the MPD.

The MPD may further include common attributes and elements. The common attributes and elements can be applied to AdaptionSet and Representation in the MPD. Common@presentable can indicate that media described by the MPD is a presentable component.

Common.Targeting can indicate targeting properties and/or personalization properties of the media described by the MPD.

Common.TargetDevice can indicate a target device or target devices of the media described by the MPD.

Common@associatedTo can indicate adaptationSet and/or representation related to the media described by the MPD.

In addition, MPD@id, Period@id and AdaptationSet@id included in the MPD may be necessary to specify media content described by the MPD. That is, the DASH client can specify content to be received on the basis of the MPD using MPD@id, Period@id and AdaptationSet@id and signal the content to the ATSC 3.0 DTV control engine. The ATSC 3.0 DTV control engine can receive the corresponding content and deliver the content to the DASH client.

FIG. 68 illustrates a protocol stack of a future hybrid broadcast system according to an embodiment of the present invention.

As shown in the figure, a future broadcast transmission system supporting IP based hybrid broadcasting can encapsulate audio or video data of broadcast services in the ISO base media file format (BMFF). Here, a DASH segment or a media processing unit (MPU) of an MMT can be used for encapsulation. In addition, the future broadcast system can equally transmit the encapsulated data through a broadcast network and the Internet or differently transmit the encapsulated data through the broadcast network and the Internet according to attributes of the respective networks. Furthermore, the future broadcast system can equally transmit the encapsulated data using at least one of broadcast or broadband. In the case of a broadcast network using broadcast, the broadcast system can transmit data encapsulated in the ISO BMFF through an application layer transport protocol packet which supports real-time object transmission. For example, the broadcast system can encapsulate data in a real-time object delivery over unidirectional transport (ROUTE) or MMTP transport packet. The broadcast system can process the encapsulated data into an IP/UDP datagram, load the IP/UDP datagram in a broadcast signal and transmit the broadcast signal. When broadband is used, the broadcast system can deliver the encapsulated data to a receiving side through streaming such as DASH.

In addition, the broadcast system can transmit broadcast service signaling information as follows. In the case of a broadcast network using broadcast, the broadcast system can transmit signaling information through physical layers of the future broadcast transmission system and the broadcast network according to signaling attributes. Here, the broadcast system can transmit the signaling information through a specific data pipe (DP) of a transport frame included in a broadcast signal. Signaling information transmitted through broadcast may have a form of being encapsulated in a bitstream or IP/UDP datagram. When broadband is used, the broadcast system can return and deliver signaling data to a receiver in response to a request of the receiver.

In addition, the broadcast system can transmit broadcast service ESG or NRT content through the following method. In the case of a broadcast network using broadcast, the broadcast system can encapsulate the ESG or NRT content in an application layer transport protocol packet, for example, real-time object delivery over unidirectional transport (ROUTE) or MMTP transport packet. The broadcast system can generate an IP/UDP datagram with the encapsulated ESG or NRT content, load the IP/UDP datagram in a broadcast signal and transmit the broadcast signal. When broadband is used, the broadcast system can return and deliver the ESG or NRT content to a receiver in response to a request of the receiver.

Figure 69:
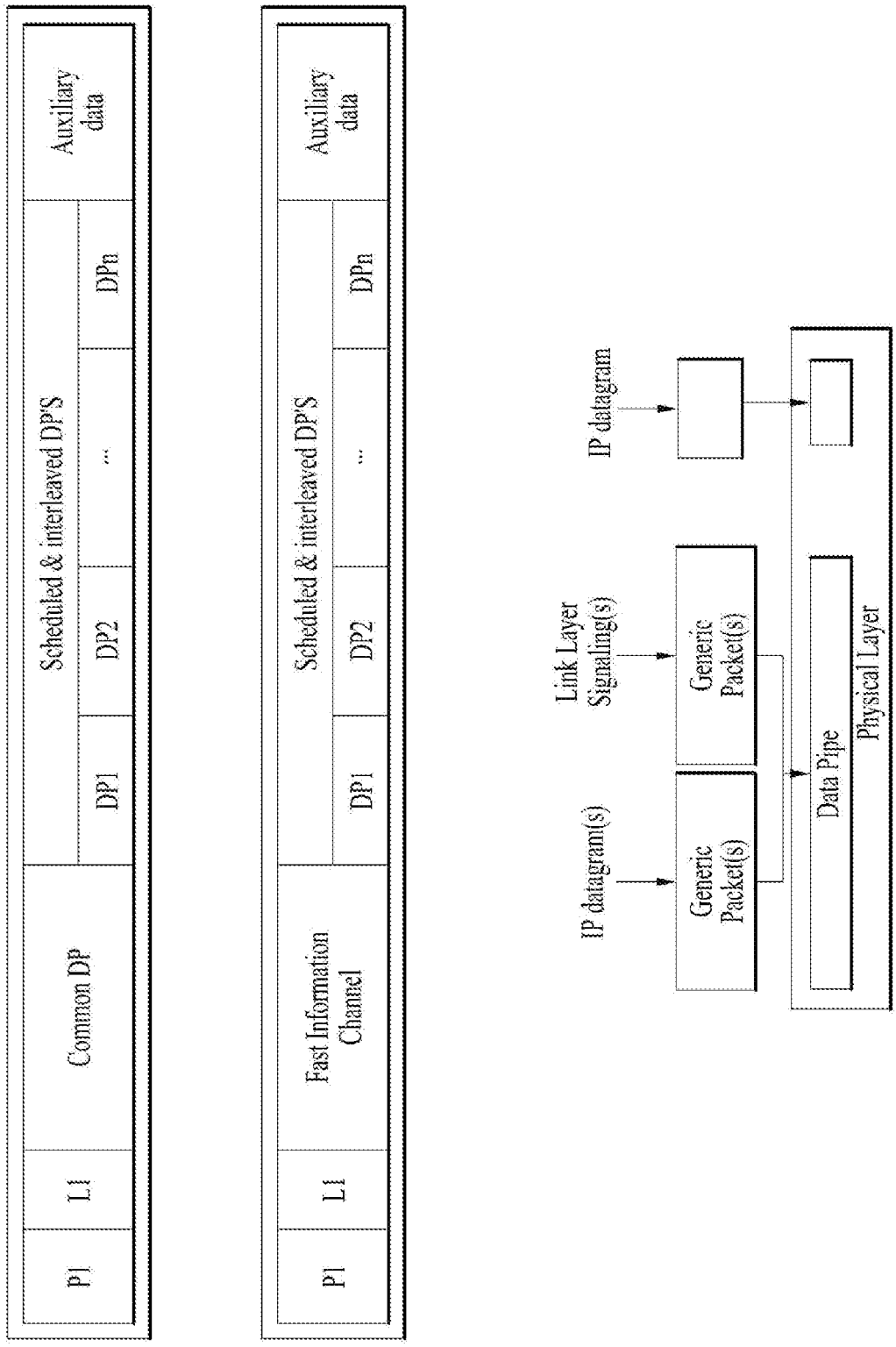
FIG. 69 illustrates a structure of a transport frame delivered to a physical layer of a future broadcast transmission system according to an embodiment of the present invention.

FIG. 69 illustrates a structure of a transport frame delivered to a physical layer of the future broadcast transmission system according to an embodiment of the present invention.

The future broadcast system can transmit a transport frame using broadcast. In the figure, P1 located at the front of the transport frame can refer to a symbol including information for transport signal detection. P1 can include tuning information and a receiver can decode a part L1 following P1 on the basis of a parameter included in the symbol P1. The broadcast system can include, in the part L1, information about transport frame configuration and characteristics of data pipes. That is, the receiver can obtain the information about the transport frame configuration and characteristics of data pipes by decoding the part L1. In addition, the receiver can acquire information that needs to be shared between DPs through a common DR According to an embodiment, the transport frame may not include the common DP.

Components such as audio, video and data in the transport frame are included in an interleaved DP region composed of DP1 to DPn and transmitted. Here, DPs through which components constituting each service (channel) are transmitted can be signaled through L1 or a common PLP.

In addition, the future broadcast system can transmit information for rapidly acquiring information about services included in a transport frame. That is, the future broadcast system enables a future broadcast receiver to rapidly acquire broadcast services and content related information included in a transport frame. When services/content generated by one or more broadcasting stations are present in the corresponding frame, the future broadcast system can enable the receiver to efficiently recognize the services/content according to the broadcasting stations. That is, the future broadcast system can include, in a transport stream, service list information about services included in the transport stream, and transmit the transport stream including the service list information.

When an additional channel, for example, a fast information channel (FIC) is present, the broadcast system can transmit broadcast service related information through the additional channel such that the receiver can rapidly scan broadcast services and content in a corresponding frequency. As shown in FIG. 44, the broadcast system can include, in the transport stream, information for broadcast service scan and acquisition and transmit the same. Here, the region including the information for broadcast service scan and acquisition may be referred to as an FIC. The receiver can acquire information about broadcast services generated and transmitted by one or more broadcasting stations and easily and rapidly scan broadcast services available therein using the information.

In addition, a specific DP included in the transport stream can serve as a base DP capable of rapidly and robustly delivering signaling about broadcast services and content transmitted in the corresponding transport frame. Data transmitted through each DP of the transport frame of the physical layer is as shown in the lower part of FIG. 44. That is, link layer signaling or an IP datagram can be encapsulated in a generic packet in a specific format and then transmitted through a DP. Here, the IP datagram can include signaling data. Link (low) layer signaling can include signaling related to fast service scan/acquisition, context information of IP header compression and emergency alert.

Figure 70:
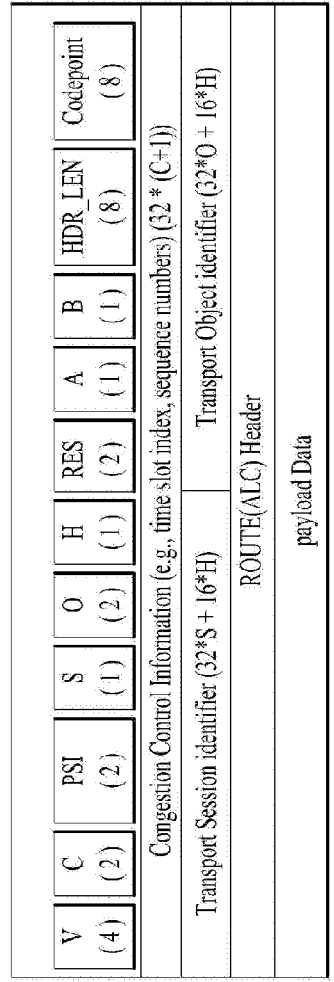
FIG. 70 illustrates a transport packet of an application layer transport protocol according to an embodiment of the present invention.

FIG. 70 illustrates a transport packet of an application layer transport protocol according to an embodiment of the present invention.

An application layer transport session can be composed of a combination of an IP address and a port number. When the application layer transport protocol corresponds to ROUTE, a ROUTE session can be composed of one or more layered coding transport (LCT) sessions. For example, when a single media component (e.g., DASH representation) is delivered through a single LCT transport session, one or more media components can be multiplexed and delivered through a single application transport session. Furthermore, one or more transport objects can be delivered through a single LCT transport session, and each transport object can be a DASH segment associated with DASH representation delivered through the transport session.

For example, when the application layer transport protocol is an LCT based protocol, a transport packet can be configured as follows. The transport packet can include an LCT header, a ROUTE header and payload data. A plurality of fields included in the transport packet is as follows.

The LCT header can include the following fields. A version field V can indicate version information of the corresponding transport protocol packet. A field C can include a flag related to the length of a congestion control information field which will be described below. A field PSI can indicate protocol-specific information, that is, information specific to the corresponding protocol. A field S can indicate a flag associated with the length of a transport session identifier (TSI) field. A field O can indicate a flag associated with the length of a transport object identifier (TOI) field. A field H can indicate whether a half-word (16 bits) is added to the lengths of the TSI field and the TOI field. A field A (close session flag) can indicate that a session is closed or closure of the session is imminent. A field B (close object flag) can indicate that an object being transmitted is closed or closure of the object is imminent. A code point field can indicate information related to encoding or decoding of a payload of the corresponding packet. For example, payload type can correspond to the information. A congestion control information field can indicate information related to congestion control. For example, the information related to congestion control can be a current time slot index (CTSI), a channel number or a packet sequence number in the corresponding channel. A transport session identifier field can indicate a transport field identifier. A transport object identifier field can indicate an identifier of an object transmitted through the corresponding transport session.

A ROUTE (ALC) header can include additional information of the preceding LCT header, such as a payload identifier related to a forward error correction scheme.

Payload data can indicate a data part of the payload of the corresponding packet.

Figure 71:
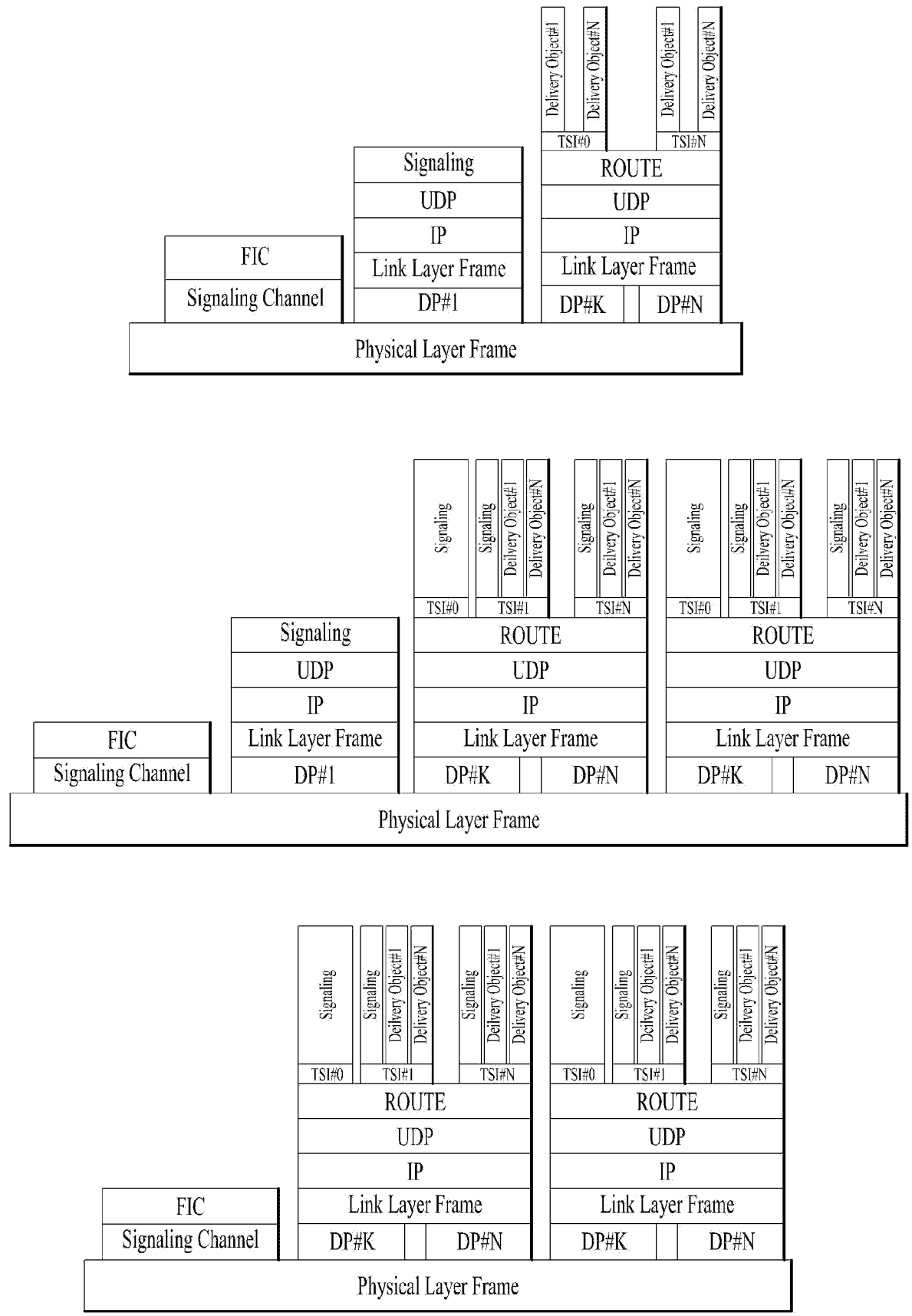
FIG. 71 illustrates a method for transmitting signaling data by a future broadcast system according to an embodiment of the present invention.

FIG. 71 illustrates a method for transmitting signaling data by the future broadcast system according to an embodiment of the present invention. Signaling data of the future broadcast system can be transmitted as shown in the figure. To enable the receiver to support fast service/content scan and acquisition, the future broadcast transmission system can transmit signaling data with respect to a broadcast service delivered through a corresponding physical layer frame, via a fast information channel (FIC). In the specification, the FIC can refer to information about a service list. Unless an additional FIC is present, the signaling data may be delivered through a path through which link layer signaling is delivered. That is, signaling information including information about services and components (audio and video) thereof can be encapsulated in an IP/UDP datagram and transmitted through one or more DPs in the physical layer frame. According to an embodiment, signaling information about services and service components can be encapsulated in an application layer transport packet (e.g. a ROUTE packet or an MMTP packet) and transmitted.

The upper part of FIG. 71 illustrates an example of delivering the aforementioned signaling data through an FIC or one or more DPs. That is, signaling data for supporting fast service scan/acquisition can be delivered through the FIC and signaling data including detailed information about services can be encapsulated in an IP datagram and transmitted through a specific DP. In the specification, the signaling data including detailed information about services may be referred to as service layer signaling.

The middle part of FIG. 71 illustrates an example of delivering the aforementioned signaling data through an FIC and one or more DPs. That is, signaling data for supporting fast service scan/acquisition can be delivered through the FIC and signaling data including detailed information about services can be encapsulated in an IP datagram and transmitted through a specific DP. In addition, part of signaling data including information about a specific component included in a service may be delivered through one or more transport sessions in the application layer transport protocol. For example, part of the signaling data can be delivered through one or more transport sessions in a ROUTE session.

The lower part of FIG. 71 illustrates an example of delivering the aforementioned signaling data through an FIC and one or more DPs. That is, signaling data for supporting fast service scan/acquisition can be delivered through the FIC and signaling data including detailed information about services can be delivered through one or more sessions in a ROUTE session.

FIG. 72 illustrates a syntax of a fast information table (FIT) according to an embodiment of the present invention.

In the present invention, the FIT may be referred to as an FIC, SLT or low level signaling (LLS). In addition, the FIT may be defined as a signaling structure included in LLS. In this case, some information included in the FIT according to an embodiment of the present invention can be included in the LLS. The LLS corresponds to signaling information delivered through a payload of an IP packet having a well-known address/port in a broadcast system.

The illustrated FIT may correspond to a signaling structure for supporting broadcast service scan and acquisition in a receiver. Broadcast services and/or content generated by one or more broadcast stations may be delivered through a specific frequency. In this case, information necessary for this procedure may be signaled through the FIT such that the receiver can rapidly and easily scan broadcasting stations corresponding to the frequency and/or services and/or content of the broadcast stations.

When a signaling structure proposed by the present invention is used, the receiver can scan services and a service acquisition speed of the receiver can be reduced. While the syntax of the illustrated FIT is described, information included in the FIT may be represented in other formats such as XML.

According to the present invention, the FIT may be delivered through a fast information channel (FIC) which is a separate channel in a physical layer transport frame. Otherwise, the FIT may be delivered through a common DP through which information that can be shared between data pipes of the physical layer can be delivered. Information included in the FIT may be delivered through a link layer signaling delivery path or link layer signaling, which is defined in the link layer. Otherwise, the FIT may be delivered through a service signaling channel through which service signaling is transmitted or a transport session of the application layer.

The FIT according to an embodiment of the present invention may include FIT_protocol_version information, broadcast_stream_id information, FIT_data_version information, FIT_length information, num_providers information, esg_service_id information, signaling_on_inet_flag information, provider_id information, inet_server_URL_length information, inet_server_URL[k] information, num_services information, service_id information, SLS_data_version information, service_category information, short_service_name_length information, short_service_name information, sp_indicator information, service_status information, SLS_simpleservice information, capability_ flag information, signaling_broadcast_flag information, capability_code information, a signaling_broadcast_info( ) element, num_service_level_descriptor information, a service_level_descriptor( ) element, num_FIT_level_descriptor information, an FIT_level_descriptor( ) element and/or a CRC( ) element.

The FIT_protocol_version information can indicate the protocol version of the FIT. When the protocol related to the FIT is changed, the FIT_protocol_version information can indicates such protocol change.

The FIT_data_version information can indicate the data version of the FIT. When data in the FIT is changed, the FIT_data_version information can indicate such data change.

FIT_length information indicates the length (size) of information subordinate to the FIT. The FIT_length can indicate the length (or size) of the FIT.

The num_providers information indicates the number of broadcasters providing the FIT or broadcasters providing services. The num_providers information may indicate the number of broadcasters providing an ESG service.

The esg_service_id information is an identifier for identifying the ESG service which provides an ESG. The esg_service_id information can be used separately from the aforementioned service_id information.

The signaling_on_inet_flag information indicates whether signaling information related to the ESG service is delivered through the Internet. The signaling_on_inet_flag information indicates whether service level signaling is delivered through a broadband network.

The provider_id information identifies a broadcaster which provides the ESG service.

The inet_server_URL_length information can indicate the length of the URL of a server which provides signaling information related to the ESG service.

The inet_serverURL[k] information can indicate the URL of a server which provides signaling information or service level signaling related to the ESG service.

The SLS_data_version information can indicate the data version of service level signaling.

The SLS_simpleservice information can indicate whether signaling which replaces SLS is transmitted in a layer in which the FIT is delivered. For example, in the case of a specific service, the receiver can configure signaling such that the corresponding service can be accessed using only information included in the FIT before information of SLS is used. In this case, the SLS_simpleservice information can indicate whether the corresponding service can be accessed using only information included in the FIT. The SLS_simpleservice information can indicate whether the corresponding service is a simple broadcast service. The SLS_ simpleservice information can indicate whether all components included in the corresponding service are delivered through a broadcast network or some components are delivered through a broadband network. That is, the SLS_simpleservice information indicates whether the receiver needs to access the broadband network in order to effectively present one or more broadcast services.

The capability_flag information indicates whether capability related information is included in the FIT.

The signaling_broadcast_flag information can indicate whether service level signaling is delivered through a broadband network.

The capability_code information indicates receiver capabilities necessary to decode a component in a service to enable significant presentation of the component.

The signaling_broadcast_info( ) element can include information necessary to acquire service level signaling when the service level signaling is delivered through a broadcast network. The signaling_broadcast_info( ) element can include information indicating a location, address and/or region through which the service level signaling is delivered and/or information indicating a protocol used to deliver the service level signaling.

The num_FIT_level_descriptor information indicates the number of descriptors defined in the level (or layer) in which the FIT is delivered.

The CRC( ) element can include information related to a CRC.

Information and/or elements which are not described in FIG. 162, from among information and/or elements included in the FIT, correspond to information/elements having the same names included in the aforementioned FIC, FIT, SLT and/or LLS and thus description thereof is omitted.

FIG. 73 illustrates description about information included in the FIT according to an embodiment of the present invention.

The FIT may include FIT_protocol_version information, Broadcast_stream_id information, FIT_data_version information, FIT_length information, num_providers information, esg_service_id information, signaling_on_inet_flag information, provider_id information, inet_server_URL_length information, inet_serverURL[k] information, num_services information, service_id information, SLS_data_version information, service_category information, short_service_name_length information, short_service_name information, sp_indicator information, service_status information, SLS_simpleservice information, capability_flag information, signaling_broadcast_flag information, capability_code information, a signaling_broadcast_info( ) element, num_service_level_descriptor information, a service_level_descriptor( ) element, num_FIT_level_descriptor information, an FIT_level_descriptor( ) element and/or a CRC( ) element.

The above information and/or elements correspond to the aforementioned information/elements and thus description thereof is omitted.

FIG. 74 illustrates a signaling connecting structure in a procedure in which the receiver acquires a service according to an embodiment of the present invention.

The receiver parses an FIT delivered through the physical layer (or the first layer). The receiver recognizes whether an FIT of a new version is delivered by parsing the FIT_version information and parses the FIT when the new FIT is delivered.

In the present embodiment, when the FIT_version information has a value of "002", the receiver checks the signaling_broadcast_flag information and/or information in the signaling_broadcast_info ( ) element and acquires service level signaling.

In the present embodiment, when the FIT_version information has a value of "03", the receiver can select a broadcaster which provides the service using the provider_id information. The receiver can receive service level signaling related to the service provided by the corresponding broadcaster through a broadband network (Internet) using the signaling_over_inet_flag information and/or information in the signaling_over_inet_information ( ) element. The receiver may check the signaling_broadcast_flag information and/or information in the signaling_broadcast_info ( ) element and acquire service level signaling.

In the present embodiment, SLS with respect to service 1 (Srv1) is delivered through a broadcast network, whereas SLS with respect to service 2 (Srv2) is delivered through a broadband network. Since LLS including the FIT can be delivered through a predetermined region or location in a broadcast signal, as described above, the receiver can acquire the LLS and/or the FIT from the corresponding region or location.

FIG. 75 illustrates a syntax of an FIT according to another embodiment of the present invention.

The FIT according to another embodiment of the present invention may include FIT_protocol_version information, broadcast_stream_id information, FIT_data_version information, FIT_length information, num_providers information, num_services information, service_id information, SLS_data_version information, service_category information, short_service_name_length information, short_service_name information, sp_indicator information, service_status information, SLS_simpleservice information, num_service_level_descriptor information, a service_level_descriptor( ) element, num_provider_level_descriptor information, a provider_level_descriptor( ) element, num_FIT_level_descriptor information, an FIT_level_descriptor( ) information and/or a CRC( ) element.

The FIT according to another embodiment of the present invention includes the num_provider_level_descriptor information and the provider_level_descriptor( ) element in addition to the aforementioned FIT and presents loops for performing signaling per provider (broadcaster) and per service.

The num_provider_level_descriptor information indicates the number of descriptors which provide information related to a broadcaster.

The provider_level_descriptor( ) element can include a descriptor providing information related to the broadcaster.

According to the present embodiment, even when a plurality of broadcasters is present, it is possible to signal information for acquiring services provided by the respective broadcasters using the signaling structure of the same FIT.

Information and/or elements which are not described in FIG. 162, from among information and/or elements included in the FIT, correspond to information/elements having the same names included in the aforementioned FIC, FIT, SLT and/or LLS and thus description thereof is omitted.

FIG. 76 is a table showing descriptor type and locations at which descriptors can be included according to an embodiment of the present invention.

The aforementioned signaling structure may include a capability_descriptor, a signaling_broadcast_descriptor and/or a signaling_over_internet_descriptor.

The capability_descriptor can include signaling information which specifies capabilities required for the receiver to effectively present a service, content and/or a component. The capability_descriptor is a service level descriptor and can be included in an FIT or an SLT.

The signaling_broadcast_descriptor can include information necessary to bootstrap (acquire) service level signaling included in a broadcast signal and delivered. The signaling_broadcast_descriptor can include information indicating source IP addresses, destination IP addresses and/or destination ports of packets which deliver the service level signaling. The signaling_broadcast_descriptor can include SLS_PLP_ID corresponding to information identifying a PLP through which the service level signaling is delivered and/or SLS_TSI information identifying a TSI of a transport session through which the service level signaling is delivered. The SLS_PLP_ID information can be included in a signaling structure delivered in the link layer as necessary.

The signaling_over_internet_descriptor can include information indicating whether the service level signaling can be delivered through the Internet and/or address information of a server which provides the service level signaling.

FIG. 77 illustrates a signaling_broadcast_descriptor according to an embodiment of the present invention.

The signaling_broadcast_descriptor according to the present embodiment may include descriptor_tag information, descriptor_length information, IP_version_flag information, SLS_src_IP_addr_flag information, SLS_src_IP_addr information, SLS_dst_IP_addr information, SLS_dst_port_num information, SLS_TSI information and/or SLS_PLP_id information.

The descriptor_tag information specifies the corresponding descriptor.

The descriptor_length information indicates the length of the descriptor.

The IP_version_flag information indicates the IP version used for an IP address delivered in the descriptor.

The SLS_src_IP_addr_flag information indicates whether the SLS_src_IP_addr information is present.

The SLS_src_IP_addr information indicates source IP addresses of packets which deliver SLS.

The SLS_dst_IP_addr information indicates destination IP addresses of packets which deliver SLS.

The SLS_dst_port_num information indicates destination port numbers of packets which deliver SLS.

The SLS_TSI information identifies a transport session through which SLS is delivered.

The SLS_PLP_id information identifies a location/region in which SLS is delivered. The SLS_PLP_id information indicates a PLP including the SLS. The SLS_PLP_id information may be included in link layer signaling and delivered.

FIG. 78 illustrates meaning of the signaling_on_inet_descriptor (or signaling_over_internet_descriptor) and values of the inet_server_URL_type information according to an embodiment of the present invention.

The signaling_on_inet_descriptor may include descriptor_tag information, descriptor_length information, num_inet_URL information, inet_server_URL_type information, inet_server_URL_length information and/or inet_server_URL information.

The descriptor_tag information identifies the corresponding descriptor.

The descriptor_length information indicates the length of the descriptor.

The num_inet_URL information indicates the number of Internet URL addresses signaled in the descriptor.

The inet_server_URL_type information indicates the type of data provided by a server corresponding to a signaled Internet URL. The type of data provided by the corresponding server can be identified according to a value allocated to the inet_server_URL_type information. Referring to the figure, when the inet_server_URL_type information has a value of "0x01", the inet_server_URL_type information can indicate a server which delivers SLS. When the inet_server_URL_type information has a value of "0x02", the inet_server_URL_type information can indicate a server which provides an ESG (Electronic Service Guide). When the inet_server_URL_type information has a value of "0x03", the inet_server_URL_type information can indicate a server which provides a template. When the inet_server_URL_type information has a value of "0x04", the inet_server_URL_type information can indicate a server which provides all types of data. URL type which can be provided by one provider can be diversified by defining type of each URL as described above. In addition, the FIT size can be reduced by using one URL for the provider level in consideration of shortcomings of URL that the length is not restricted.

The inet_server_URL_length information indicates the URL length of a server.

The inet_server_URL information indicates the URL of a server.

FIG. 79 illustrates meaning of the capability_descriptor and values of the capability_category information according to an embodiment of the present invention.

The capability_descriptor according to the present embodiment may include descriptor_tag information, descriptor_length information, num_capability information, capability_category information, capability_code_type information, capability_code_int information, capability_code_string_length information and/or capability_code_string information.

The descriptor_tag information identifies the corresponding descriptor.

The descriptor_length information indicates the length of the descriptor.

The num_capability information indicates the number of signaled capabilities.

The capability_category information identifies capability category. In one embodiment, the capability_category information can indicate that capabilities for download protocols are signaled when the capability_category information is "0x01", indicate that capabilities for an FEC algorithm are signaled when the capability_category information is "0x02", indicate that capabilities for wrapper/archive formats are signaled when the capability_category information is "0x03", indicate that capabilities for compression algorithms are signaled when the capability_category information is "0x04", indicate that capabilities for media types are signaled when the capability_category information is "0x05" and indicate that capabilities for delivery protocols are signaled when the capability_category information is "0x06".

The capability_code_type information indicates capability_code type.

The capability_code_int information indicates a capability code. The capability code can correspond to information indicating a degree of receiver capability.

The capability_code_string_length information indicates a string length of the capability code.

The capability_code_string information indicates a capability code.

The capability code can be defined in the form of an integer or a string according to the capability_code_int information or the capability_code_string information.

FIG. 80 illustrates a syntax of an FIT according to another embodiment of the present invention.

The FIT according to another embodiment of the present invention may include FIT_protocol_version information, broadcast_stream_id information, FIT_data_version information, FIT_length information, num_providers information, num_services information, service_id information, SLS_data_version information, service_category information, short_service_name_length information, short_service_name information, sp_indicator information, service_status information, SLS_simpleservice information, signaling_broadcast_flag information, IP_version_flag information, SLS_src_IP_addr_flag information, SLS_src_IP_addr information, SLS_dst_IP_addr information, SLS_dst_port_num information, SLS_TSI information, SLS_PLP_id information, num_service_level_descriptor information, a service_level_descriptor( ) element, num_provider_level_descriptor information, a provider_level_descriptor( ) element, num_FIT_level_descriptor information, an FIT_level_descriptor( ) element and/or a CRC( ) element.

The IP_version_flag information, SLS_src_IP_addr flag information, SLS_src_IP_addr information, SLS_dst_IP_addr information, SLS_dst_port_num information, SLS_TSI information and/or SLS_PLP_id information can be defined as a signaling_broadcast_info( ) element.

The IP_version_flag information indicates the IP version used for the IP address delivered in the corresponding descriptor.

The SLS_src_IP_addr_flag information indicates whether the SLS_src_IP_addr information is present.

The SLS_src_IP_addr information indicates source IP address of packets which deliver SLS.

The SLS_dst_IP_addr information indicates destination IP address of packets which deliver SLS.

The SLS_dst_port_num information indicates destination port numbers of packets which deliver SLS.

The SLS_TSI information indicates a transport session through which SLS is delivered.

The SLS_PLP_id information identifies a location/region at which SLS is delivered. The SLS_PLP_id information identifies a PLP including the SLS. The SLS_PLP_id information may be included in link layer signaling and delivered.

Information or elements included in the FIT according to another embodiment of the present invention correspond to the aforementioned information or elements having the same names and thus description thereof is omitted.

According to the present embodiment, bootstrapping information about SLS can be signaled using a flag instead of a descriptor. In this case, the FIT size can be reduced.

FIG. 81 compares methods for signaling information about service level signaling delivered through a broadcast network according to an embodiment of the present invention.

The information included in the aforementioned signaling_broadcast_descriptor may be signaled through the FIT by being included in the aforementioned signaling_broadcast_info( ) element.

In this case, the descriptor_tag information and/or the descriptor_length information included in the signaling_broadcast_descriptor may be omitted, and thus up to 2 bytes from among bytes allocated for FIT signaling can be reduced.

FIG. 82 is a table showing descriptor type and locations at which descriptors can be included according to an embodiment of the present invention.

According to the present embodiment, a capability_descriptor can be included in a service level descriptor and a signaling_over_internet_descriptor can be included in a provider level descriptor.

Information that can be included in each descriptor has been described.

According to the present embodiment, the FIT may not separately include the signaling_broadcast_descriptor, and the signaling_broadcast_info( ) element can signal information necessary to bootstrap service level signaling.

FIG. 83 illustrates an FIT in XML format according to another embodiment of the present invention.

The FIT according to the present embodiment may include @protocol_version information, @Broadcast_stream_id information, @FIT_data_version information, a provider element, an inet_server_URL element, @type information, a service element, @service_id information, @SLS_data_version information, @service_category information, @service_name information, @sp_indicator information, @service_status information, @SLS_simpleservice information, a capability element, a signaling_broadcast element, a service_level_descriptor element, a signaling_on_inet_URL element, a provider_level_descriptor( ) element, an FIT_Ievel_descriptor( ) element and/or a CRC( ) element.

The provider element includes information about a provider. The provider element can signal information about 0 to N providers.

The inet_server_URL element includes information indicating the URL of a server which provides data through the Internet.

The @type information indicates the type of data provided by the server having the URL identified by the inet_server_URL element. The @type information can identify a server delivering SLS, a server providing an ESG, a server providing a template and a server providing all types of data according to values thereof.

The capability element can include information contained in the aforementioned capability_descriptor.

The signaling_broadcast element can include information contained in the aforementioned signaling_broadcast_descriptor.

FIG. 84 illustrates description about information included in an FIT according to an embodiment of the present invention.

The FIT may include FIT_protocol_version information, broadcast_stream_id information, FIT_data_version information, FIT_length information, num_providers information, num_services information, service_id information, SLS_data_version information, service_category information, short_service_name_length information, short_service_name information, sp_indicator information, service_status information, SLS_simpleservice information, capability_flag information, signaling_broadcast_flag information, capability_code information, num_service_level_descriptor information, a service_level_descriptor( ) element, num_provider_level_descriptor information, a provider_level_descriptor( ) element, num_FIT_level_descriptor information, an FIT_Ievel_descriptor( ) element and/or a CRC( ) element.

The SLS_simpleservice information can indicate whether a service is a simple broadcast service. The SLS_simpleservice information can indicate whether all components included in the service are delivered through a broadcast network or some components are delivered through a broadband network. That is, the SLS_simpleservice information indicates whether the receiver needs to access the broadband network in order to effectively present one or more broadcast services.

The num_provider_level_descriptor information indicates the number of provider level descriptors.

The provider_level_descriptor( ) element can include a provider level descriptor including description information about a provider.

The aforementioned information and/or elements have been described above.

FIG. 85 illustrates a signaling connecting structure in a procedure in which the receiver acquires a service according to an embodiment of the present invention.

In the present embodiment, service 1 (Srv1) and service 2 (Srv2) are delivered through a broadcast stream. SLS for each service is delivered through a broadcast network.

In this case, the receiver accesses a dedicated region in which an FIT is delivered in a broadcast signal to acquire the FIT and obtains the FIT_version information of the FIT. When the version of the FIT has been changed, the receiver parses the FIT.

The receiver acquires information about service 1 and service 2 in loops for service 1 and service 2 in the FIT. The information about the services is shown in the figure. Particularly, the information can include a signaling_broadcast_descriptor ( ) element. The signaling_broadcast_descriptor ( ) element can include the aforementioned signaling_broadcast_descriptor and the receiver can acquire SLS for service 1 and SLS for service 2 using information included in the signaling_broadcast_descriptor.

The receiver can acquire the SLS for each service and access a session delivering components included in service 1 and/or service 2 using the SLS information. The receiver acquires components for presenting the services from the corresponding session and present service 1 and/or service 2 viewers.

FIG. 86 illustrates a signaling connecting structure in a procedure in which the receiver acquires a service according to another embodiment of the present invention.

In the present embodiment, service 1 (Srv1) and service 2 (Srv2) are delivered through a broadcast stream. SLS for service 1 can be delivered through a broadcast network, whereas SLS for service 2 can be delivered through a broadband network.

In this case, the receiver acquires an FIT by accessing a dedicated region in which the FIT is delivered in a broadcast signal and obtains the FIT_version information of the FIT. When the version of the FIT has been changed, the receiver parses the FIT.

The receiver acquires information about service 1 and service 2 in loops for service 1 and service 2 in the FIT. The information about the services is shown in the figure. Particularly, the loop for service 1 can include a signaling_broadcast_descriptor ( ) element and the loop for service 2 can include a signaling_on_inet_URL_descriptor ( ) element.

The signaling_broadcast_descriptor ( ) element can include the aforementioned signaling_broadcast_descriptor and the receiver can acquire SLS for service 1 using information in the signaling_broadcast_descriptor.

The signaling_on_inet_URL_descriptor ( ) element can include the aforementioned signaling_on_inet_descriptor and the receiver can acquire SLS delivered through the broadband network using information in the signaling_on_inet_descriptor.

The receiver can access a session delivering components included in service 1 and/or service 2 using the acquired SLS information. The receiver acquires the components for presenting the services from the corresponding session and presents service 1 and/or service 2 to viewers.

FIG. 87 illustrates a template delivery table according to an embodiment of the present invention.

As described above, signaling information such as SLS may be transmitted by using a template-based compression method. In other words, signaling information may be managed through Diff and patch process. A signaling template may be pre-shared between a transmitter and a receiver.

A template may be transmitted in the format of a signaling table as shown in FIG. 87. The fields included in the template delivery table of FIG. 87 are described below.

Table_ID: indicates an identifier of a template delivery table

Version_Number: indicates the version of the template delivery table

Table_length: indicates the length of the template delivery table encoding_type: indicates the encoding type of the template delivery table Table_id_extension: extends the table identifier of the template delivery table current_segment_number: indicates the current segment number of a descriptor for the template delivery table last_segment_number: indicates the last segment number of a descriptor for the template delivery table Signaling_id: indicates the signaling ID of the template delivery table Signaling_version: indicates the signaling version of the template delivery table Template_id: indicates the ID of a template included in the template delivery table Template_version: indicates the version of a template included in the template delivery table template_length: indicates the length of a template included in the template delivery table template: template information included in the template delivery table As described in detail above, service signaling information may be stored as a (signaling) template. And if a signaling instance which changes the service signaling information is generated, a transmitter may transmit the difference between the template and the signaling instance by generating Diff. A receive may recover the signaling instance by applying the Diff to a pre-shared template and apply the recovered signaling instance to a system/data. Such a signaling template may be pre-shared with the receiver in the form of template delivery table.

FIG. 88 illustrates a level descriptor according to an embodiment of the present invention.

In an embodiment of the present invention, a descriptor may be included in a table depending on the needs. Also, a descriptor may be included for each level. In FIG. 88, capability_descriptor, signaling_broacbast_descriptor, and signaling_on_internet_discriptor may be referred to as capability information, broadcast signaling information, and URL signaling information, respectively. Description about each information of FIG. 88 is substituted for by the detailed description given above.

An FIT may include signaling information at the FIT level and signaling information at the service level. The signaling information at the FIT level is the information applied to the entire services described by the FIT, and the signaling information at the service level is the information applied to an individual service described by the FIT. It is a waste of resources to always include the signaling information applied to the entire services for each individual service. Therefore, the signaling information applied to the entire services is included at the FIT level. It is preferable that the signaling information for each individual service should be included at the service level.

In the embodiment of FIG. 88, capability_descriptor, signaling_broacdast_descriptor, and signaling_on_internet_discriptor may all be signaled at the service level. However, signaling_on_internet_discriptor may also be signaled at the FIT level. signaling_on_internet_descriptor may include a URL at which an ESG or other signaling file may be obtained.

If URL signaling information is included at the FIT level, the corresponding URL may represent a URL at which signaling information about all of the broadcast services described in the FIT may be retrieved over broadband. If URL signaling information is included at the FIT level, the corresponding URL may represent a URL at which all of the providers described in the FIT or an ESG about the corresponding services may be retrieved over broadband.

If URL signaling information is included at the service level, the corresponding URL may represent a URL at which signaling information about a service including URL signaling information may be retrieved over broadband. If URL signaling information is included in the FIT level, the corresponding URL may represent a URL at which an ESG including the URL signaling information may be retrieved over broadband. The URL signaling information may be included at both of the service and FIT levels.

FIG. 89 illustrates an FIT to which level descriptors are applied according to an embodiment of the present invention.

In FIG. 89, descriptions about the information included in the FIT are replaced with the detailed descriptions given above.

In the FIT of FIG. 89, as described with reference to FIG. 88, signaling_broacdast_descriptor information, signaling_on_internet_descriptor information, and capability_descriptor may be included in the FIT as service level descriptors. A service level descriptor may be included selectively/optionally depending on the needs. And signaling_on_internet_descriptor information may be included in the FIT as an FIT level descriptor. The FIT level descriptor may also be selectively/optionally included depending on the needs.

The signaling structure as shown in FIG. 89 may improve flexibility of signaling table/resource utilization. In other words, since signaling_broacdast_descriptor information, signaling_on_internet_discriptor information, and capability_descriptor information are not always included at fixed locations, they may be included even when it is not necessary to do so, thereby avoiding wasting signaling resources. In particular, since signaling_on_internet_descriptor information may be included in at least one of the service level or FIT level, it gives an advantageous effect that broadband communication may be applied in a flexible manner depending on the needs of the transmitter-side.

FIG. 90 illustrates descriptors for the respective levels according to an embodiment of the present invention.

In FIG. 90, the FIT may include signaling information in the form of level-specific descriptor. Descriptors transmitted in group may be managed as illustrated in FIG. 90. Through version management based on group IDs, a receiver may manage descriptor information included when the FIT is received.

In FIG. 90, information managed by descriptors includes service_status_descriptor, service_name_descriptor, capability_descriptor, service_bootstrap_descriptor, signaling_template_descriptor, and signaling_over_internet_descriptor. Description about each descriptor is replaced with the detailed description given above.

In the embodiment of FIG. 90, service_status_descriptor and service_name_descriptor may be managed on the basis of group ID1. service_status_descriptor, service_name_descriptor, capability_descriptor, and service_bootstrap_descriptor may be managed on the basis of group ID2. And service_status_descriptor, service_name_descriptor, capability_descriptor, service_bootstrap_descriptor, signaling_template_descriptor, and signaling_on_internet_descriptor may be managed on the basis of group ID3. In this document, signaling_on_internet_descriptor may be called signaling_on_inet_descriptor. Also, signaling_bootstrap_descriptor may be called signaling_broadcast_descriptor.

FIG. 91 illustrates an FIT to which level descriptors are applied according to an embodiment of the present invention.

In FIG. 91, descriptions about the information included in the FIT are replaced with the detailed descriptions given above.

In the FIT of FIG. 91, as described with reference to FIG. 90, service_status_descriptor, service_name_descriptor, capability_descriptor, service_bootstrap_descriptor, signaling_template_descriptor, and signaling_over_internet_descriptor may be included in the FIT as service level descriptors. A service level descriptor may be included selectively/optionally depending on the needs.

In the embodiment of FIG. 91, information of signaling_on_internet_descriptor (signaling_on_inet_desc), signaling_bootstrap_descriptor (signaling_broadcast_desc), capability_descriptor (capability desc), and signaling_template_descriptor (templete desc) may be included in the FIT at the service level.

In what follows, a method for supporting service acquisition in association with a broadcast signaling service and an ESG service will be described.

FIG. 92 illustrates a method for signaling a service ID according to an embodiment of the present invention.

The service ID information included in the FIT is unique not only within a broadcast stream but also within a broadcast area and may be signaled in 16 bits. The global service ID information included in an ESG service fragment (@globalServiceID) and the service ID information included in a USD element (@serviceID) are both URIs, both of which are globally unique and represent the same service. In an embodiment, service ID information of the URI format included in a USD element may be called a global service ID.

The purpose of the service ID of the FIT is to provide a linkage for the announcement structure and three service signaling in a broadcast stream. Therefore, maintaining uniqueness of the service ID within a broadcast stream is important.

The ESG and service layer signaling information (USD) may include service ID information of the URI format, and the FIT may include service ID information in 16 bits. Therefore, in order for a receiver to match a service of the ESG to a service of the broadcast signaling, it is preferable that at least one signaling data out of three signaling data includes 16-bit service ID information and URI service ID information. The three signaling data are ESG, SLS information (USD), and FIT.

Therefore, in the embodiment of the present invention, SLS information such as USD may include not only the service ID information of the URI format (@ServiceID) but also the 16-bit service ID information (@atscServiceID). Therefore, by referring to the USD, a broadcast receiver may map the service ID information of the FIT to the service ID information (@globalService) of a service fragment of the ESG.

In addition, the service ID information (FITServiceID) of the FIT may be included in the ESG. In this case, a broadcast receiver may match the service ID information of the FIT immediately to the service ID information of the ESG.

FIG. 93 illustrates an embodiment of an ESG service fragment including service ID information of an FIT.

The 16-bit service ID information of the FIT is indicated by FITServcieID in FIG. 93. As a method for including FITServiceID information in an ESG service fragment, three embodiments may be proposed as shown in FIG. 93.

1) FITServiceID information may be added as an attribute of a service fragment.

2) FITServcieID information may be added as a child element of a service fragment.

3) FITServiceID information may be added as a child element in the Private Extension part of a service fragment.

Figure 94:
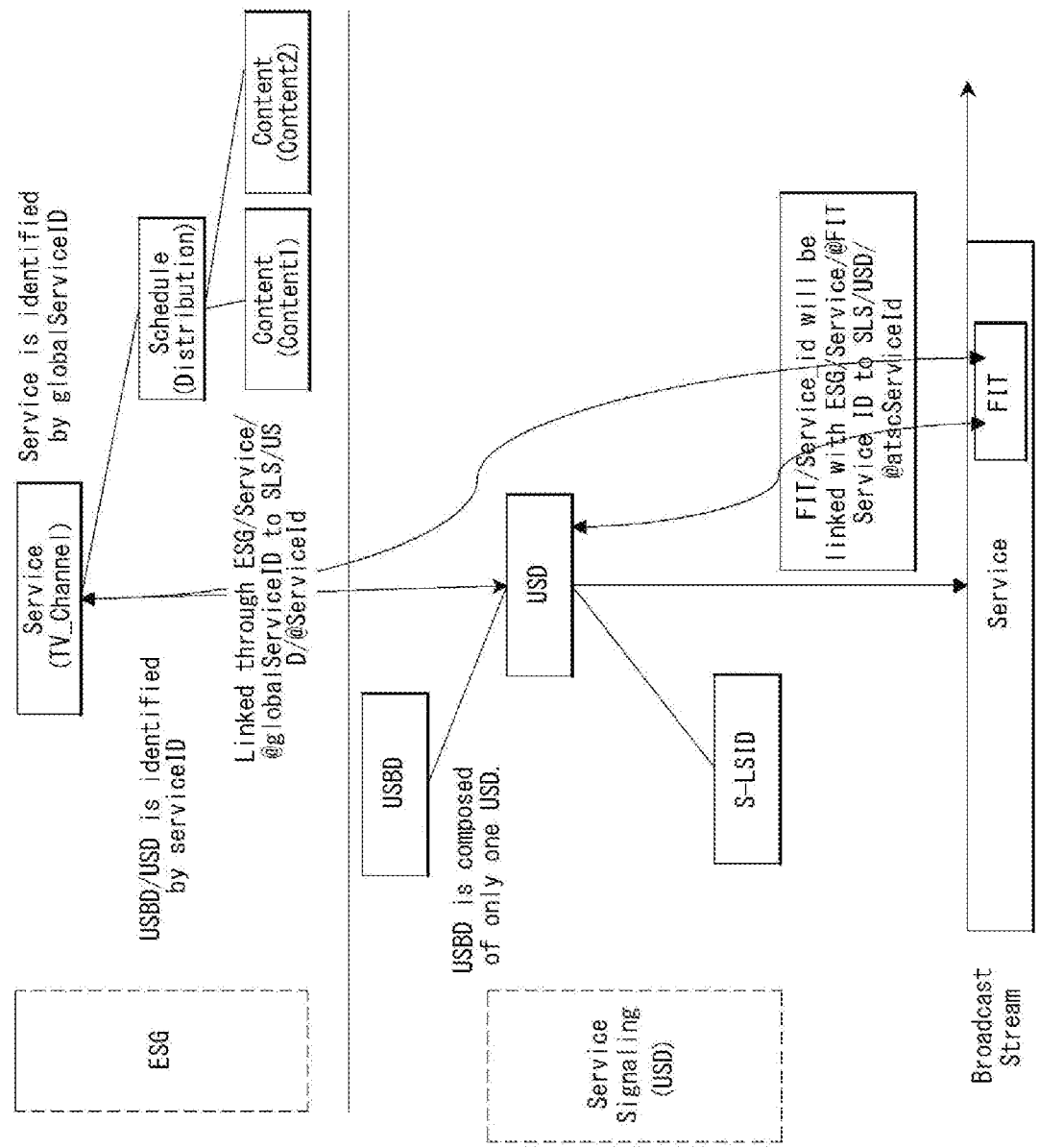
FIG. 94 illustrates a broadcast system structure according to an embodiment of the present invention.

FIG. 94 illustrates a broadcast system structure according to an embodiment of the present invention.

In the ESG area, a service (TV-Channel) may be identified by a global service ID. In the FIT included in a broadcast stream, a service may be identified by a service ID. A link between the global service ID of the ESG and the service ID of the FIT may be performed through service signaling (USD). A broadcast receiver may link the service ID of the FIT to the global service ID of the ESG by using the service ID and the global service ID of the USD.

However, as shown in FIG. 93, if the ESG includes the service ID of the FIT, a broadcast receiver may map the global service ID of the ESG directly to the service ID of the FIT. Therefore, even before SLS information such as USD is parsed, a receiver may match the services included in both data to each other directly by using the ESG and FIT only.

FIG. 95 illustrates a method for transmitting a broadcast signal according to an embodiment of the present invention.

A broadcast transmitter transmits a broadcast signal including a content component of a broadcast service, and a method for transmitting a broadcast signal according to an embodiment of the present invention is described below.

A broadcast transmitter may process at least one of a broadcast service or a content component of the broadcast service according to a delivery protocol. The delivery protocol may include the ROUTE protocol or MMT protocol.

A broadcast transmitter may generate service layer signaling (SLS) information S95010. The service layer signaling information includes information about discovery and acquisition of a broadcast service and a content component of the broadcast service. Service layer signaling information is referred to as SLS in this document, detailed description of which is substituted for by the description already given above.

The broadcast transmitter may generate service list information S95020. The service list information may include information for building a basic service list and discovering service layer signaling information. The service list information is referred to as the terms of FIT, FIC, LLS, and LCT, detailed description of which is substituted for by the description already given above.

The broadcast transmitter may perform physical layer processing on the service list information, service layer signaling information, and content component. The broadcast transmitter may perform physical layer processing on the service list information, service layer signaling information, and content component; generate a signal frame; and transmit the generated signal frame. Physical layer processing of the broadcast transmitter is described with reference to FIGS. 18 to 40.

A content component and service layer signaling information may be transmitted by using at least one delivery protocols between the ROUTE and the MMT protocols.

The service list information may include signaling information at the service list information level and signaling information at the service level. The signaling information at the service list information level may include signaling information about all of the services described by the service list information. The signaling information at the service level may include signaling information about a specific service included in the service list information.

The signaling information at the service list information level may include capability information, broadcast signaling location information, and URL signaling information. The capability information may indicate the capability required for processing of a broadcast service. The broadcast signaling location information may include address information required for obtaining service layer signaling information. URL signaling information may indicate a URL at which an ESG or a service layer signaling file about all of the services included in the service list information may be obtained. The signaling information at the service layer signaling information level may indicate a URL at which an ESG or service layer signaling file about the corresponding service may be obtained.

The capability information, broadcast signaling location information, and URL signaling information at the service list information level; and the URL signaling information at the service layer signaling information level may be included in the service list information selectively/optionally.

The service list information may include service ID information of 16-bit integer format for identifying a broadcast service, and the service layer signaling information may include the service ID information of 16-bit integer format and global service ID information of URI format. The global service ID information may be included in the ESG transmitted over broadband.

The service layer signaling information may be stored as a signaling template. A signaling template may be pre-shared between a broadcast transmitter and a broadcast receiver. When a signaling instance which changes service signaling information is generated, a broadcast transmitter may compare the signaling instance with a signaling template and transmit the difference as Diff information.

FIG. 96 illustrates a broadcast signal transmitter and a broadcast signal receiver according to an embodiment of the present invention.

The broadcast signal transmitter 96100 comprises a broadcast content encoder 96110, signaling processor 96120, and physical layer processor 96130. FIG. 95 and the detailed descriptions given above are applied to the operation of the broadcast signal transmitter.

The broadcast content encoder 96110 may process broadcast data according to a delivery protocol. The broadcast data may be encoded/formatted according to the ROUTE or MMT protocol. The broadcast data may correspond to a content component.

The signaling processor 96120 may generate signaling information. The signaling information may include service list information and service layer signaling information. The description about the present invention given in detail above may be applied to the description of the service list information and service layer signaling information.

The physical layer processor 96130 may perform physical layer processing on the broadcast data processed by the broadcast content processor 96110 and signaling information generated by the signaling processor 96120. The physical layer processor 96130 may transmit a physical layer processed signal frame, where the operation of the physical layer processor 96130 may be described by the descriptions given with reference to FIGS. 18 to 40.

A broadcast signal receiver 96200 may comprise a broadcast content decoder 96210, signaling parser 96220, and physical layer parser 96230.

The physical layer parser 96230 may perform physical layer processing on a receiver broadcast signal frame and extract broadcast data and signaling information.

The signaling parser 96220 may parse signaling information and obtain service list information and service layer signaling information. The broadcast content decoder 96210 may process a content component corresponding to a service according to a delivery protocol. The broadcast data may be decoded according to the ROUTE or MMT protocol.

The broadcast receiver 96200 may control the physical layer parser 96230 according to the signaling information obtained by the signaling parser 96220 and extract data corresponding to a specific service from a signal frame. And the broadcast receiver 96200 may process the extracted data by using the broadcast content decoder 96210 and output/provide a service/service content.

A module or unit may comprise processors executing sequential operation steps stored in the memory (or storage unit). The individual steps described in the embodiments above may be performed by hardware/processors. Each individual module/block/unit described in the embodiment above may be operated as hardware/processor. Also, the methods proposed by the present invention may be executed as program codes. These codes may be written to a processor-readable storage medium and therefore may be read by a processor provided by an apparatus.

Although the present invention has been described with reference to individual drawings for the convenience of description, it is still possible to design so that embodiments described with reference to each drawing may be combined to implement a new embodiment. Also, depending on the needs of those skilled in the art, designing a computer-readable recording medium in which programs for executing the embodiments described above are stored also belongs to the technical scope of the present invention.

The apparatus and method according to the present invention are not limited to the embodiments described above, but the entire or part of the embodiments may be combined selectively so that various modifications may be made to the embodiments.

Meanwhile, the method according to the present invention may be implemented in the form of processor-readable program codes in a recording medium that may be read by a processor installed in a network device. The processor-readable recording medium includes all kinds of recording devices storing data that may be read by the processor. Examples of processor-readable recording media include ROM, RAM, CD-ROM, magnetic tape, floppy disk, optical data storage device, and implementation in the form of carrier waves such as transmission through the Internet. Also, the processor-readable recording medium may be distributed over computer systems connected to each other through a network so that processor-readable codes may be stored and executed in a distributed manner.

Throughout the document, preferred embodiments of the present invention have been described with reference to appended drawings; however, the present invention is not limited to the embodiments above. Rather, it should be noted that various modifications of the present invention may be made by those skilled in the art to which the present invention belongs without leaving the technical scope of the present invention defined by the appended claims, and these modifications should not be understood individually from the technical principles or aspects of the present invention.

The present document describes both of the product invention and the process invention, and depending on the needs, descriptions of the respective inventions may be applied in a supplementary manner.

It should be understood by those skilled in the art that various modifications and variations of the present invention may be made without departing from the technical principles and scope. Therefore, it should be understood that the present invention includes modifications and variations thereof provided by the appended claims of the present invention and within their equivalent scope. The present document describes both of an apparatus and a method according to the present invention, and descriptions of both of the apparatus and method according to the present invention may be applied in a complementary manner.

MODE FOR INVENTION

Various embodiments have been described, in their best mode to embody the present invention

INDUSTRIAL APPLICABILITY

The present invention is used in a series of broadcast signal providing fields.

It should be understood by those skilled in the art that various modifications and variations of the present invention may be made without departing from the technical principles and scope. Therefore, it should be understood that the present invention includes modifications and variations thereof provided by the appended claims of the present invention and within their equivalent scope.

The invention claimed is:

1. A method for transmitting a broadcast signal, the method comprising:
   encoding service data for a service;
   encoding service list information for one or more services including the service; and
   transmitting the broadcast signal including the encoded service data and the encoded service list information,
   wherein the service list information includes first URL (Uniform Resource Locator) information for indicating a URL for acquiring first ESG (Electronic Service Guide) information or first service layer signaling information for all services when the first ESG information or the first service layer signaling information is available via a broadband, wherein the service list information further includes information for the service, and
   wherein the information for the service includes:
   service identification information for identifying the service,
   category information for indicating a type of the service,
   capability information for indicating a capability required for decoding and presenting the service data, and second URL information for indicating a URL for acquiring second ESG information or second service layer signaling information for the service when the second ESG information or the second service layer signaling information is available via the broadband.

2. The method of claim 1,
generating Diff information by comparing an XML (Extensible Markup Language) template and an XML signaling instance of service layer signaling information; and
transmitting the Diff information, wherein the Diff information represents a difference between the XML template and the XML signaling instance,
wherein the XML template is pre-shared between a transmission system and a reception system through HTTP(S) (Hypertext Transfer Protocol (Secure)) over the broadband, and wherein the Diff information is encapsulated into metadataEnvelope.

3. The method of claim 2, wherein the metadataEnvelope includes: an XML signaling instance ID for identifying the XML signaling instance and an XML template ID for identifying the XML template.

4. The method of claim 2, wherein the first URL information or the second URL information is used to make a request for the Diff information.

5. The method of claim 1, wherein the service list information further includes first URL type information for indicating a type of the first URL information and second URL type information for indicating a type of the second URL information.

6. A device for transmitting a broadcast signal, the device comprising:
an encoder configured to encode service data and encode service list information for one or more services including the service; and
a transmitter configured to transmit the broadcast signal including the encoded service data and the encoded service list information,
wherein the service list information includes first URL (Uniform Resource Locator) information for indicating a URL for acquiring first ESG (Electronic Service Guide) information or first service layer signaling information for all services when the first ESG information or the first service layer signaling information is available via a broadband,
wherein the service list information further includes information for the service, and wherein the information for the service:
service identification information for identifying the service,
category information for indicating a type of the service,
capability information for indicating a capability required for decoding and presenting the service data, and
second URL information for indicating a URL for acquiring second ESG information or second service layer signaling information for the service when the second ESG information or the second service layer signaling file is available via the broadband.

7. The device of claim 6, further comprising:
a Diff generator configured to generate Diff information by comparing an XML(Extensible Markup Language) template and an XML signaling instance of service layer signaling information and transmit the Diff information,
wherein the Diff information represents a difference between the XML template and the XML signaling instance,
wherein the XML template is pre-shared between a transmission system and a reception system through HTTP(S) (Hypertext Transfer Protocol (Secure)) over the broadband, and wherein the Diff information is encapsulated in metadataEnvelope.

8. The device of claim 7, wherein the metadataEnvelope includes:
an XML signaling instance ID for identifying the XML signaling instance and an XML template ID for identifying the XML template.

9. The device of claim 7, wherein the first URL information or the second URL information is used to make a request for the Diff information.

10. The device of claim 6, wherein the service list information further includes first URL type information for indicating a type of the first URL information and second URL type information for indicating a type of the second URL information.

11. A method for receiving a broadcast signal, the method comprising:
receiving the broadcast signal including service data for a service and service list information for one or more services including the service,
wherein the service list information includes first URL (Uniform Resource Locator) information for indicating a URL for acquiring first ESG (Electronic Service Guide) information or first service layer signaling information for all services when the first ESG information or the first service layer signaling information is available via a broadband,
wherein the service list information further includes information for the service, and wherein the information for the service includes:
service identification information for identifying the service,
category information for indicating a type of the service,
capability information for indicating a capability required for decoding and presenting the service data, and
second URL information for indicating a URL for acquiring second ESG information or second service layer signaling information for the service when the second ESG information or the second service layer signaling information is available via the broadband;
decoding the service data; and
decoding the service list information.

12. The method of claim 11, further comprising:
recovering an XML(Extensible Markup Language) signaling instance of service layer signaling information by applying Diff information received to an XML template,
wherein the Diff information represents a difference between the XML template and the XML signaling instance,
wherein the XML template is pre-shared between a transmission system and a reception system through HTTP(S) (Hypertext Transfer Protocol (Secure)) over the broadband, and wherein the Diff information is encapsulated in metadataEnvelope.

13. The method of claim 12, wherein the metadataEnvelope includes: an XML signaling instance ID for identifying the XML signaling instance and an XML template ID for identifying the XML template.

14. The method of claim 12, wherein the first URL information or the second URL information is used to make a request for the Diff information.

15. The method of claim 11, wherein the service list information further includes first URL type information for indicating a type of the first URL information and second URL type information for indicating a type of the second URL information.

16. A device for receiving a broadcast signal, the device comprising:
a receiver configured to receive the broadcast signal including service data for a service and service list information for one or more services including the service,
wherein the service list information includes first URL (Uniform Resource Locator) information for indicating a URL for acquiring first ESG (Electronic Service Guide) information or first service layer signaling information for all services when the first ESG information or the first service layer signaling information is available via a broadband, wherein the service list information further includes information for the service,
wherein the information for the service includes:
service identification information for identifying the service,
category information for indicating a type of the service,
capability information for indicating a capability required for decoding and presenting the service, and
second URL information indicating a URL for acquiring second ESG information or second service layer signaling information for the service when the second ESG information or the second service layer signaling information is available via the broadband; and a decoder configured to decode the service data and decode the service list information.

17. The device of claim 16, further comprising:
a Diff applier configured to recover an XML(Extensible Markup Language) signaling instance of service layer signaling information by applying Diff information received to an XML template,
wherein the Diff information represents a difference between the XML template and the XML signaling instance,
wherein the XML template is pre-shared between a transmission system and a reception system through HTTP(S) (Hypertext Transfer Protocol (Secure))over the broadband, and wherein the Diff information is encapsulated in metadataEnvelope.

18. The device of claim 17, wherein the metadataEnvelope includes:
an XML signaling instance ID for identifying the XML signaling instance and an XML template ID for identifying the XML template.

19. The device of claim 17, wherein the first URL information or the second URL information is used to make a request for the Diff information.

20. The device of claim 16, wherein the service list information further includes first URL type information for indicating a type of the first URL information and second URL type information for indicating a type of the second URL information.

* * * * *